(12) United States Patent
Hwang et al.

(10) Patent No.: US 11,845,824 B2
(45) Date of Patent: Dec. 19, 2023

(54) SAME NOVEL POLYMER AND ORGANIC LIGHT EMITTING DEVICE COMPRISING THE SAME

(71) Applicant: LG Chem, Ltd., Seoul (KR)

(72) Inventors: Minho Hwang, Daejeon (KR); Ho Gyu Lee, Daejeon (KR); Jaechol Lee, Daejeon (KR)

(73) Assignee: LG Chem, Ltd.

( * ) Notice: Subject to any disclaimer, the term of this patent is extended or adjusted under 35 U.S.C. 154(b) by 575 days.

(21) Appl. No.: 17/059,858

(22) PCT Filed: Nov. 14, 2019

(86) PCT No.: PCT/KR2019/015560
§ 371 (c)(1),
(2) Date: Nov. 30, 2020

(87) PCT Pub. No.: WO2020/111603
PCT Pub. Date: Jun. 4, 2020

(65) Prior Publication Data
US 2021/0221932 A1    Jul. 22, 2021

(30) Foreign Application Priority Data

Nov. 27, 2018 (KR) .................... 10-2018-0148562
Nov. 12, 2019 (KR) .................... 10-2019-0144347

(51) Int. Cl.
*C08F 236/20* (2006.01)
*C08F 212/14* (2006.01)
(Continued)

(52) U.S. Cl.
CPC .......... *C08F 236/20* (2013.01); *C08F 212/21* (2020.02); *H10K 85/111* (2023.02);
(Continued)

(58) Field of Classification Search
CPC ..... C08F 236/20; C08F 212/21; H10K 85/111
See application file for complete search history.

(56) References Cited

U.S. PATENT DOCUMENTS 9,337,429 B2    5/2016    Funyuu et al.
9,748,488 B2    8/2017    Funyuu et al.
(Continued)

FOREIGN PATENT DOCUMENTS

CN        105733562 A    7/2016
CN        110121493 A    8/2019
(Continued)

OTHER PUBLICATIONS

Berven, et al., "Self-Crosslinking Borate Anions for the Production of Tough UV-Cured Polyelectrolyte Surfaces," Journal of Polymer Science Part A: Polymer Chemistry, Feb. 1, 2013, pp. 499-508, vol. 51, No. 3.
(Continued)

*Primary Examiner* — Anthony Ho
(74) *Attorney, Agent, or Firm* — Lerner David LLP

(57) ABSTRACT

The present disclosure provides a novel polymer compound prepared by curing a compound represented by the following Chemical Formula 1 and a compound represented by the following Chemical Formula 4, and an organic light emitting device comprising the same:

[Chemical Formula 1]

(Continued)

-continued

[Chemical Formula 4]

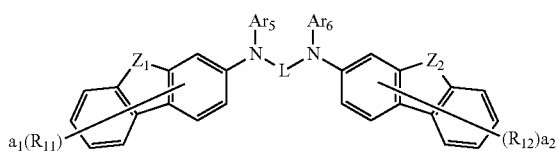

with each variable being defined therein.

19 Claims, 1 Drawing Sheet

(51) Int. Cl.
H10K 85/10 (2023.01)
H10K 50/15 (2023.01)
H10K 50/16 (2023.01)
H10K 50/17 (2023.01)

(52) U.S. Cl.
CPC ............ H10K 50/15 (2023.02); H10K 50/16 (2023.02); H10K 50/171 (2023.02)

(56) References Cited

U.S. PATENT DOCUMENTS

| | | | |
|---|---|---|---|
| 9,978,473 | B2 | 5/2018 | Seshadri et al. |
| 9,985,210 | B2 | 5/2018 | Funyuu et al. |
| 2013/0092887 | A1 | 4/2013 | Seshadri et al. |
| 2014/0332791 | A1 | 11/2014 | Funyuu et al. |
| 2015/0094437 | A1 | 4/2015 | Caille et al. |
| 2015/0115241 | A1 | 4/2015 | Zoellner et al. |
| 2019/0019956 | A1 | 1/2019 | Gorohmaru et al. |
| 2019/0214568 | A1 | 7/2019 | Kang et al. |
| 2019/0280206 | A1 | 9/2019 | Lee et al. |
| 2020/0020858 | A1 | 1/2020 | Lee et al. |
| 2020/0020873 | A1 | 1/2020 | Lee et al. |
| 2020/0227645 | A1 | 7/2020 | Lee et al. |
| 2020/0259095 | A1 | 8/2020 | Shin et al. |

FOREIGN PATENT DOCUMENTS

| | | |
|---|---|---|
| JP | 2015518653 A | 7/2015 |
| KR | 20000051826 A | 8/2000 |
| KR | 20140089364 A | 7/2014 |
| KR | 20140106617 A | 9/2014 |
| KR | 20140107594 A | 9/2014 |
| KR | 20150093995 A | 8/2015 |
| KR | 20180059377 A | 6/2018 |
| KR | 20180059378 A | 6/2018 |
| KR | 20180059380 A | 6/2018 |
| KR | 20180059381 A | 6/2018 |
| WO | 2017164268 A1 | 9/2017 |
| WO | 2018097659 A1 | 5/2018 |
| WO | 2018097661 A1 | 5/2018 |

OTHER PUBLICATIONS

International Search Report for Application No. PCT/KR2019/015560 dated Mar. 3, 2020, 3 pages.
Ren, et al., "Tetrakis(pentafluorophenyl)gallates (I)," Tetrahedron Letters, Nov. 4, 2000, pp. 8669-8672, vol. 4, No. 45.

【FIG. 1】
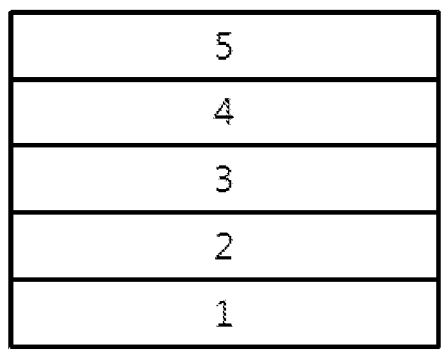
【FIG. 2】
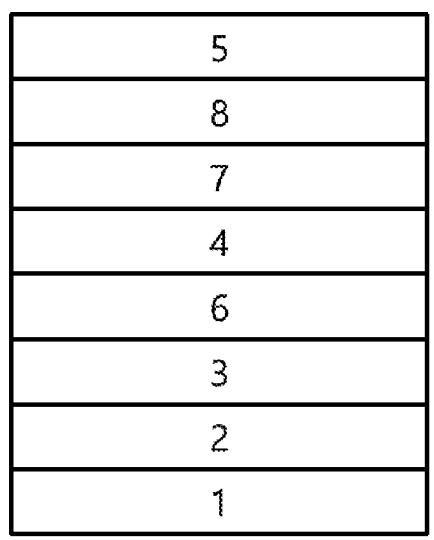

SAME NOVEL POLYMER AND ORGANIC LIGHT EMITTING DEVICE COMPRISING THE SAME

CROSS-REFERENCE TO RELATED APPLICATION(S)

This application is a national phase entry under 35 U.S.C, § 371 of International Application No. PCT/KR2019/015560 filed Nov. 14, 2019, which claims priority from Korean Patent Application No. 10-2018-0148562 filed Nov. 27, 2018, and Korean Patent Application No. 10-2019-0144347 filed Nov. 12, 2019, all of which are incorporated herein by reference.

TECHNICAL FIELD

The present disclosure relates to a novel polymer and an organic light emitting device comprising the same.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

In this regard, the present disclosure provides novel materials for organic light emitting devices that can be used for an organic light emitting device and simultaneously, can be deposited by a solution process.

PRIOR ART LITERATURE

Patent Literature (Patent Literature 0001) Korean Patent Publication No. 10-2000-0051826

DETAILED DESCRIPTION OF THE INVENTION

Technical Problem

It is an object of the present disclosure to provide a novel polymer and an organic light emitting device comprising the same.

Technical Solution

According to an aspect of the present disclosure, there is provided a polymer prepared by curing a compound represented by the following Chemical Formula 1 and a compound represented by the following Chemical Formula 4:

[Chemical Formula 1]

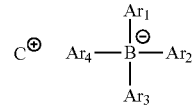

in the Chemical Formula 1, $C^\oplus$ is a cationic group, $Ar_1$ to $Ar_4$ are the same as or different from each other, at least one of $Ar_1$ to $Ar_4$ is represented by the following Chemical Formula 2, and the remaining $Ar_1$ to $Ar_4$ are represented by the following Chemical Formula 3,

[Chemical Formula 2]

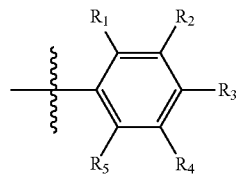

in the Chemical Formula 2, at least one of $R_1$ to $R_5$ is a photocurable/thermosetting functional group, the remaining $R_1$ to $R_5$ are each independently hydrogen; deuterium; F; a cyano group; a substituted or unsubstituted fluoroalkyl group; a nitro group; —C(O)$R_{100}$; —S$R_{102}$; —SO$_3R_{103}$; —COO$R_{104}$; —OC(O)$R_{105}$; —C(O)N$R_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, $R_{100}$ to $R_{107}$ are each independently hydrogen; deuterium; or a substituted or unsubstituted alkyl group,

[Chemical Formula 3]

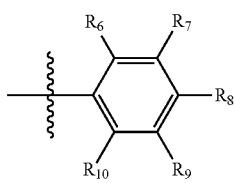

in the Chemical Formula 3, $R_6$ to $R_{10}$ are each independently a photocurable/thermosetting functional group; hydrogen; deuterium; F; a cyano group; a substituted or unsubstituted fluoroalkyl group; a nitro group; —$C(O)R_{100}$; —$OR_{101}$; —$SR_{102}$; —$SO_3R_{103}$; —$COOR_{104}$; —$OC(O)R_{105}$; —$C(O)NR_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, $R_{100}$ to $R_{107}$ are each independently hydrogen; deuterium; or a substituted or unsubstituted alkyl group,

[Chemical Formula 4]

![Chemical Formula 4 structure]

in the Chemical Formula 4, $Z_1$ and $Z_2$ are each independently $C(A_1)(A_2)$; O or S, $A_1$ and $A_2$ are each independently $-L_1-Y_1$, $Ar_5$ and $Ar_6$ are each independently a substituted or unsubstituted aryl group; a substituted or unsubstituted heteroaryl group; or $-L_2-Y_2$, L, $L_1$ and $L_2$ are each independently a substituted or unsubstituted arylene group; or a substituted or unsubstituted alkylene group, $Y_1$ and $Y_2$ are each independently hydrogen; or —$Z_3$-A, at least one of $Y_1$ and $Y_2$ is —$Z_3$-A, $Z_3$ is O or S, A is a photocurable/thermosetting functional group, $a_1$ and $a_2$ are each independently an integer of 0 to 7, $R_{11}$ and $R_{12}$ are each independently hydrogen; deuterium; a nitro group; —$C(O)R_{200}$; —$OR_{201}$; —$SR_{202}$; —$SO_3R_{203}$; —$COOR_{204}$; —$OC(O)R_{205}$; —$C(O)NR_{206}R_{207}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, and $R_{200}$ to $R_{207}$ are each independently hydrogen; deuterium; or a substituted or unsubstituted alkyl group.

According to another aspect of the present disclosure, there is provided an organic light emitting device comprising: a first electrode; a second electrode that is provided opposite to the first electrode; and one or more organic material layers that are provided between the first electrode and the second electrode, wherein one or more layers of the organic material layers include a polymer prepared by curing a compound represented by Chemical Formula 1 and a compound represented by Chemical Formula 4.

Advantageous Effects

The polymer according to the present disclosure can be used as a material of an organic material layer of an organic light emitting device, and can improve the efficiency, achieve low driving voltage and/or improve lifetime characteristics in the organic light emitting device. In particular, the polymer according to the present disclosure can be applied to a solution process, and can be used as a hole injection material, hole transport material, hole injection and transport material, light emitting material, electron transport material, or electron injection material.

BRIEF DESCRIPTION OF THE DRAWINGS

FIG. 1 shows an example of an organic light emitting device comprising a substrate 1, an anode 2, a hole injection layer 3, a light emitting layer 4, and a cathode 5.

FIG. 2 shows an example of an organic light emitting device comprising a substrate 1, an anode 2, a hole injection layer 3, a hole transport layer 6, a light emitting layer 4, an electron transport layer 7, an electron injection layer 8, and a cathode 5.

DETAILED DESCRIPTION OF THE EMBODIMENTS

Hereinafter, embodiments of the present disclosure will be described in more detail to facilitate understanding of the invention.

As used herein, the notation

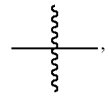

, or means a bond linked to another substituent group.

As used herein, the term "unsubstituted or substituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group containing at least one of N, O and S atoms, or being unsubstituted or substituted with a substituent to which two or more substituents of the above-exemplified substituents are connected. For example, "a substituent in which two or more substituents are connected" may be a biphenyl group. Namely, a biphenyl group may be an aryl group, or it may be interpreted as a substituent in which two phenyl groups are connected.

In the present disclosure, the carbon number of a carbonyl group is not particularly limited, but is preferably 1 to 40. Specifically, the carbonyl group may be a group having the following structural formulas, but is not limited thereto:

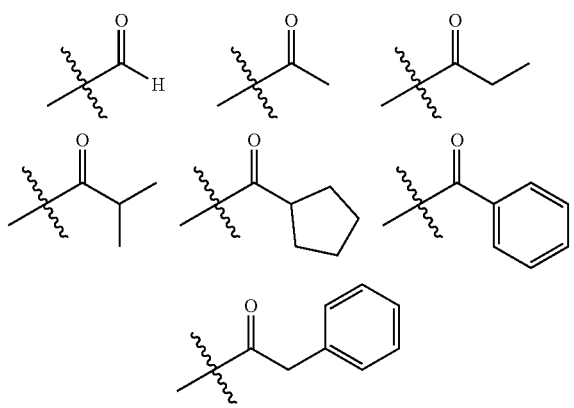

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a group having the following structural formulas, but is not limited thereto.

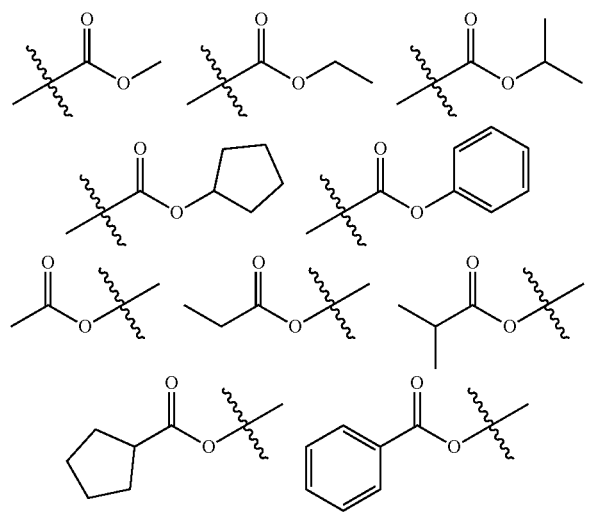

In the present disclosure, the carbon number of an imide group is not particularly limited, but is preferably 1 to 25. Specifically, the imide group may be a group having the following structural formulas, but is not limited thereto.

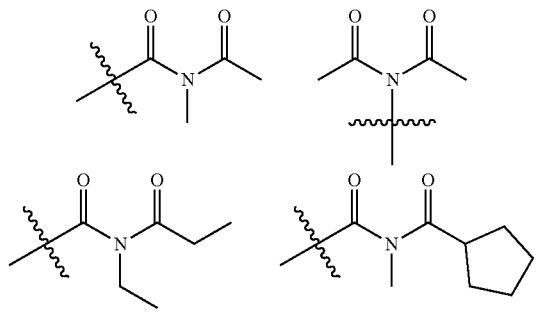

-continued

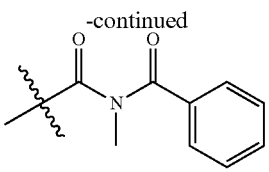

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present disclosure, the fluorenyl group may be substituted, and two substituents may be linked with each other to form a spiro structure. In the case where the fluorenyl group is substituted,

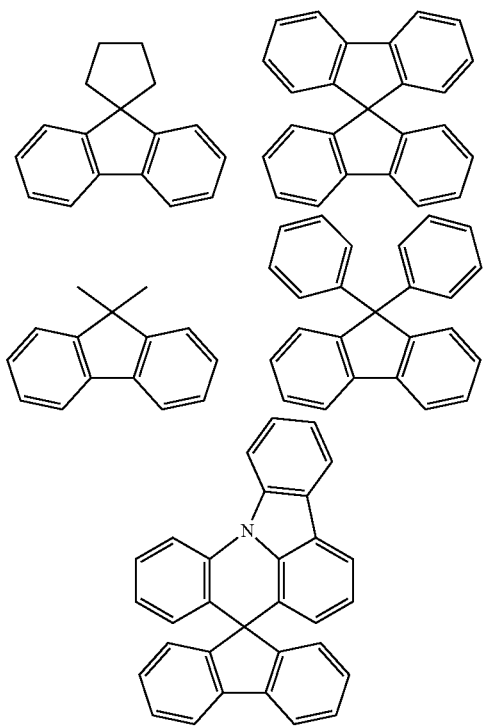

and the like can be formed. However, the structure is not limited thereto.

In the present disclosure, a heterocyclic group is a heterocyclic group containing one or more of O, N, Si and S as a heteroatom, and the carbon number thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group and the arylamine group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can be applied to the aforementioned description of the heterocyclic group. In the present disclosure, the alkenyl group in the aralkenyl group is the same as the aforementioned examples of the alkenyl group. In the present disclosure, the aforementioned description of the aryl group may be applied except that the arylene is a divalent group. In the present disclosure, the aforementioned description of the heterocyclic group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heterocyclic group can be applied, except that the heterocyclic group is not a monovalent group but formed by combining two substituent groups.

In the present disclosure, the term "photocurable/thermosetting functional group" may mean a reactive substituent group that causes crosslinking between compounds by exposure to heat and/or light. The crosslink may be formed by decomposing carbon-carbon multiple bonds and cyclic structures by heat treatment or light irradiation and linking the generated radicals.

In the present disclosure, the onium compound means a compound formed by coordinatively bonding a hydrogen ion or other organic radical with an unshared electron pair such as oxygen, sulfur, nitrogen, and phosphorus.

The present disclosure provides a polymer prepared by curing the compound represented by Chemical Formula 1 and the compound represented by Chemical Formula 4.

Conventionally used materials for solution film formation are used as a single molecule in an organic material layer or the like, but during such use, a specific chemical solvent in which the single molecule is dissolved must be used, and it must be resistant to the solvent used in the next layer. If such a specific solvent is not used, there is a problem in that properties such as film retention factors are deteriorated.

Meanwhile, in the case of conventional monomolecular materials at the time of manufacturing the devices, the material may not be uniformly distributed in the solution, which may result in deterioration in device characteristics.

However, the polymer according to the present disclosure may be used in an organic material layer, preferably a hole injection layer, a hole transport layer, or a layer that that simultaneously performs hole injection and hole transport, more preferably a hole injection layer, as will be described in detail below, in which case the device performance can be improved.

In particular, by curing a dopant material together with a host material in advance, instead of applying a monomolecular dopant material with a host material and then heat-curing it, it can be used for the manufacture of the devices by removing uncured residual materials that may occur in the device manufacturing process, and by removing unnecessary photocurable/thermosetting functional groups remaining without being cured in the existing process, the efficiency and lifetime of the organic light emitting device can be improved.

Further, in the case of a single molecule, it exhibits the solubility and solution processability of the host and the dopant material only in a specific solvent, and thus, non-uniform mixing may occur due to the difference in solubility of each material. However, the polymer according to the present disclosure behaves like a single material, and thus, solvent selection is made easy, and the solution processability can be improved. Therefore, when a solvent is used in the solution process, coating is made easy, and an effect of improving film properties can be expected.

Preferably, the photocurable/thermosetting functional group may be selected from the following photocurable/thermosetting functional groups:

[Photocurable/Thermosetting Functional Group]

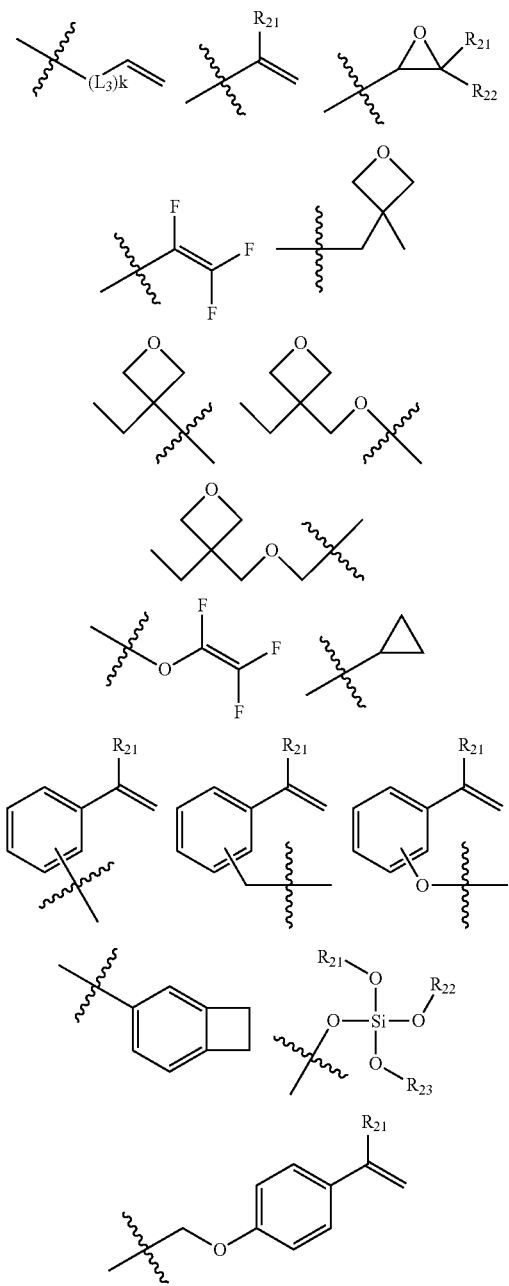

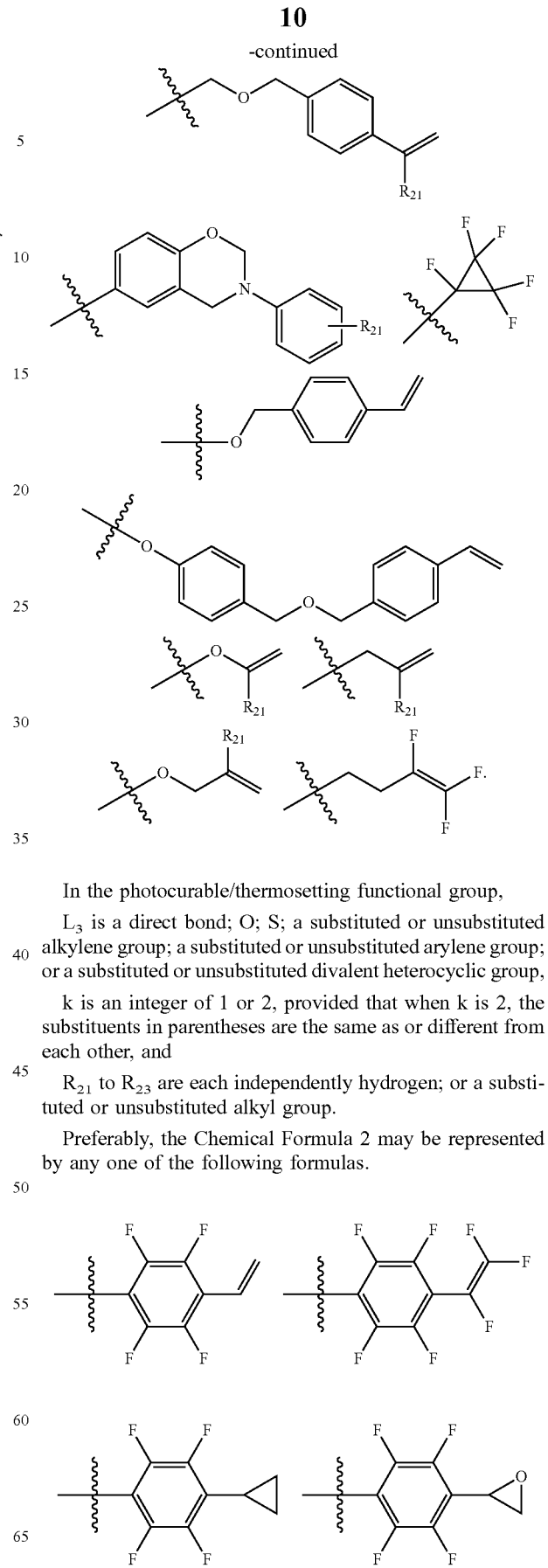

In the photocurable/thermosetting functional group, $L_3$ is a direct bond; O; S; a substituted or unsubstituted alkylene group; a substituted or unsubstituted arylene group; or a substituted or unsubstituted divalent heterocyclic group, k is an integer of 1 or 2, provided that when k is 2, the substituents in parentheses are the same as or different from each other, and $R_{21}$ to $R_{23}$ are each independently hydrogen; or a substituted or unsubstituted alkyl group.

Preferably, the Chemical Formula 2 may be represented by any one of the following formulas.

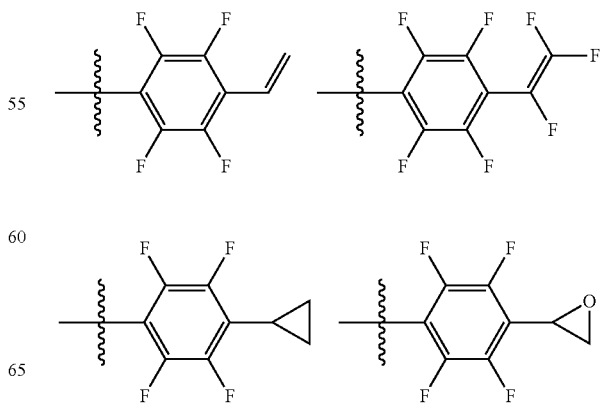

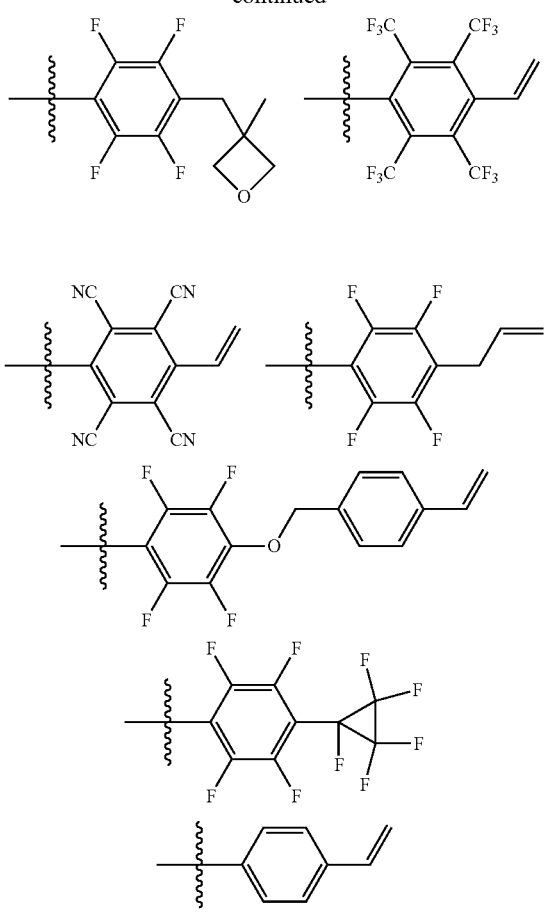
Preferably, the compound represented by Chemical Formula 1 may be selected from the group consisting of the following structural formulas:
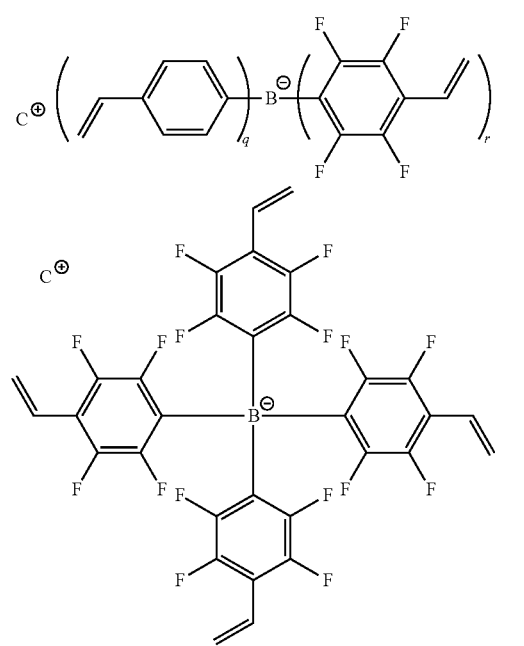
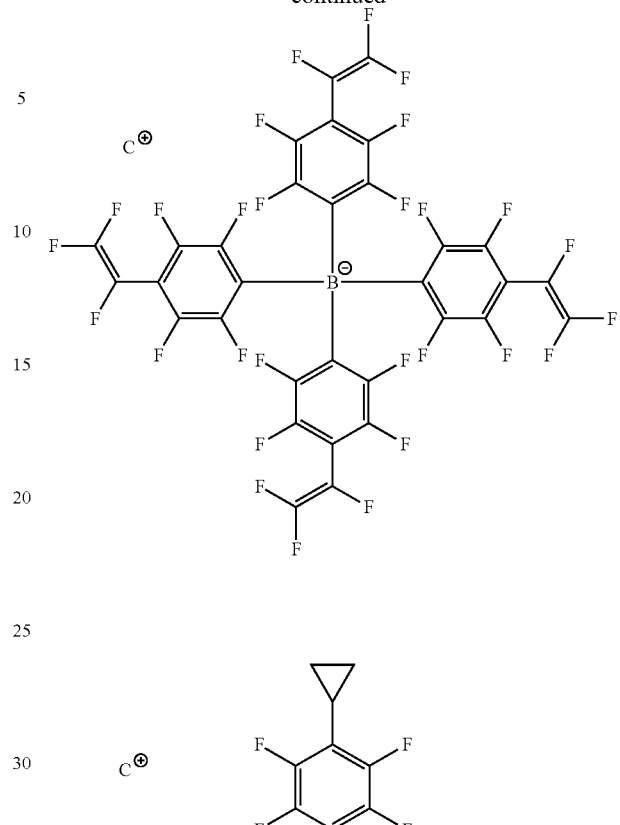
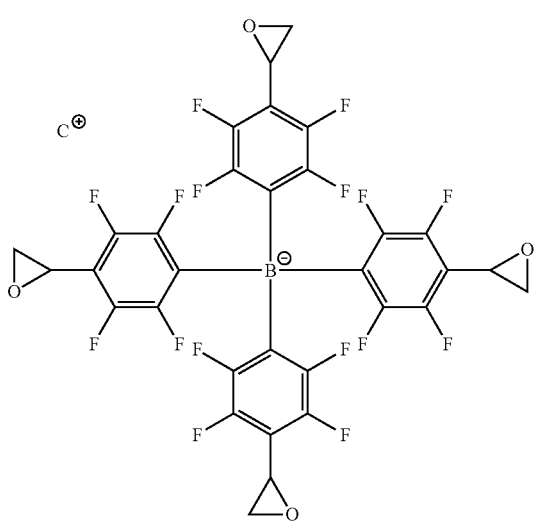

-continued
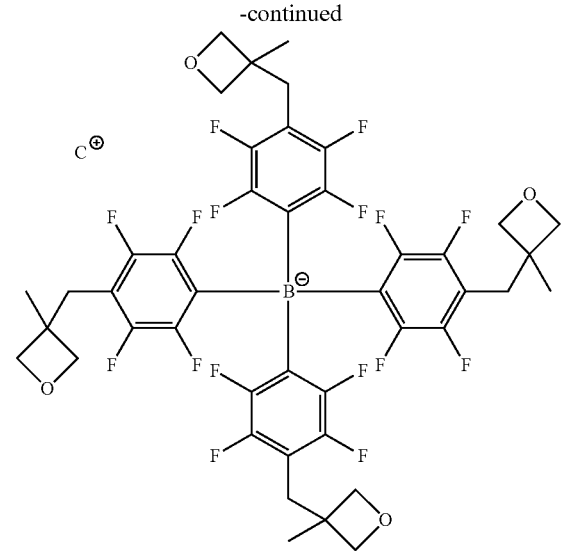
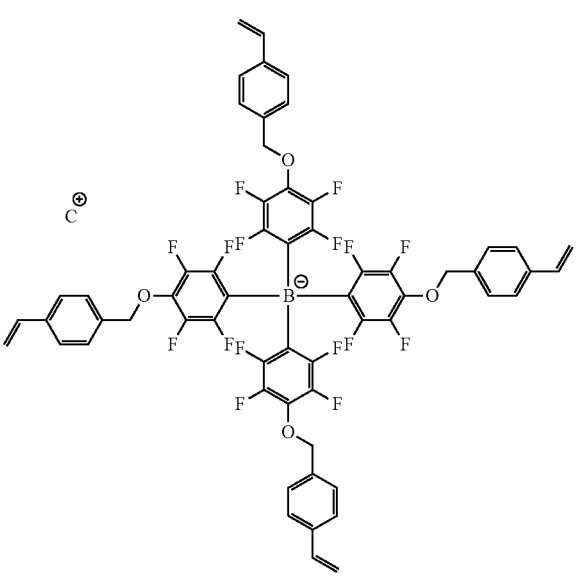
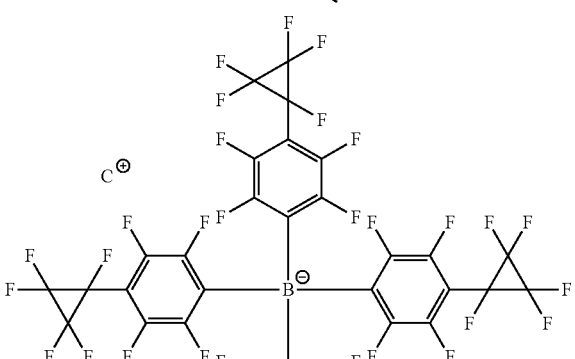
-continued
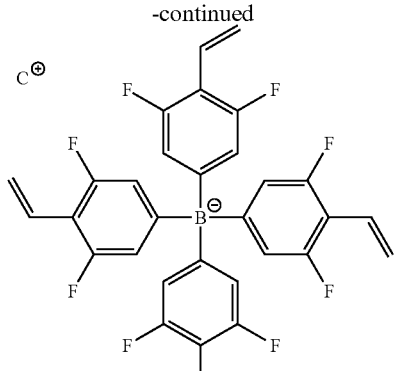
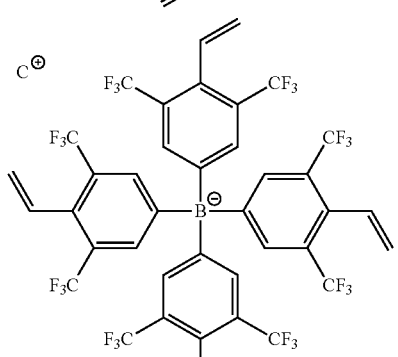
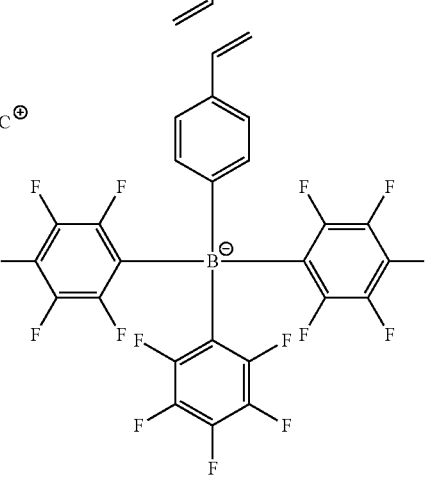
in the above structural formulas,
r is an integer from 1 to 4,
q is an integer from 0 to 3, and
q+r=4.
Preferably, the cationic group may be selected from a monovalent cationic group, an onium ion or the group consisting of the following formulas:
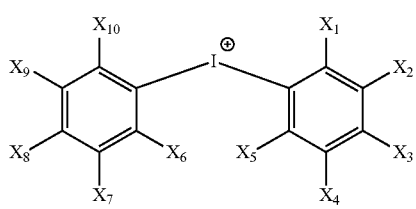

-continued

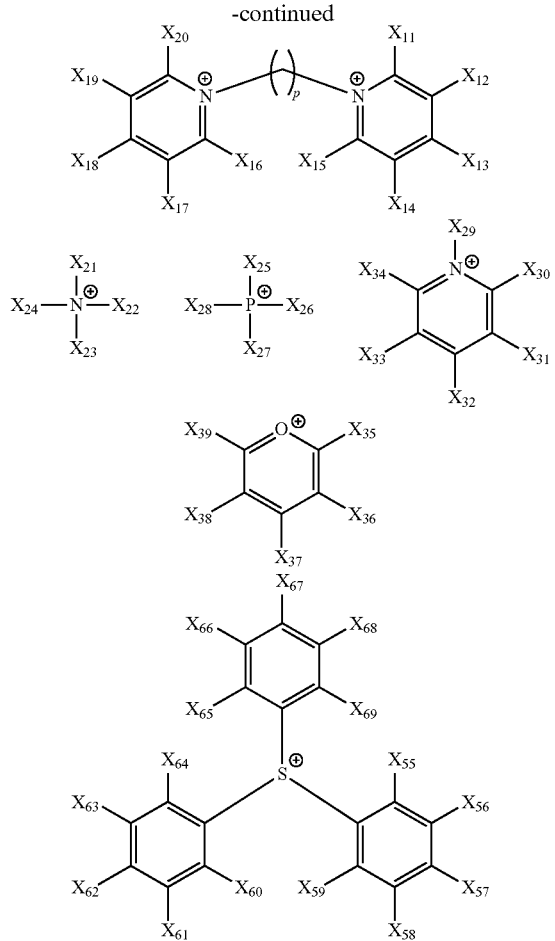

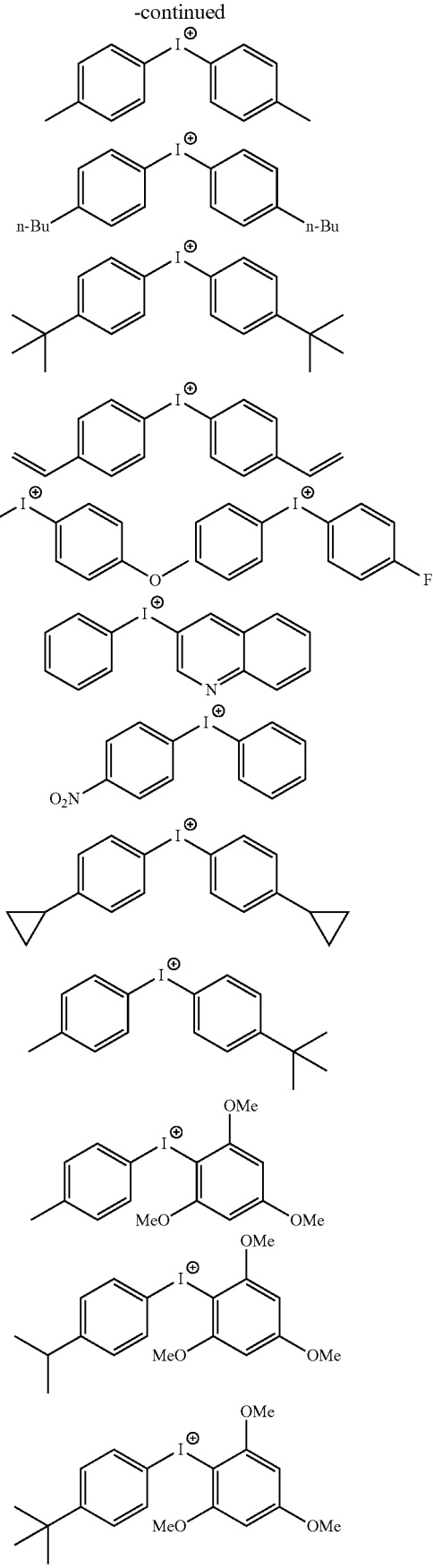

in the above formulas, $X_1$ to $X_{39}$ and $X_{55}$ to $X_{69}$ are each independently hydrogen; a cyano group; a nitro group; a halogen group; —$COOR_{104}$; a substituted or unsubstituted alkyl group; a substituted or unsubstituted alkoxy group; a substituted or unsubstituted cycloalkyl group; a substituted or unsubstituted fluoroalkyl group; or a substituted or unsubstituted aryl group, or a photocurable/thermosetting functional group, $R_{104}$ is hydrogen; deuterium; or a substituted or unsubstituted alkyl group, and p is an integer of 0 to 10.

Meanwhile, the monovalent cation group may be an alkali metal cation, and the alkali metal cation includes $Na^+$, $Li^+$, $K^+$ or the like, but is not limited thereto.

Preferably, the cationic group may be selected from the group consisting of the following formulas:

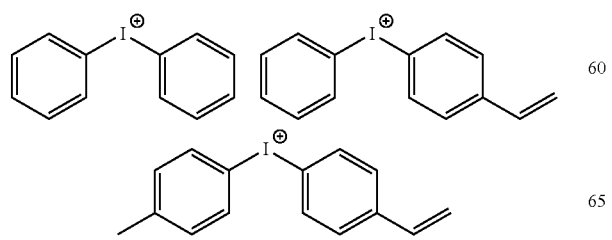

-continued
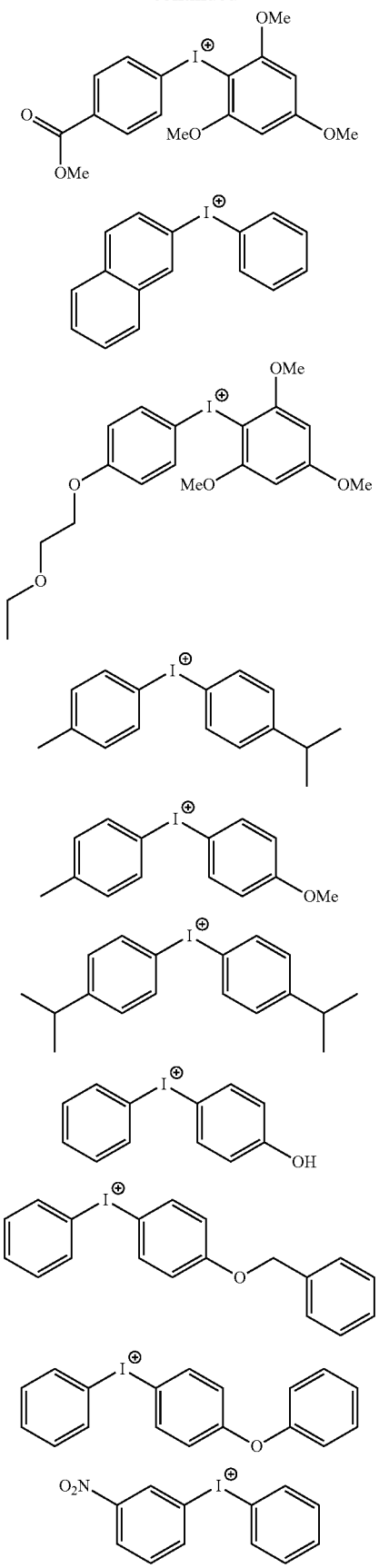
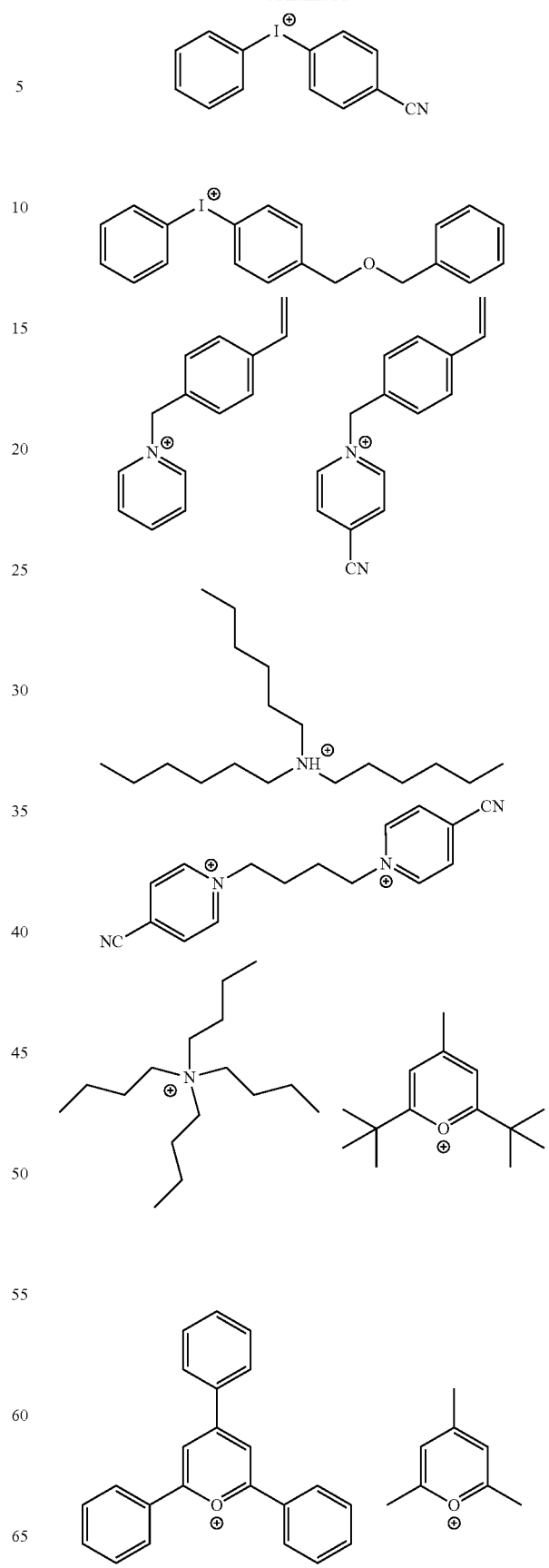

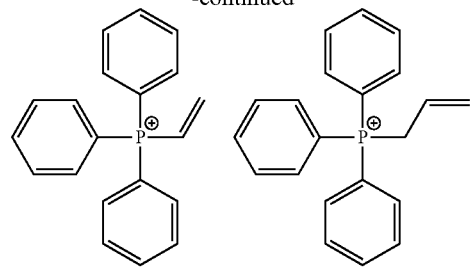
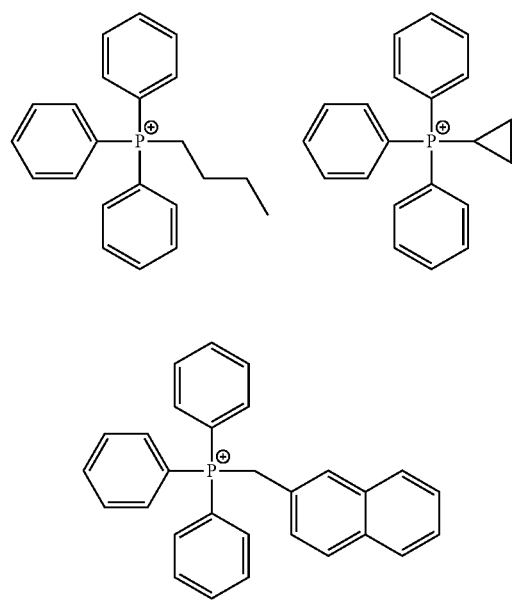
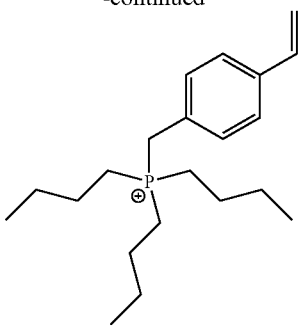
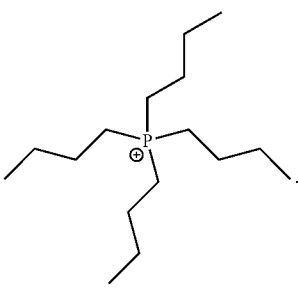
Preferably, the compound represented by Chemical Formula 1 may be selected from the group consisting of Chemical Formula 1-1-1 to Chemical Formula 1-1-20, Chemical Formula 1-2-1, Chemical Formula 1-2-3 to Chemical Formula 1-2-5, Chemical Formula 1-3-1 to Chemical Formula 1-3-4 and Chemical Formula 1-4-1:
[Chemical Formula 1-1-1]
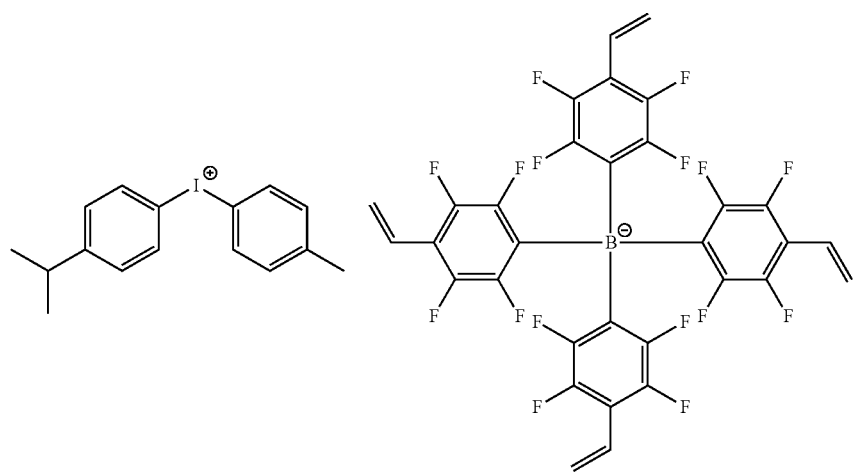

[Chemical Formula 1-1-2]
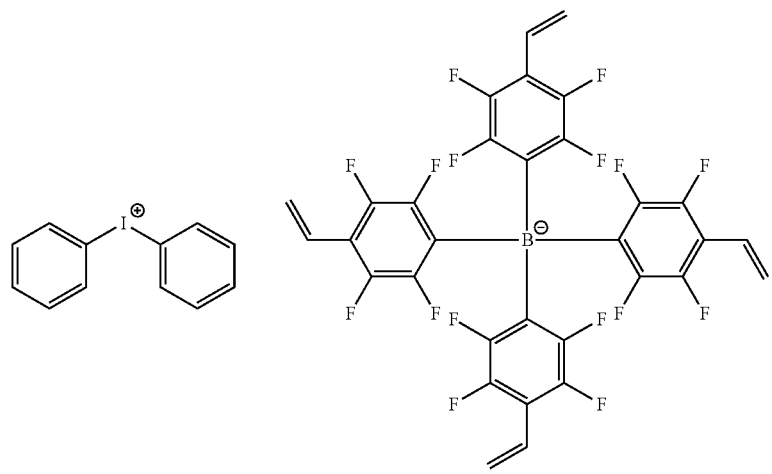
[Chemical Formula 1-1-3]
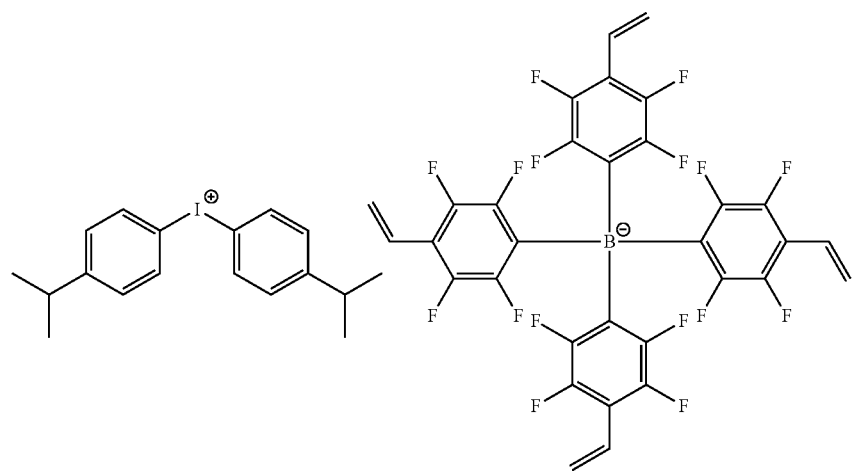
[Chemical Formula 1-1-4]
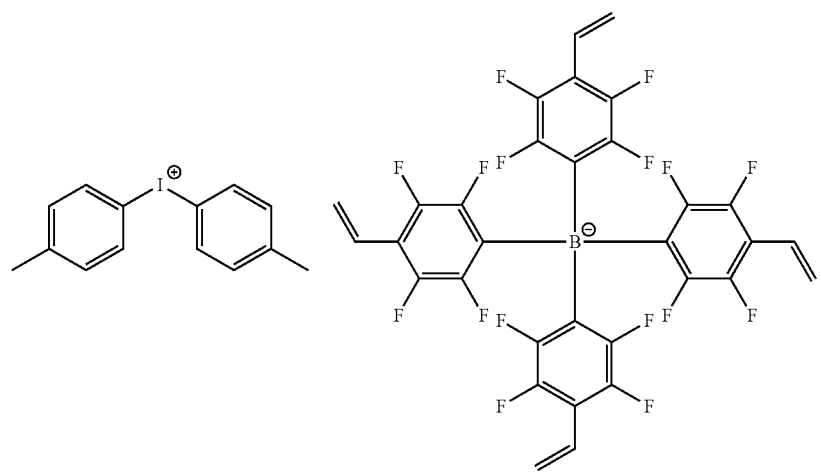

[Chemical Formula 1-1-5]
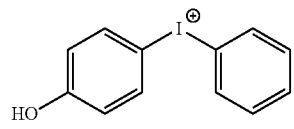 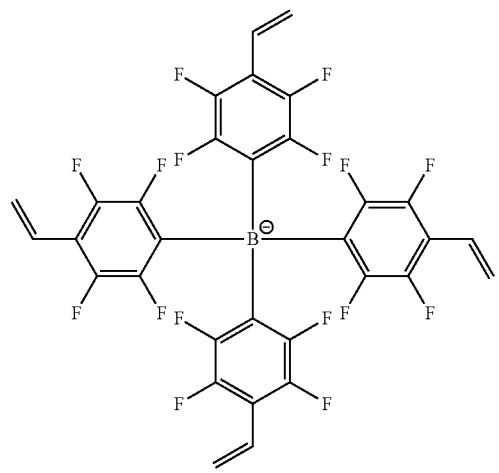
[Chemical Formula 1-1-6]
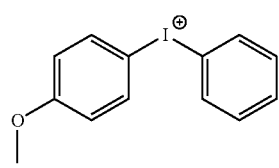 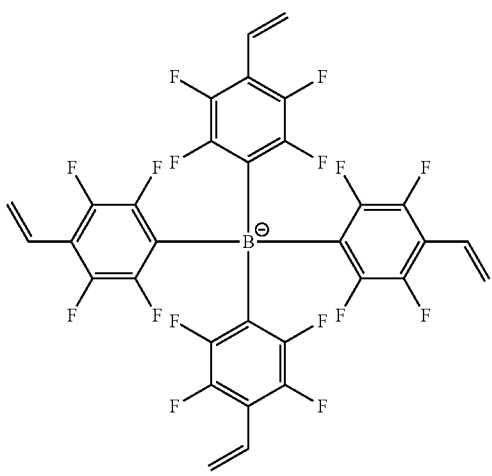
[Chemical Formula 1-1-7]
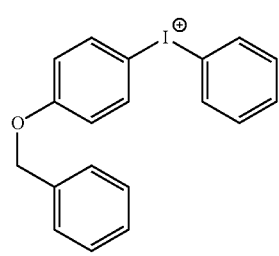 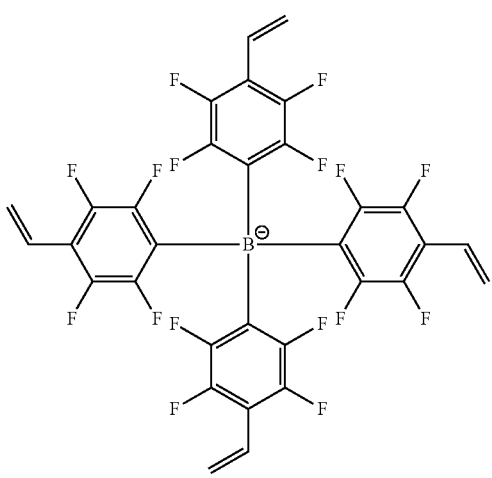

-continued
[Chemical Formula 1-1-8]
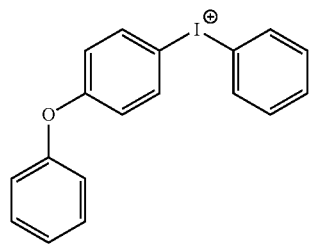 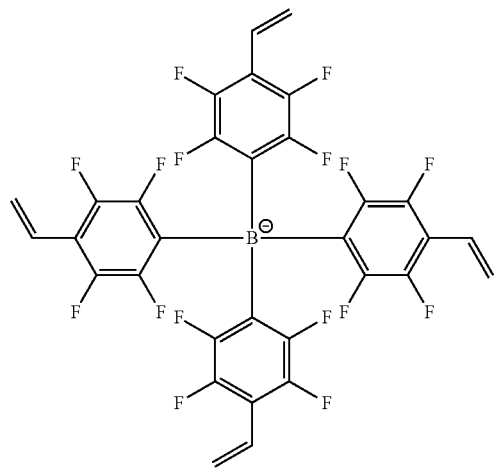
[Chemical Formula 1-1-9]
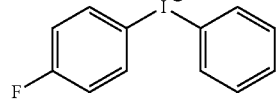 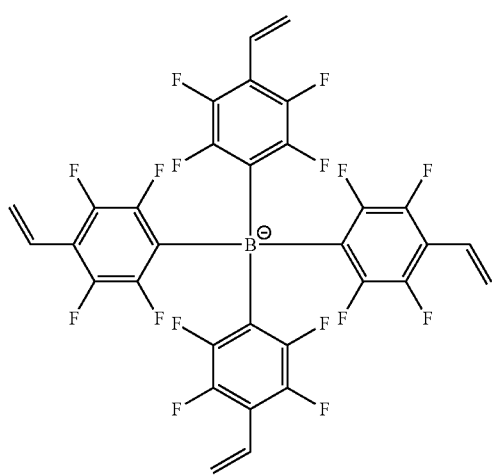
[Chemical Formula 1-1-10]
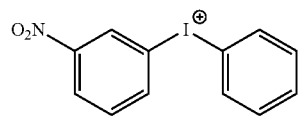 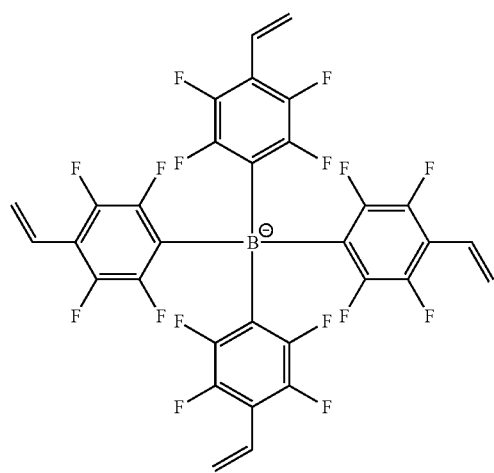

[Chemical Formula 1-1-11]
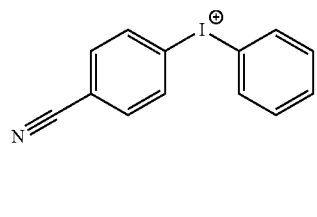
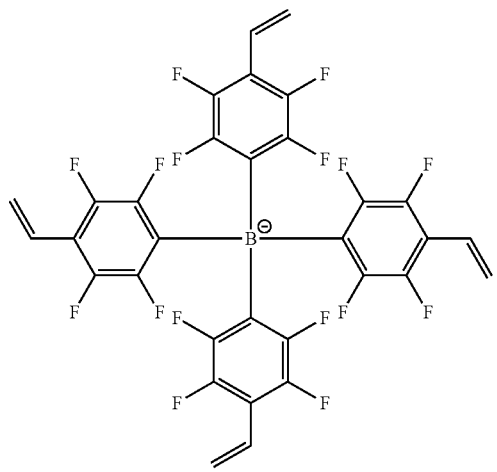
[Chemical Formula 1-1-12]
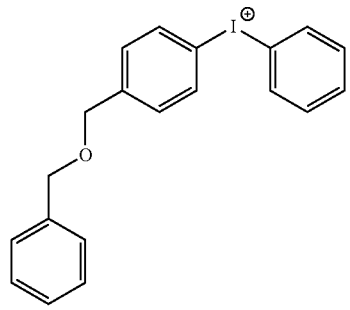
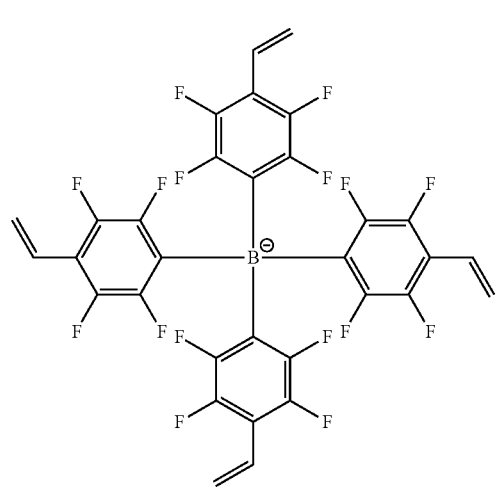
[Chemical Formula 1-1-13]
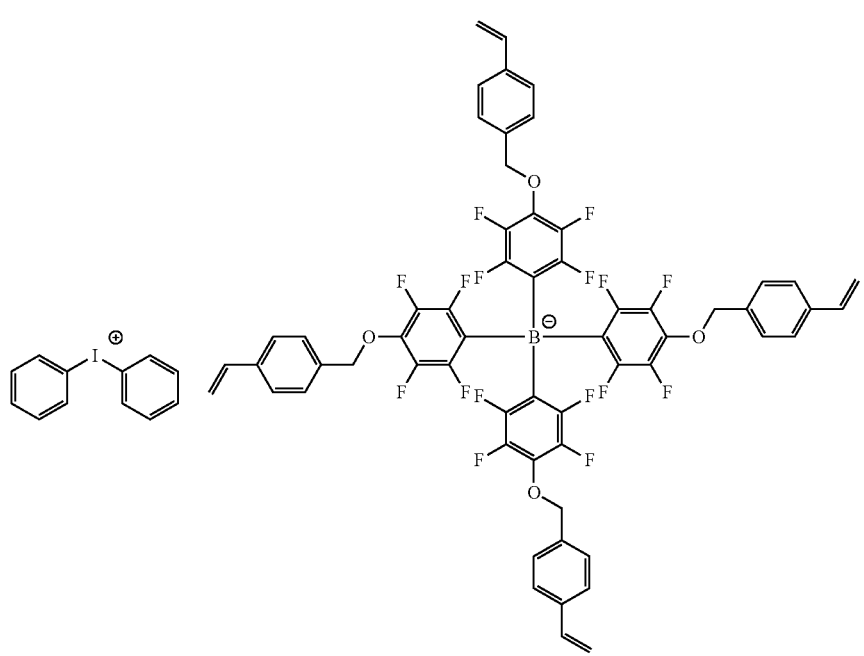

[Chemical Formula 1-1-14]
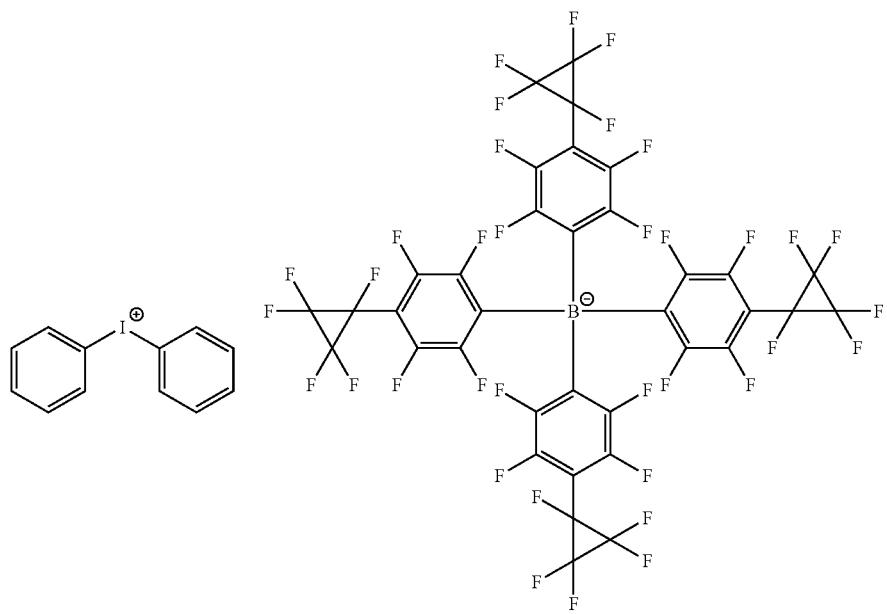
[Chemical Formula 1-1-15]
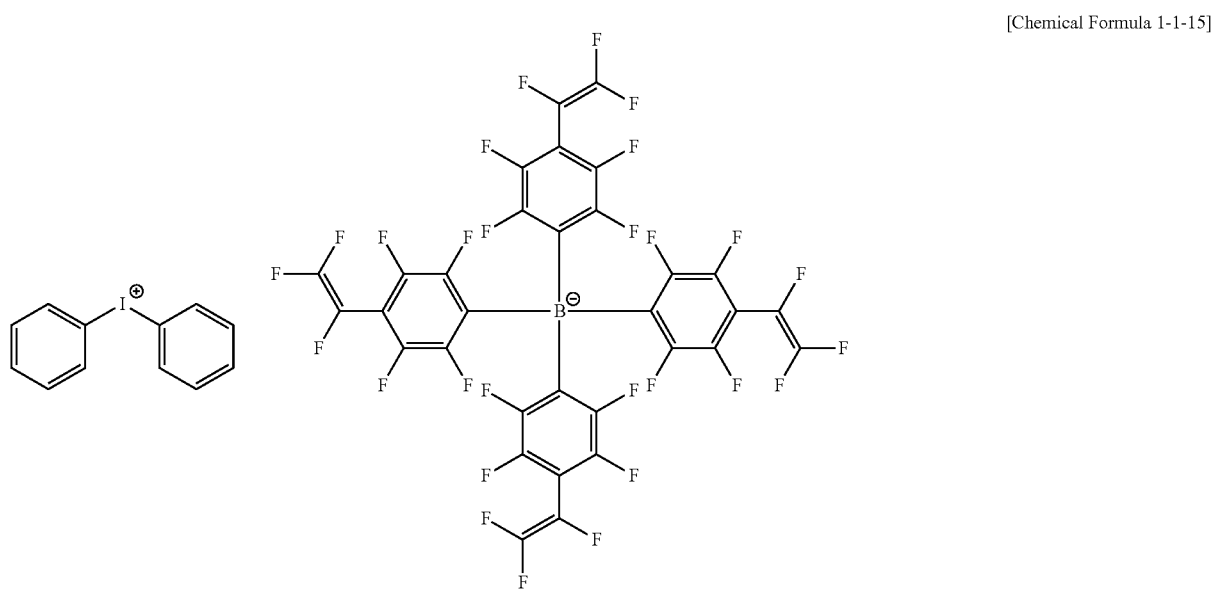
[Chemical Formula 1-1-16]
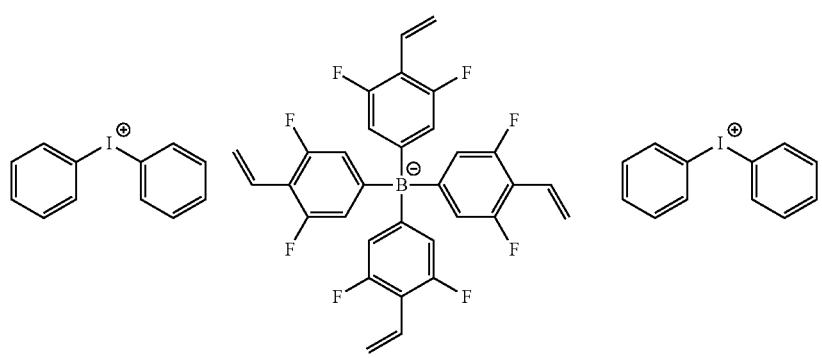
[Chemical Formula 1-1-17]
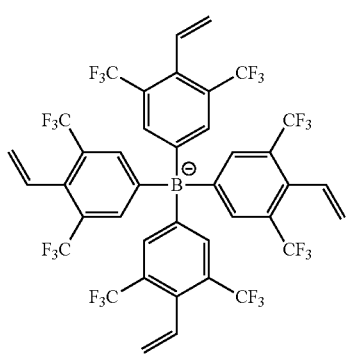

[Chemical Formula 1-1-18]
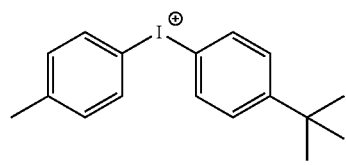
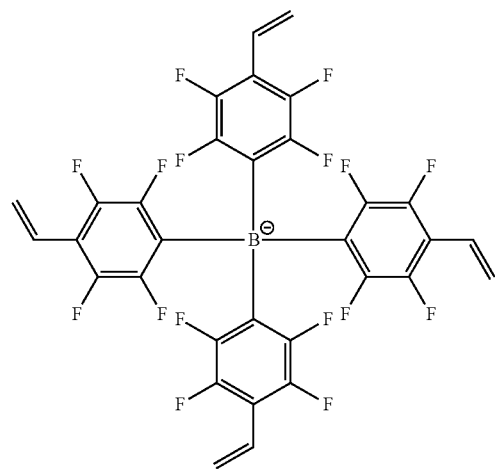
[Chemical Formula 1-1-19]
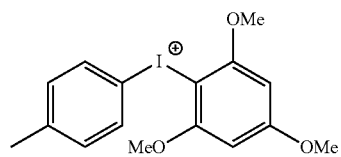
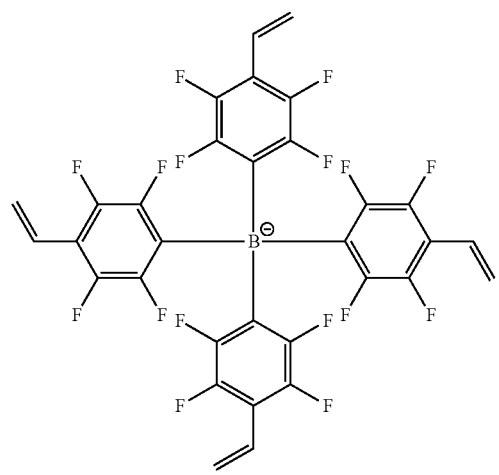
[Chemical Formula 1-1-20]
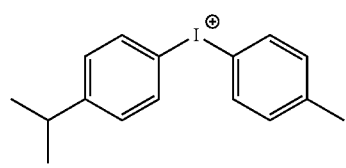
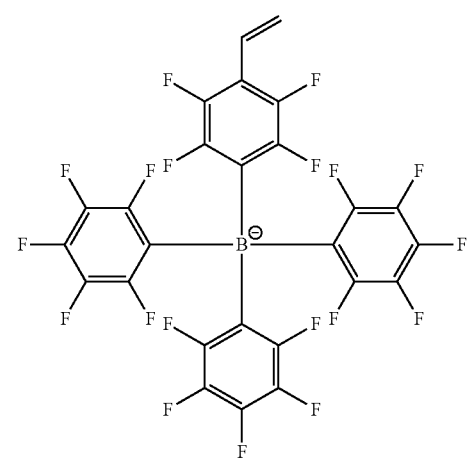

-continued
[Chemical Formula 1-2-1]
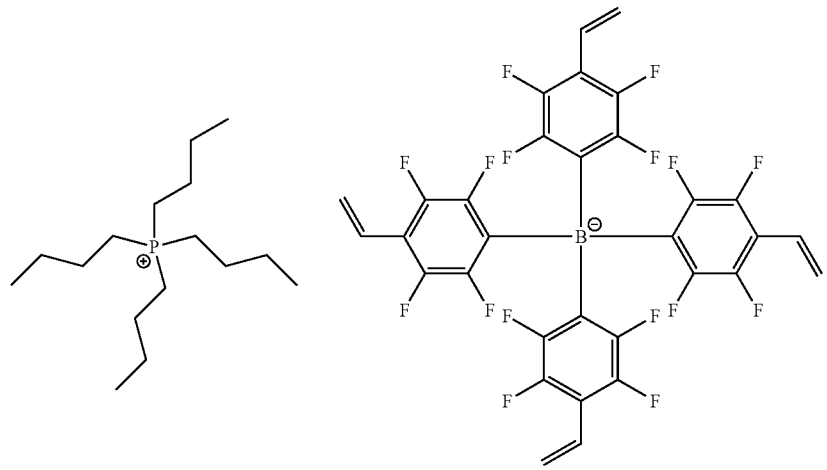
[Chemical Formula 1-2-3]
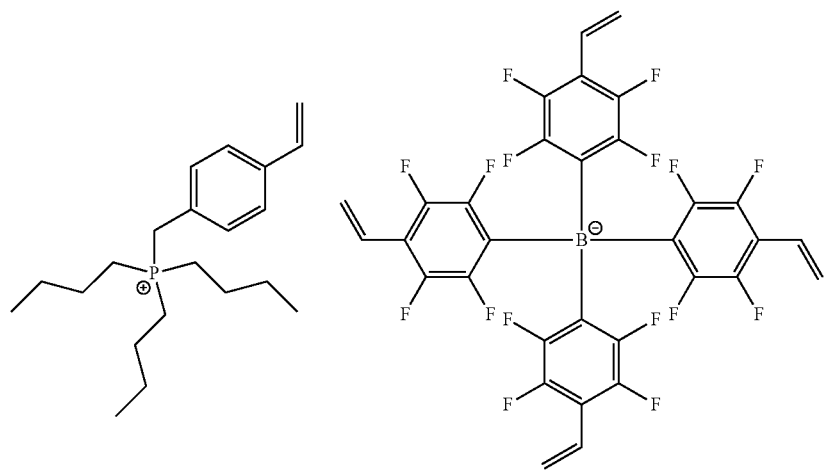
[Chemical Formula 1-2-4]     [Chemical Formula 1-2-5]
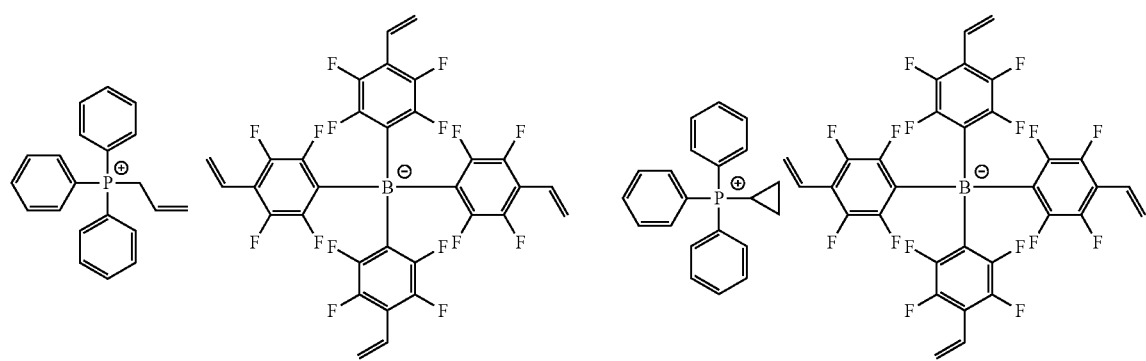

-continued
[Chemical Formula 1-3-1]
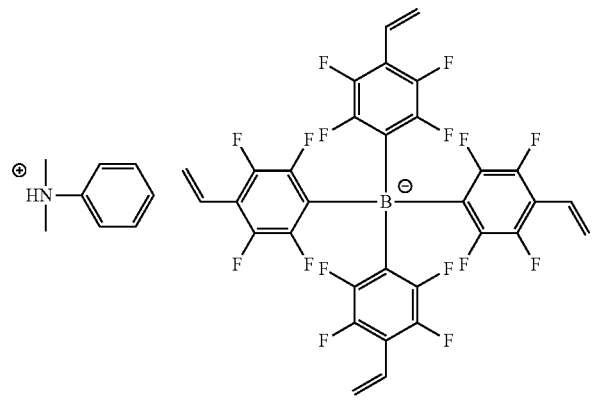
[Chemical Formula 1-3-2]
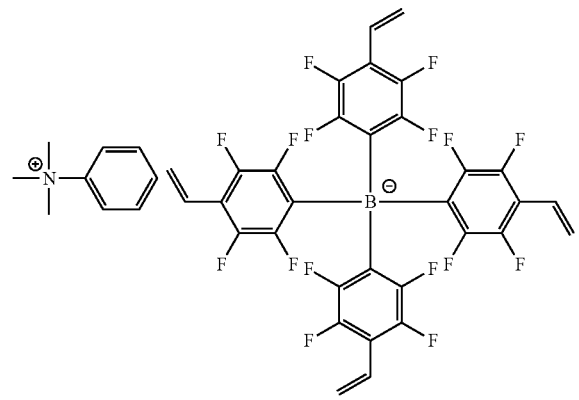
[Chemical Formula 1-3-3]
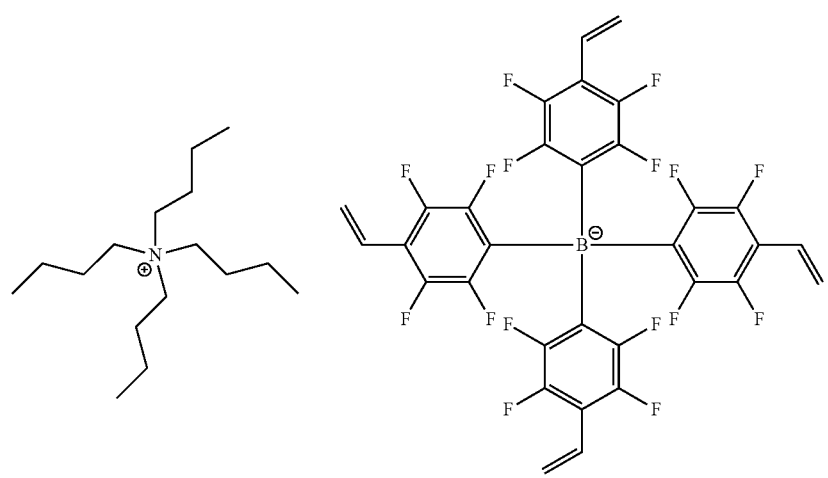
[Chemical Formula 1-3-4]
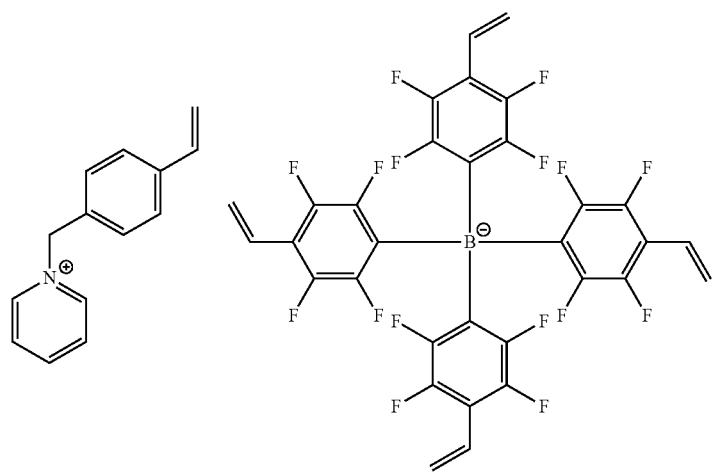

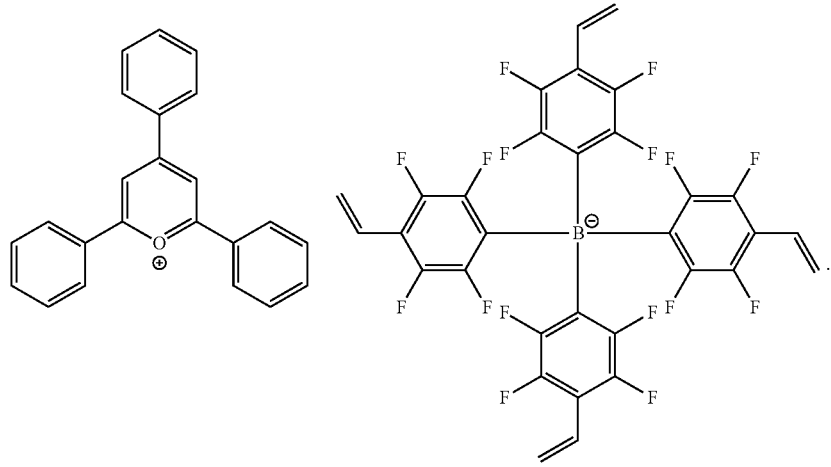

[Chemical Formula 1-4-1]

Preferably, the Chemical Formula 4 may be represented by any one of the following Chemical Formulas 4-1 to 4-4:

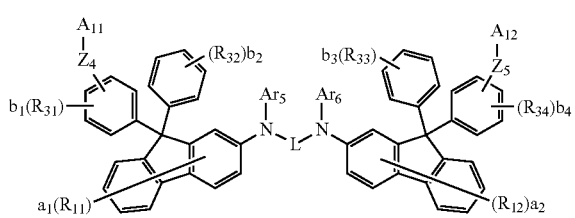

[Chemical Formula 4-1]

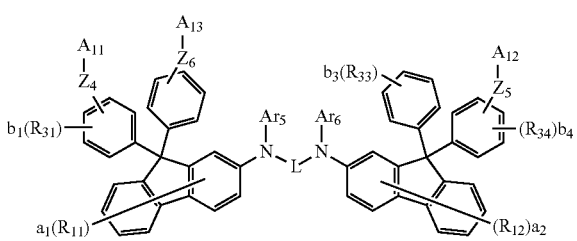

[Chemical Formula 4-2]

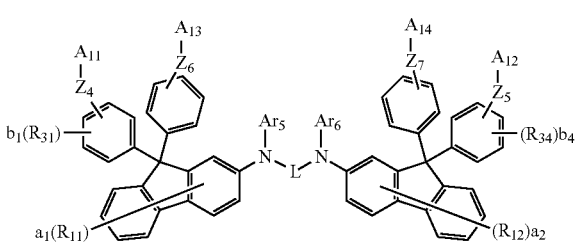

[Chemical Formula 4-3]

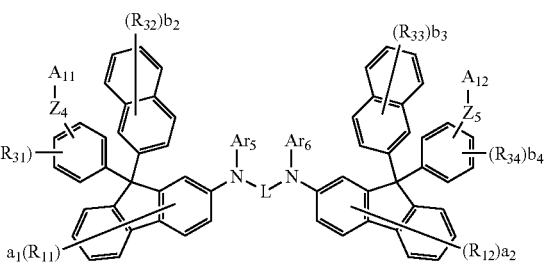

[Chemical Formula 4-4]

in Chemical Formulas 4-1 to 4-4, $a_1$, $a_2$, $R_{11}$, $R_{12}$, L, $Ar_5$ and $Ar_6$ are as defined in Chemical Formula 4, $Z_4$ to $Z_7$ are each independently O or S, $A_{11}$ to $A_{14}$ are each independently a photocurable/thermosetting functional group, $R_{31}$ to $R_{34}$ are each independently hydrogen; deuterium; a halogen group; a substituted or unsubstituted alkyl group; a substituted or unsubstituted alkoxy group; a substituted or unsubstituted aryloxy group; a substituted or unsubstituted aryl group; or a substituted or unsubstituted heteroaryl group, and $b_1$ to $b_4$ are each independently an integer of 0 to 4.

Preferably, L may be a substituted or unsubstituted phenylene; a substituted or unsubstituted biphenyldiyl; a substituted or unsubstituted terphenyldiyl; or a substituted or unsubstituted quarterphenyldiyl.

Preferably, the compound represented by Chemical Formula 4 may be selected from the group consisting of the following formulas:

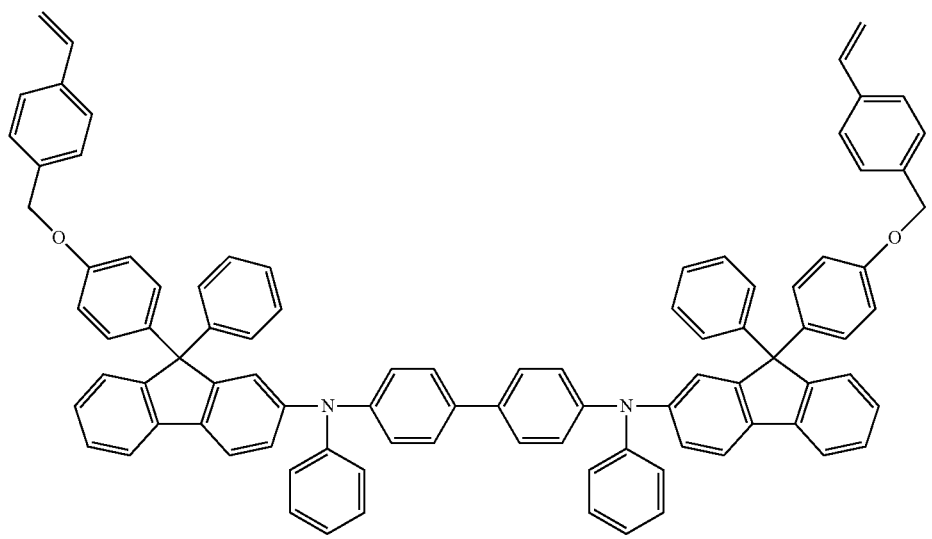
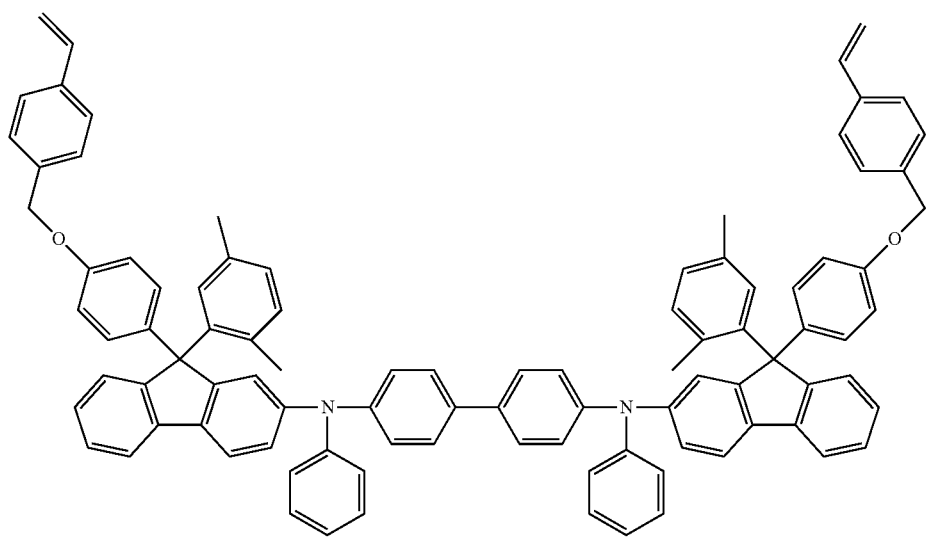
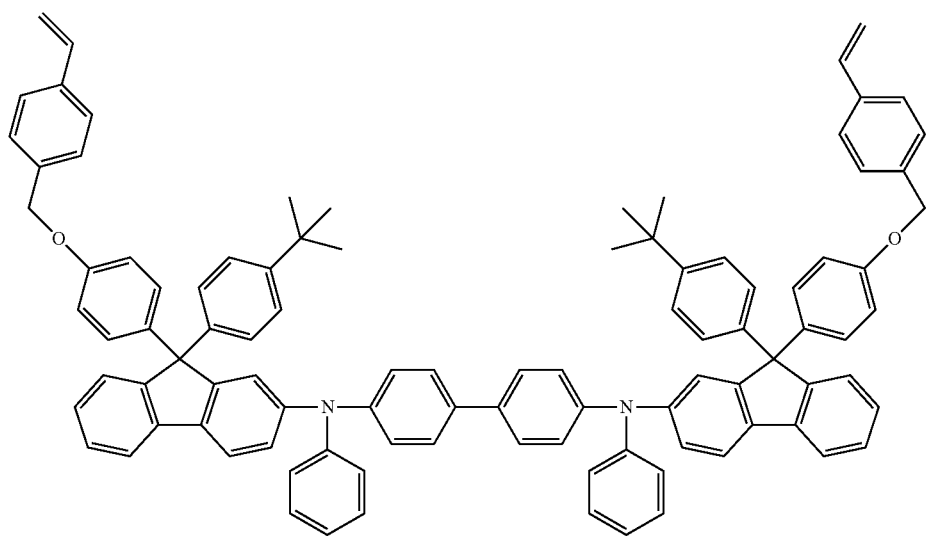

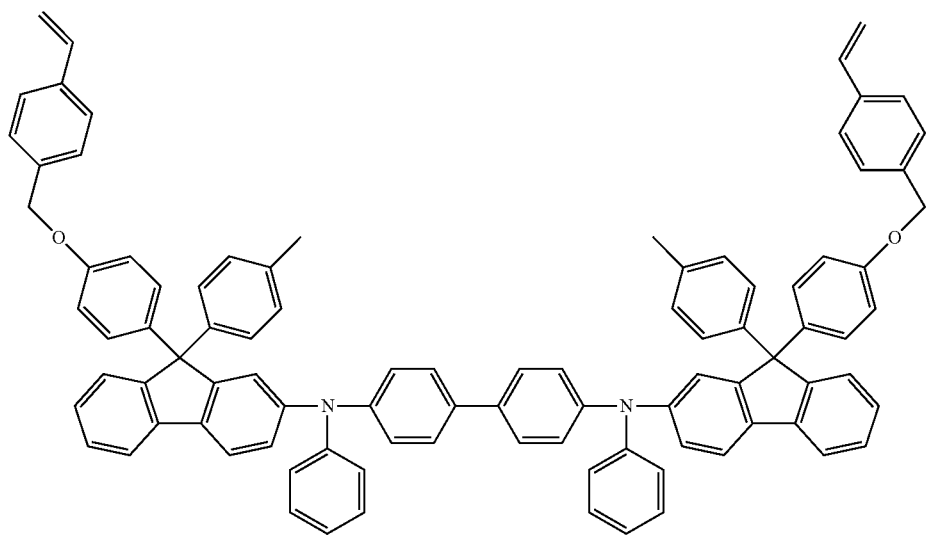
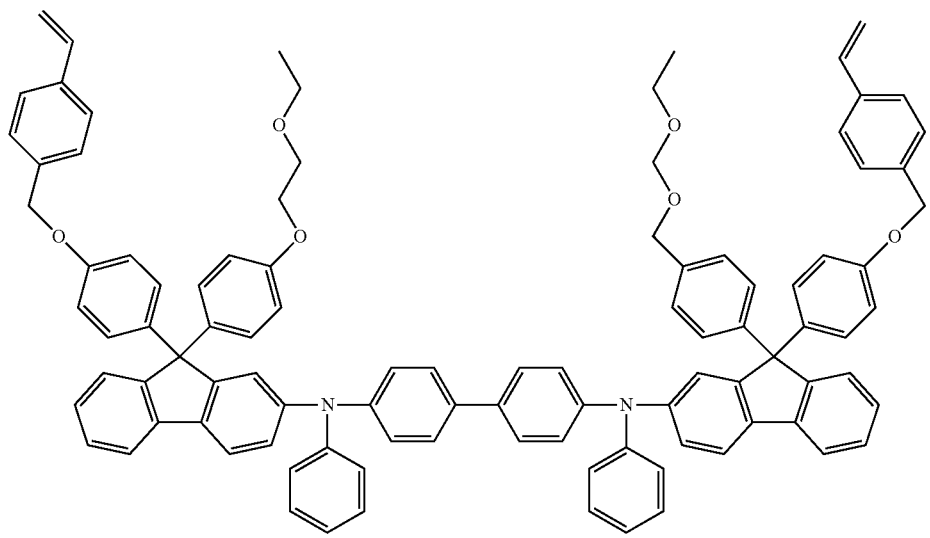
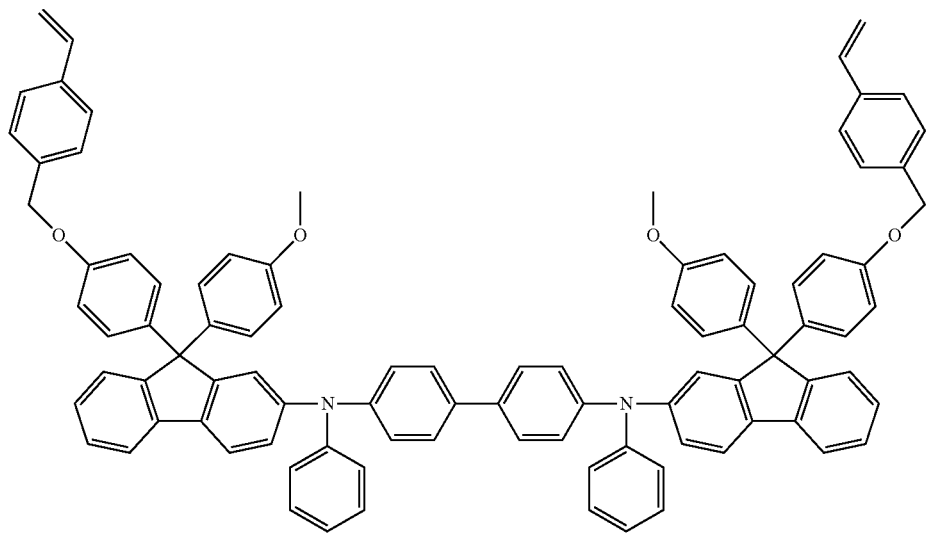

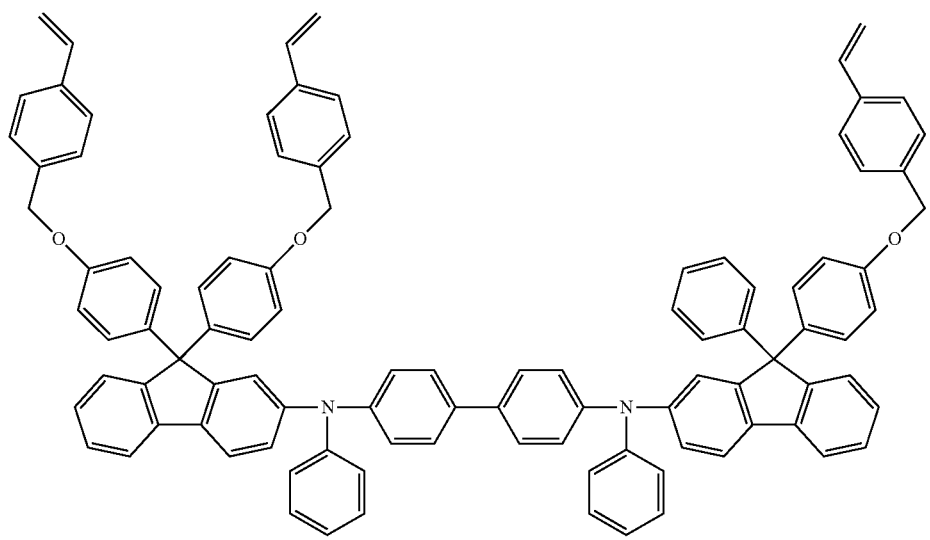
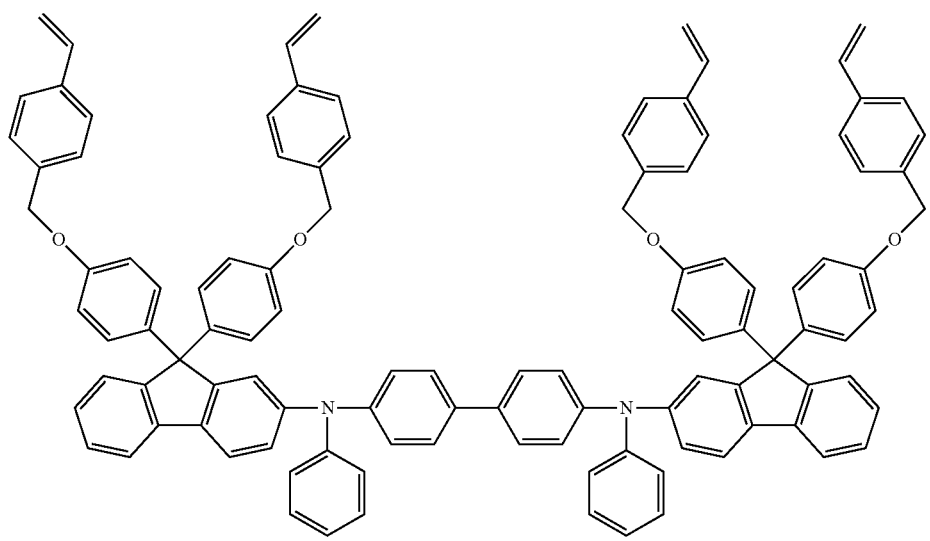
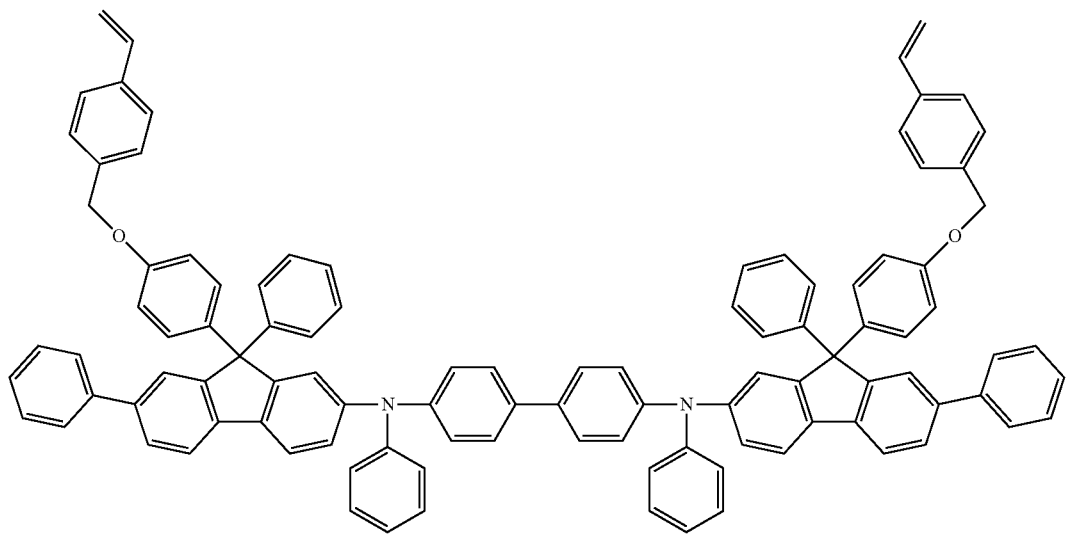

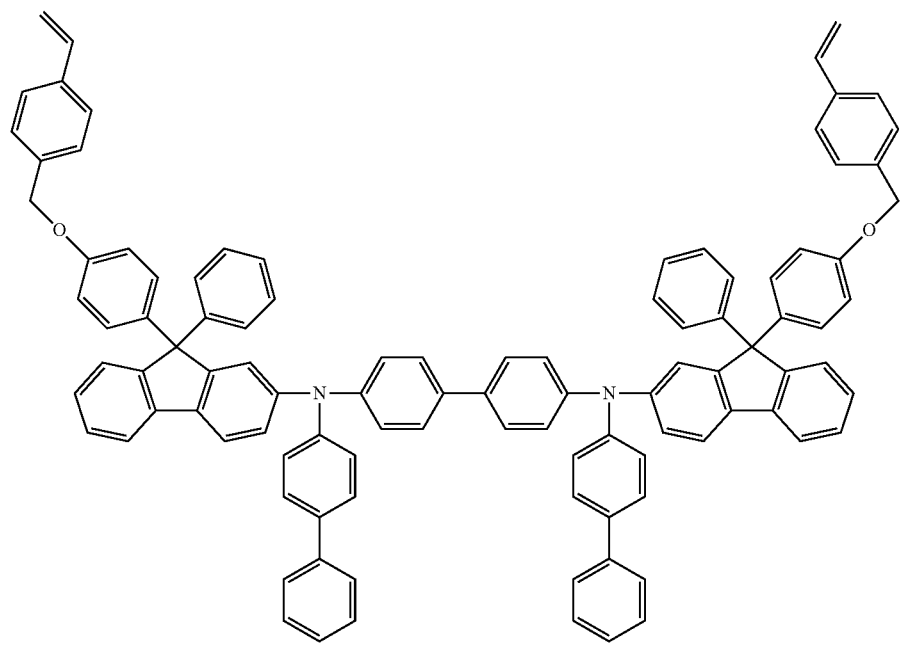
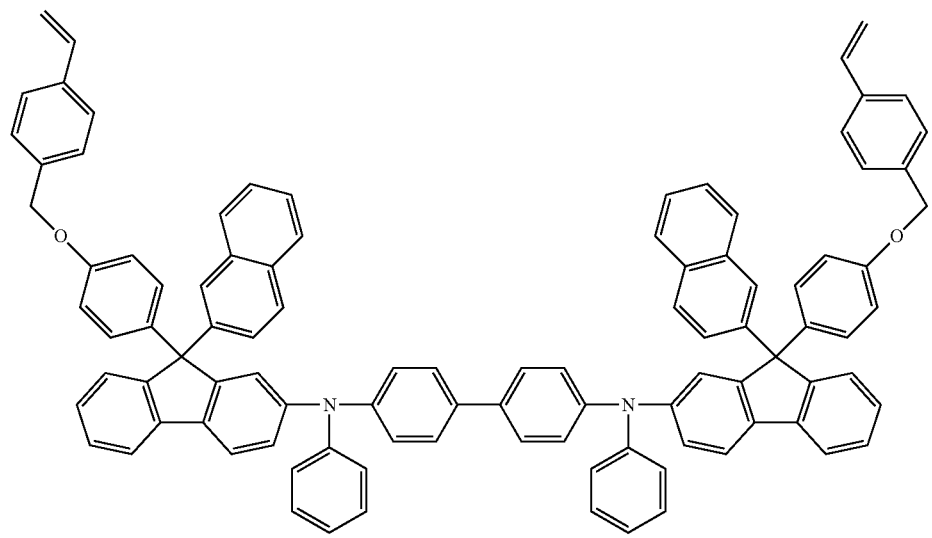
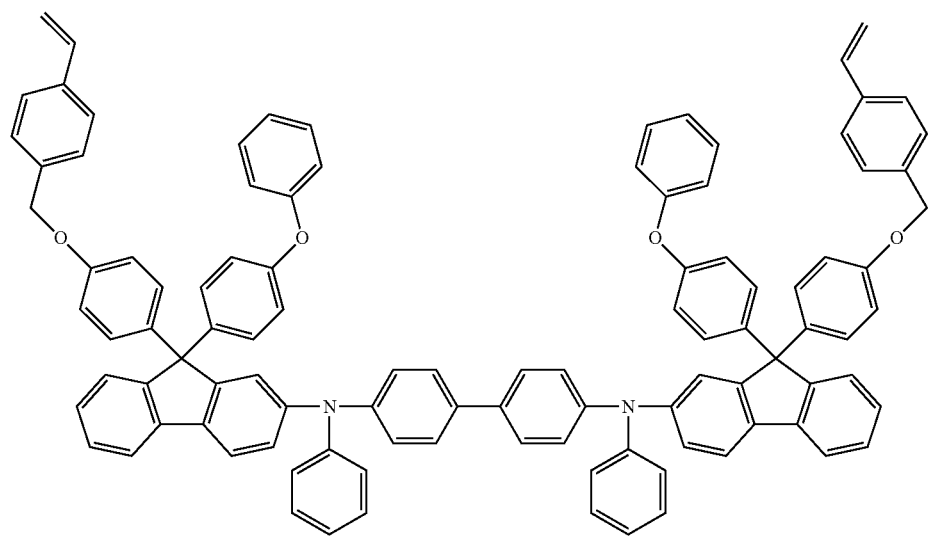

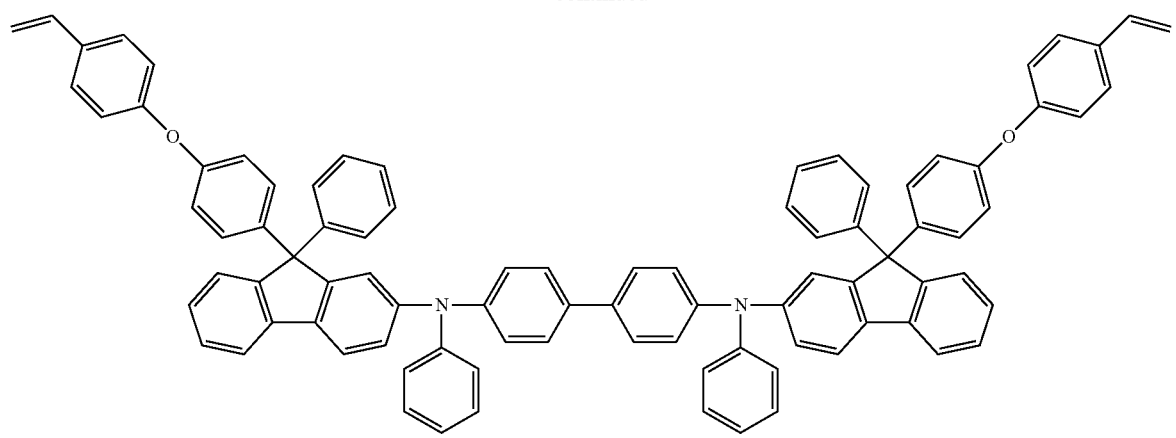
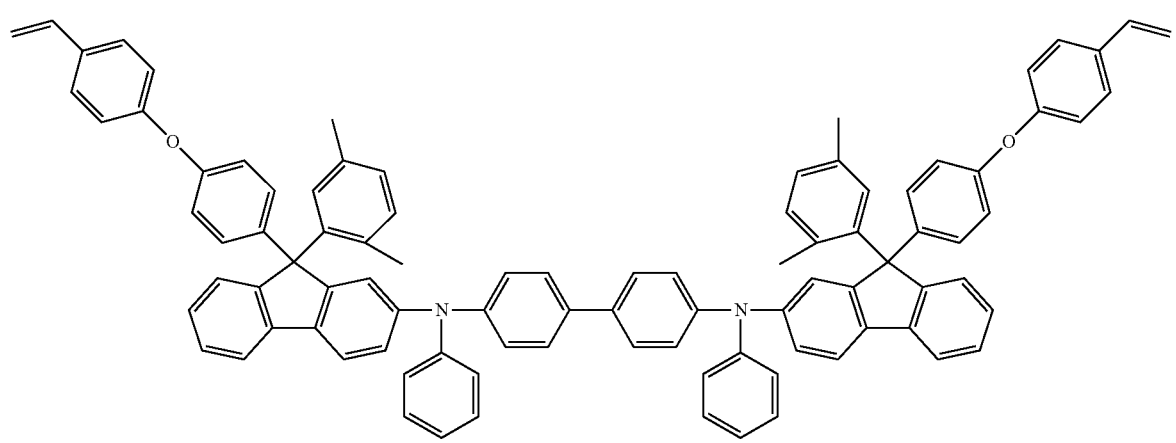
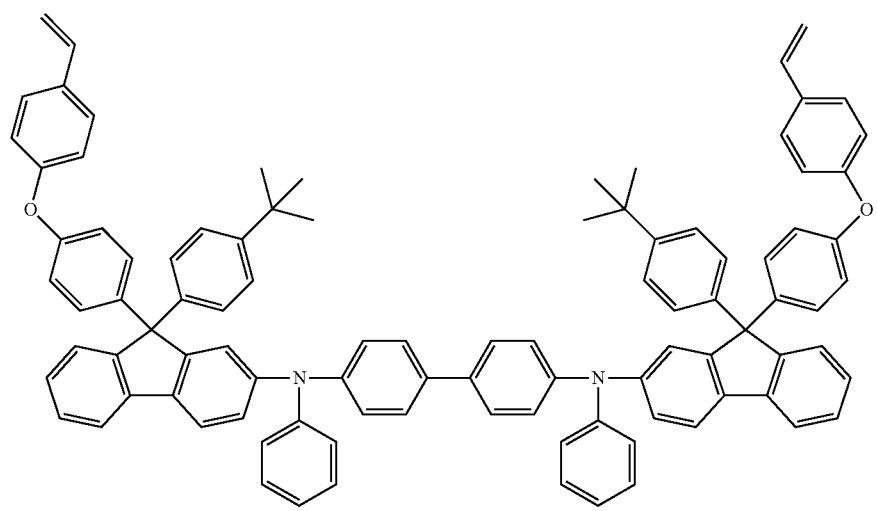

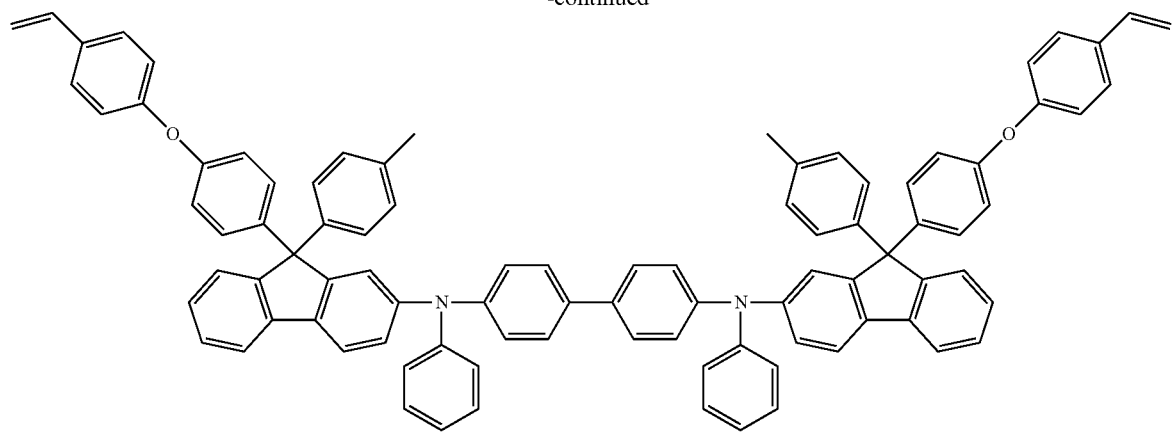
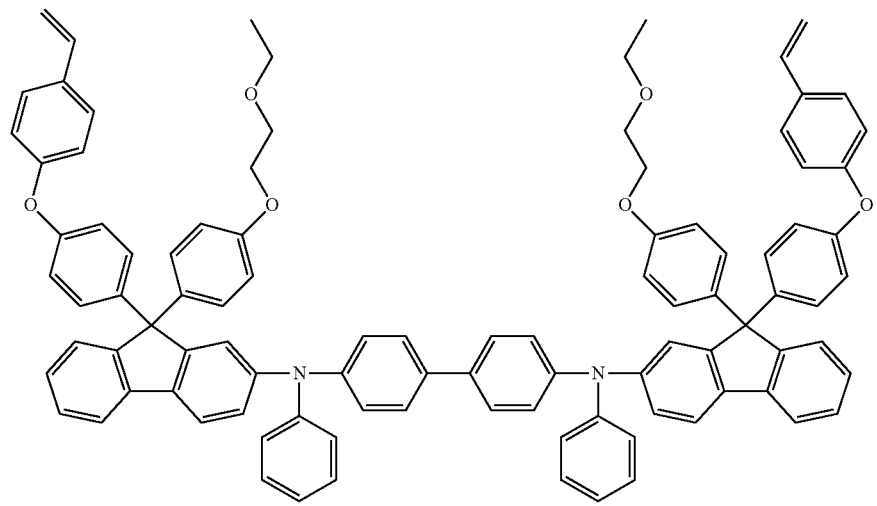
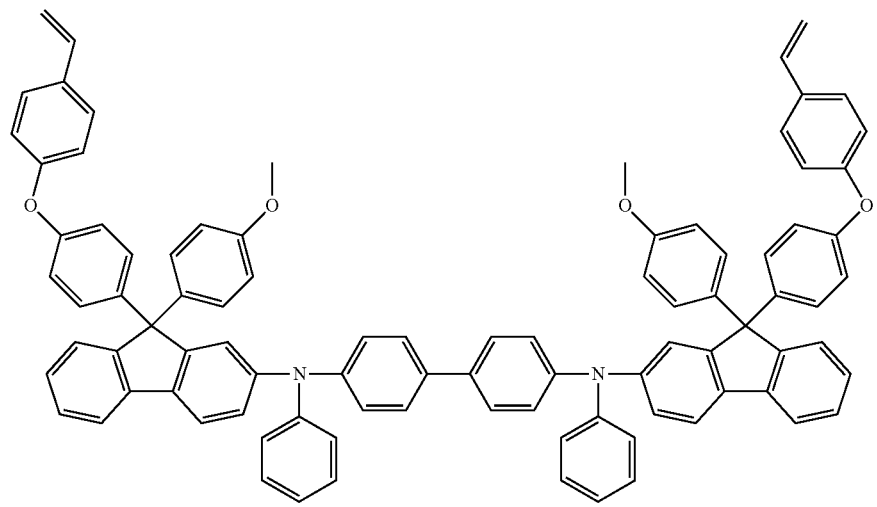

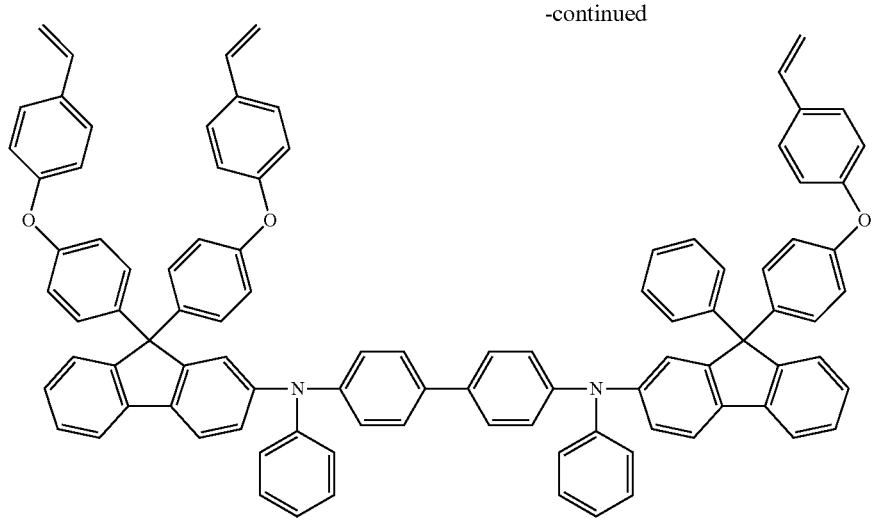
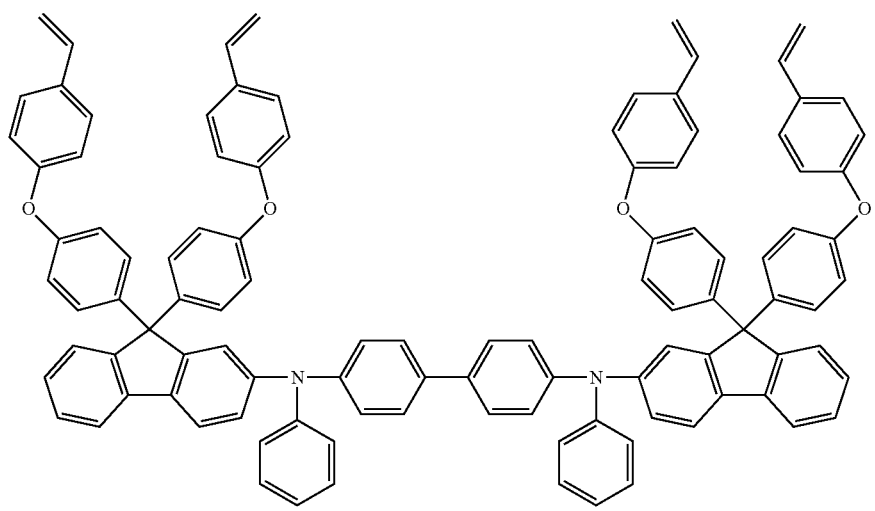
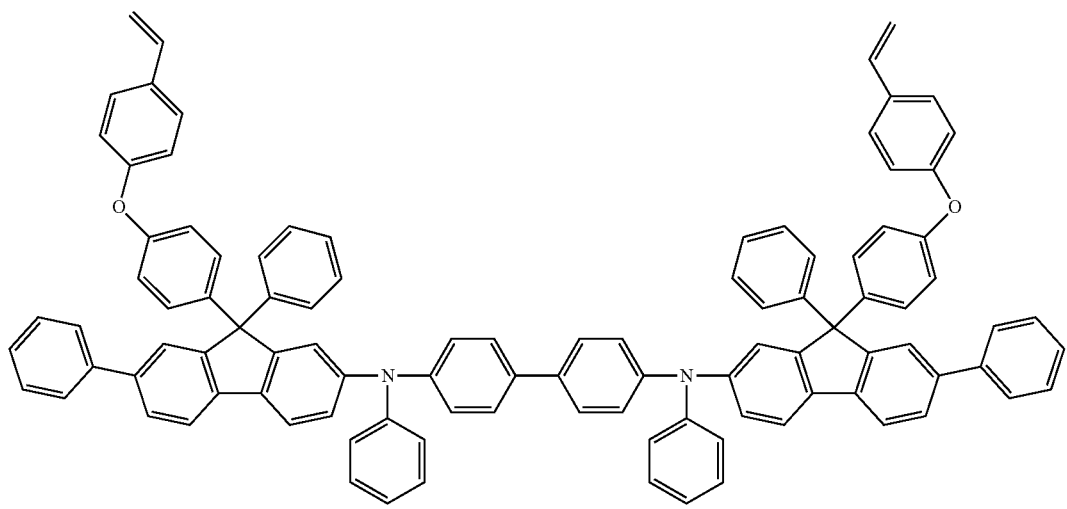

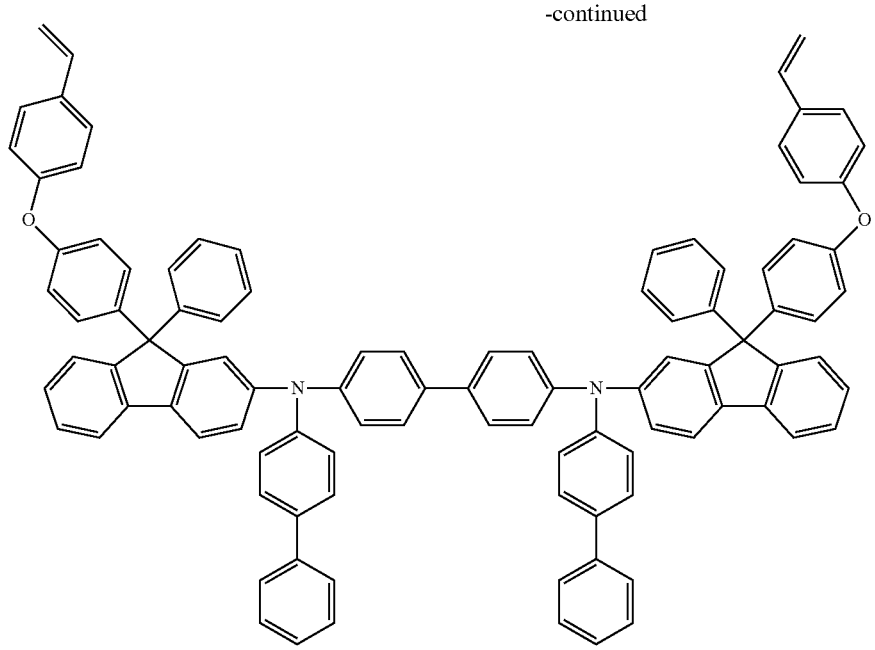
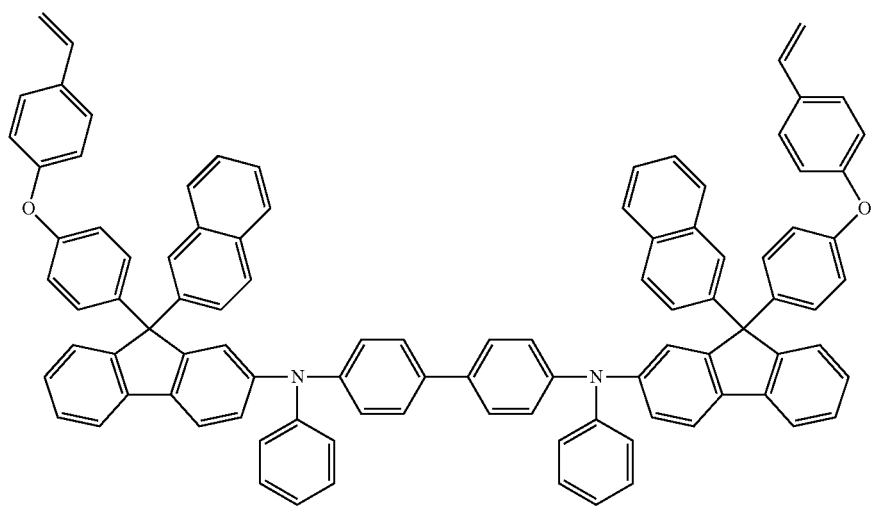
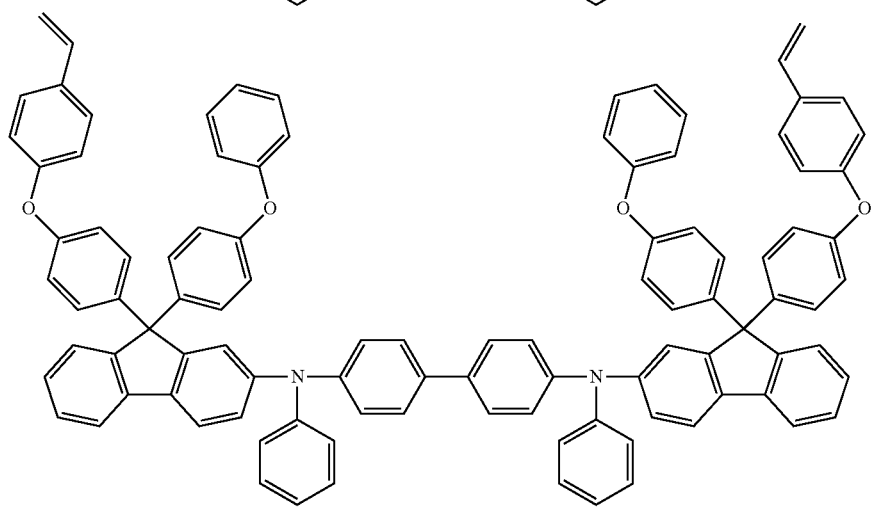

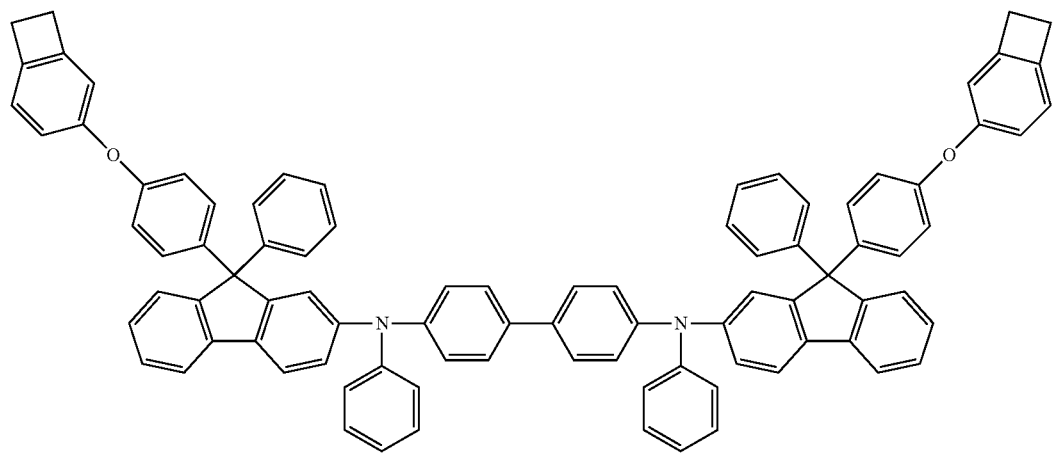
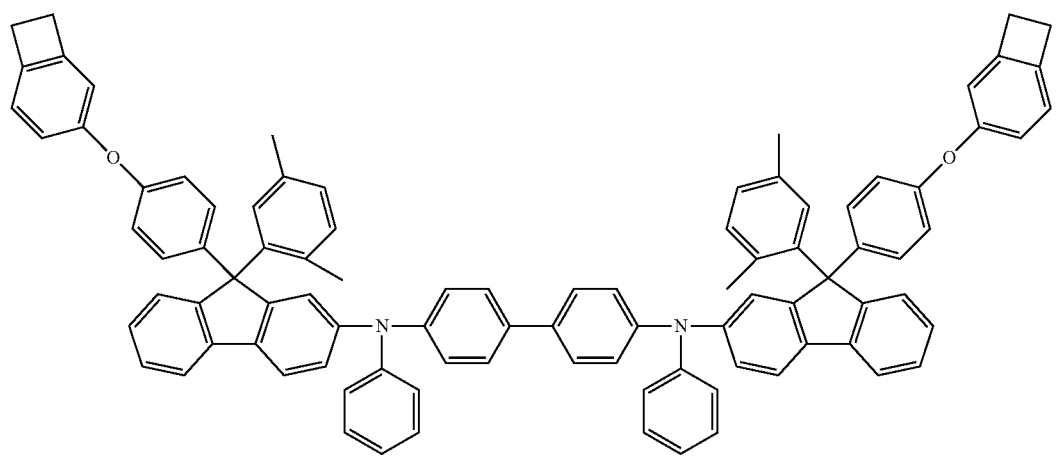
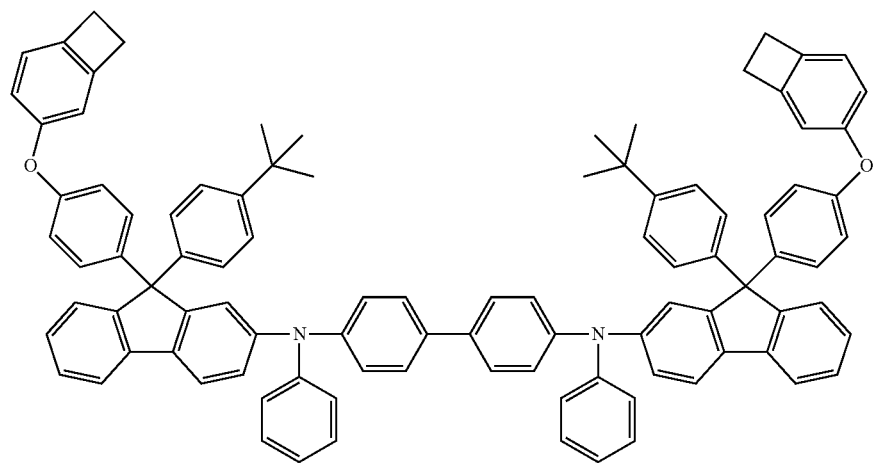

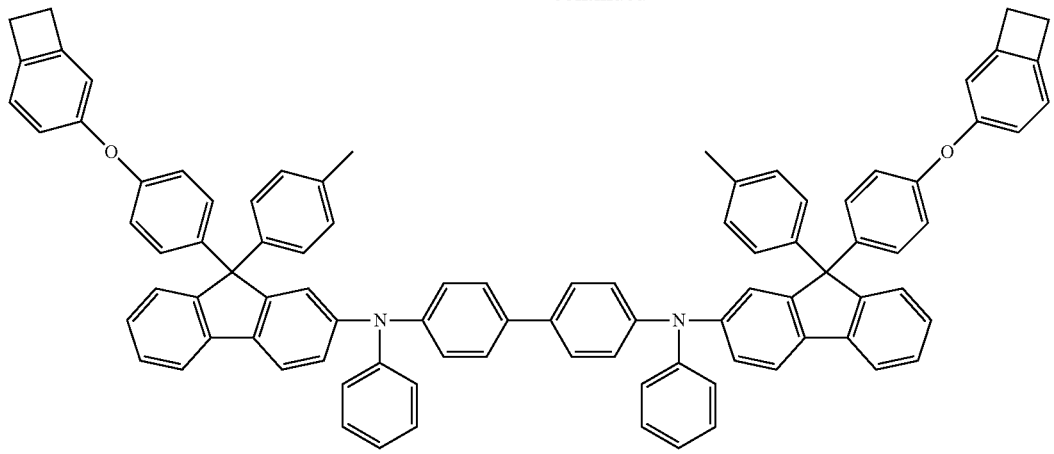

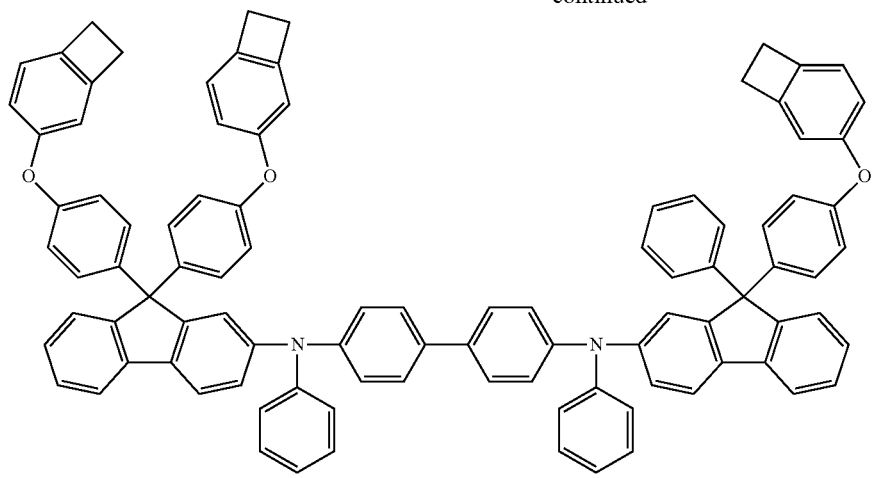
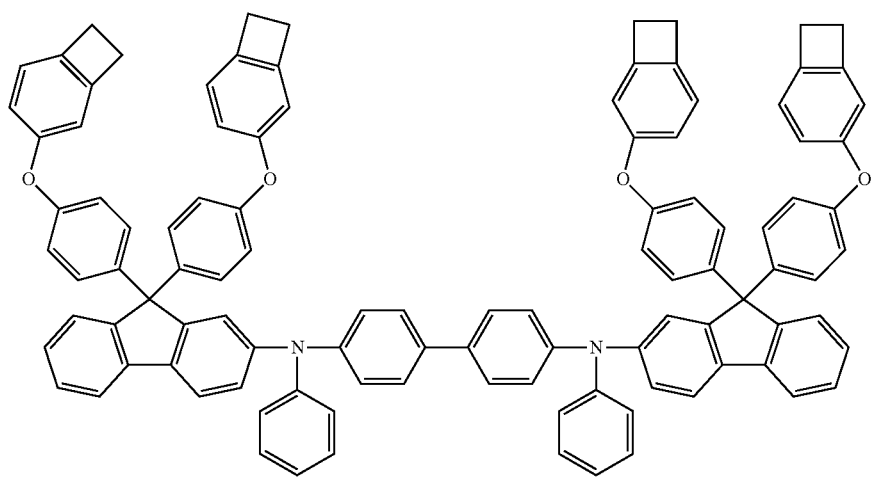
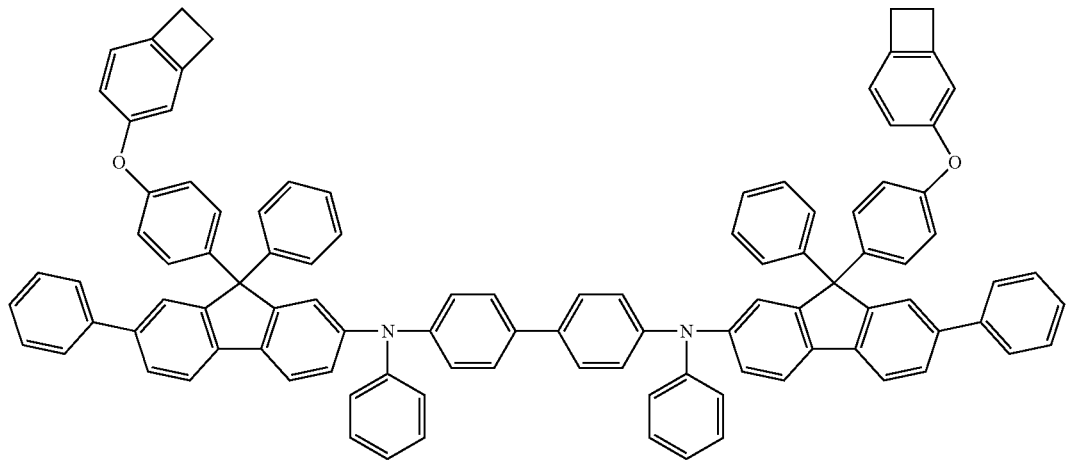

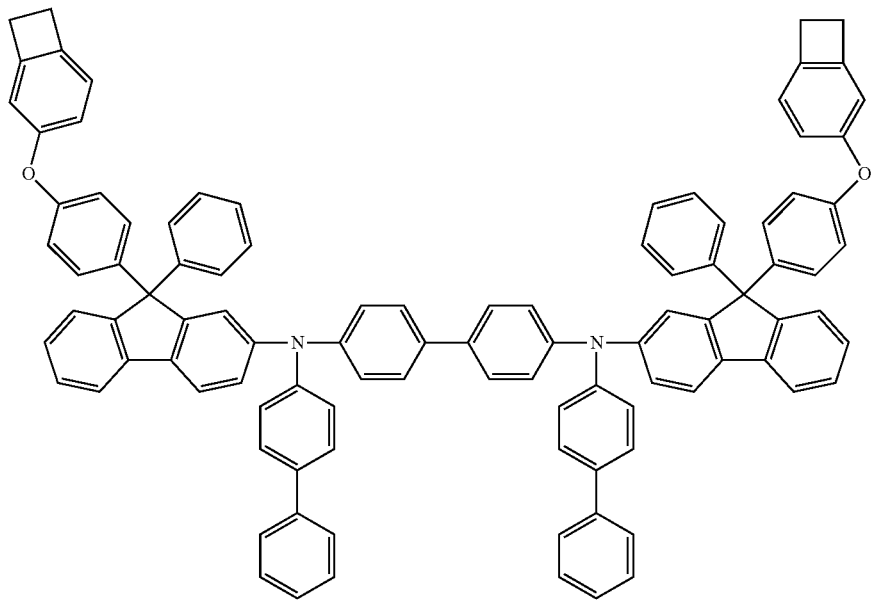
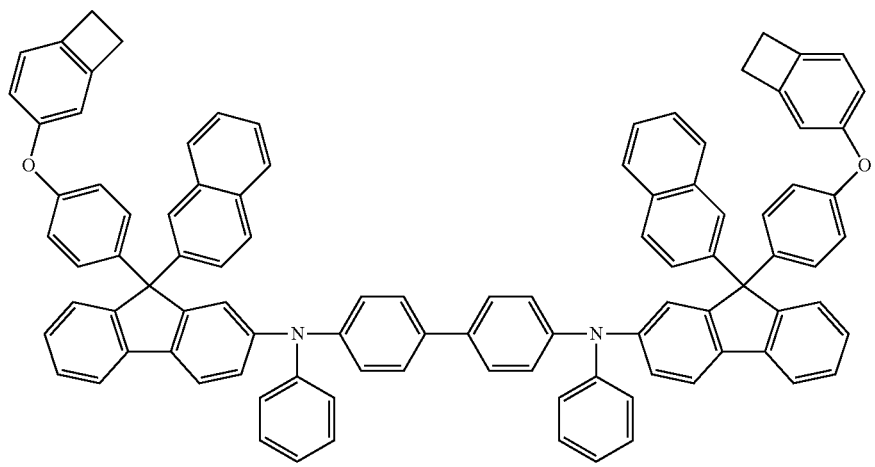
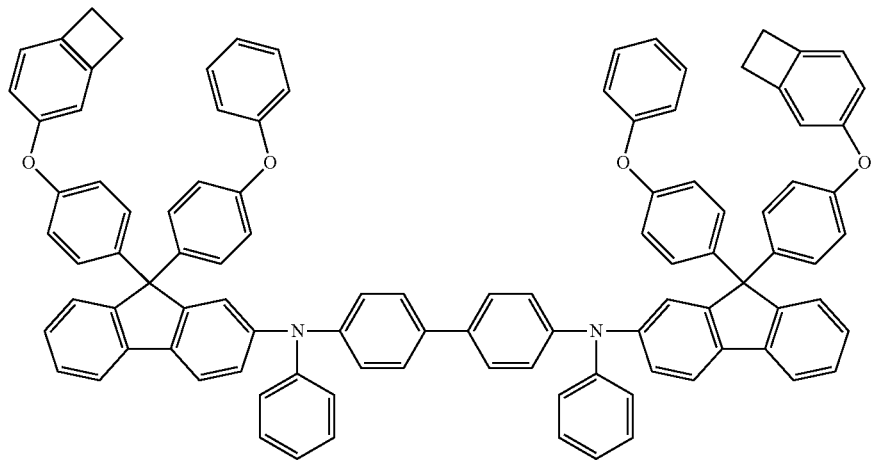

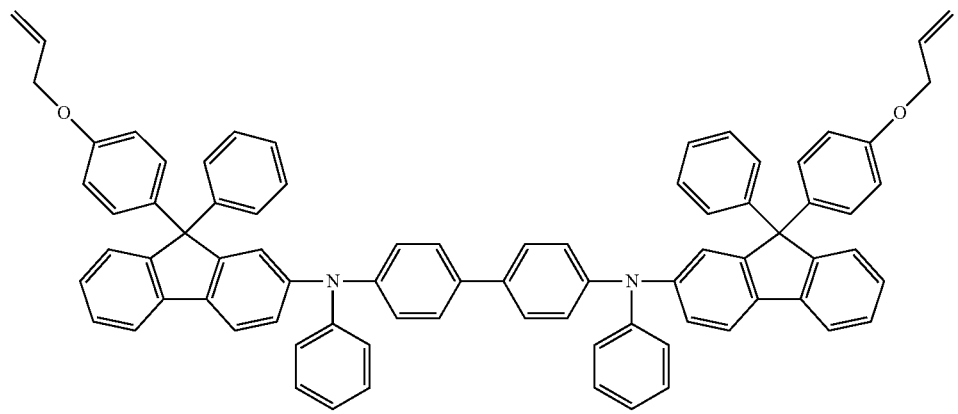
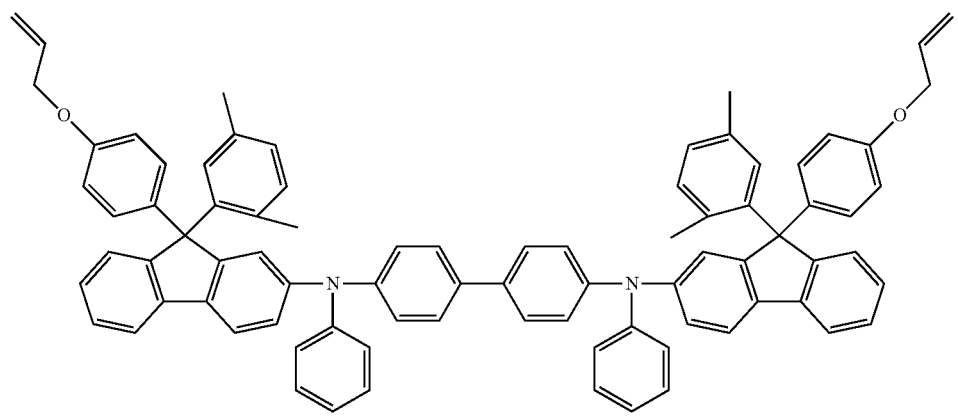
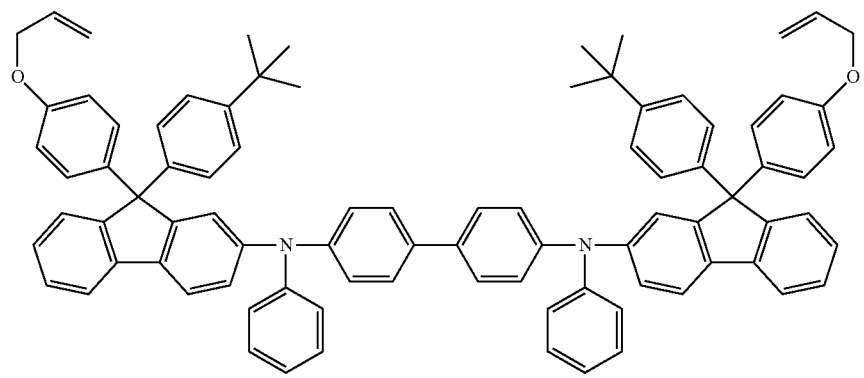
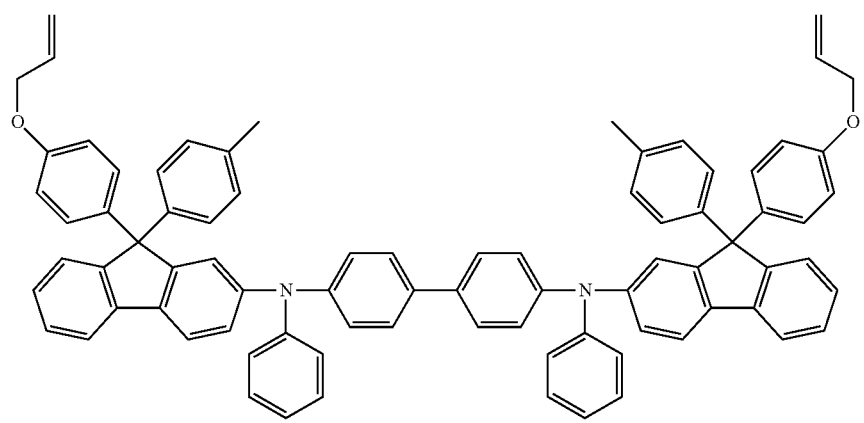

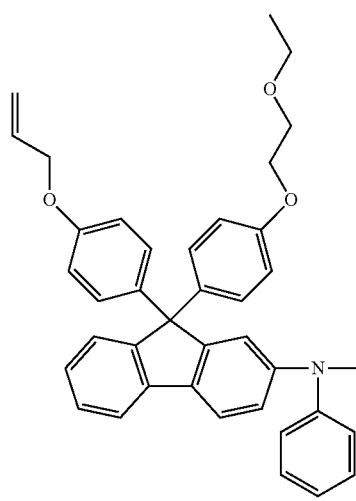
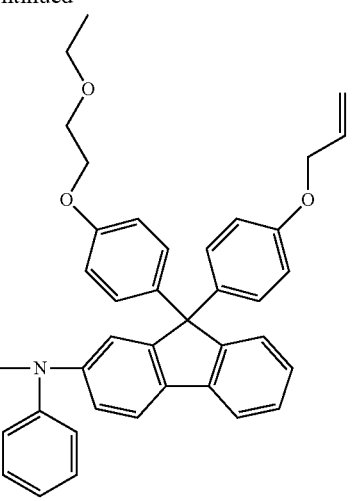
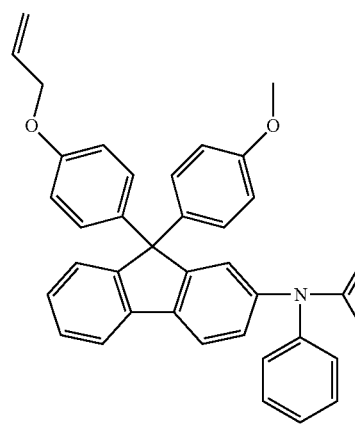
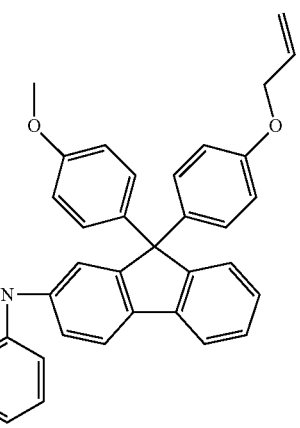
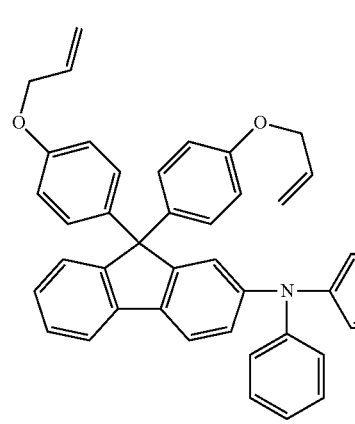
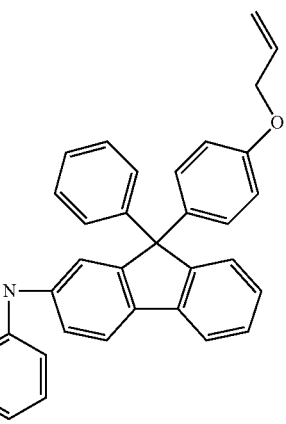

-continued
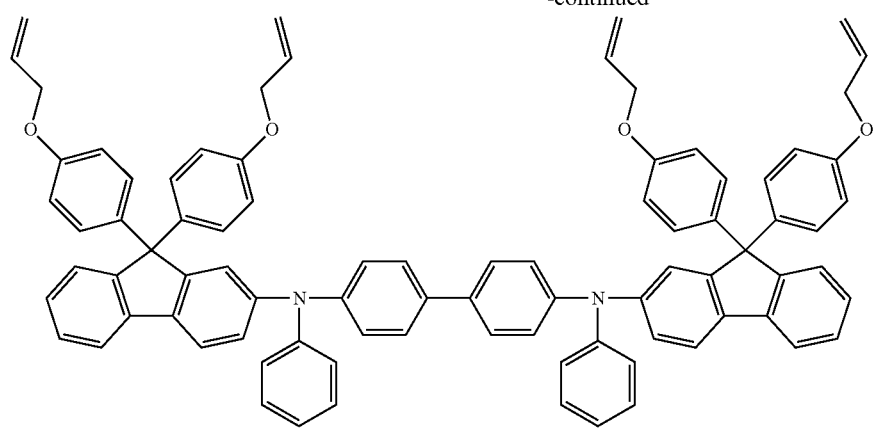
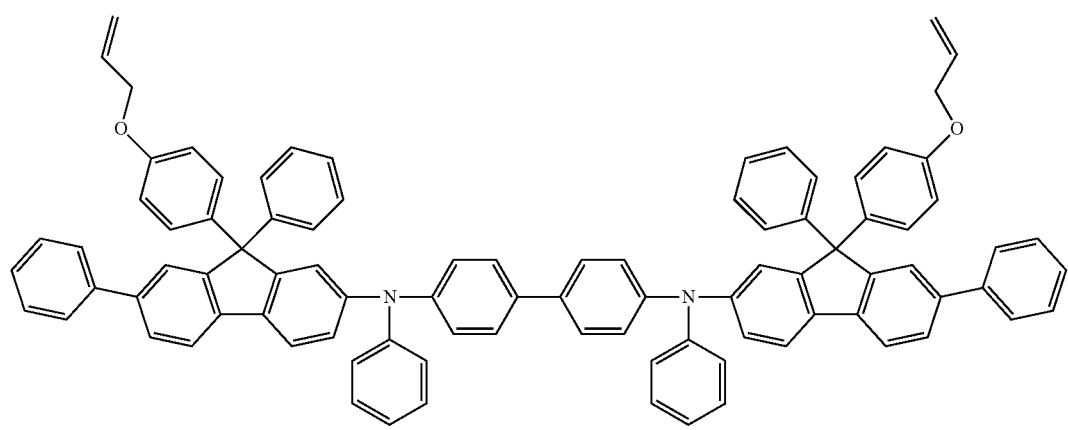
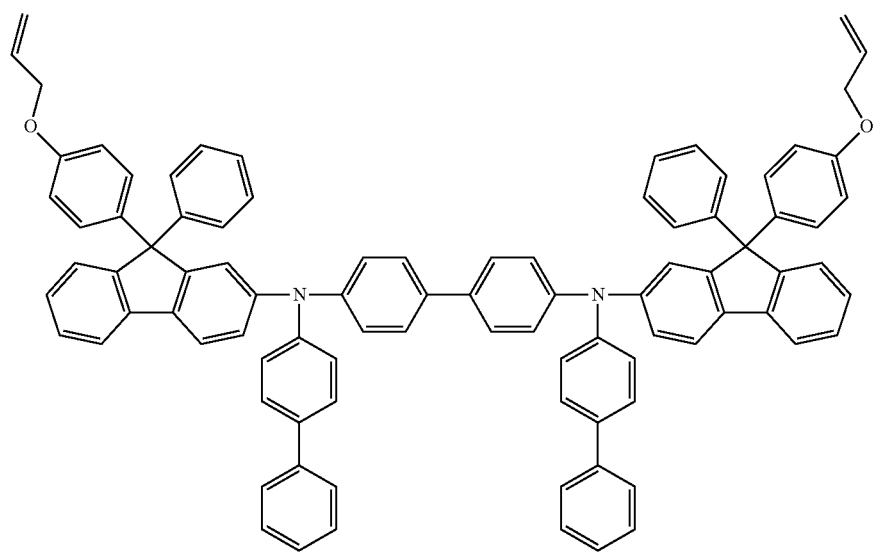

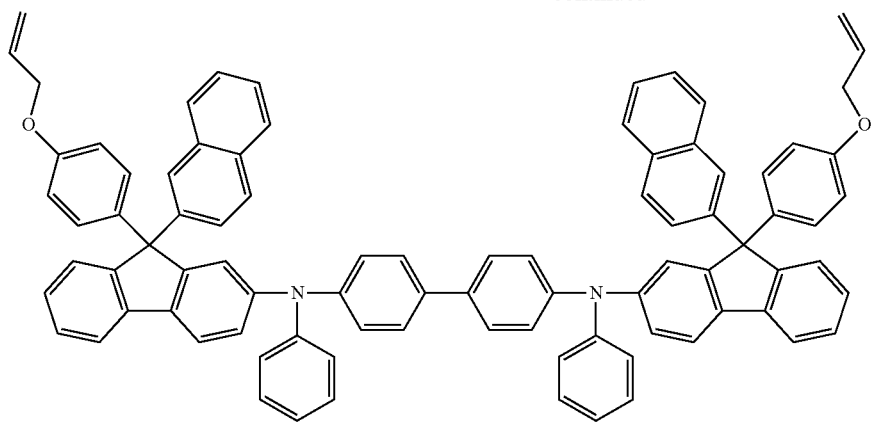
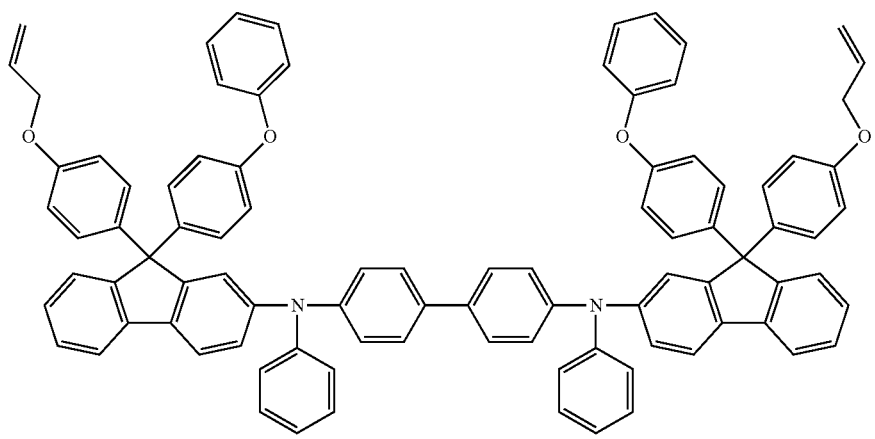
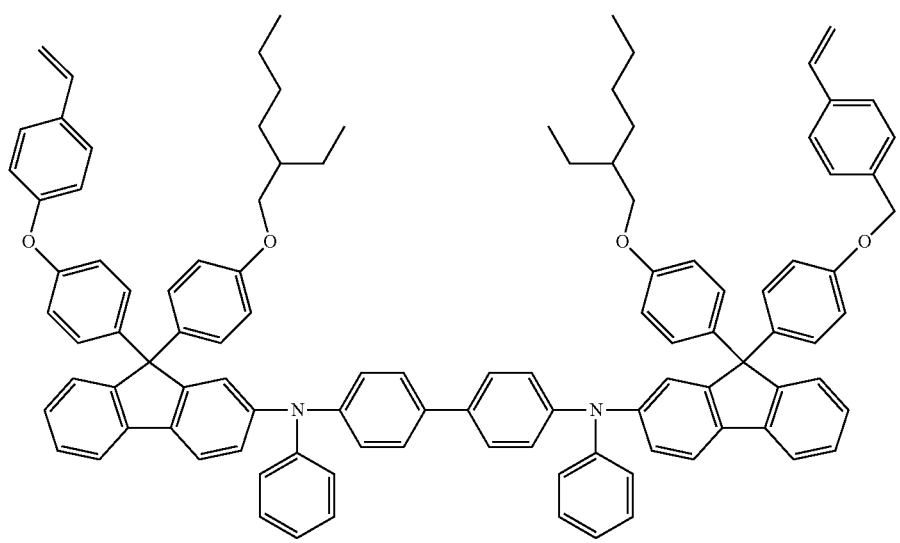

-continued
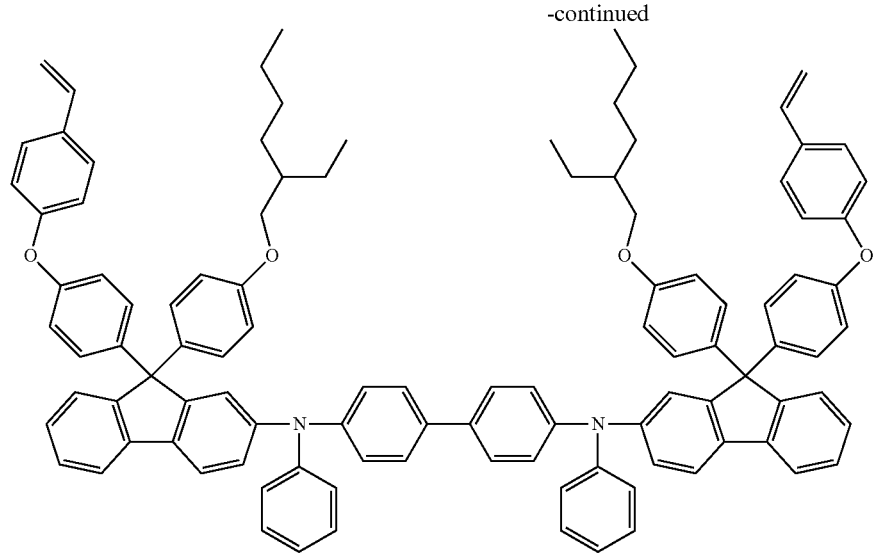
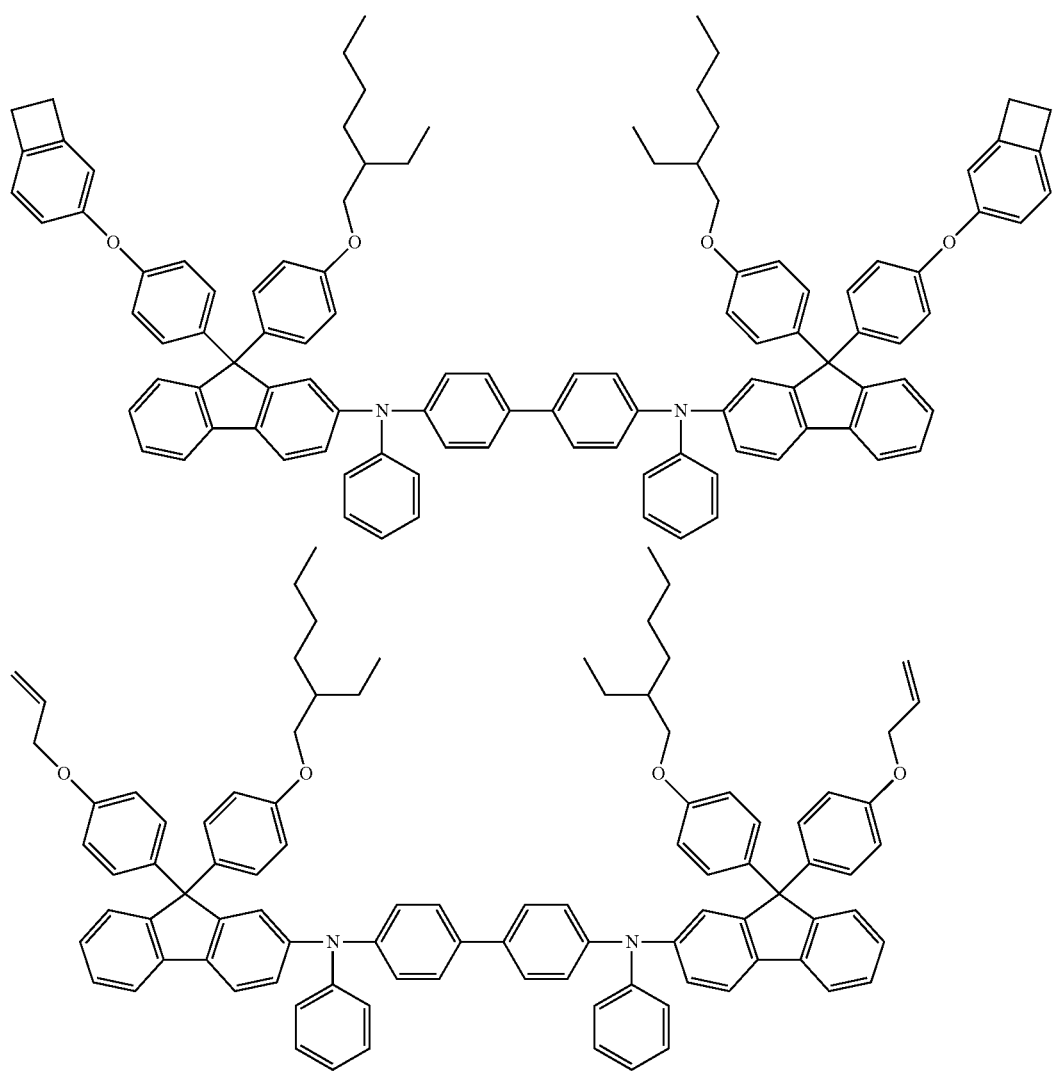

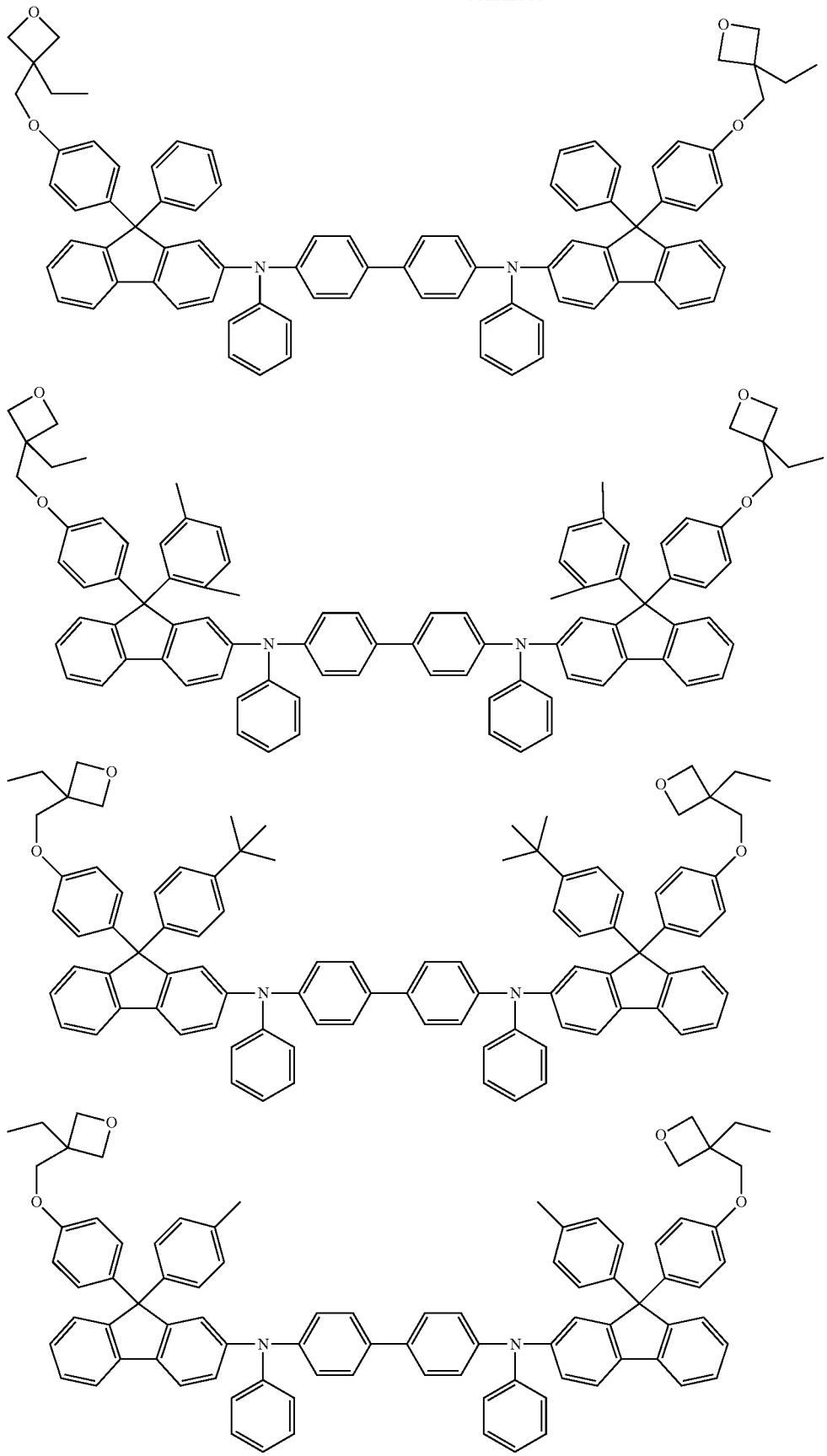

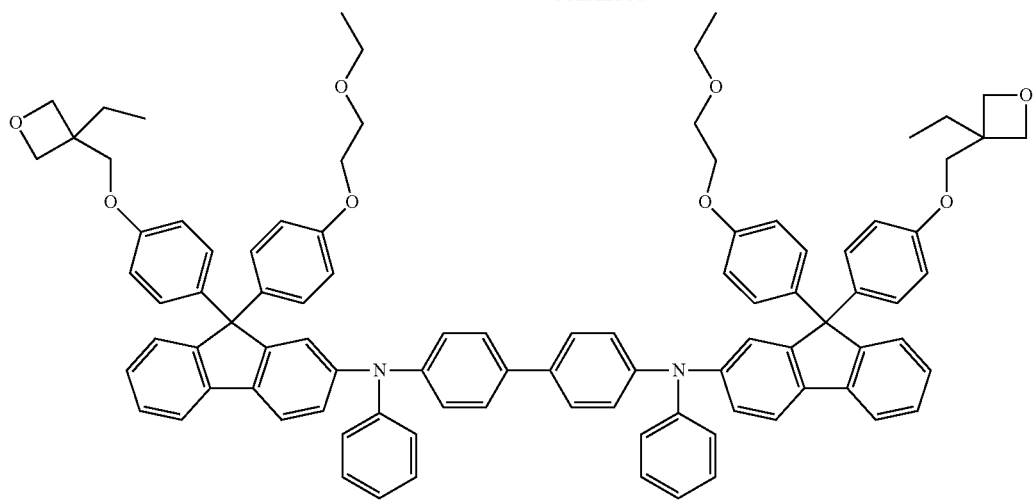
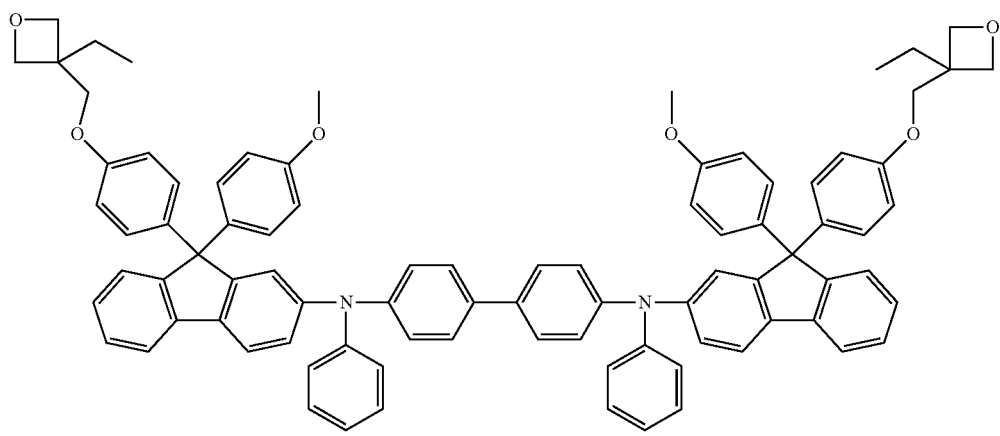
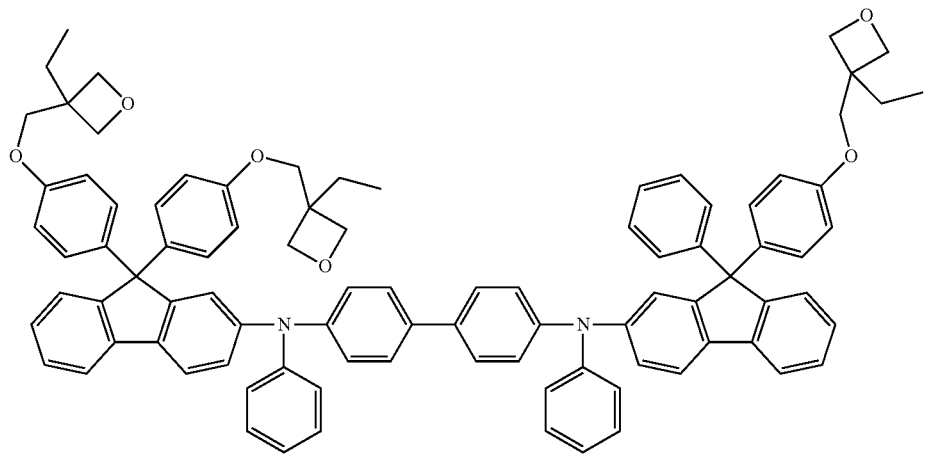

77
78
-continued
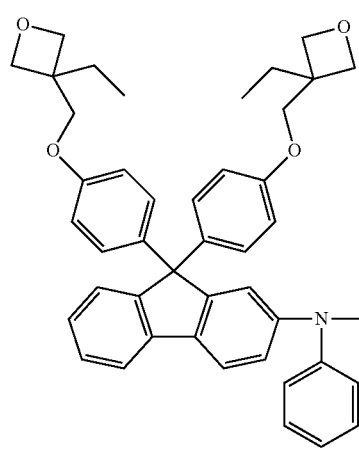
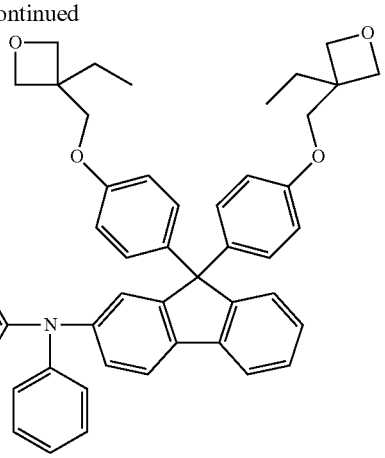
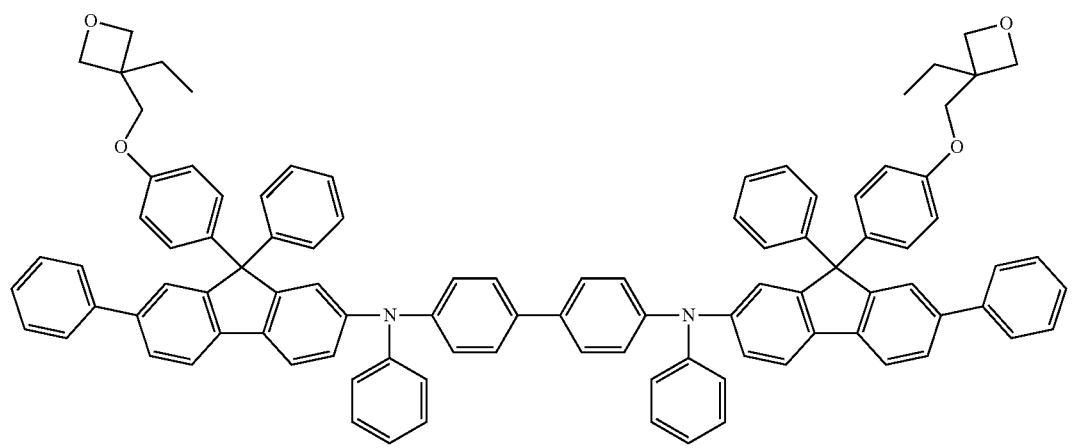
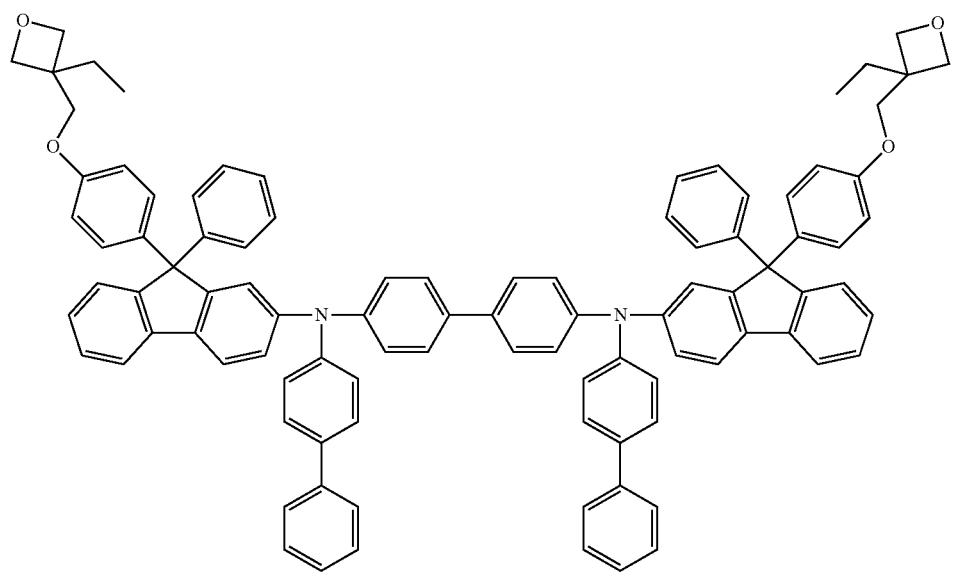

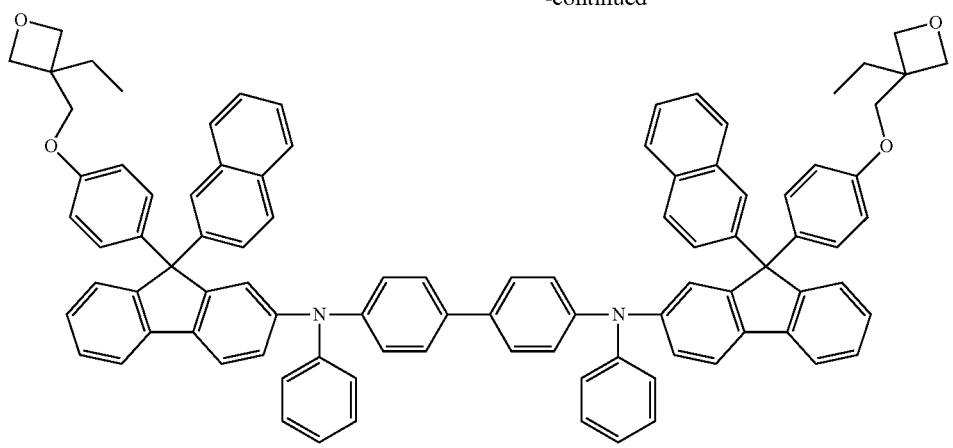
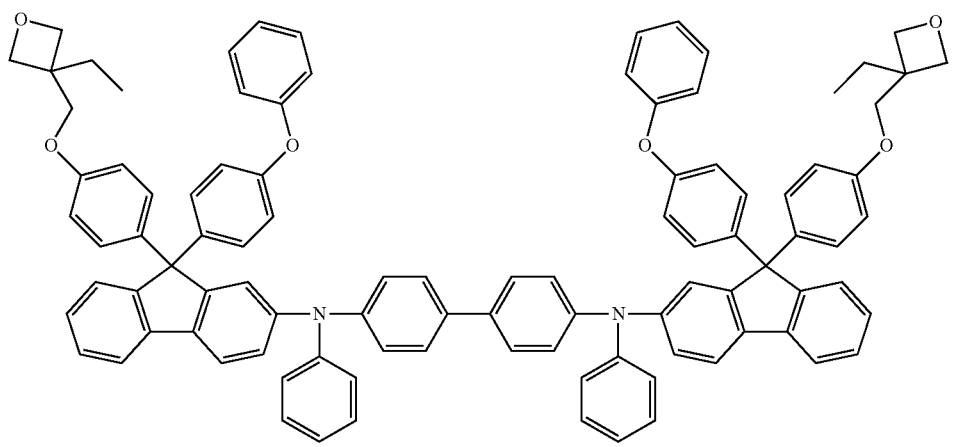
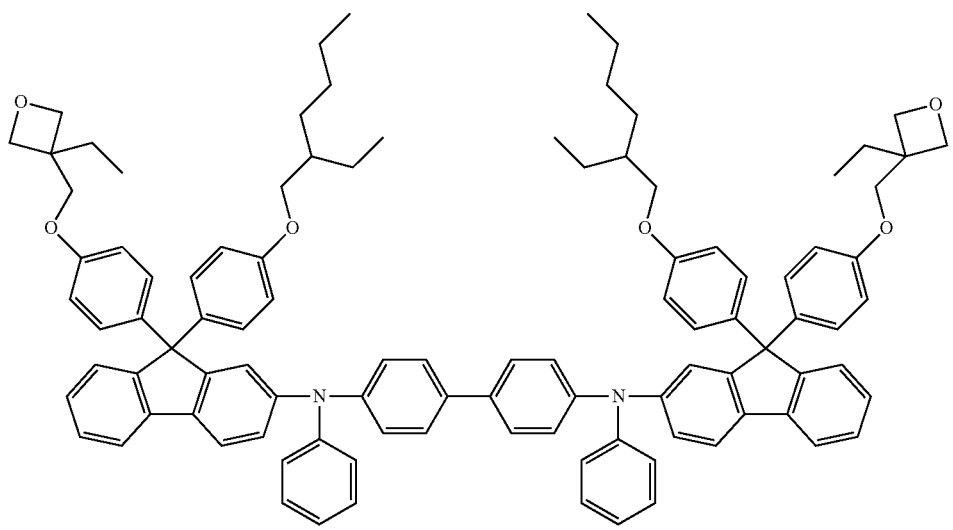

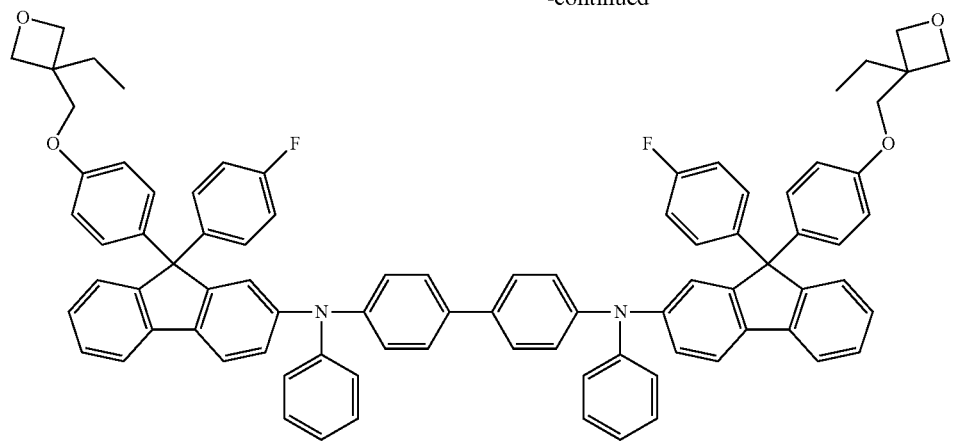
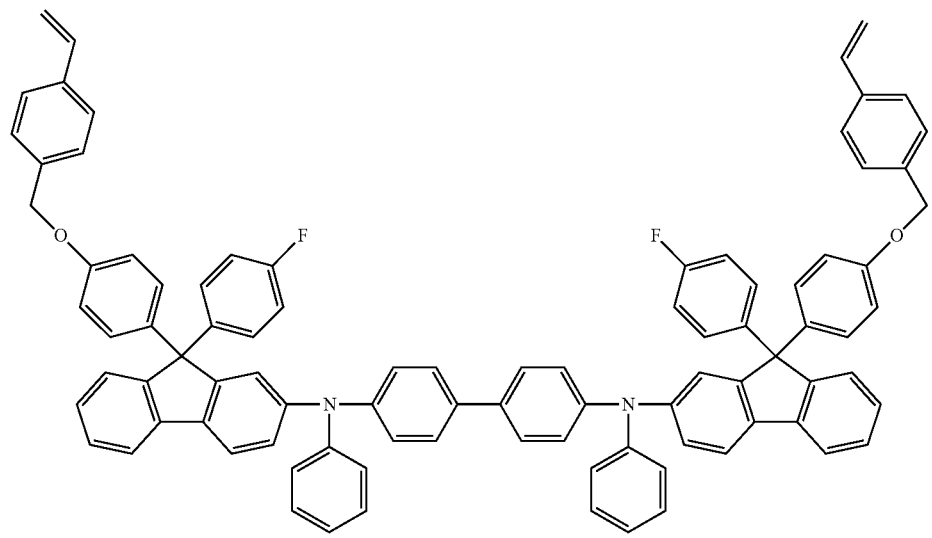
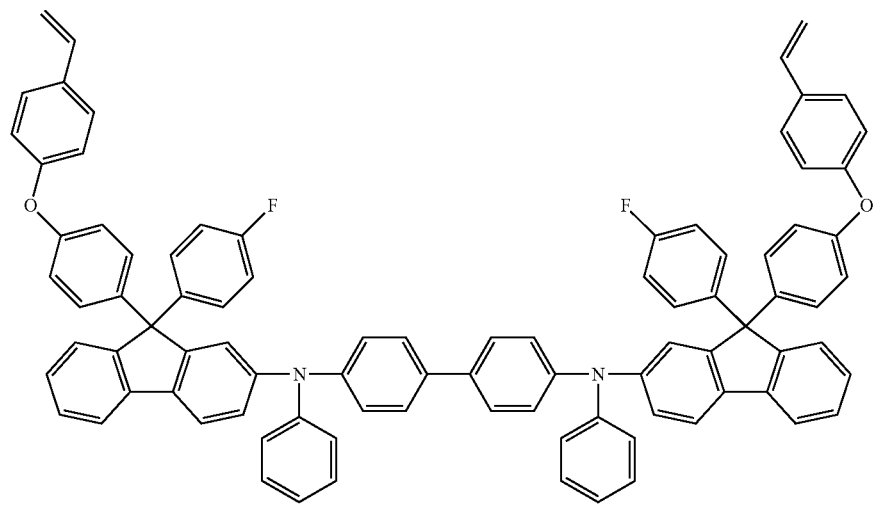

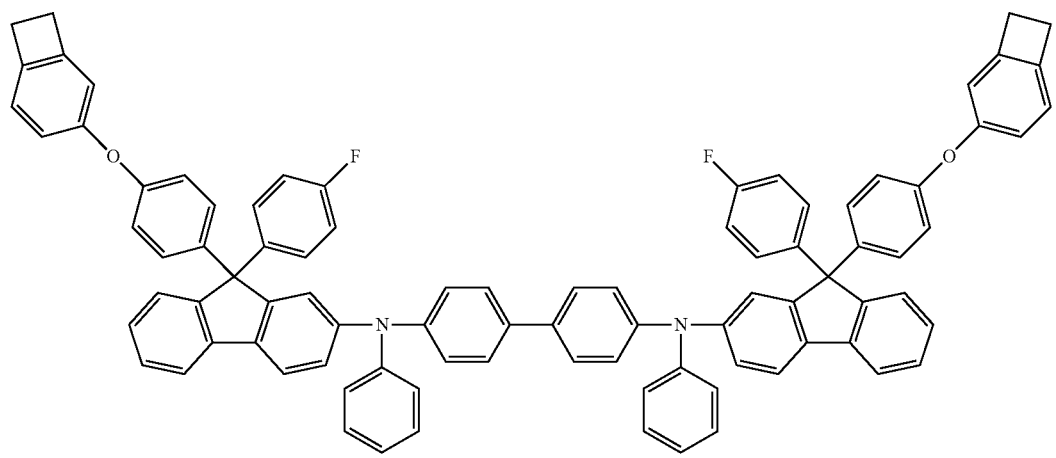
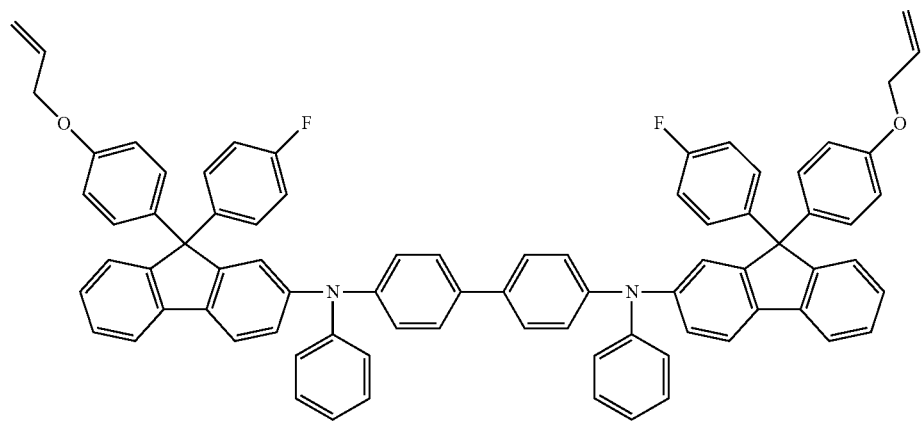
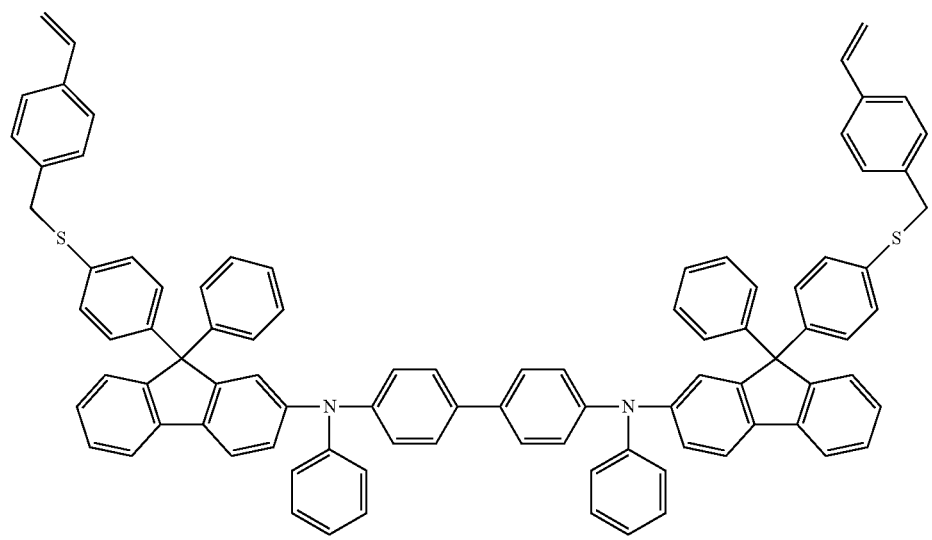

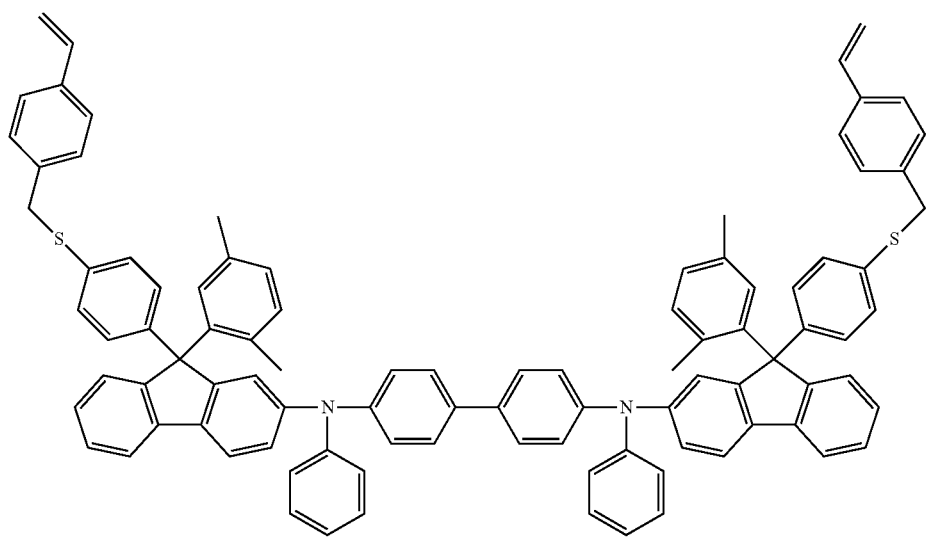
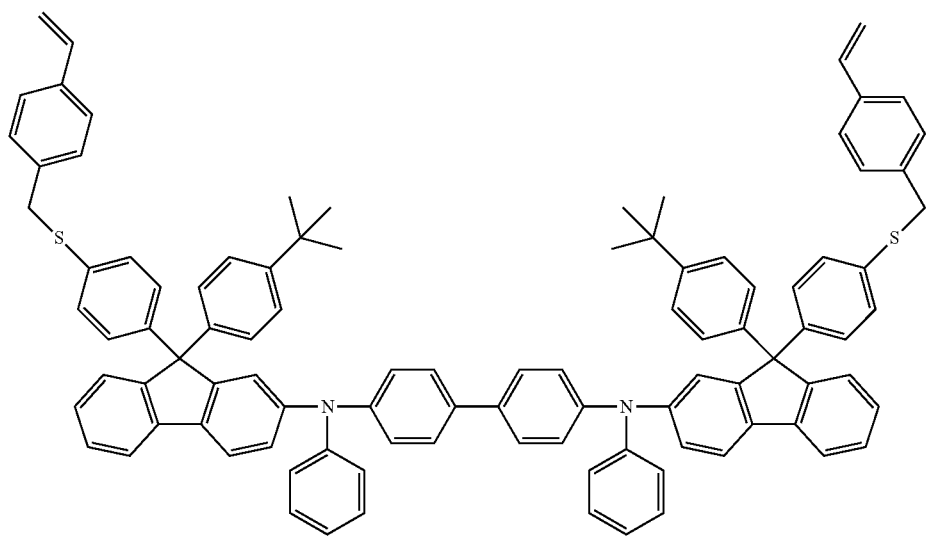
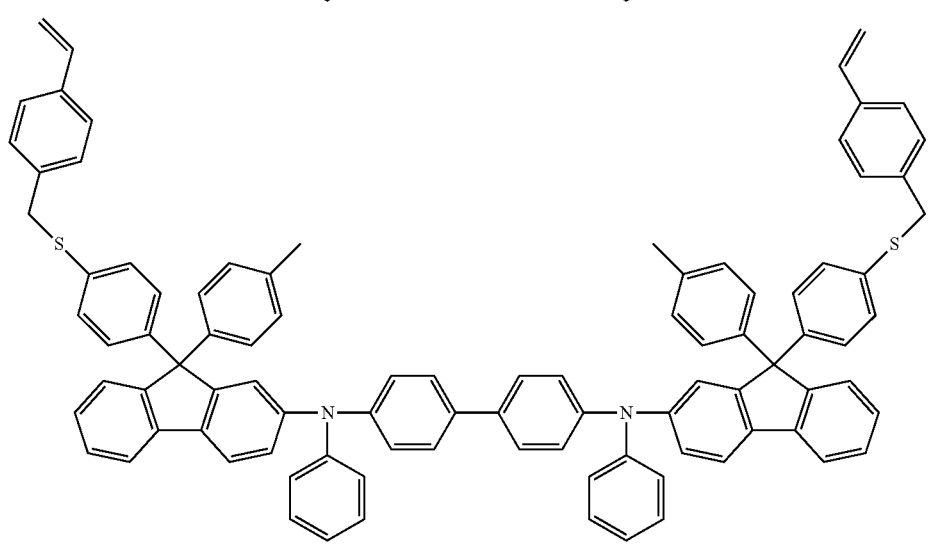

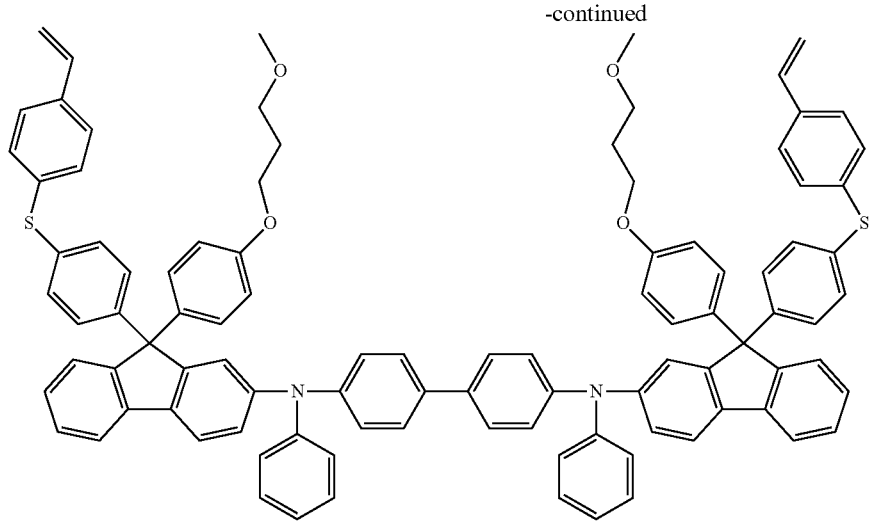
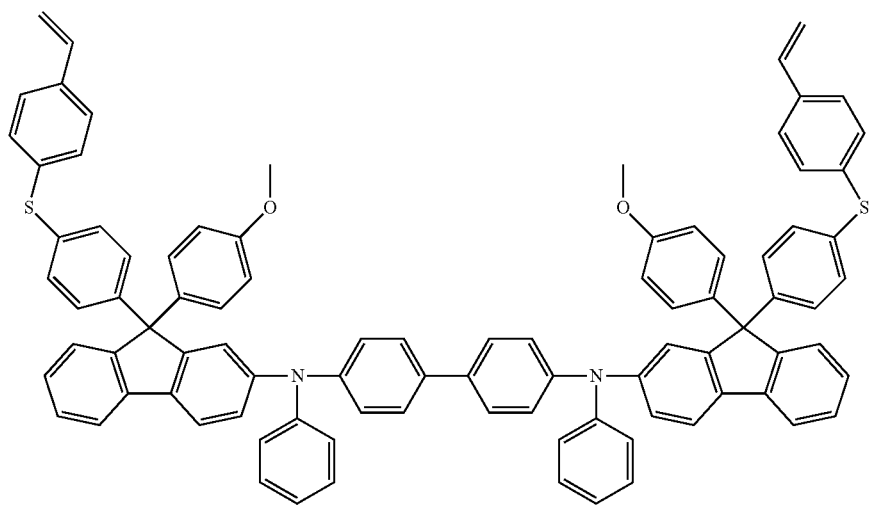
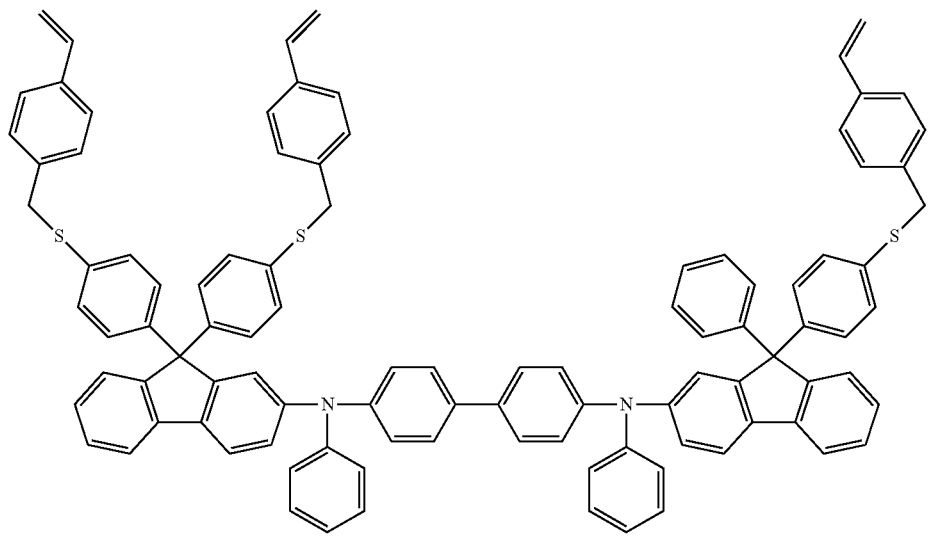

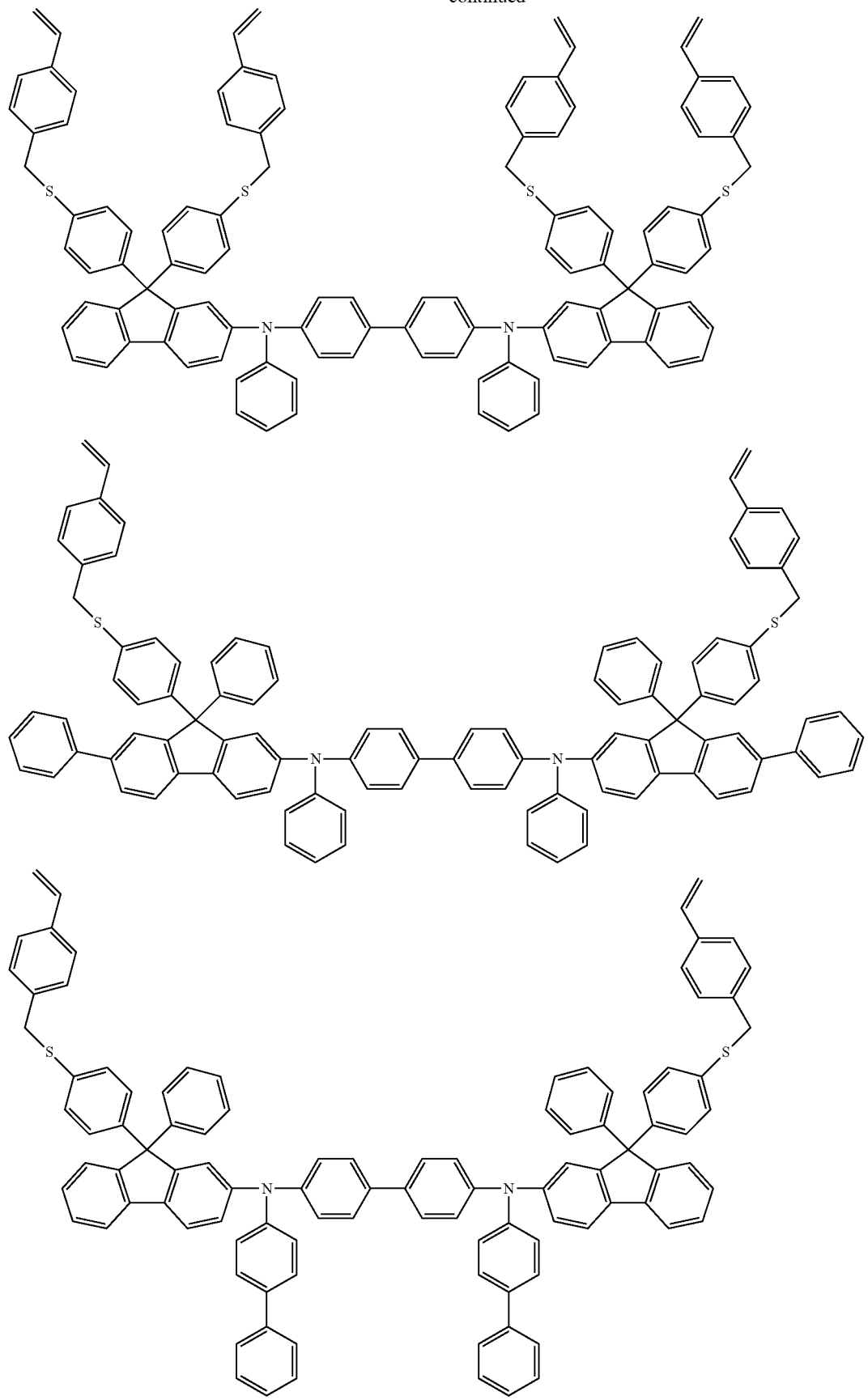

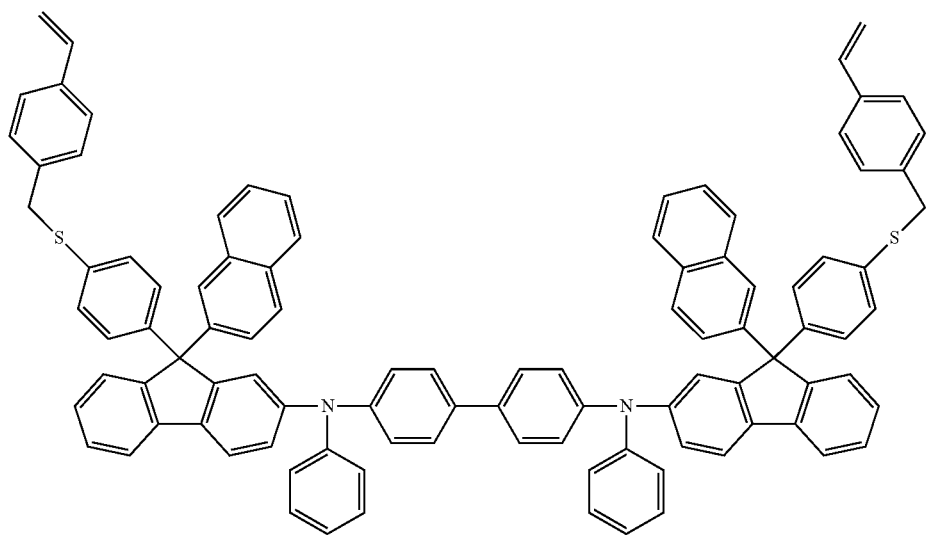
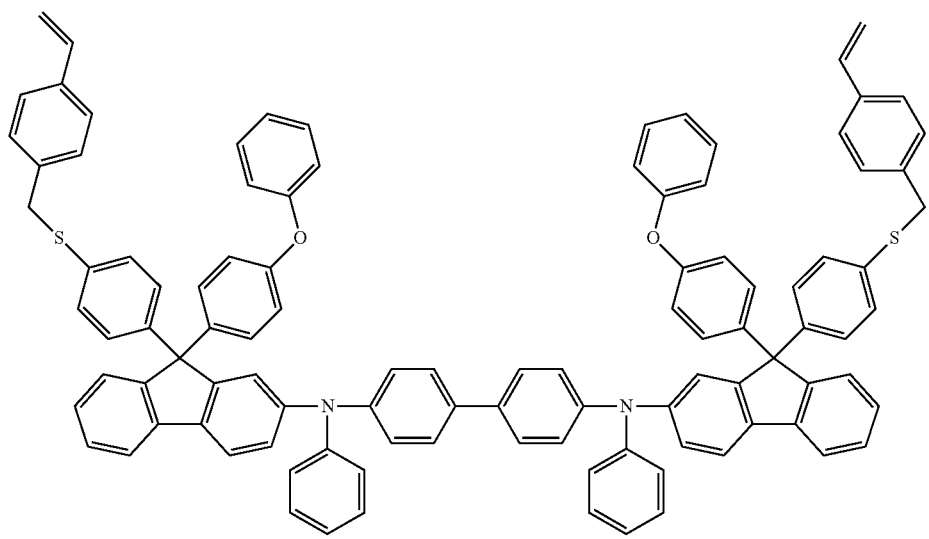
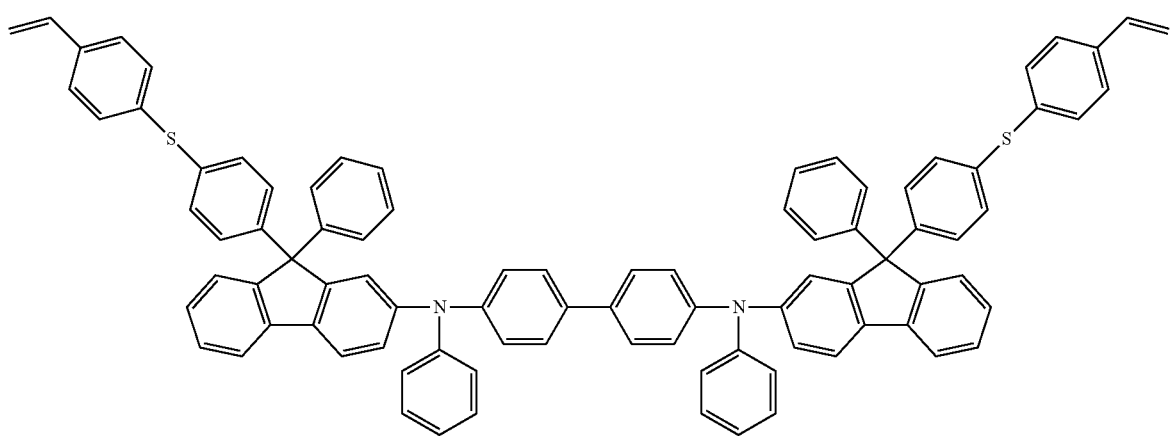

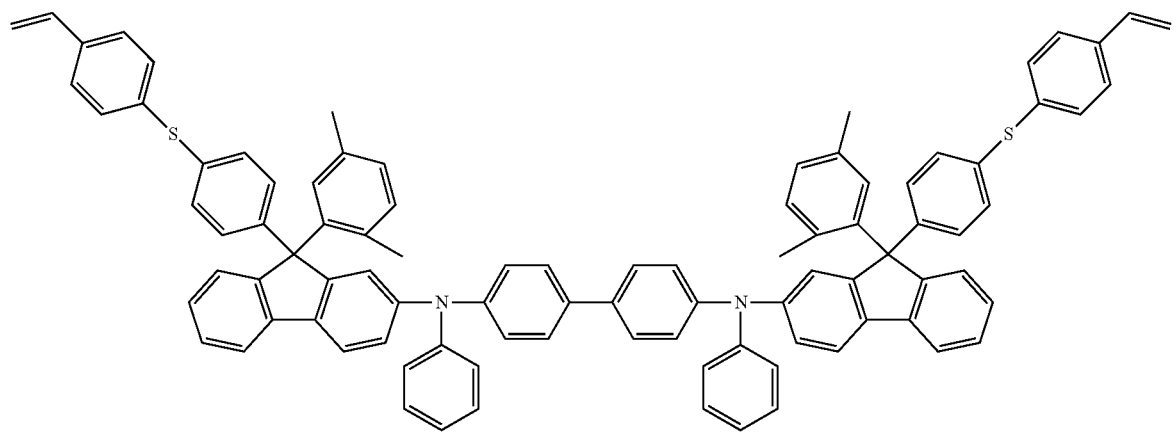
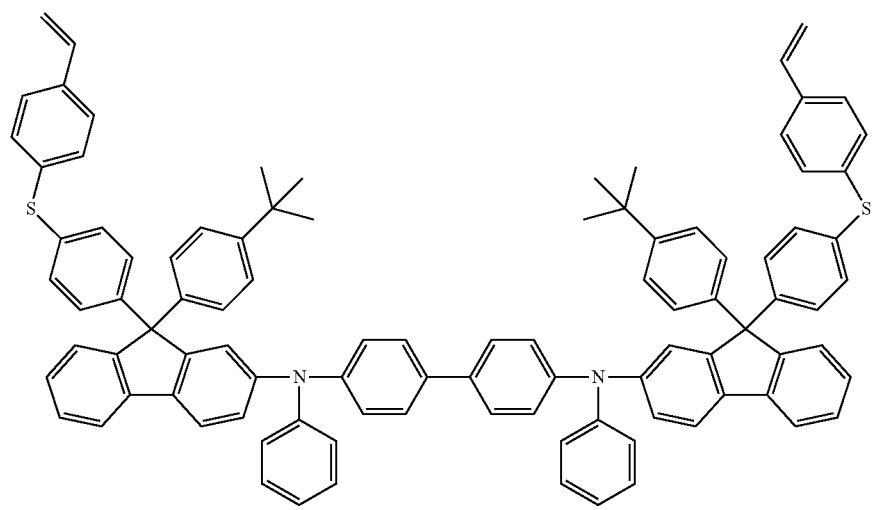
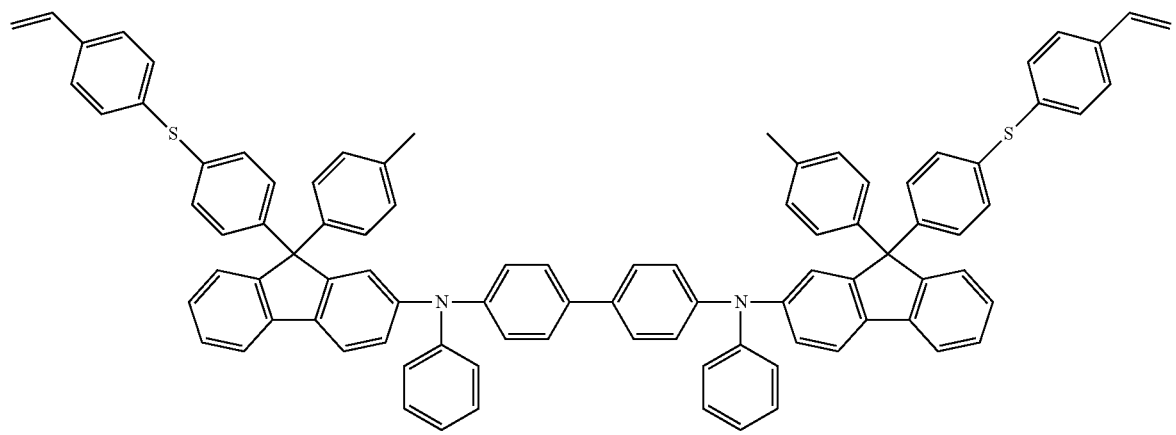

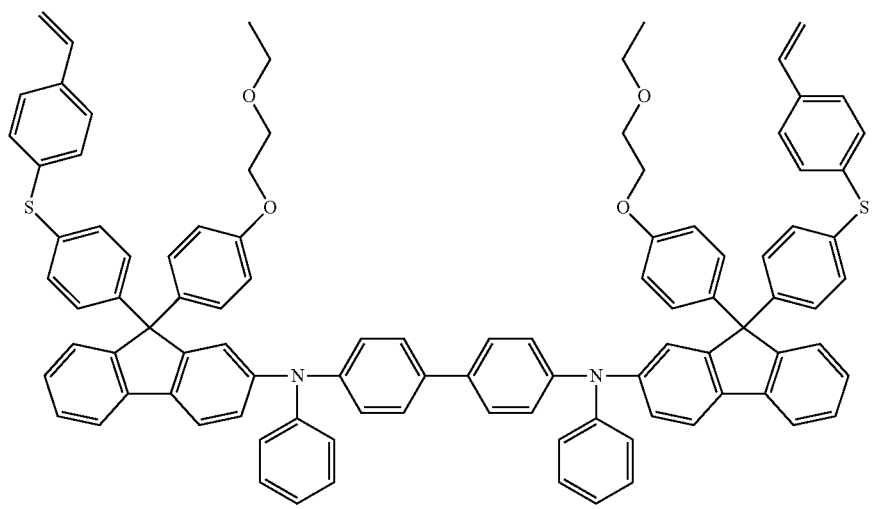
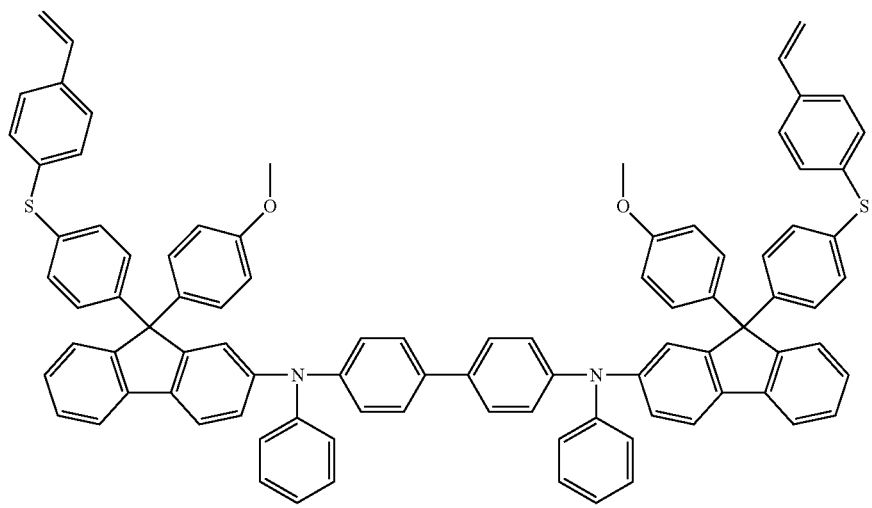
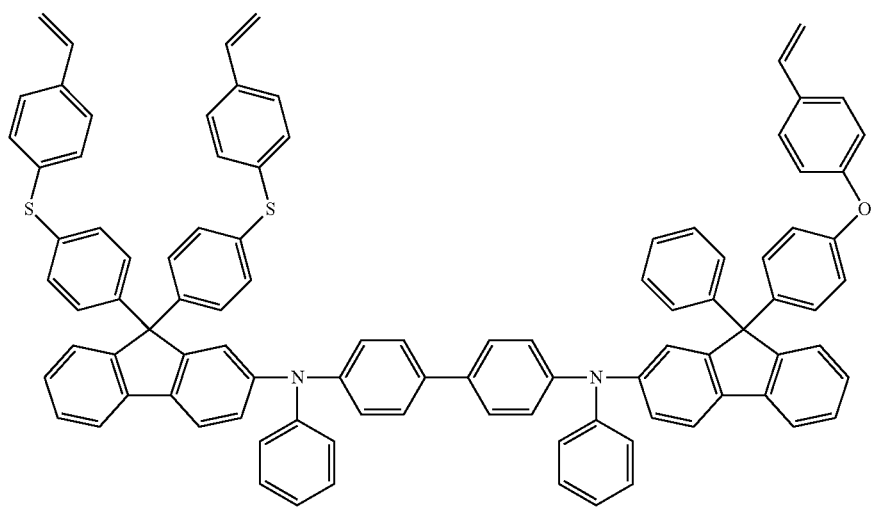

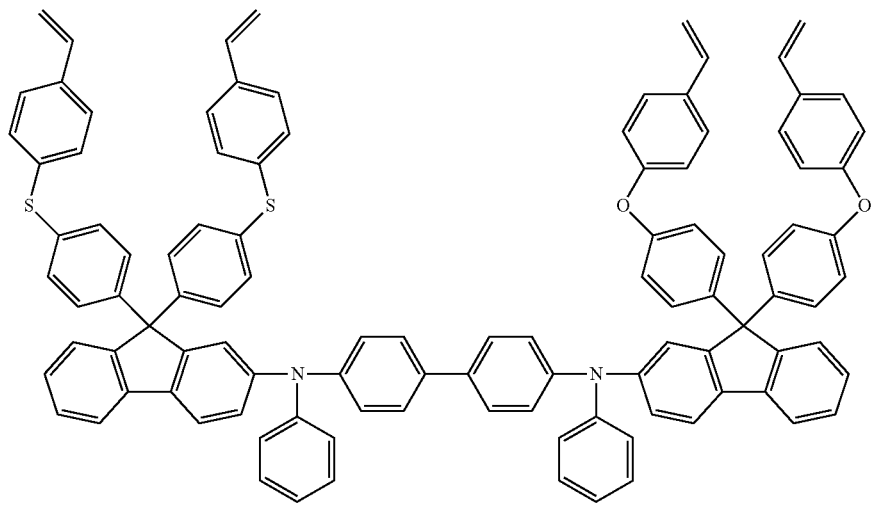
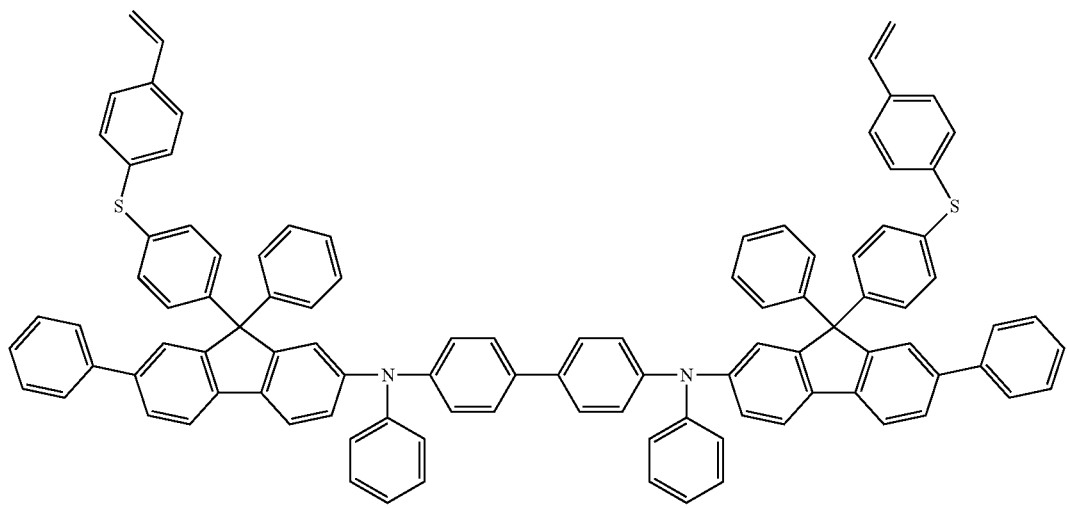
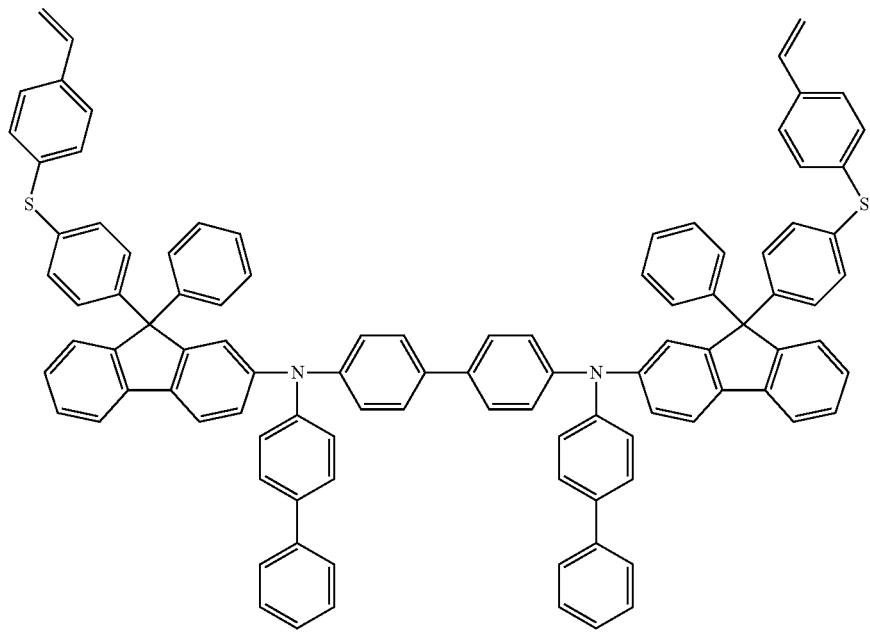

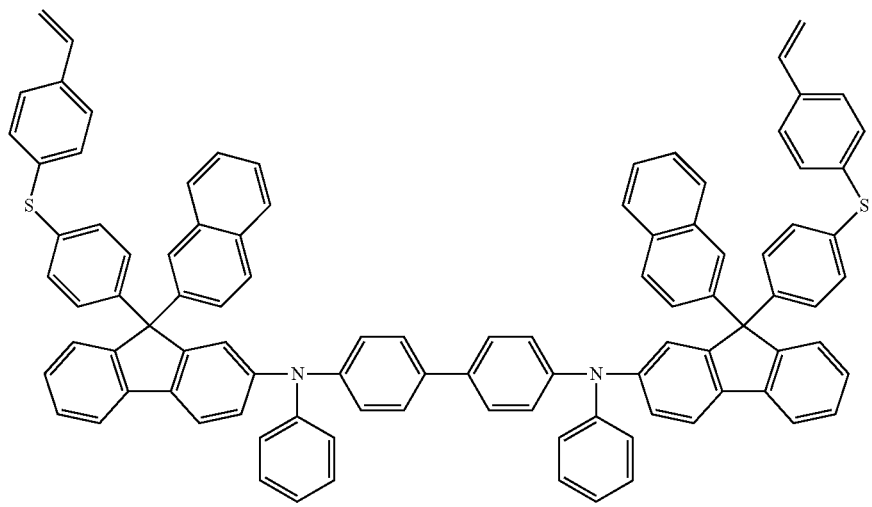
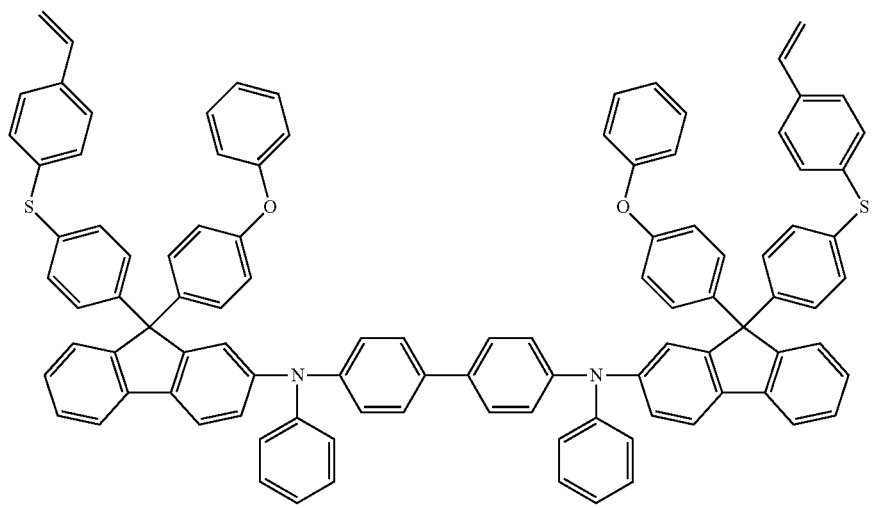
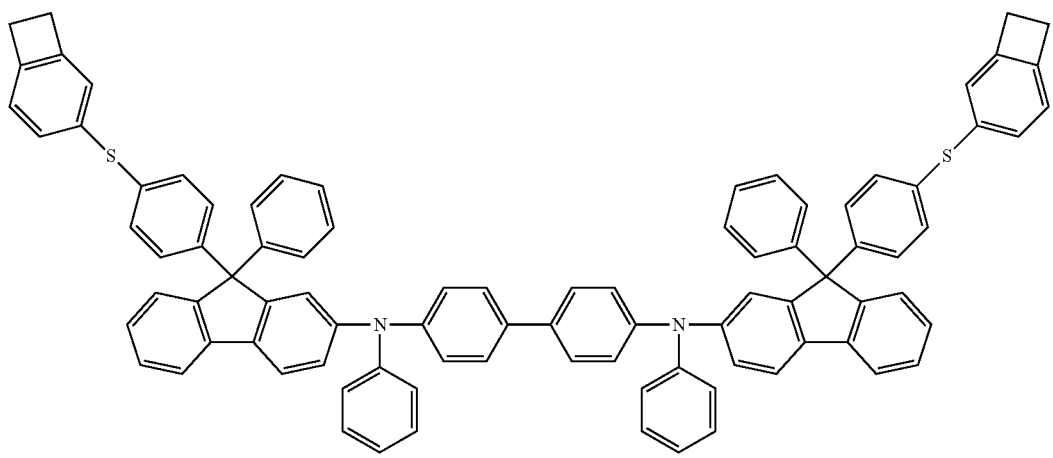

101
102
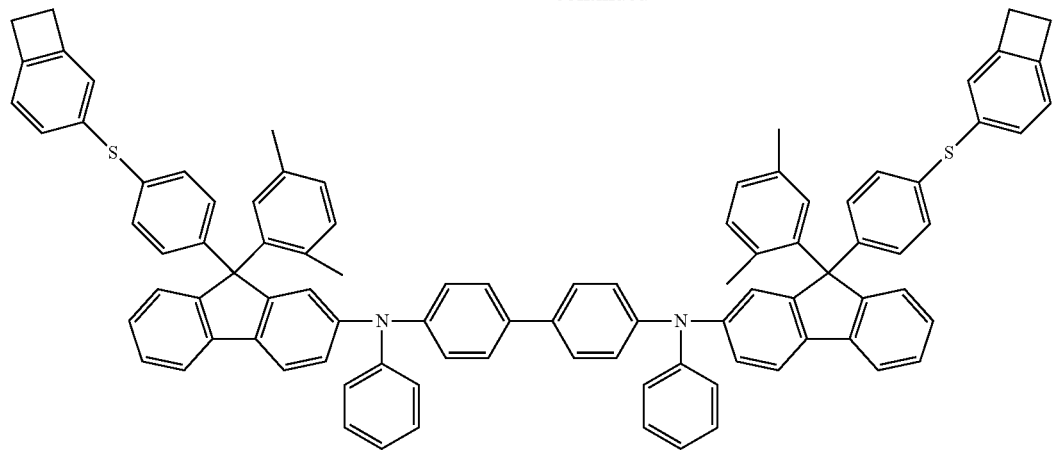
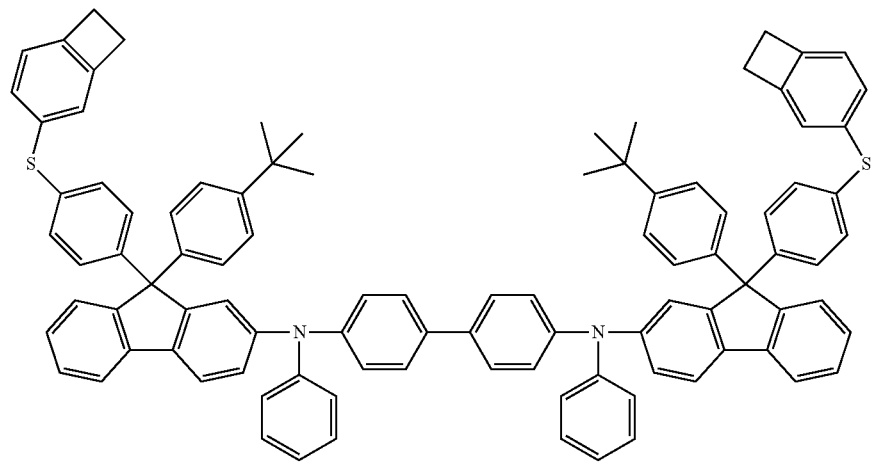
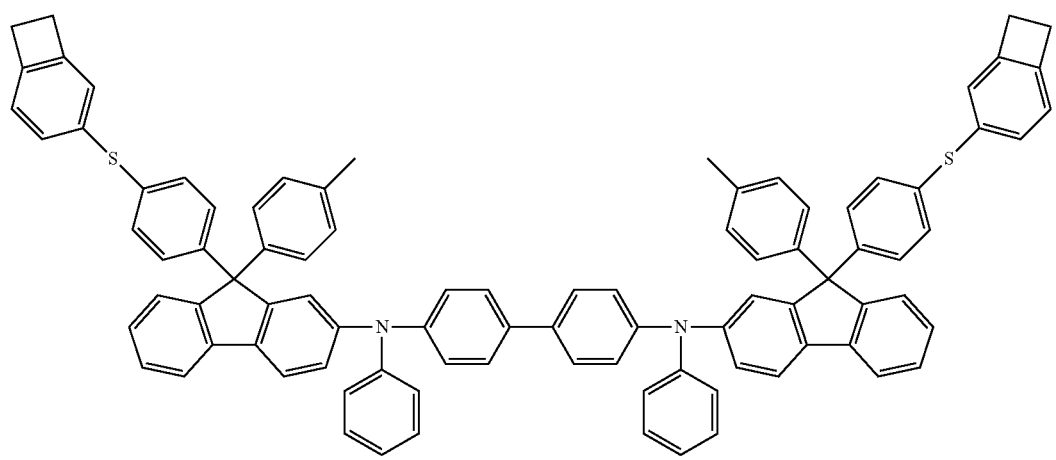

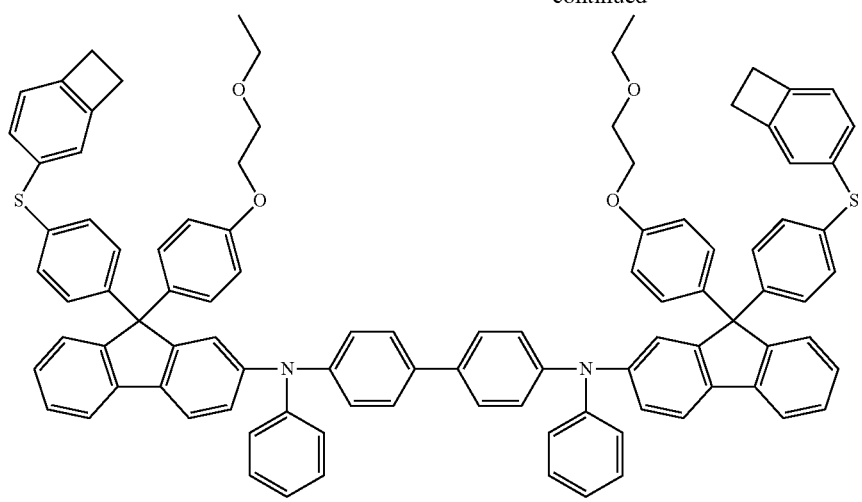
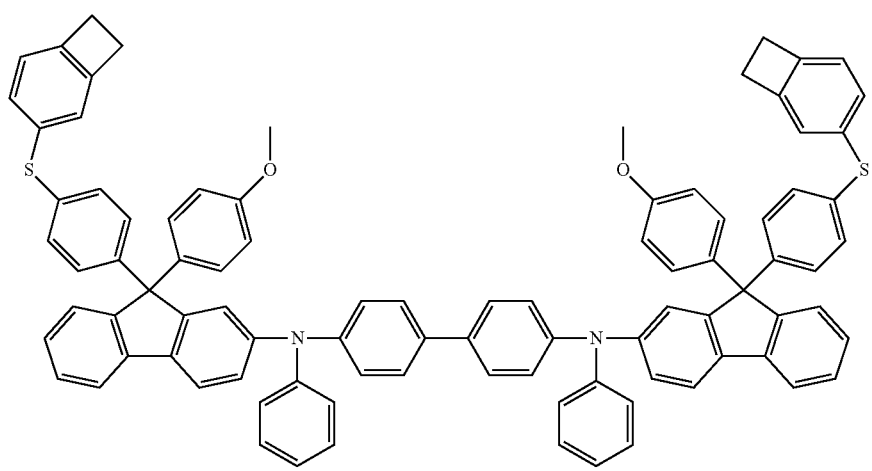
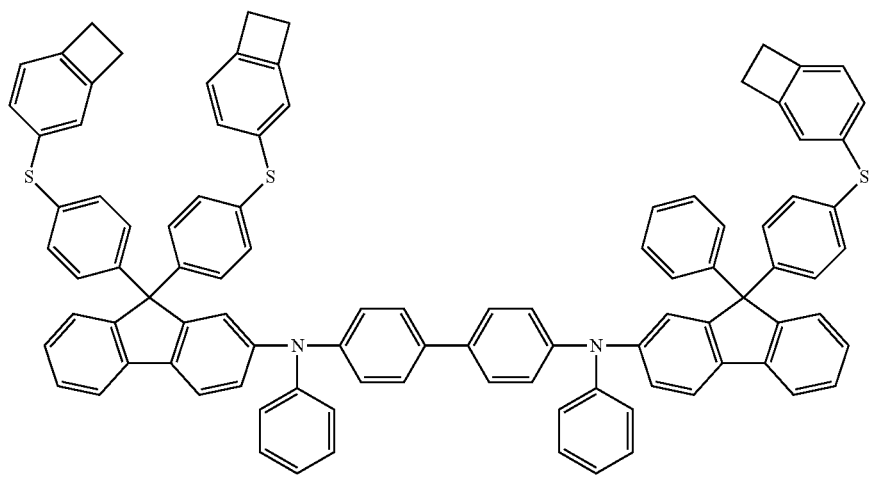

105
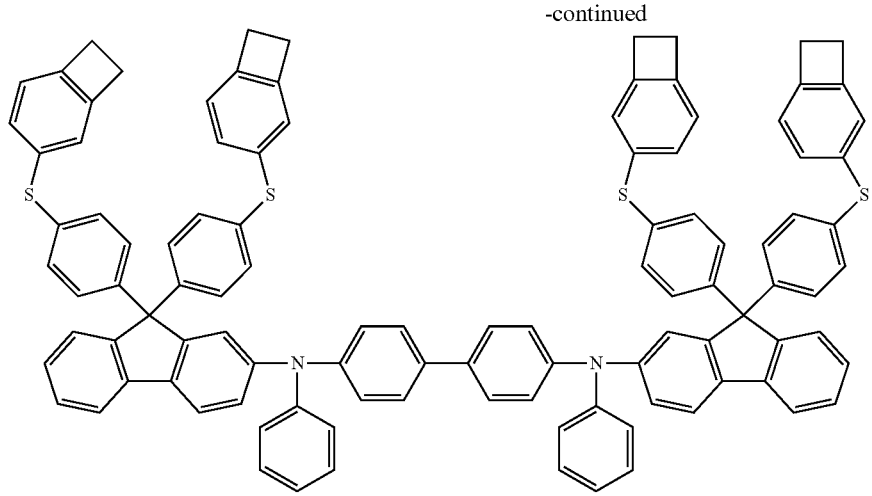
106
-continued
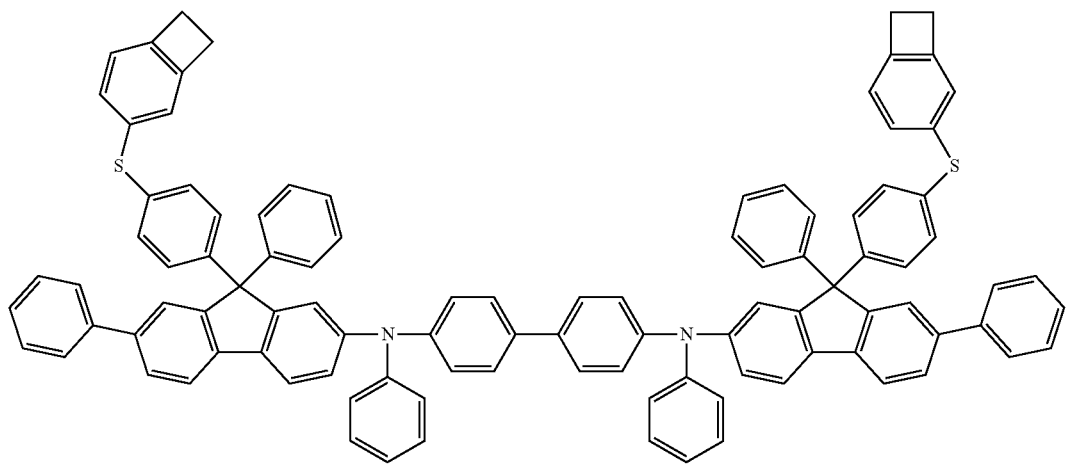
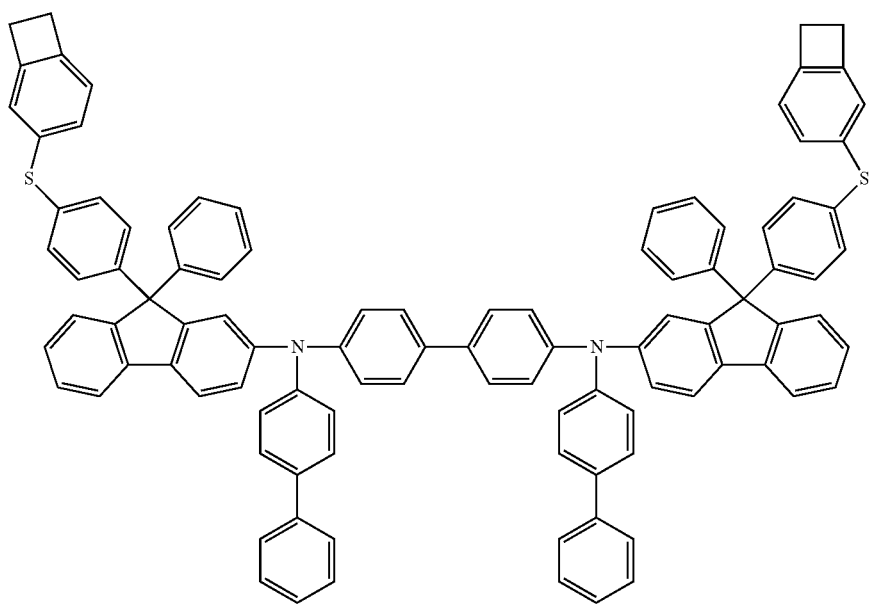

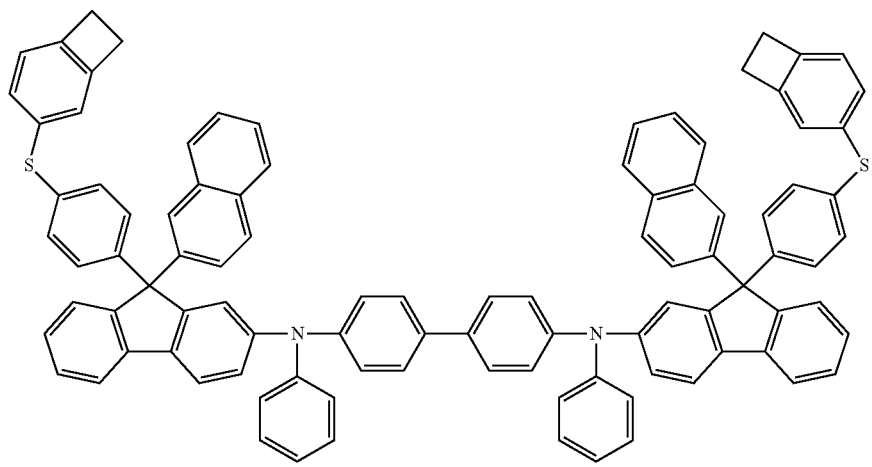
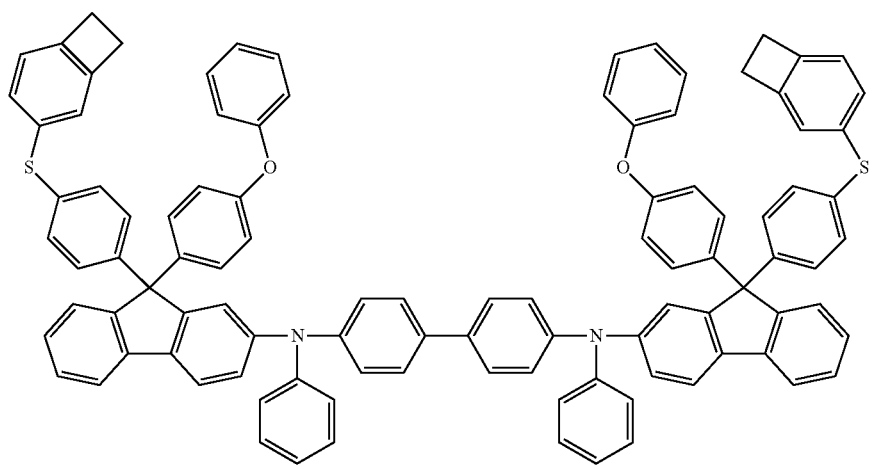
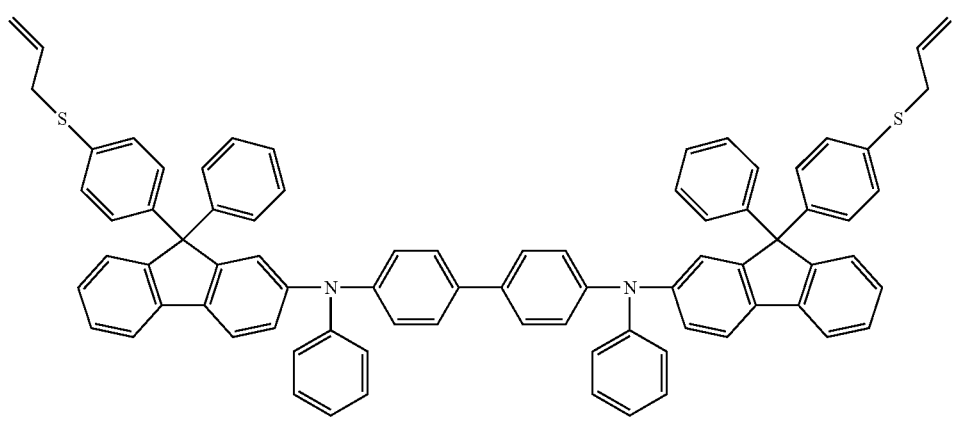

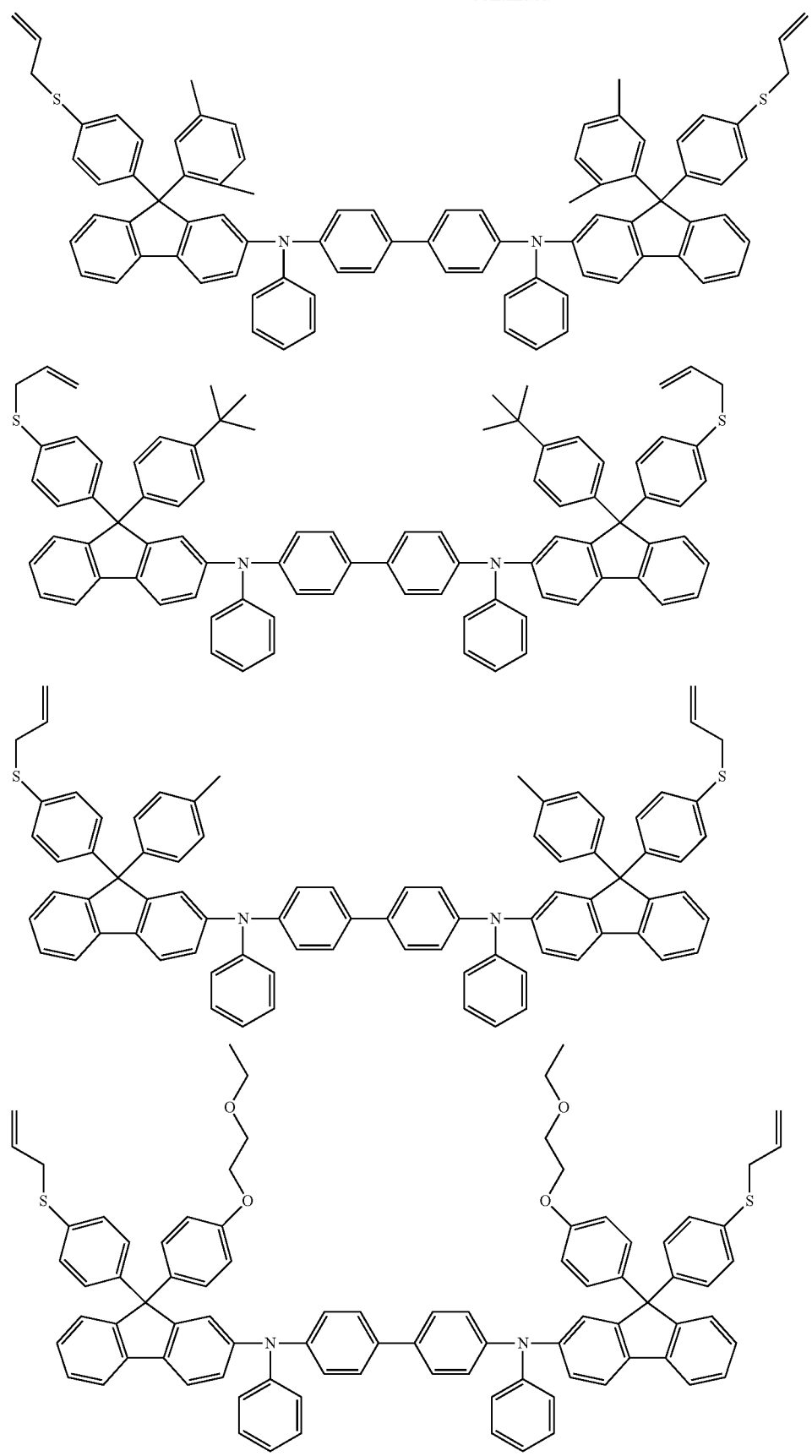

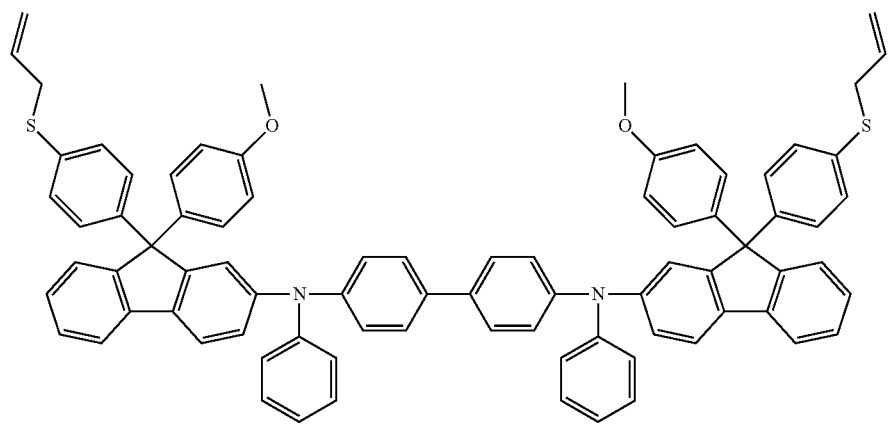
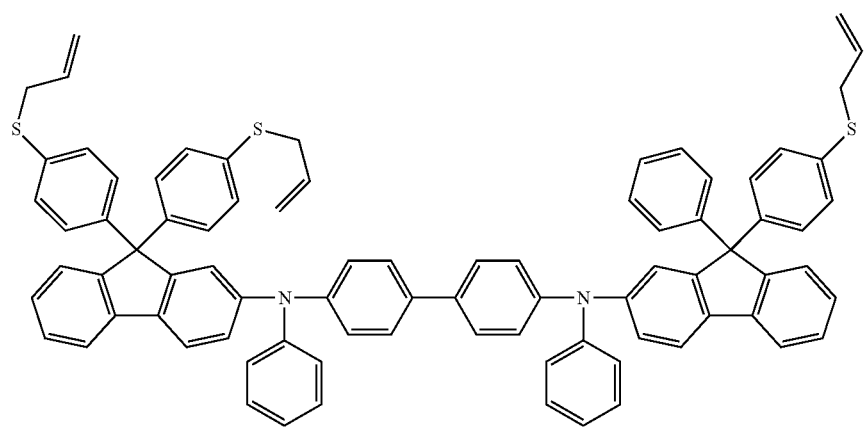
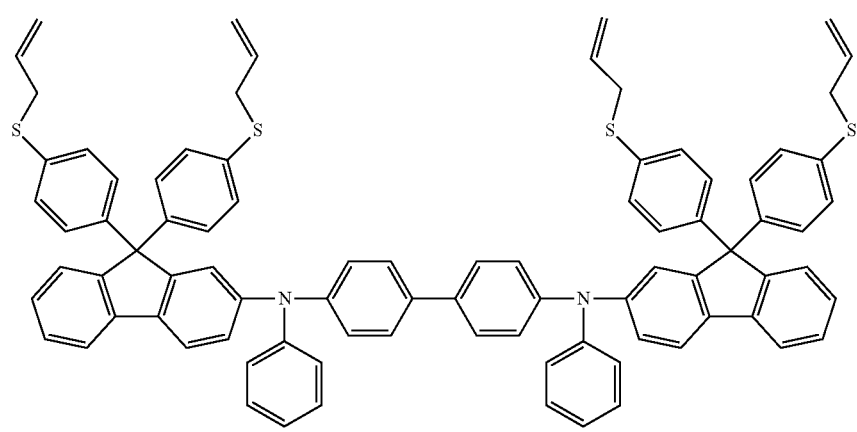
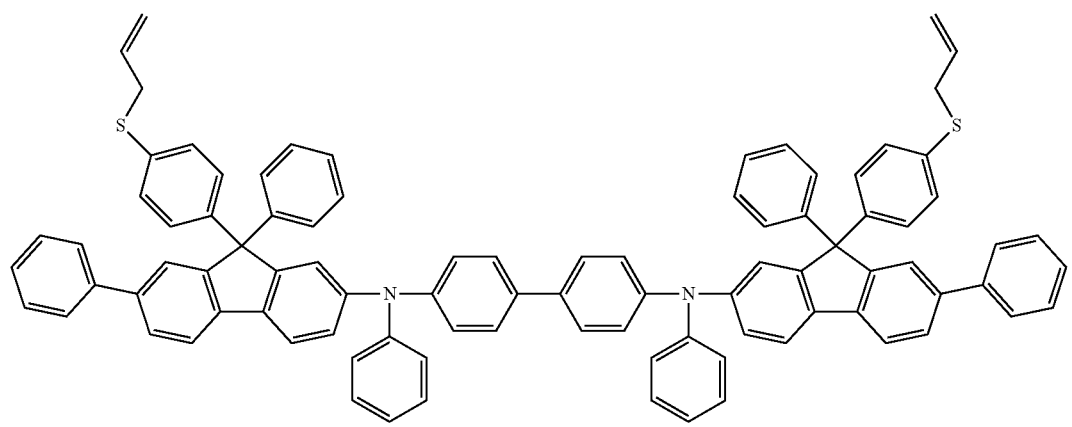

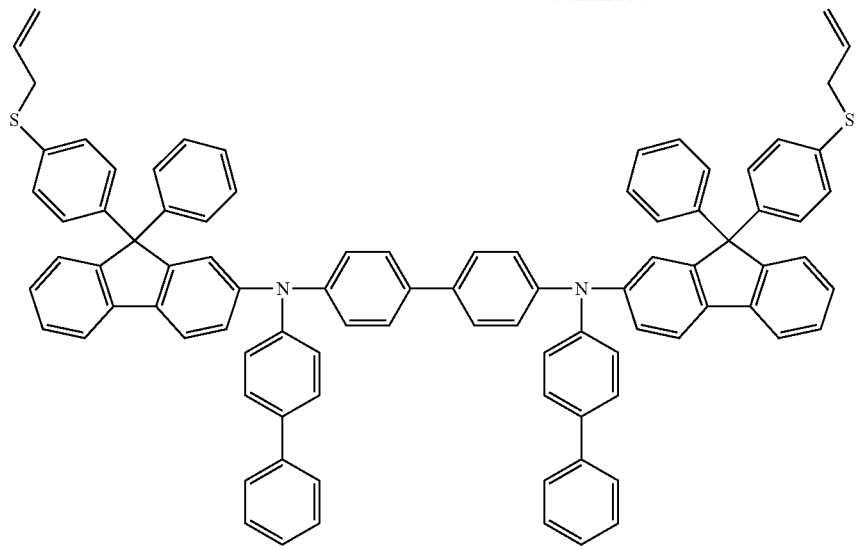
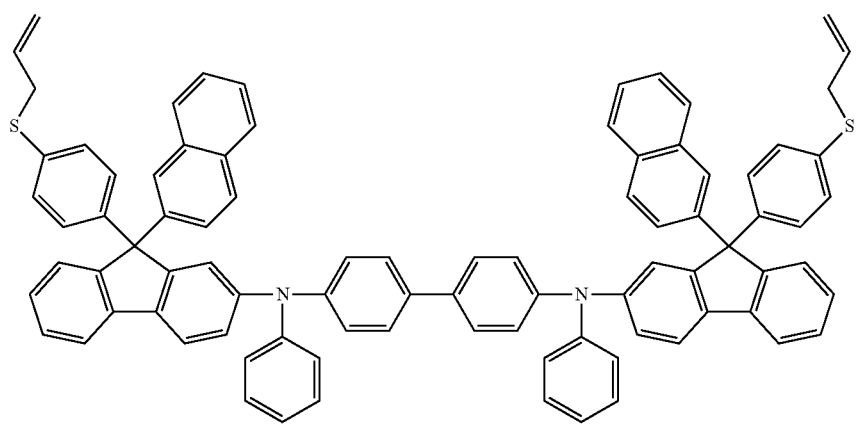
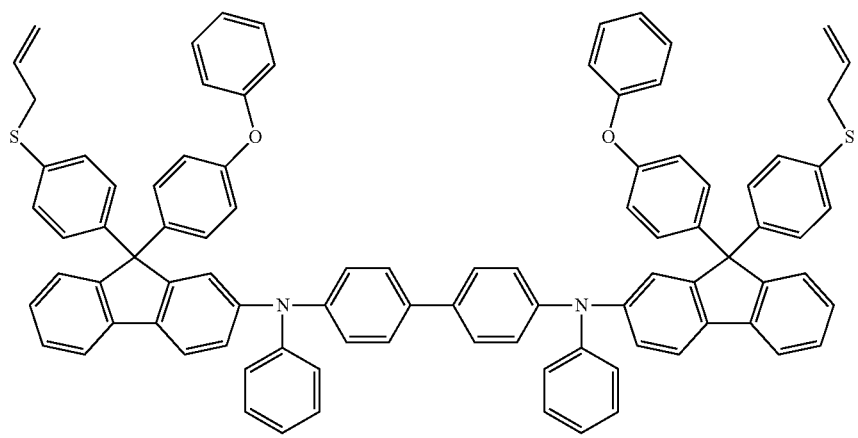

115 116
-continued
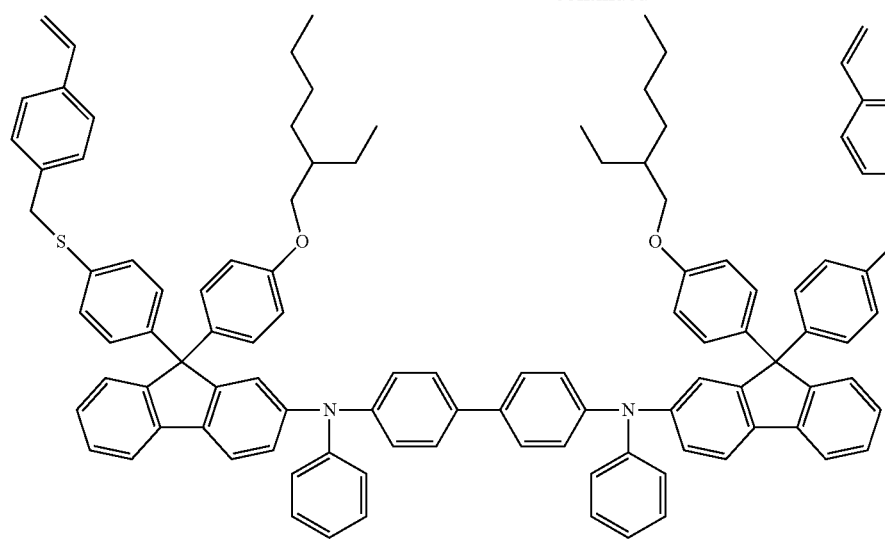
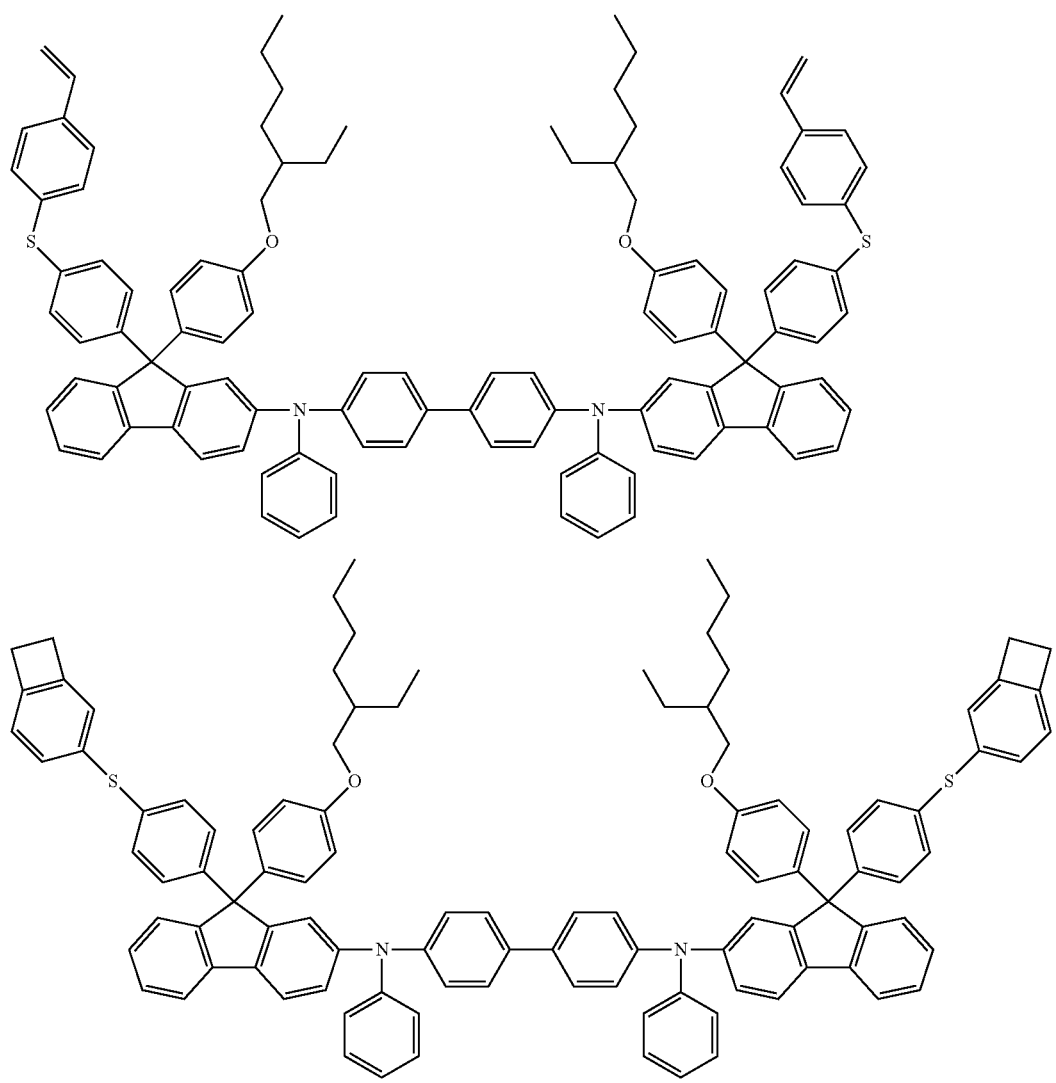

-continued
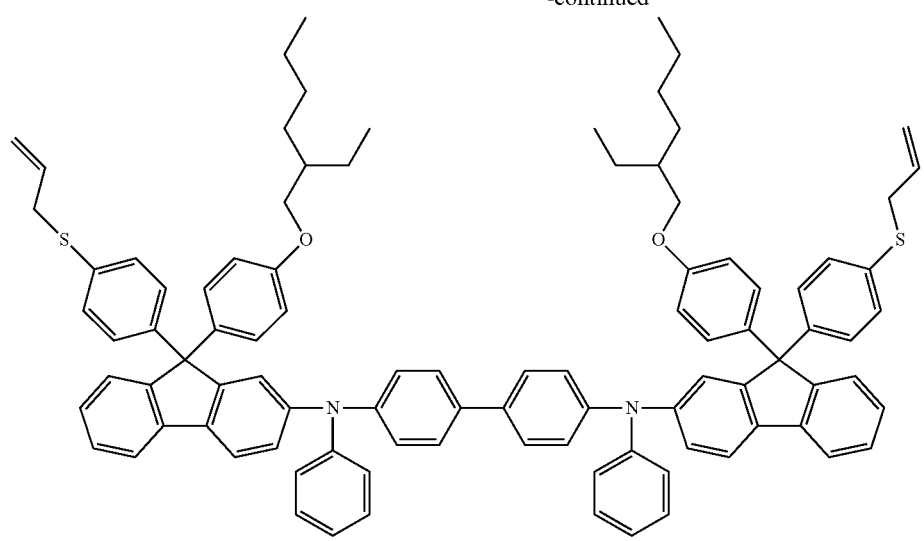
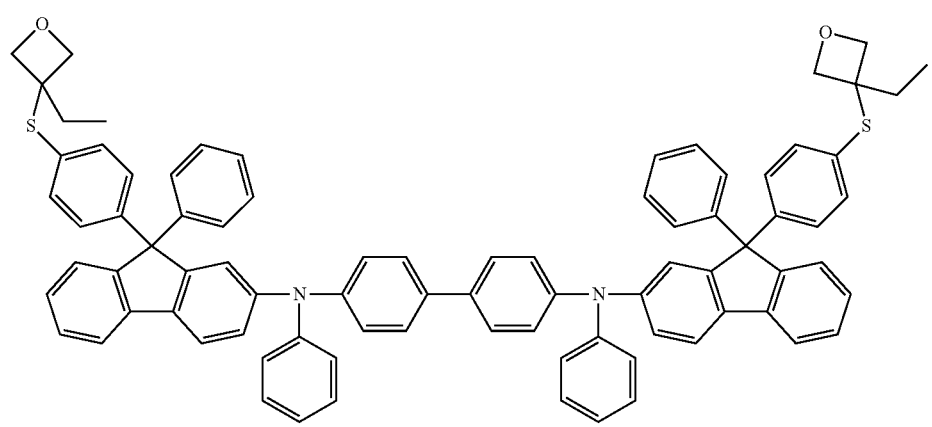
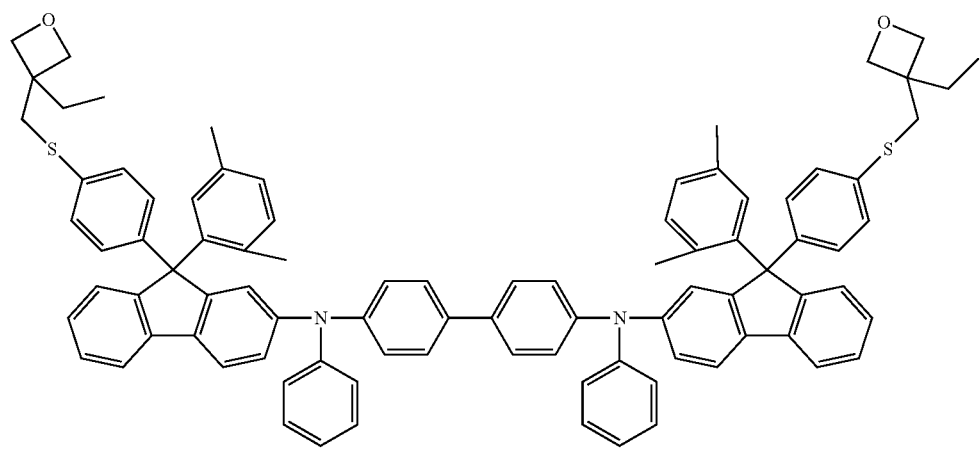

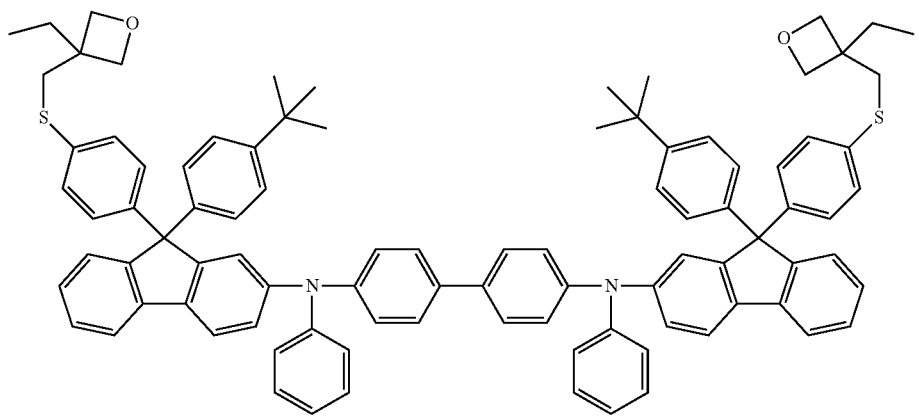
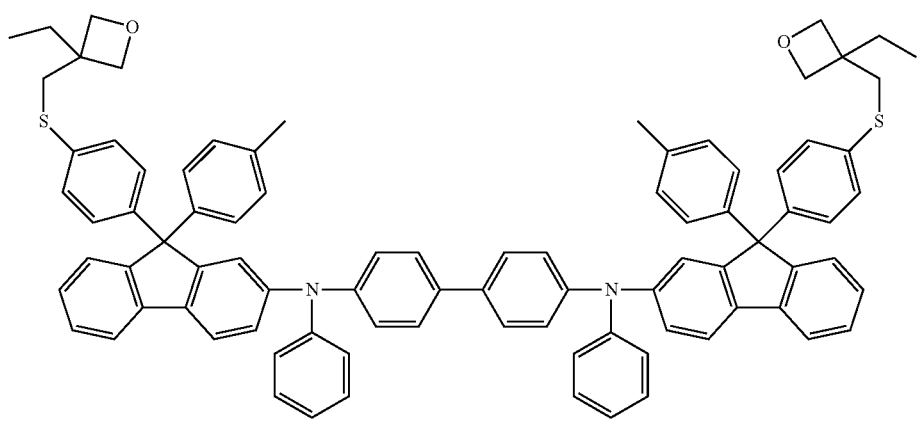
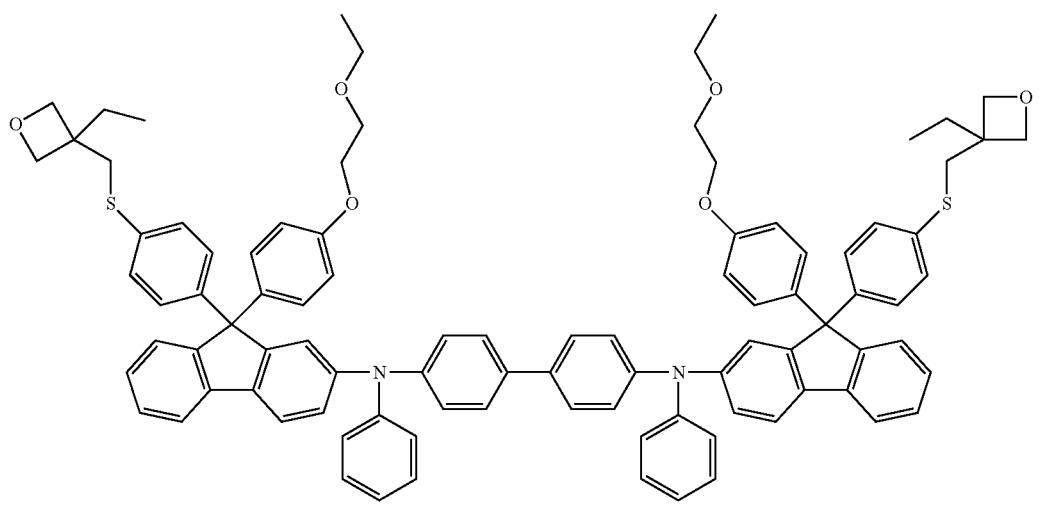

121 122
-continued
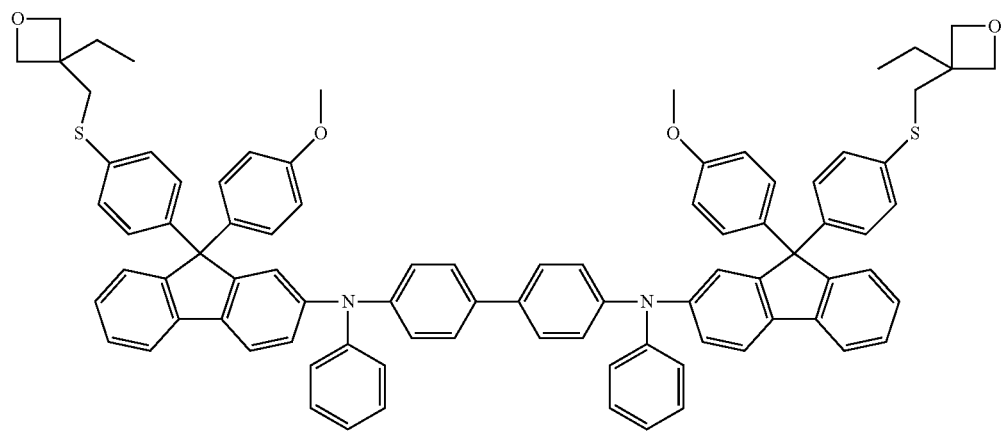
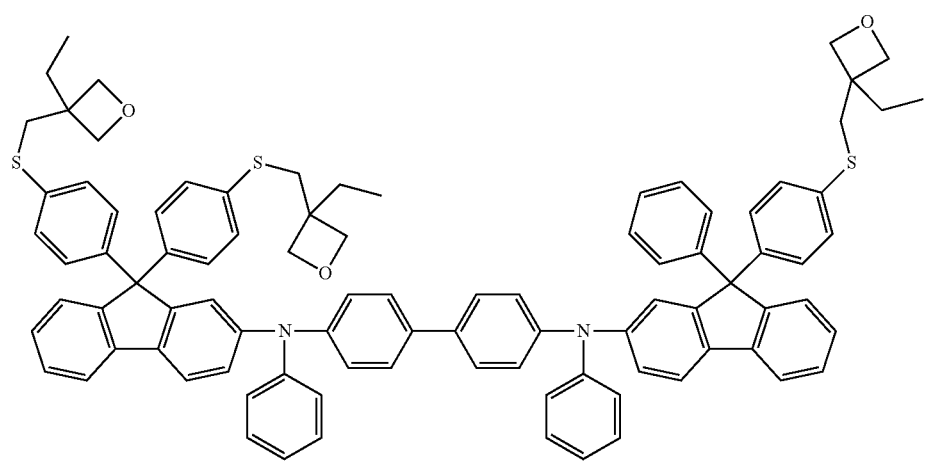
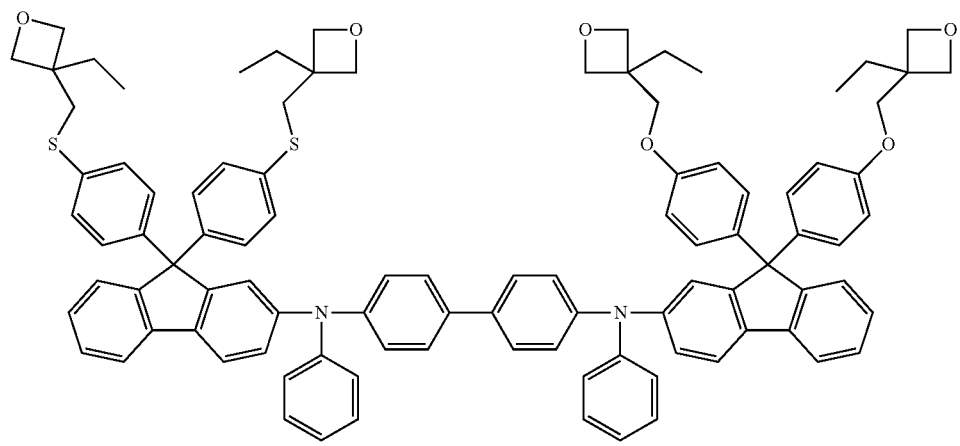

123
124
-continued
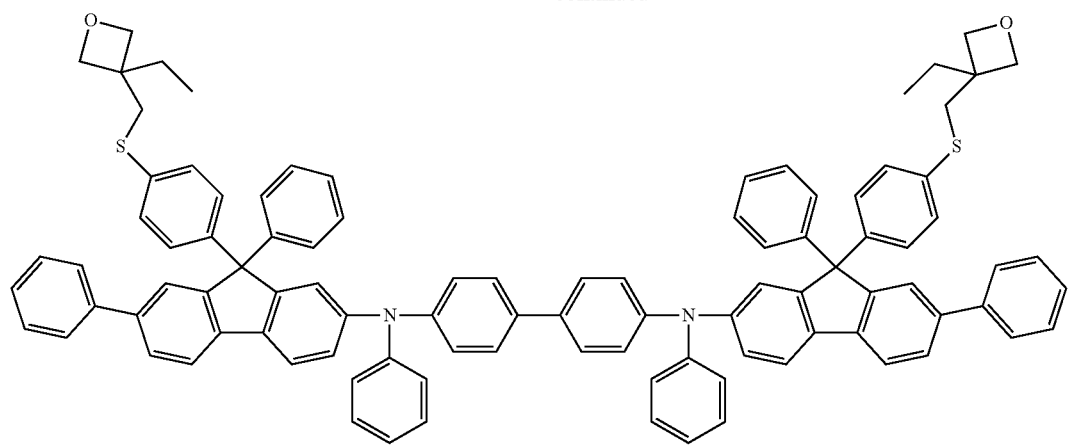
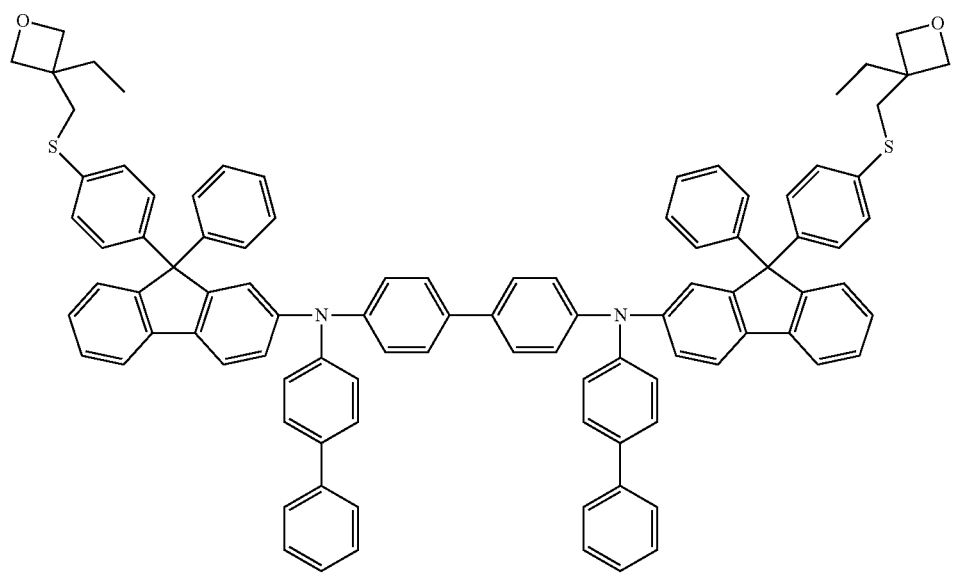
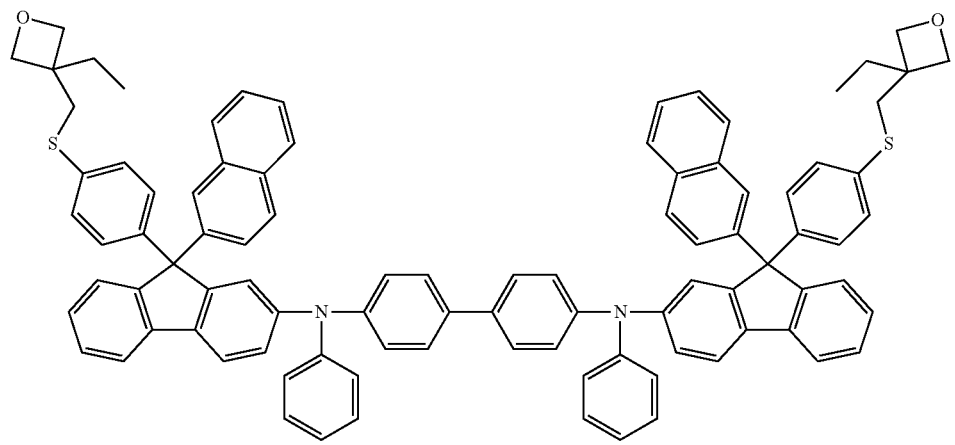

125 126
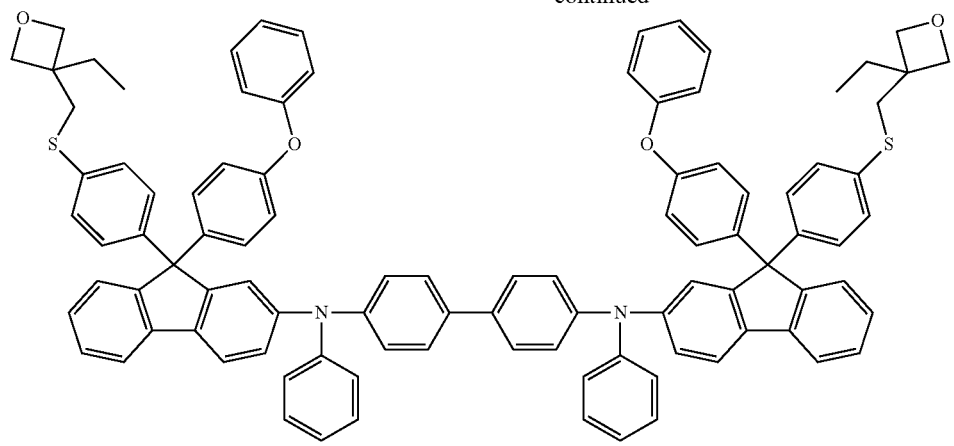
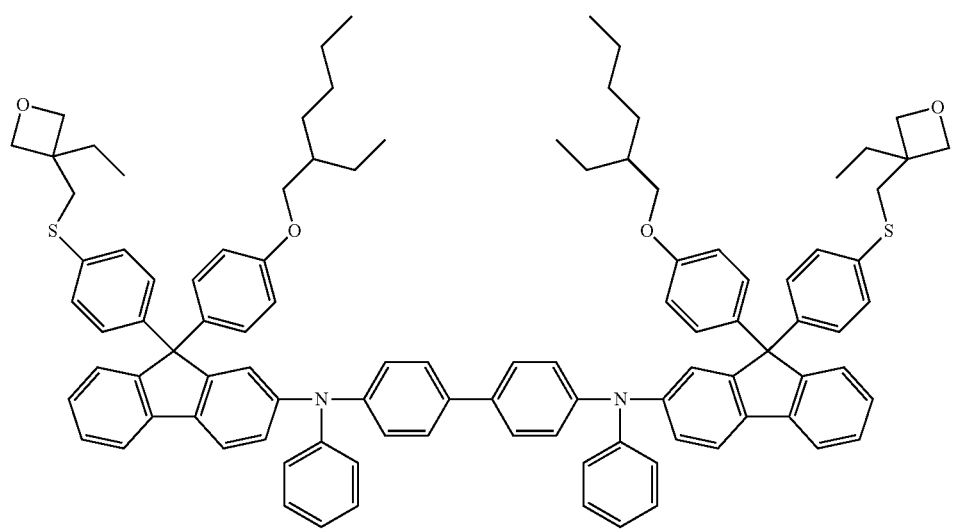
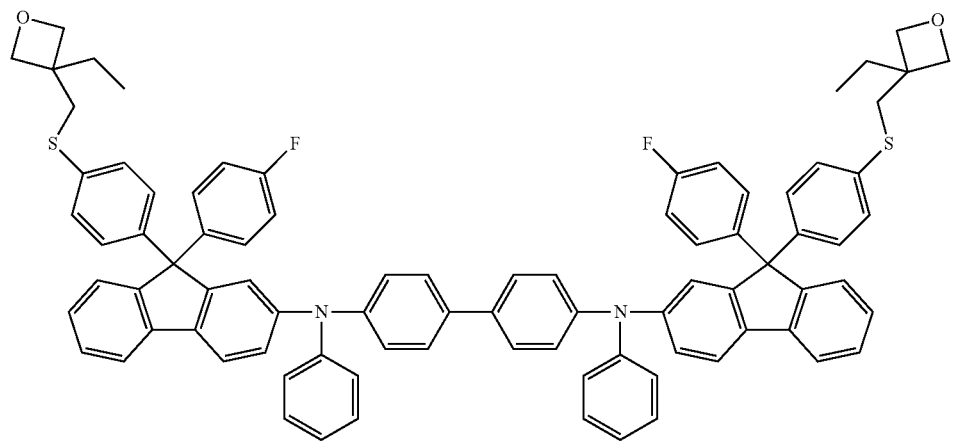

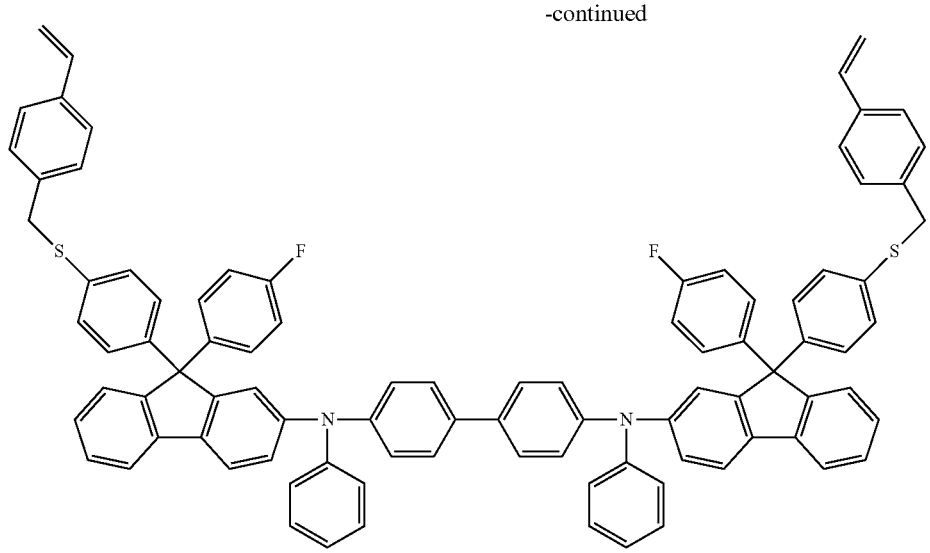
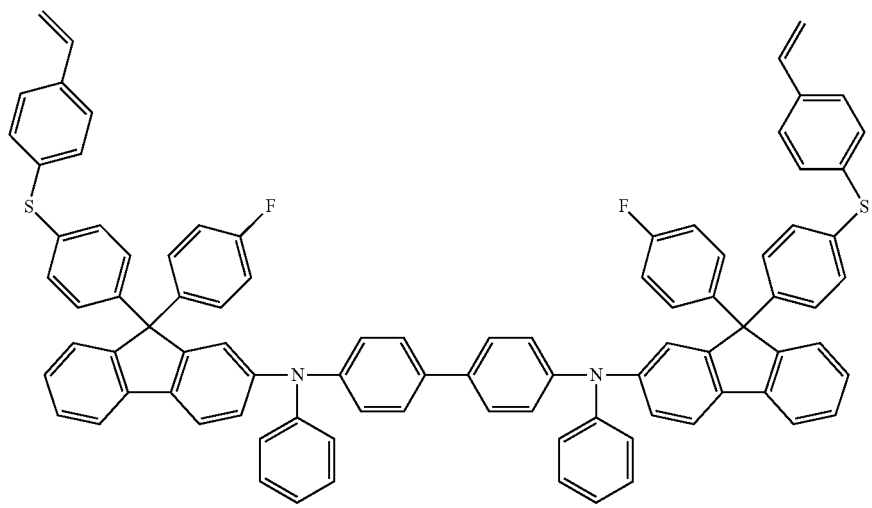
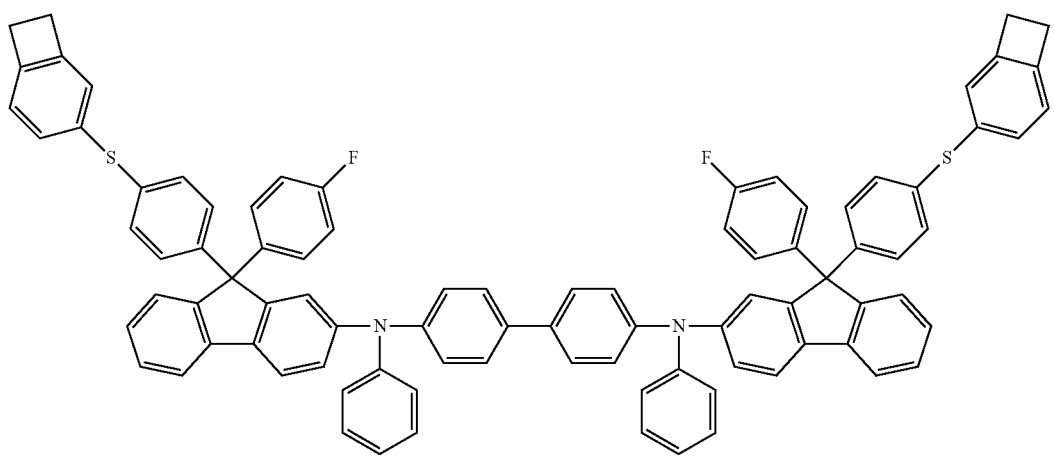

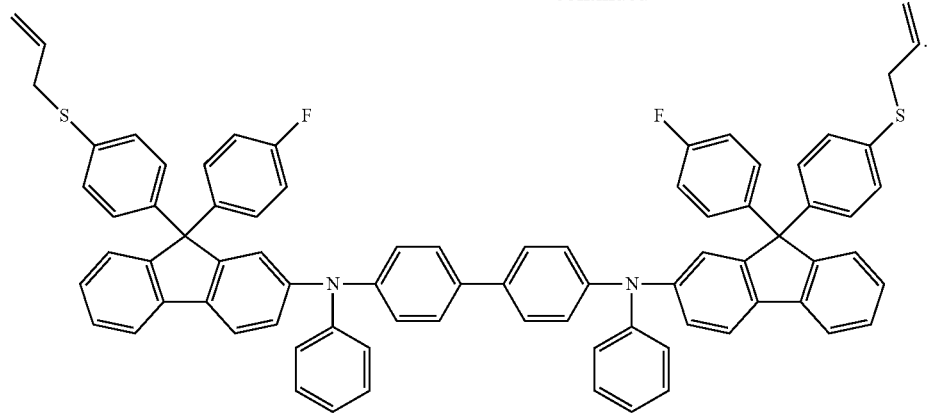

Preferably, the polymer is formed by the compound represented by Chemical Formula 1 through 1 to 4 crosslinks and the compound represented by Chemical Formula 4 through 1 to 6 crosslinks.

Preferably, the weight ratio of the compound represented by Chemical Formula 1 and the compound represented by Chemical Formula 4 may be 1:99 to 99:1, more preferably 5:95 to 40:60.

Preferably, the weight average molecular weight of the polymer may be 10,000 to 1,000,000 g/mol, more preferably 10,000 to 60,000 g/mol.

Preferably, the polydispersity index of the polymer may be 1 to 10, more preferably 1 to 5.5.

(Polymer)

The polymer according to the present disclosure can be prepared by curing the compound represented by Chemical Formula 1 and the compound represented by Chemical Formula 4. Preferably, the polymer according to the present disclosure is a random copolymer including a compound represented by Chemical Formula 1 and a compound represented by Chemical Formula 4.

Preferably, the weight average molecular weight of the polymer is 10,000 to 1,000,000 g/mol.

(Coating Composition)

The polymer according to the present disclosure can form an organic material layer, particularly a hole injection layer, a hole transport layer, or a layer that simultaneously performs hole injection and hole transport by a solution process, of an organic light emitting device by a solution process. For this purpose, the present disclosure provides a coating composition comprising the above-mentioned polymer according to the present disclosure and a solvent.

The solvent is not particularly limited as long as it is a solvent capable of dissolving or dispersing the polymer according to the present disclosure. Examples of the solvent may include chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butyl benzoate and methyl-2-methoxybenzoate; tetraline; 3-phenoxy-toluene, and the like. In addition, the above-mentioned solvents may be used singly or in combination of two or more solvents.

Further, the viscosity of the coating composition is preferably 1 cP to 10 cP, and coating is made easy within the above range. Further, in the coating composition, the concentration of the polymer according to the present disclosure is preferably 0.1 wt/v % to 20 wt/v %.

Further, the coating composition may further include one or two or more additives selected from the group consisting of a thermal polymerization initiator and a photopolymerization initiator.

Examples of the thermal polymerization initiator may include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5, 5-trimethylhexanoyl peroxide, lauryl peroxide, and benzoyl peroxide, and azo-based nitriles such as azobis isobutylnitrile, azobis dimethylvaleronitrile and azobis cyclohexylnitrile, but are not limited thereto.

Examples of the photopolymerization initiator may include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one and 1-phenyl-1,2-propanedion-2-(o-ethoxycarbonyl)oxime; benzoin ether-based photopolymerization initiators such as benzoin, benzoin methyl ether and benzoin ethyl ether; benzophenone-based photopolymerization initiators such as benzophenone, 4-hydroxybenzophenone, 2-benzoyl naphthalene, 4-benzoylbiphenyl and 4-benzoylphenyl ether; thioxanthone-based photopolymerization initiators such as 2-isopropylthioxanthone, 2-chlorothioxanthone, 2,4-dimethylthioxanthone, 2,4-diethylthioxanthone and 2,4-dichlorothioxanthone; and other photopolymerization initiators such as ethyl anthraquinone, 2,4,6-trimethylbenzoyl diphenylphosphine oxide, 2,4,6-trimethylbenzoyl phenylethoxyphosphine oxide, bis(2,4,6-trimethylbenzoyl)phenylphosphine oxide, and bis(2,4-dimethoxy benzoyl)-2,4,4-trimethylpentylphosphine oxide, but are not limited thereto.

In addition, those having a photopolymerization accelerating effect may be used either alone or as a combination with the photopolymerization initiator. Examples thereof may include triethanolamine, methyldiethanolamine, ethyl 4-dimethylaminobenzoate, isoamyl 4-dimethylaminobenzoate, (2-dimethylamino)ethyl benzoate, 4,4-methylaminobenzophenone and the like, but are not limited thereto.

In another embodiment of the present disclosure, there is provided a method for forming an organic material layer using the above-mentioned coating composition. Specifically, the method includes the steps of: coating the coating composition according to the present disclosure on the anode, or on the hole injection layer, the hole transport layer or the layer that simultaneously performs hole injection and hole transport, formed on the anode by a solution process; and heat treating or light treating the coated coating composition.

The solution process uses the above-mentioned coating composition according to the present disclosure, and refers to spin coating, dip coating, doctor blading, inkjet printing, screen printing, spray method, roll coating, and the like, but is not limited thereto.

The heat treatment temperature in the heat treatment step is preferably from 150 to 230° C. Further, a heat treatment time may be from 1 minute to 3 hours, more preferably 10 minutes to 1 hour. Further, the heat treatment is preferably carried out in an inert gas atmosphere such as argon and nitrogen. Further, the method may further include a step of evaporating the solvent between the coating step and the heat treatment or light treatment step.

(Organic Light Emitting Device)

In another embodiment of the present disclosure, there is provided an organic light emitting device including the above-described polymer according to the present disclosure. Specifically, the present disclosure provides an organic light emitting device comprising: a first electrode; a second electrode that is provided opposite to the first electrode; and one or more organic material layers that are provided between the first electrode and the second electrode, wherein the organic material layers include a polymer according to the present disclosure.

Preferably, the organic material layer containing the polymer may be a hole injection layer, a hole transport layer, or a layer that simultaneously performs hole injection and hole transport, more preferably a hole injection layer.

The structure of the organic light emitting device according to one embodiment of the present disclosure is illustrated in FIGS. 1 and 2.

FIG. 1 shows an example of an organic light emitting device comprising a substrate 1, an anode 2, a hole injection layer 3, a light emitting layer 4, and a cathode 5.

FIG. 2 shows an example of an organic light emitting device comprising a substrate 1, an anode 2, a hole injection layer 3, a hole transport layer 6, a light emitting layer 4, an electron transport layer 7, an electron injection layer 8, and a cathode 5.

The organic light emitting device according to the present disclosure may be manufactured by materials and methods known in the art, except that the organic material layer includes the polymer according to the present disclosure and is manufactured according to the above-described method.

For example, the organic light emitting device according to the present disclosure can be manufactured by sequentially stacking an anode, an organic material layer and a cathode on a substrate. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon. In addition to such a method, the organic light emitting device may be manufactured by sequentially depositing a cathode material, an organic material layer and an anode material on a substrate.

In addition, when manufacturing an organic light emitting device including the polymer according to the present disclosure, it may be formed as an organic material layer by a solution coating method as well as a vacuum deposition method. In particular, the polymer prepared by curing the compound represented by Chemical Formula 1 and the compound represented by Chemical Formula 4 has excellent solubility in a solvent used in the solution coating method, and thus it is easy to apply the solution coating method. Herein, the solution coating method means a spin coating, a dip coating, a doctor blading, an inkjet printing, a screen printing, a spray method, a roll coating, or the like, but is not limited thereto.

As an example, the first electrode is an anode, and the second electrode is a cathode, or alternatively, the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to an electron injection layer or the electron injection material, and further is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The light emitting material is preferably a material which may receive holes and electrons transported from a hole transport layer and an electron transport layer, respectively, and combine the holes and the electrons to emit light in a visible ray region, and has good quantum efficiency to fluorescence or phosphorescence. Specific examples of the light emitting material include an 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene)(PPV)-based polymer; a spiro compound; polyfluorene, rubrene, and the like, but are not limited thereto.

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

The electron transport layer is a layer which receives electrons from an electron injection layer and transports the electrons to a light emitting layer, and an electron transport material is suitably a material which may receive electrons well from a cathode and transfer the electrons to a light emitting layer, and has a large mobility for electrons. Specific examples of the electron transport material include: an Al complex of 8-hydroxyquinoline; a complex including $Alq_3$; an organic radical compound; a hydroxyflavone-metal complex, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and the electron injection material is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples of the electron injection material include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present disclosure may be a front side emission type, a back side emission type, or a double side emission type according to the used material.

In addition, the polymer according to the present disclosure may be included in an organic solar cell or an organic transistor in addition to an organic light emitting device.

The preparation of the polymer according to the present disclosure and the organic light emitting device containing the same will be described in detail in the following examples. However, these examples are presented for illustrative purposes only, and are not intended to limit the scope of the present disclosure.

Preparation Example 1: Preparation of Compound 1

Step 1) Preparation of Intermediate 1-1

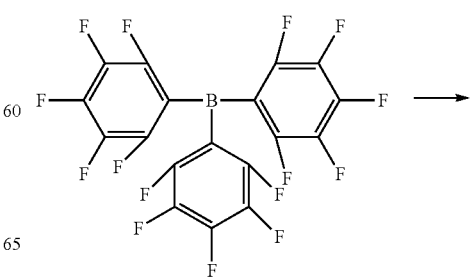

-continued

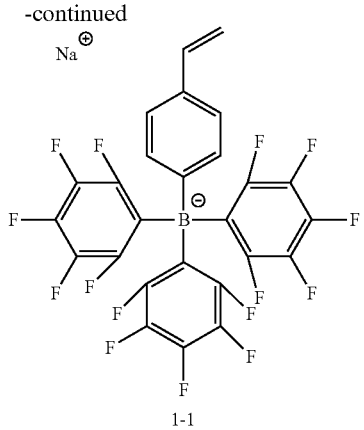

1-1

Mg (193 mg, 7.9208 mmol), I₂ (4 mg) and tetrahydrofuran (THF) (10 mL) were placed in a 100 mL round bottom flask under a nitrogen atmosphere, and stirred for 30 minutes. 4-Bromostyrene (1.04 mL, 7.9208 mmol) was added thereto, and the mixture was stirred for a day while a 30° C. water bath was placed under the round bottom flask. Dissolution of Mg was identified by the solution becoming black. 5 mL of ether was added thereto to dilute the reaction solution. Tris(pentafluorophenyl)borane (1 g, 3.9604 mmol) was dissolved in 5 mL of ether and slowly added to the reaction solution for 30 minutes. The solution was stirred for a day. Na₂CO₃ (0.1 M, 80 mL, 8.0 mmol) was slowly added to the reaction solution. The organic solvent was extracted using ethyl acetate (20 mL×3), and residual water was removed with MgSO₄. In order to additionally remove residual water and impurities, the result was distilled with benzene using a Dean-stark. When approximately 10 mL of the solvent was left, the solution was cooled and filtered to give 1.6 g of a target compound. (Yield: 64%).

Step 2) Preparation of Compound 1

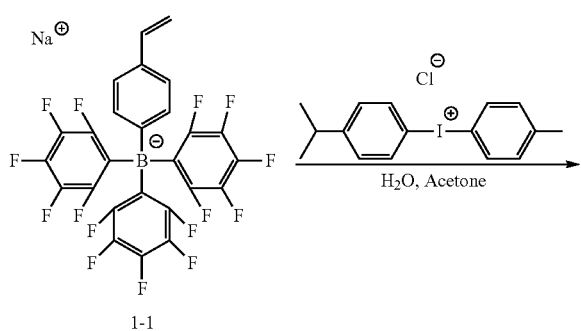

Sodium tris(perfluorophenyl)(4-vinylphenyl)borate (100 mg, 0.1567 mmol), distilled water (10 mL) and (4-isopropylphenyl) (p-tolyl)iodonium chloride (70 mg, 0.1881 mmol) were placed in a 25 mL round bottom flask, and the mixture was stirred for 1 hour. When 15 mL of acetone was added to the reaction solution, a precipitate was formed. The precipitate was filtered and dried to give 120 mg of Compound 1. (Yield: 81%)

Preparation Example 2: Preparation of Compound 2

Step 1) Preparation of Intermediate 2-1

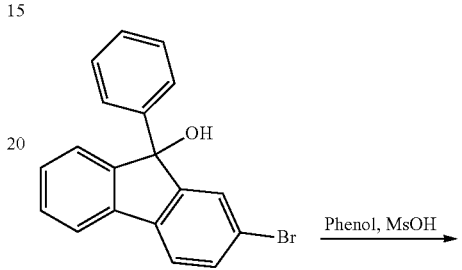

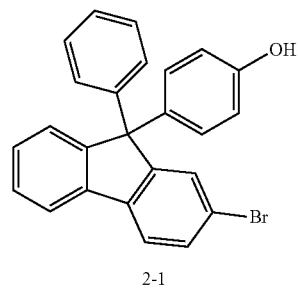

2-1

50 g (148.3 mmol, 1.0 eq) of 2-bromo-9-phenyl-9H-fluoren-9-ol, and 41.8 g (444.9 mmol, 3.0 eq) of phenol were placed in a 500 mL round bottom flask, and dissolved in 200 ml (0.74 M) of methanesulfonic acid. A Dean-stark apparatus was installed and the mixture was stirred under reflux overnight. Then, the reaction was stopped with a saturated NaHCO₃ aqueous solution, and the organic layer was extracted with ethyl acetate [EA]. The organic layer was dried with magnesium sulfate, and then the solvent was removed and purified by column chromatography to give an intermediate compound 2-1.

2) Preparation of Intermediate 2-2

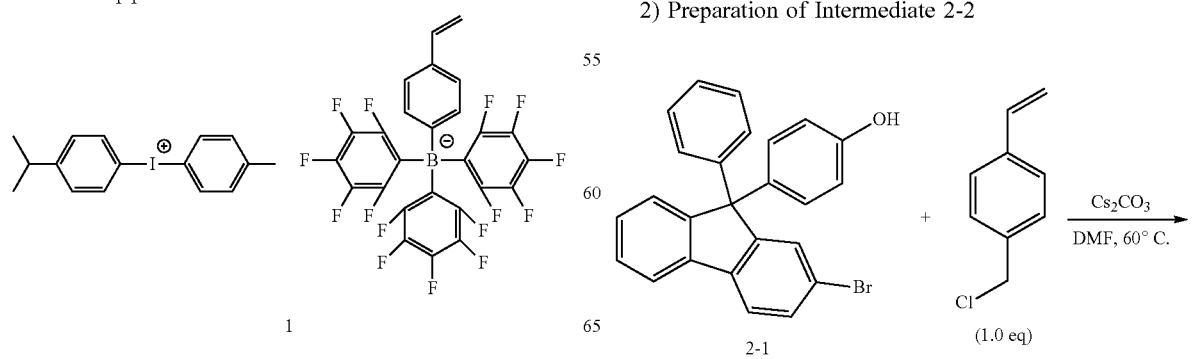

-continued

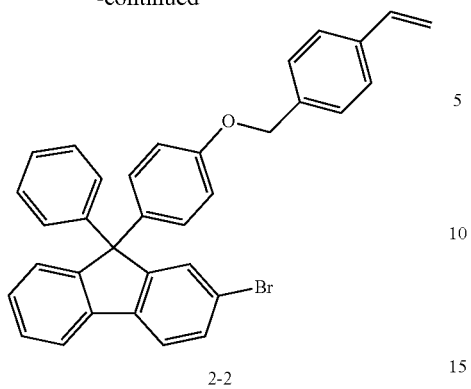

2-2

30 g (63.9 mmol, 1.0 eq) of Intermediate 2-1 and 41.6 g (127.8 mmol, 2.0 eq) of cesium carbonate were dissolved in 120 ml (0.5 M) of DMF in a 500 ml round flask, and heated to 50° C. and stirred. Then, 9.15 ml (9.75 g, 1.0 eq) of 4-vinylbenzylchloride was added thereto and stirred at 60° C. After cooling to room temperature [RT], water was added thereto to stop the reaction, and then the organic layer was extracted using ethyl acetate [EA]. The organic layer was separated, dried over magnesium sulfate, and then the solvent was removed and purified by column chromatography to give an intermediate 2-2.

3) Preparation of Compound 2

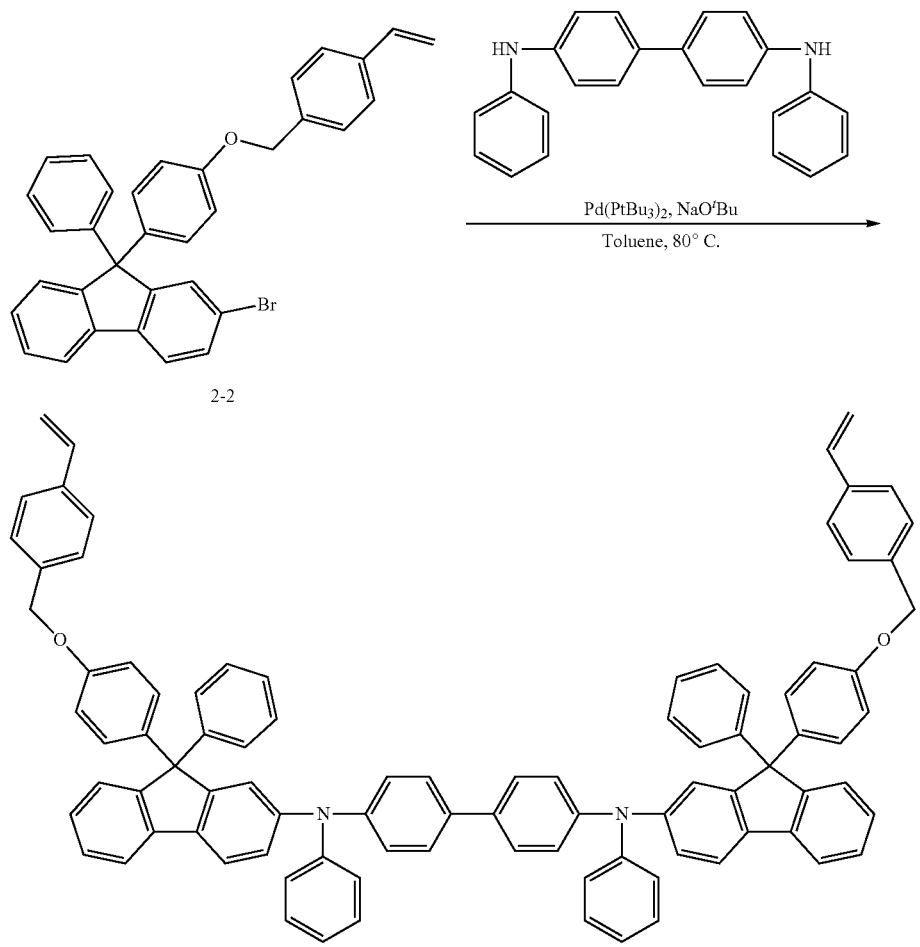

2

12.0 g (20.49 mmol, 2.05 eq) of Intermediate 2-2, 3.36 g (10.0 mmol, 1.0 eq) of N4,N4-diphenyl[1,1-biphenyl]-4,4-diamine), 3.36 g (34.99 mmol, 3.5 eq) of NaOtBu, and 255 mg (0.5 mmol, 0.05 eq.) of Pd(PtBu$_3$)$_2$ were dissolved in 100 ml of toluene in a 250 ml round flask, then stirred and reacted under a nitrogen atmosphere. Subsequently, when the reaction was completed, it was worked-up with water and ethyl acetate [EA], and the organic layer was separated, dried and then filtered. Subsequently, the solvent was removed with a rotary vacuum evaporator. The resulting crude material was purified by column chromatography and the solvent was removed to obtain Compound 1 as a white solid. The NMR data values of the compound 1 are as follows.

1H NMR (500 MHz): δ=8.00-7.82 (m, 4H), 7.70-7.68 (d, 4H), 7.62-7.55 (m, 6H), 7.35-7.15 (m, 38H), 7.05-7.03 (t, 2H), 6.92-9.85 (d, 4H), 6.73-6.70 (m, 2H), 5.76-5.73 (d, 2H), 5.39-5.37 (d, 2H), 5.17 (s, 4H)

Preparation Example 3. Preparation of Polymer 1

Compound 1 (0.3 g, 0.3150 mmol) and Compound 2 (0.7 g, 0.5679 mmol) were dissolved in THF (40 mL), to which AIBN (20 mg) was added, and then reacted at 60 degrees for 4 hours, and the temperature was lowered to room temperature, and then the reaction mixture was precipitated in ethanol. Thereby, the synthesized polymer 1 was prepared.

The weight average molecular weight and the number average molecular weight were measured by GPC using PS Standard with Agilent 1200 series, and the measured values are as follows.
Mn: 16,000 g/mol
Mw: 50,000 g/mol
Polydispersity index: 3.15

EXAMPLE

Example 1

A glass substrate on which ITO (indium tin oxide) was coated as a thin film to a thickness of 1,500 Å was put into distilled water in which a detergent was dissolved, and ultrasonically cleaned. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol and acetone, dried, and then the substrate was cleaned for 30 minutes, and then transferred to a glove box.

On the ITO transparent electrode thus prepared, the coating composition obtained by mixing the polymer 1 (20 mg) previously prepared and toluene (1 mg) was spin-coated to form a hole injection layer with a thickness of 300 Å, and the coating composition was cured on a hot plate in air for 1 hour. After being transferred to a vacuum depositor, the following α-NPD was vacuum-deposited on the hole injection layer to form a hole transport layer with a thickness of 40 nm.

The following Alq$_3$ was vacuum deposited (50 nm) on the hole transport layer to form a light emitting layer. LiF and aluminum were deposited to have a thickness of 0.5 nm and 100 nm, respectively, on the light emitting layer, thereby forming a cathode.

In the above-mentioned process, the vapor deposition rate of the organic material was maintained at 0.4 to 0.7 Å/sec, the deposition rate of LiF was maintained at 0.3 Å/sec, the deposition rate of aluminum was maintained at 2 Å/sec, and the degree of vacuum during the deposition was maintained at $2 \times 10^{-7}$ to $3 \times 10^{-5}$ torr.

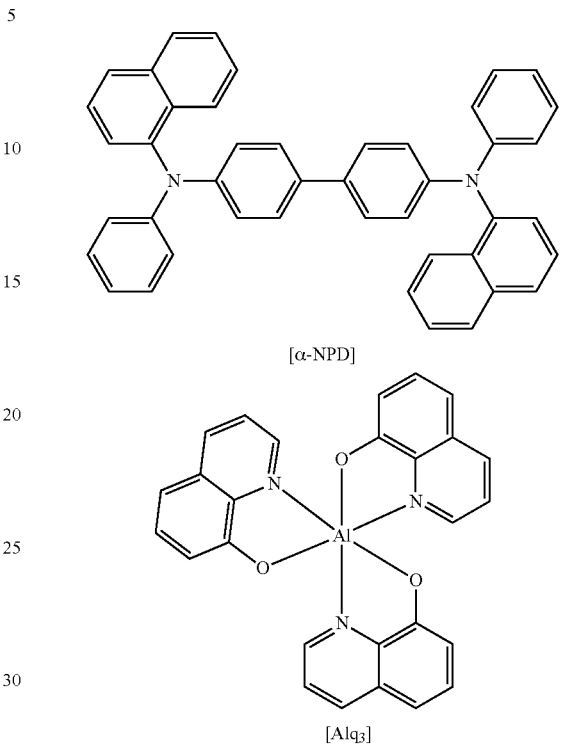

[α-NPD]

[Alq$_3$]

Comparative Example 1

The organic light emitting devices were manufactured in the same manner as in Example 1, except that Compound 1 (1 mg) and Compound 2 (20 mg) were mixed and used instead of Polymer 1 in Example 1.

The driving voltage, current efficiency, quantum efficiency (QE), and luminance values of the organic light emitting devices manufactured in Example 1 and Comparative Example 1 were measured at a current density of 10 mA/cm$^2$, and the time (T90) required for the luminance to be reduced to 90% of the initial luminance was measured at a current density of 10 mA/cm$^2$. The results are shown in Table 1 below.

TABLE 1

| Device | Driving voltage (V) | Current efficiency (cd/A) | QE(%) | Luminance (Cd/m$^2$) | Lifetime T90 (10 mA/cm$^2$) |
|---|---|---|---|---|---|
| Example 1 | 3.65 | 5.65 | 5.61 | 511.1 | 82.9 |
| Comparative Example 1 | 3.90 | 4.88 | 5.31 | 470.3 | 65.9 |

From the results in Table 1, it can be confirmed that Example 1 in which an organic light emitting device was manufactured using the polymer of the present disclosure has low driving voltage, and excellent current efficiency and quantum efficiency and also excellent life characteristics as compared with the organic light emitting device manufactured in Comparative Example 1.

DESCRIPTION OF SYMBOLS

1: substrate
2: anode
3: hole injection layer
4: light emitting layer
5: cathode
6: hole transport layer
7: electron transport layer
8: electron injection layer

The invention claimed is:

1. A polymer prepared by curing a compound represented by the following Chemical Formula 1 and a compound represented by the following Chemical Formula 4:

[Chemical Formula 1]

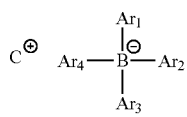

in the Chemical Formula 1, $C^{\oplus}$ is a cationic group, $Ar_1$ to $Ar_4$ are the same as or different from each other, at least one of $Ar_1$ to $Ar_4$ is represented by the following Chemical Formula 2, and the remaining $Ar_1$ to $Ar_4$ if present are represented by the following Chemical Formula 3,

[Chemical Formula 2]

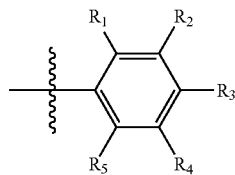

in the Chemical Formula 2, at least one of $R_1$ to $R_5$ is a photocurable/thermosetting functional group, the remaining $R_1$ to $R_5$ if present are each independently hydrogen; deuterium; F; a cyano group; a substituted or unsubstituted fluoroalkyl group; a nitro group; —C(O)$R_{100}$; —O$R_{101}$; —S$R_{102}$; —SO3$R_{103}$; —COO$R_{104}$; —OC(O)$R_{105}$; —C(O)N$R_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, $R_{100}$ to $R_{107}$ are each independently hydrogen; deuterium; or a substituted or unsubstituted alkyl group,

[Chemical Formula 3]

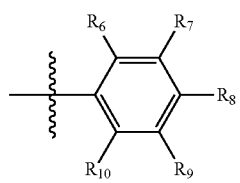

in the Chemical Formula 3, $R_6$ to $R_{10}$ are each independently a photocurable/thermosetting functional group; hydrogen; deuterium; F; a cyano group; a substituted or unsubstituted fluoroalkyl group; a nitro group; —C(O)$R_{100}$; —O$R_{101}$; —S$R_{102}$; —SO3$R_{103}$; —COO$R_{104}$; —OC(O)$R_{105}$; —C(O)N$R_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, $R_{100}$ to $R_{107}$ are each independently hydrogen; deuterium; or a substituted or unsubstituted alkyl group,

[Chemical Formula 4]

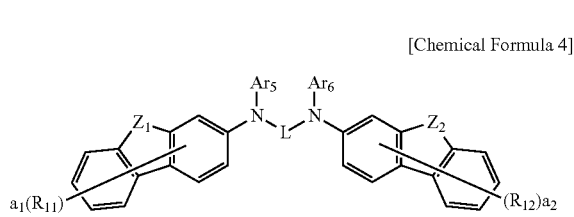

in the Chemical Formula 4, $Z_1$ and $Z_2$ are each independently $C(A_1)(A_2)$; O or S, $A_1$ and $A_2$ are each independently -$L_1$-$Y_1$, $Ar_5$ and $Ar_6$ are each independently a substituted or unsubstituted aryl group; a substituted or unsubstituted heteroaryl group; or -$L_2$-$Y_2$, L, $L_1$ and $L_2$ are each independently a substituted or unsubstituted arylene group; or a substituted or unsubstituted alkylene group, $Y_1$ and $Y_2$ are each independently hydrogen; or —$Z_3$-A, and at least one of $Y_1$ and $Y_2$ is —$Z_3$-A, $Z_3$ is O or S, A is a photocurable/thermosetting functional group, $a_1$ and $a_2$ are each independently an integer of 0 to 7, $R_{11}$ and $R_{12}$ are each independently hydrogen; deuterium; a nitro group; —C(O)$R_{200}$; —O$R_{201}$; —S$R_{202}$; —SO3$R_{203}$; —COO$R_{204}$; —OC(O)$R_{205}$; —C(O)N$R_{206}R_{207}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, and $R_{200}$ to $R_{207}$ are each independently hydrogen; deuterium; or a substituted or unsubstituted alkyl group.

2. The polymer of claim 1, wherein the photocurable/thermosetting functional group is each independently selected from the following photocurable/thermosetting functional groups:

[Photocurable/thermosetting functional group]

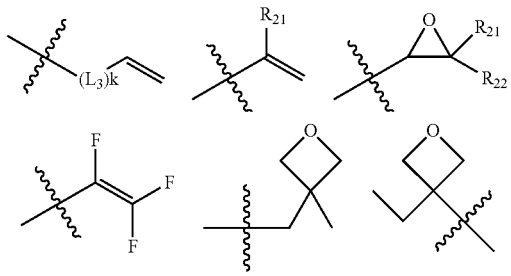

143

-continued

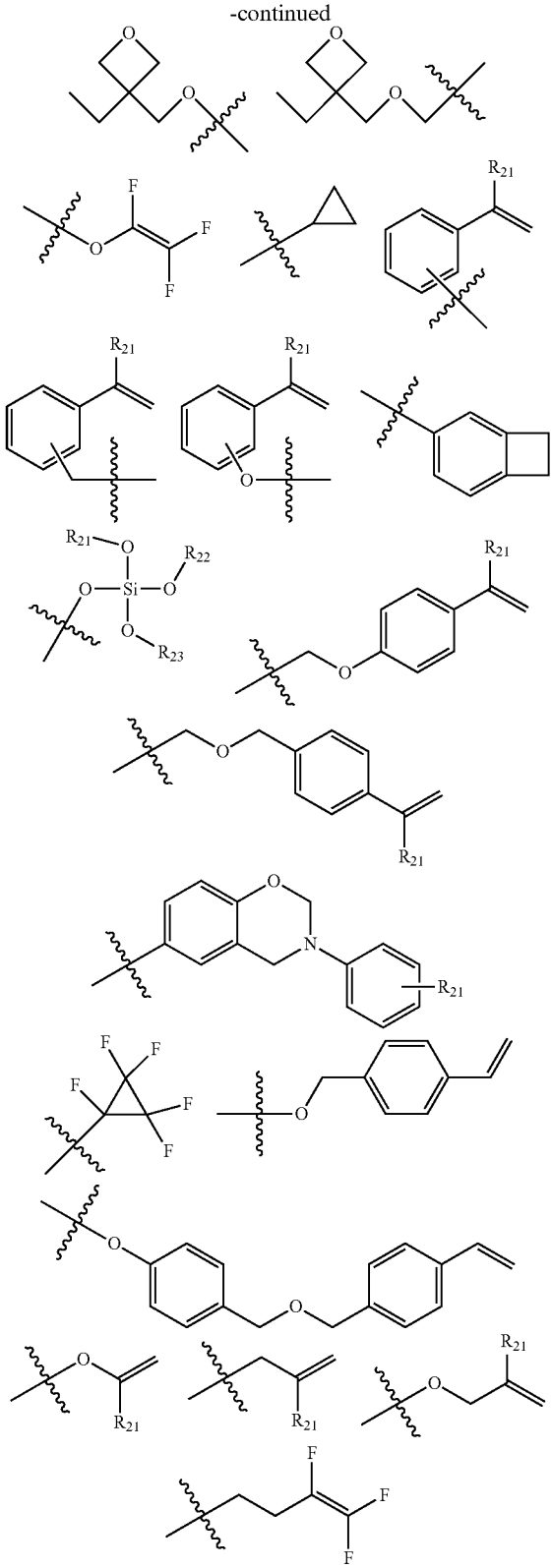

wherein,
L₃ is a direct bond; O; S; a substituted or unsubstituted alkylene group; a substituted or unsubstituted arylene group; or a substituted or unsubstituted divalent heterocyclic group,

144 k is an integer of 1 or 2, provided that when k is 2, L₃s are the same as or different from each other, and R₂₁ to R₂₃ are each independently hydrogen; or a substituted or unsubstituted alkyl group.

3. The polymer of claim 1, wherein
the Chemical Formula 2 is represented by any one of the following formulas:

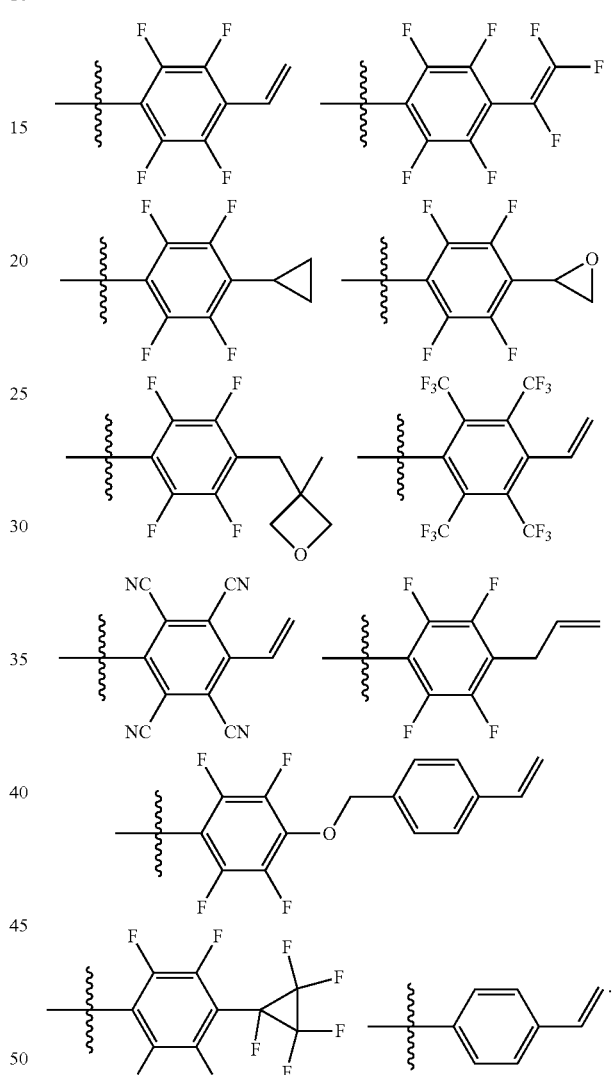

4. The polymer of claim 1, wherein
the compound represented by Chemical Formula 1 is any one selected from the group consisting of the following structural formulas:

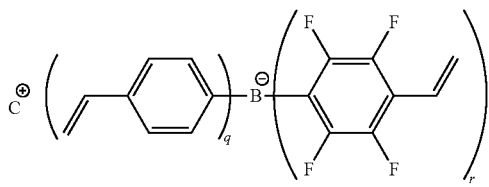

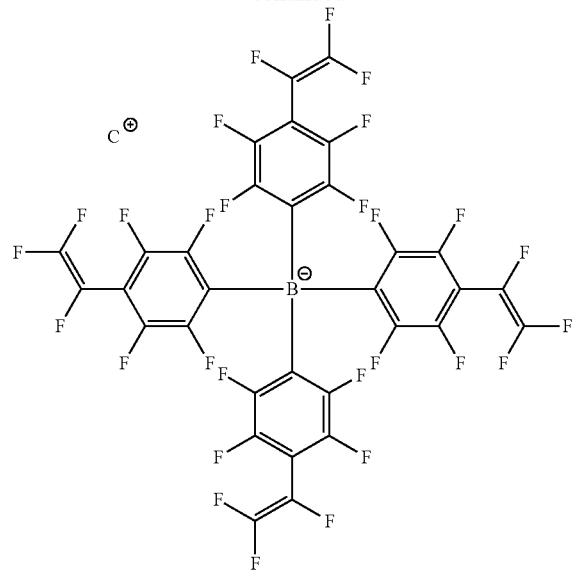
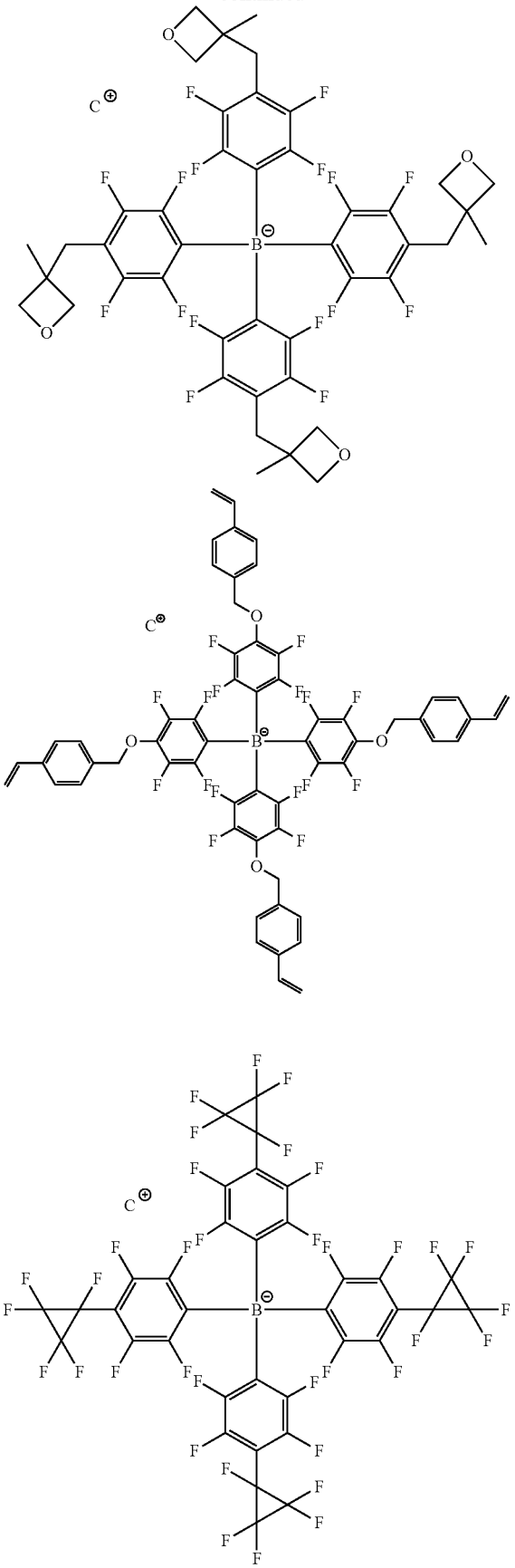

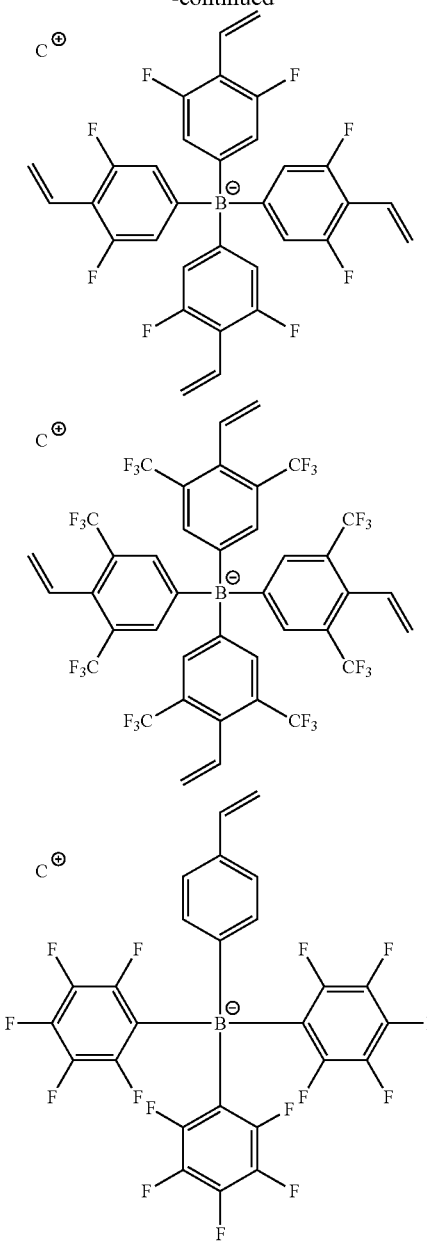
wherein,
r is an integer from 1 to 4,
q is an integer from 0 to 3, and
q+r=4.
5. The polymer of claim 1, wherein
the cationic group is any one selected from a monovalent cationic group.
6. The polymer of claim 1, wherein
the cationic group is any one selected from the group consisting of the following formulas:
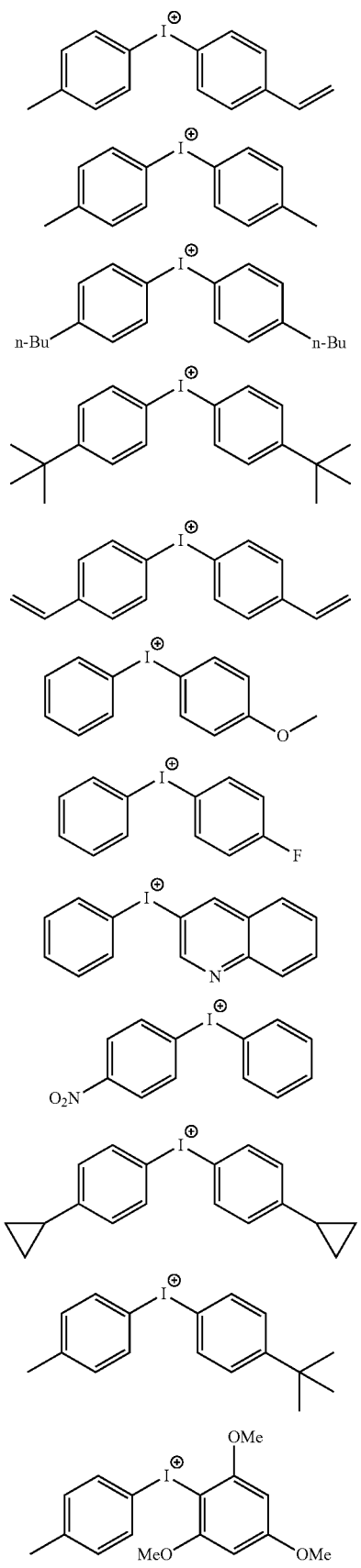

149
-continued
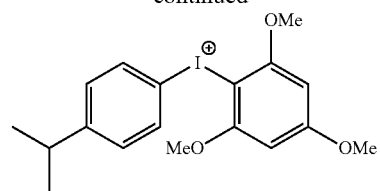
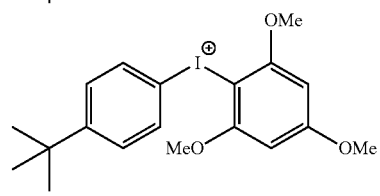
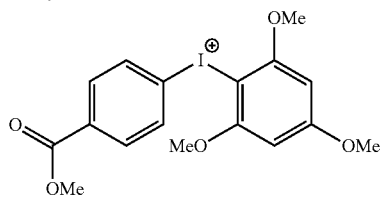
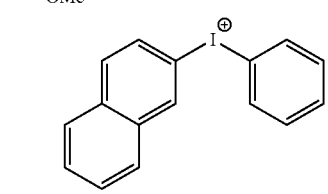
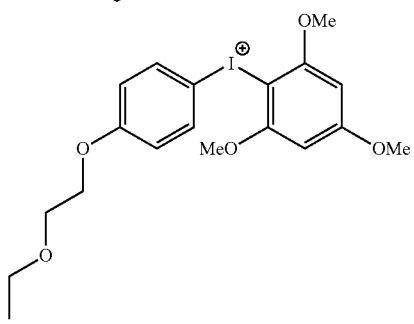
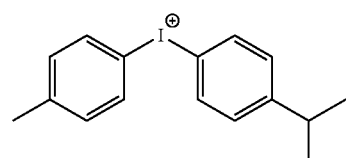
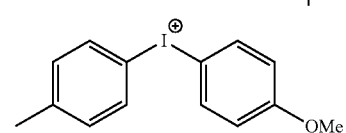
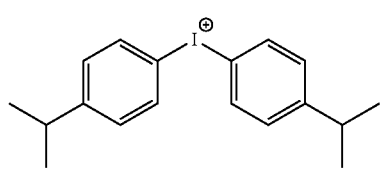
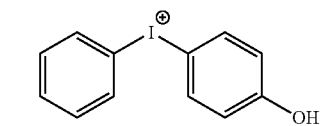
150
-continued
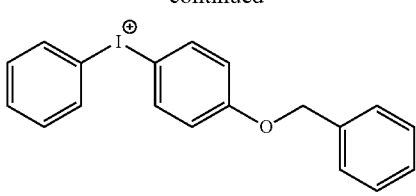
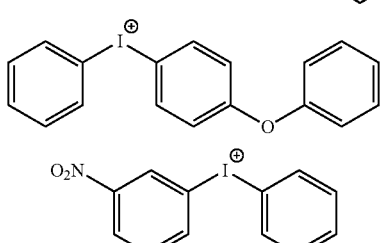
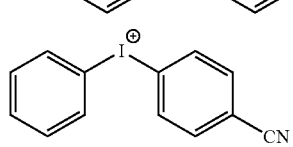
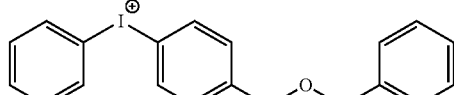
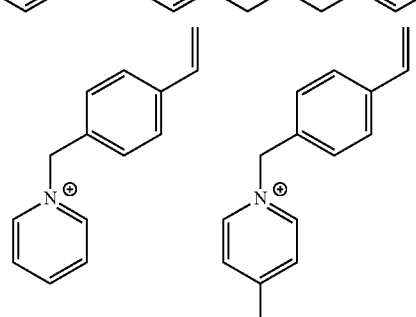
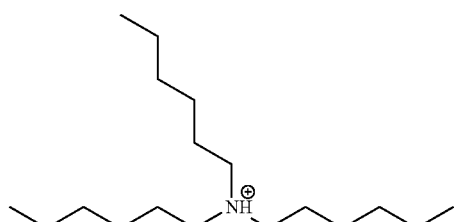
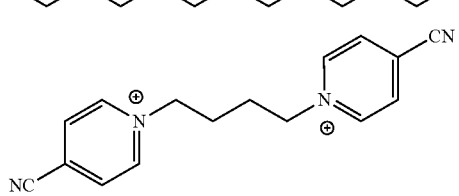
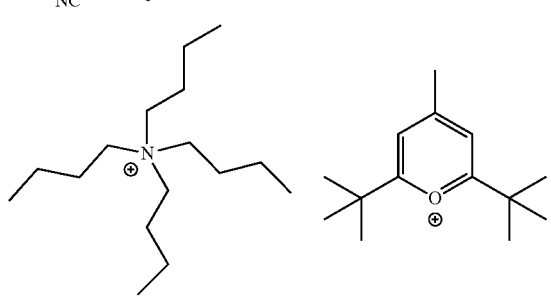

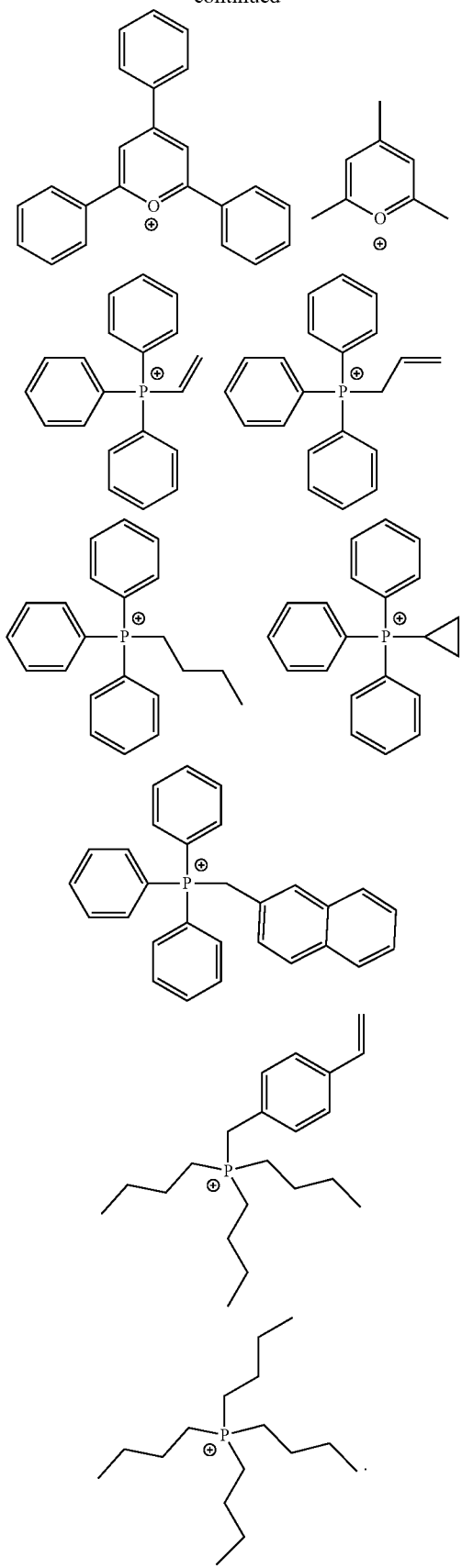
7. The polymer of claim 1, wherein
the compound represented by Chemical Formula 1 is any one selected from the group consisting of Chemical Formula 1-1-1 to Chemical Formula 1-1-20, Chemical Formula 1-2-1, Chemical Formula 1-2-3 to Chemical Formula 1-2-5, Chemical Formula 1-3-1 to Chemical Formula 1-3-4 and Chemical Formula 1-4-1:
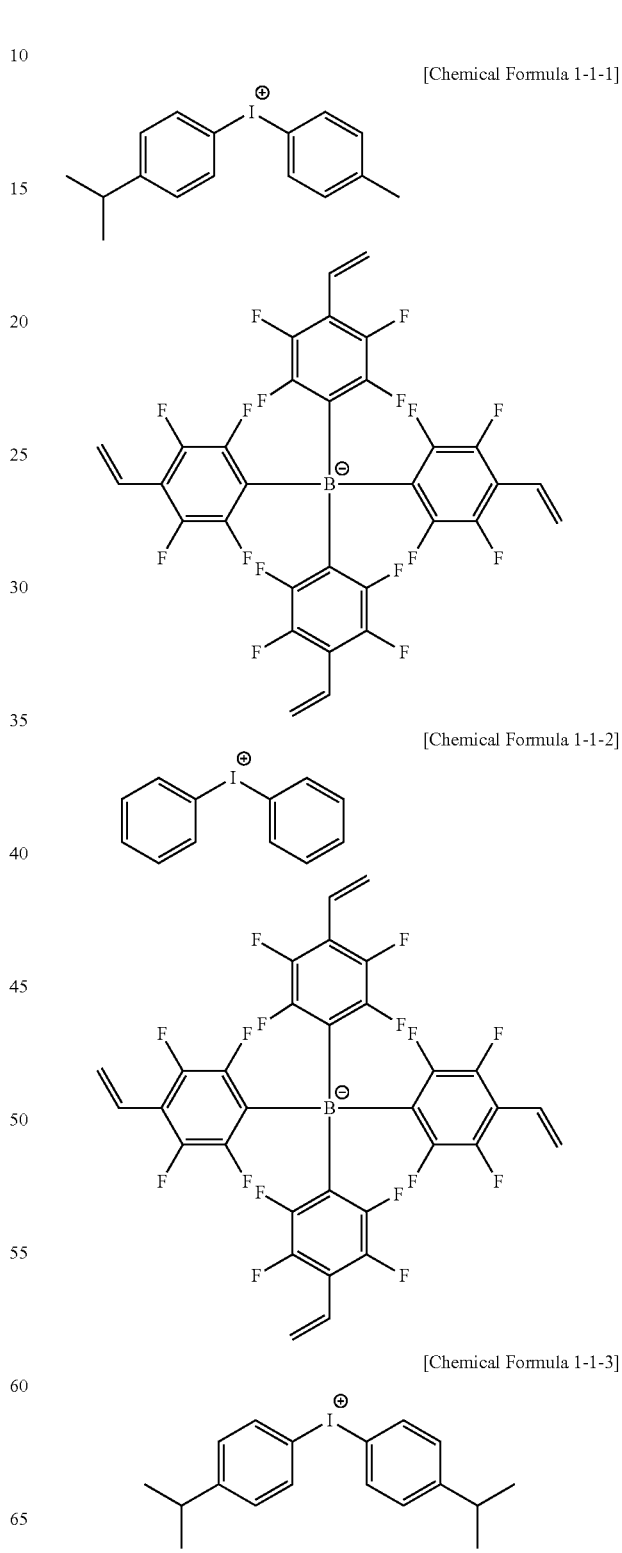

-continued
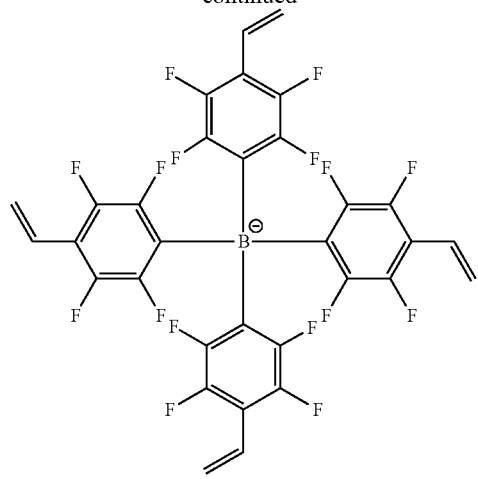
[Chemical Formula 1-1-4]
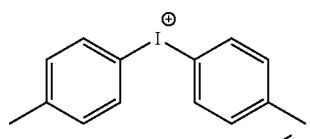
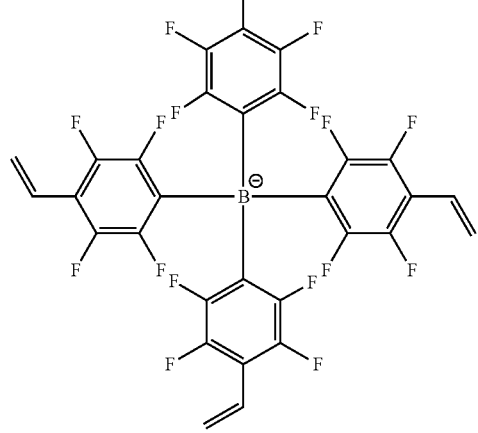
[Chemical Formula 1-1-5]
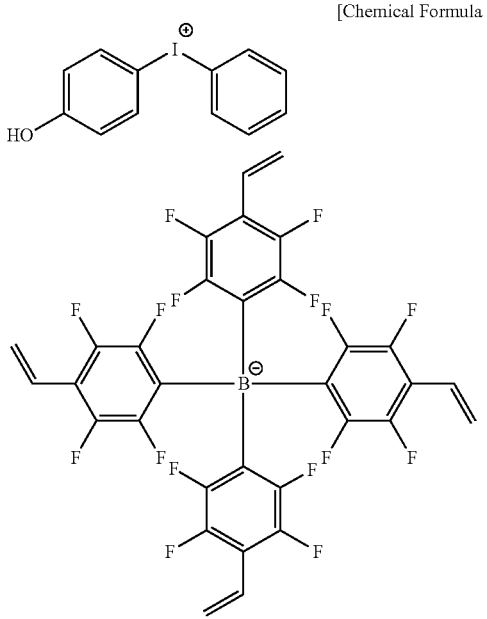
-continued
[Chemical Formula 1-1-6]
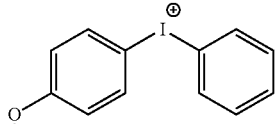
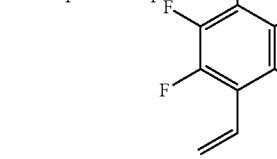
[Chemical Formula 1-1-7]
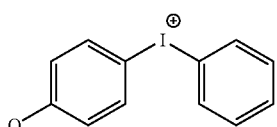
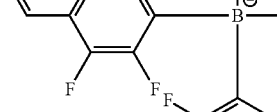
[Chemical Formula 1-1-8]

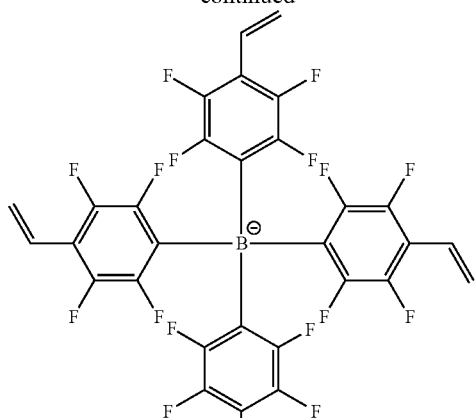
[Chemical Formula 1-1-9]
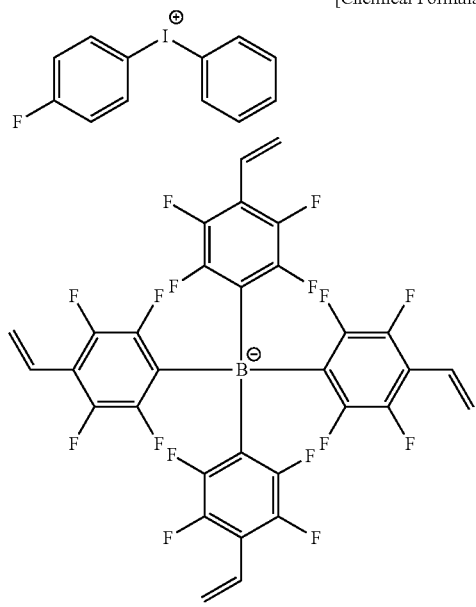
[Chemical Formula 1-1-10]
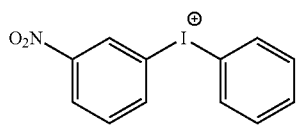
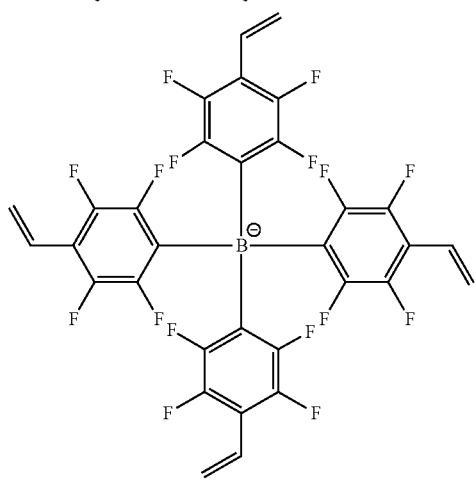
[Chemical Formula 1-1-11]
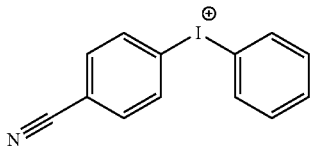
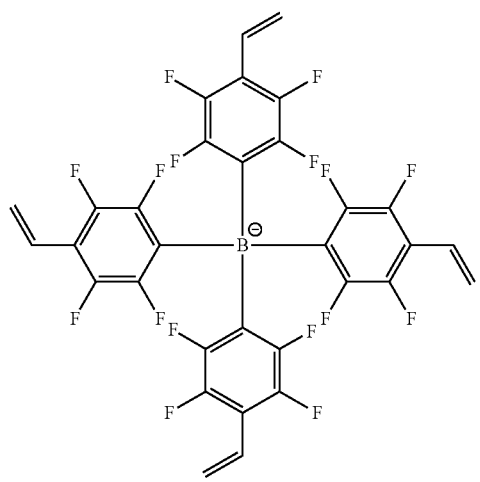
[Chemical Formula 1-1-12]
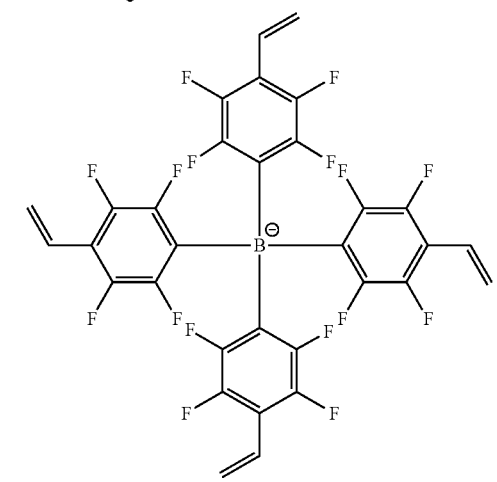
[Chemical Formula 1-1-13]
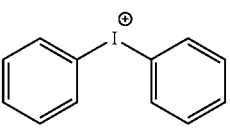

[Chemical Formula 1-1-14]

[Chemical Formula 1-1-15]

[Chemical Formula 1-1-16]

[Chemical Formula 1-1-17]

[Chemical Formula 1-1-18]
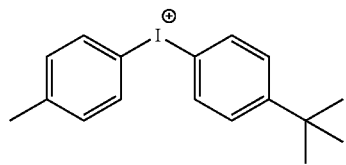
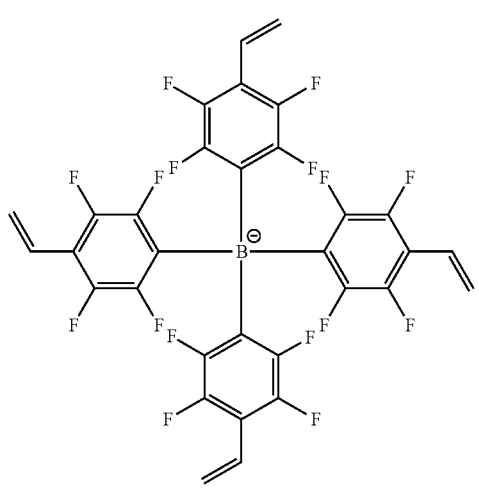
[Chemical Formula 1-1-19]
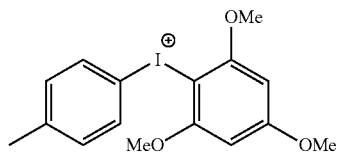
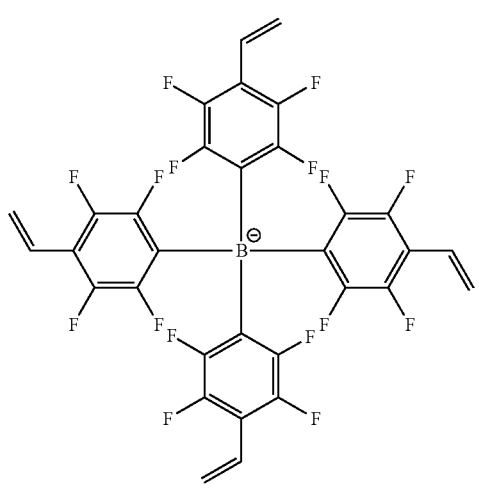
[Chemical Formula 1-1-20]
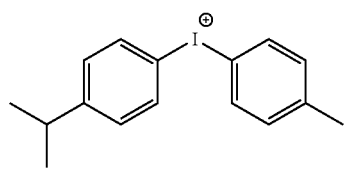
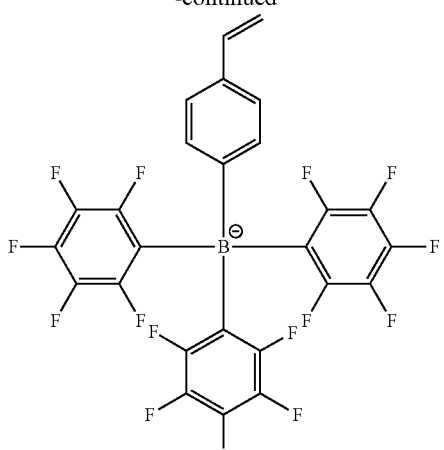
[Chemical Formula 1-2-1]
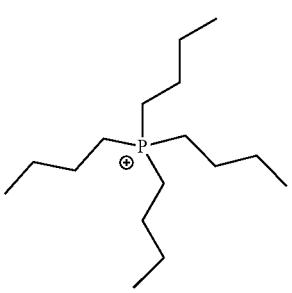
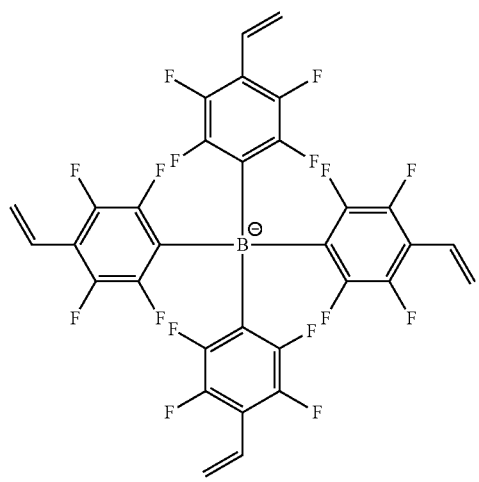
[Chemical Formula 1-2-3]
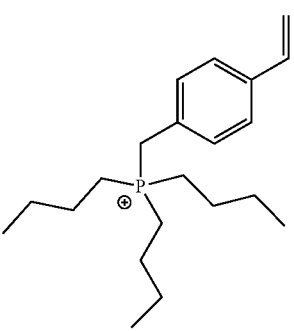

-continued
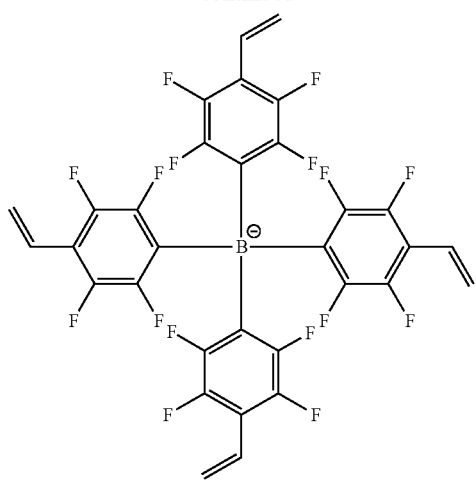
[Chemical Formula 1-2-4]
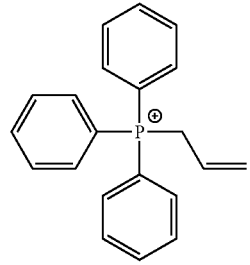
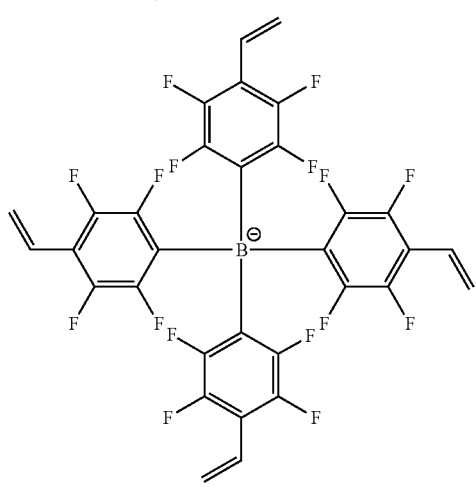
[Chemical Formula 1-2-5]
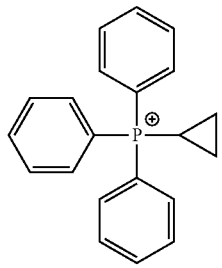
-continued
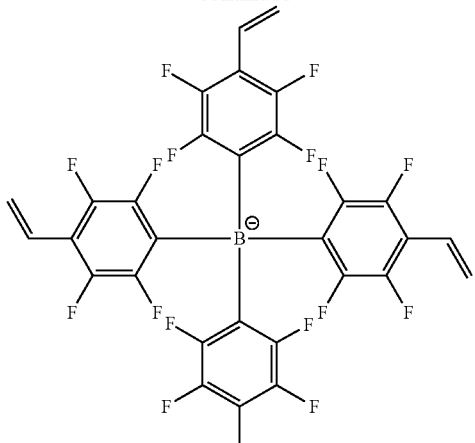
[Chemical Formula 1-3-1]
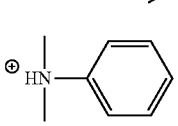
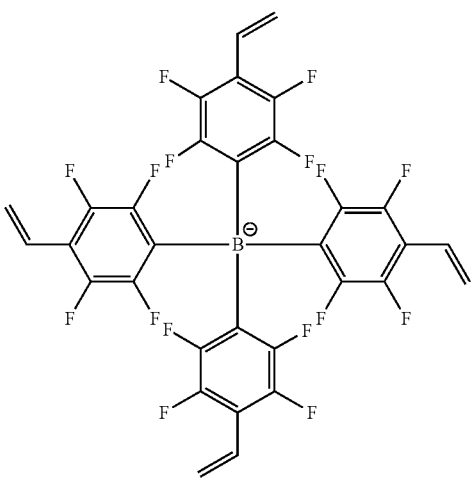
[Chemical Formula 1-3-2]
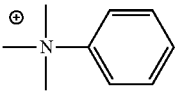
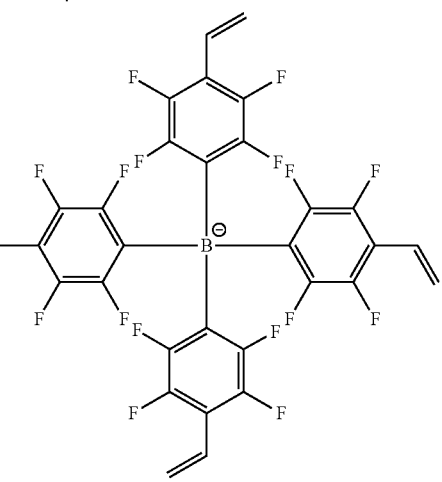

163
-continued
[Chemical Formula 1-3-3]
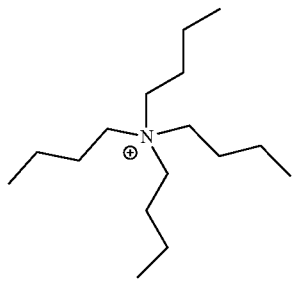
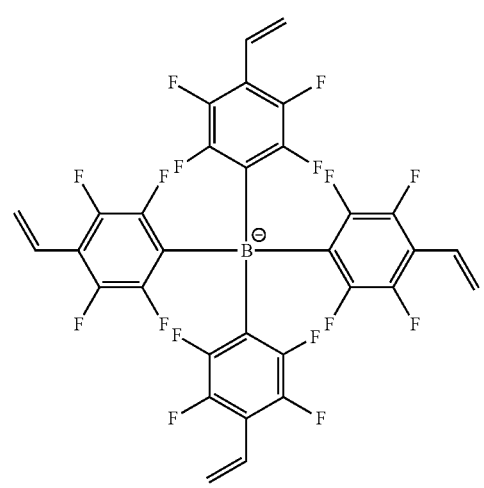
[Chemical Formula 1-3-4]
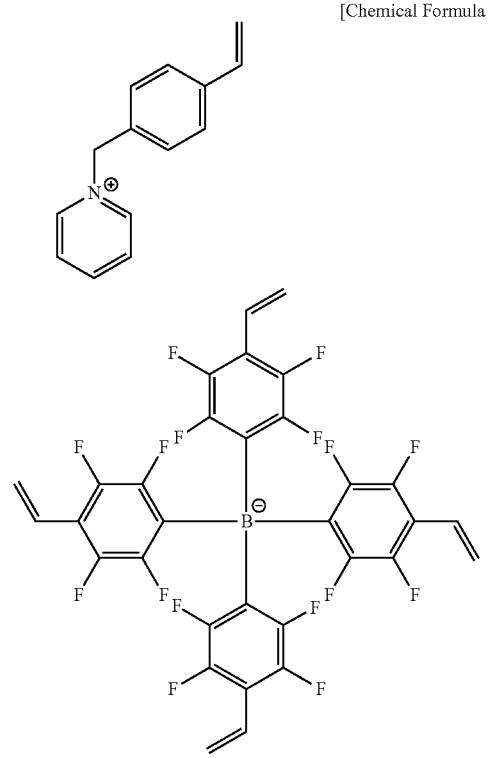
164
-continued
[Chemical Formula 1-4-1]
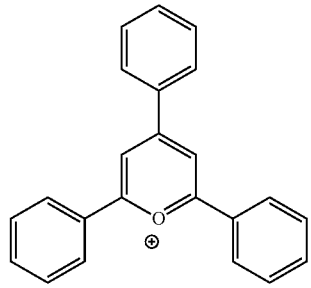
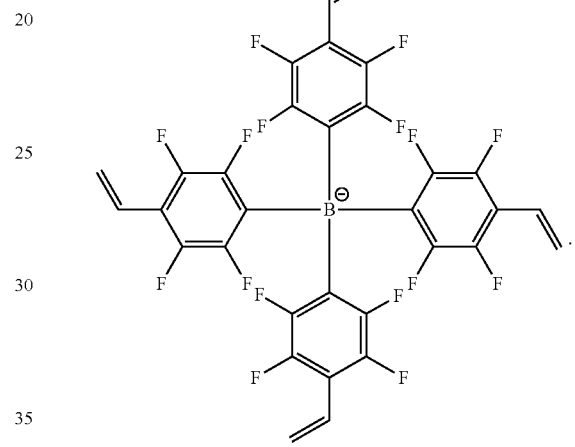
8. The polymer of claim 1, wherein the Chemical Formula 4 is represented by any one of the following Chemical Formulas 4-1 to 4-4:
[Chemical Formula 4-1]
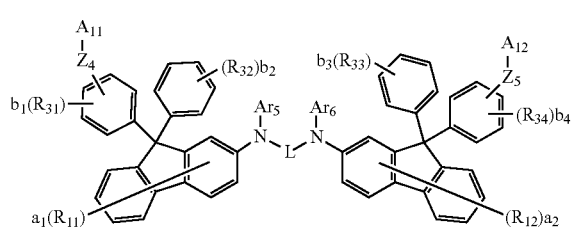
[Chemical Formula 4-2]
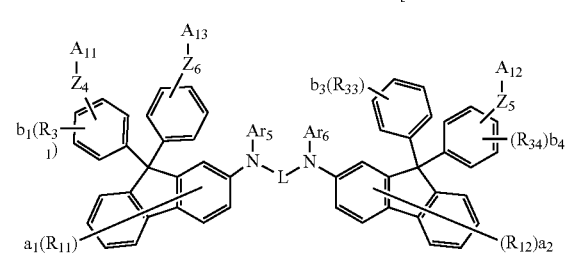

-continued

[Chemical Formula 4-3]

[Chemical Formula 4-4]

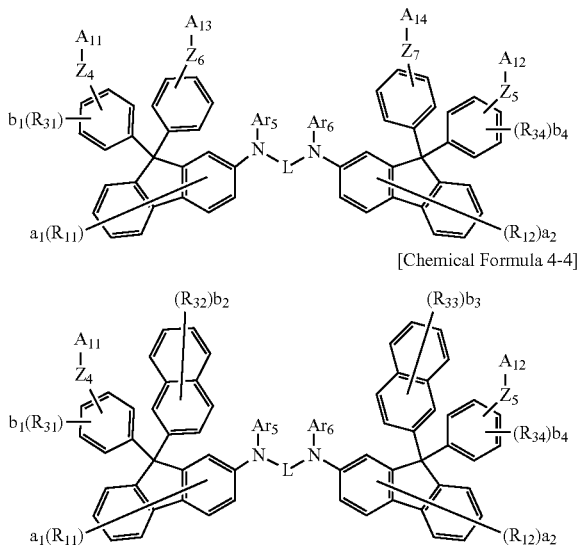

wherein, $a_1$, $a_2$, $R_{11}$, $R_{12}$, L, $Ar_5$ and $Ar_6$ are as defined in claim 1, $Z_4$ to $Z_7$ are each independently O or S, $A_{11}$ to $A_{14}$ are each independently a photocurable/thermosetting functional group, $R_{31}$ to $R_{34}$ are each independently hydrogen; deuterium; a halogen group; a substituted or unsubstituted alkyl group; a substituted or unsubstituted alkoxy group; a substituted or unsubstituted aryloxy group; a substituted or unsubstituted aryl group; or a substituted or unsubstituted heteroaryl group, and $b_1$ to $b_4$ are each independently an integer of 0 to 4.

9. The polymer of claim 1, wherein

L is a substituted or unsubstituted phenylene; a substituted or unsubstituted biphenyldiyl; a substituted or unsubstituted terphenyldiyl; or a substituted or unsubstituted quarterphenyldiyl.

10. The polymer of claim 1, wherein the compound represented by Chemical Formula 4 is any one selected from the group consisting of the following formulas:

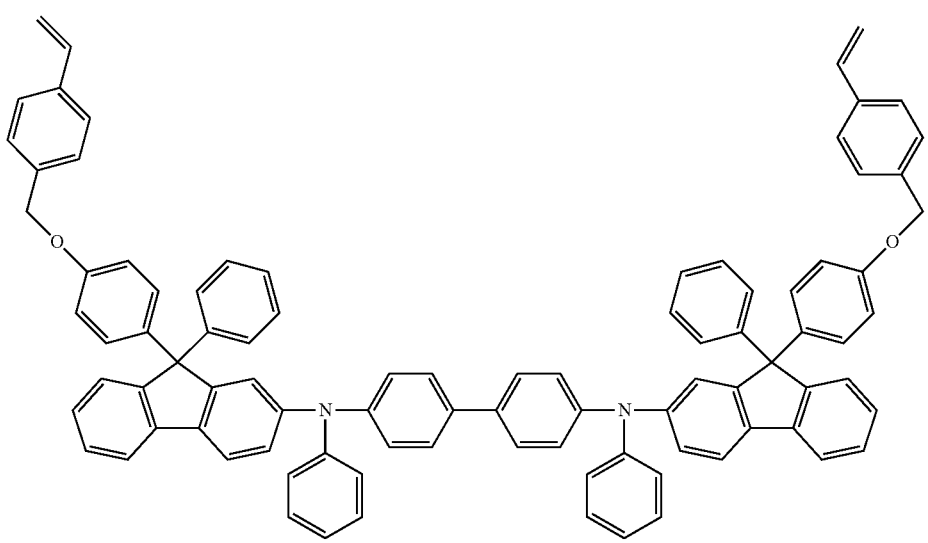

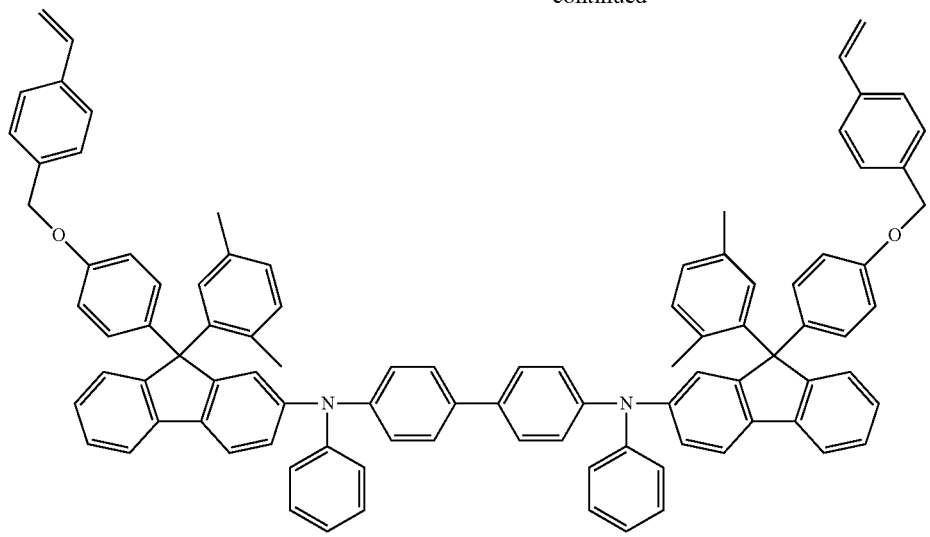
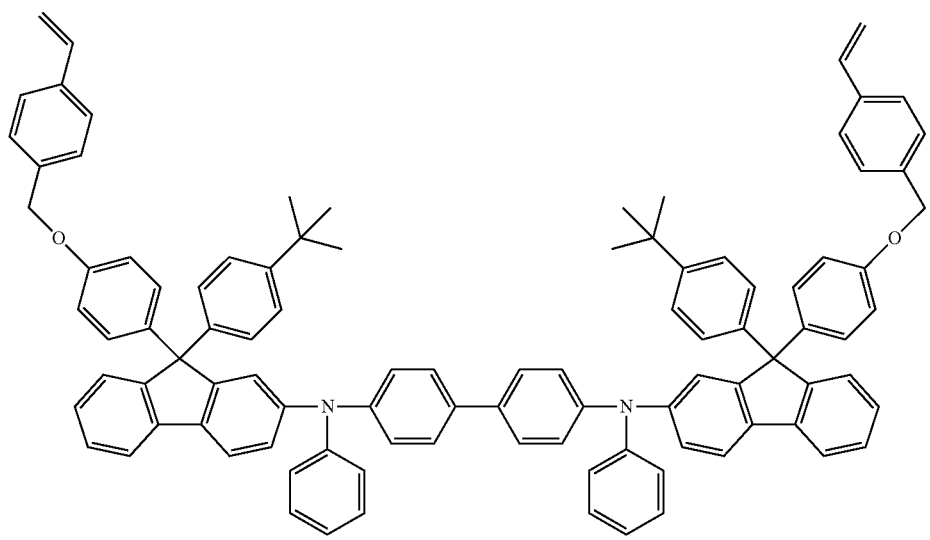
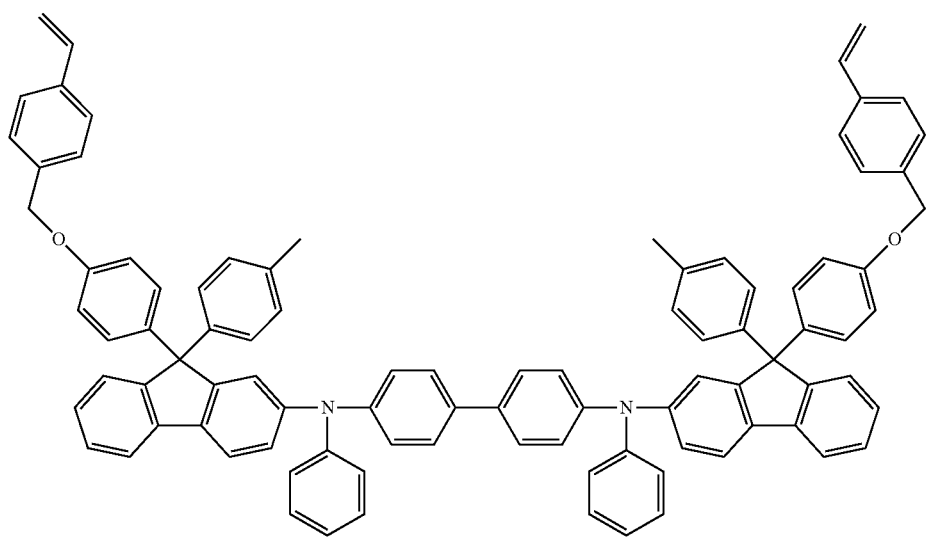

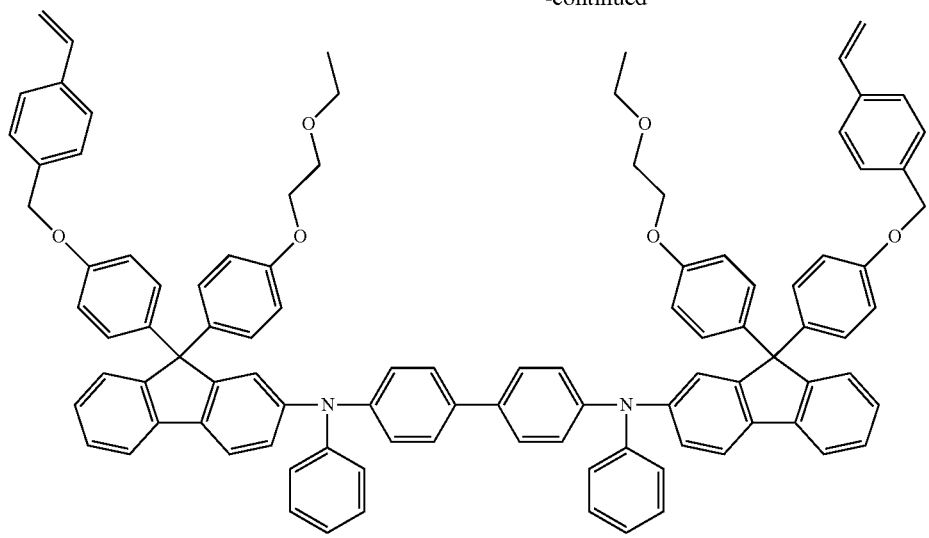
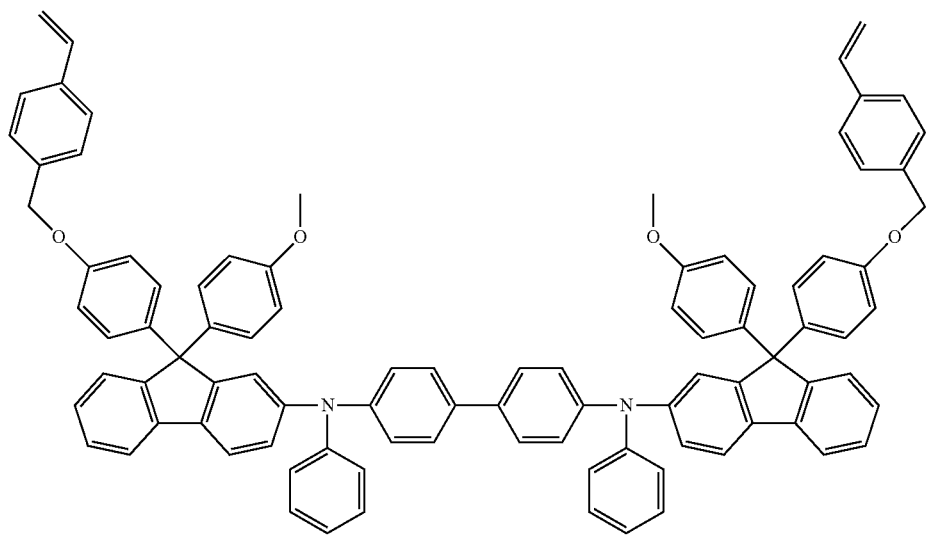
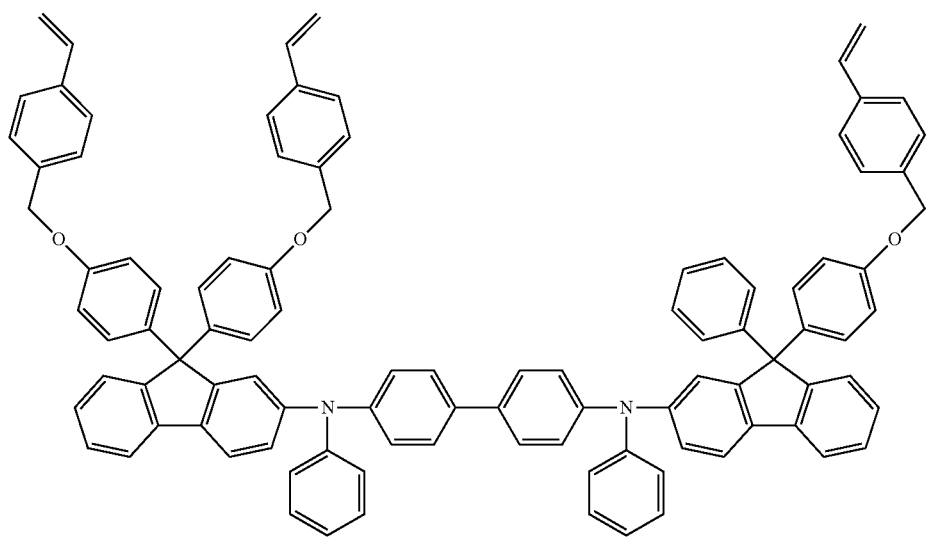

-continued
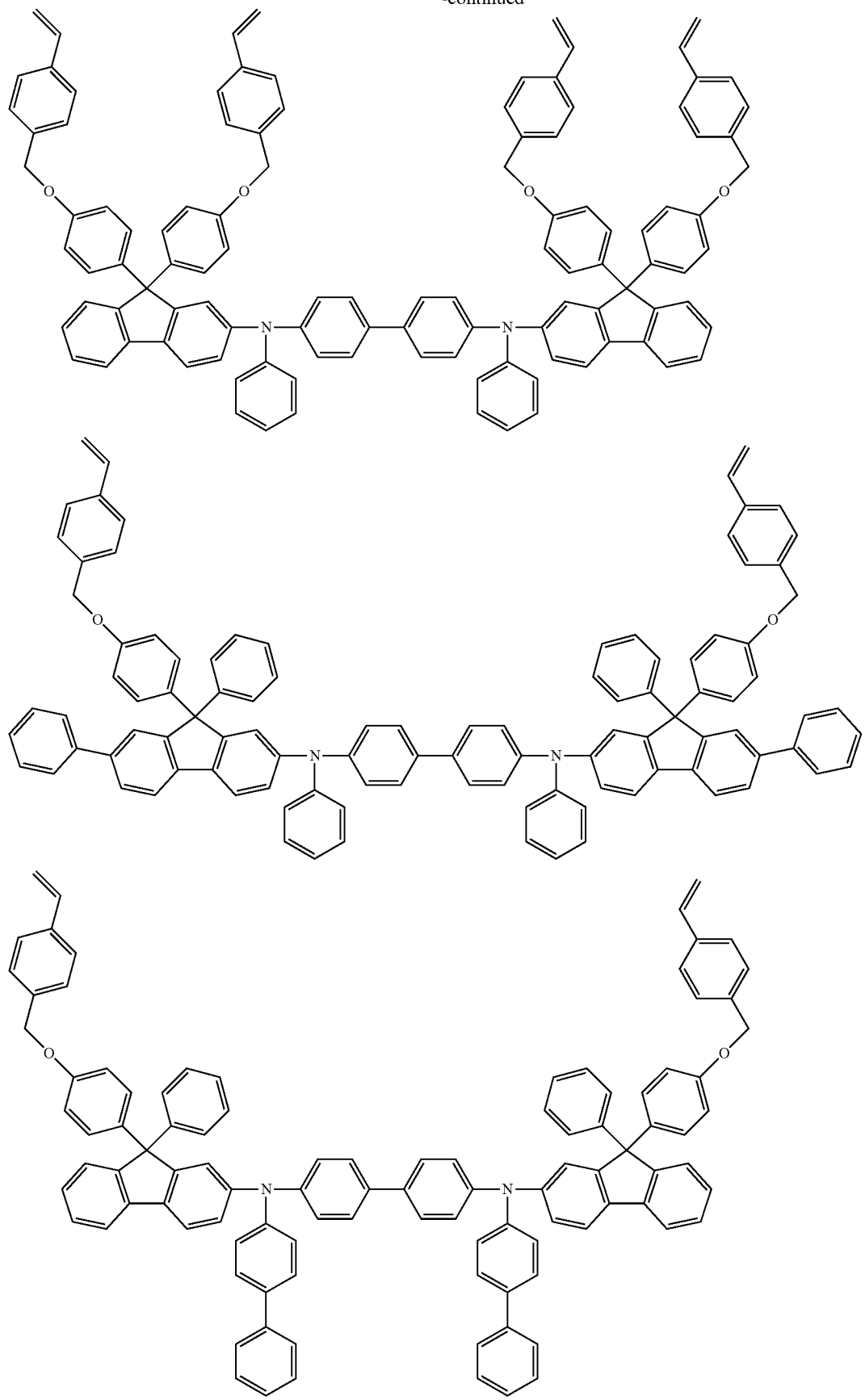

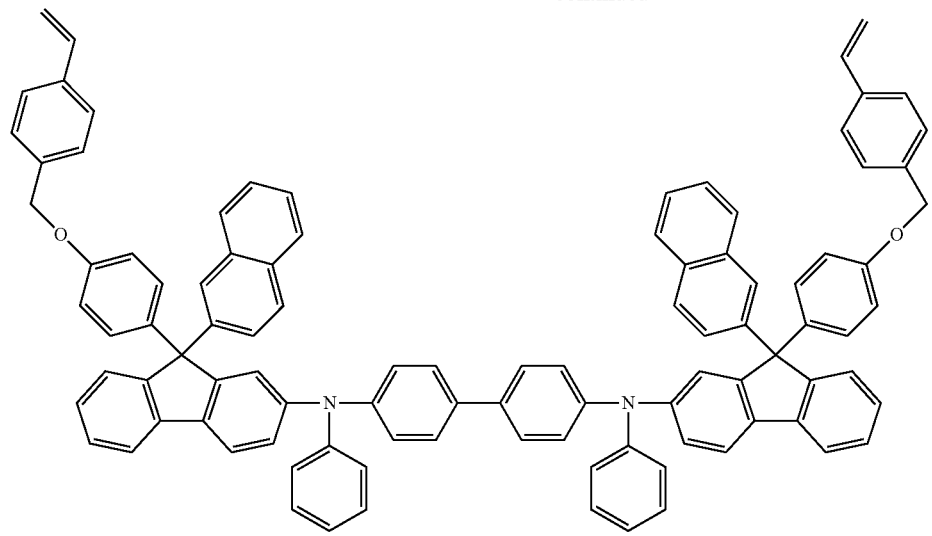
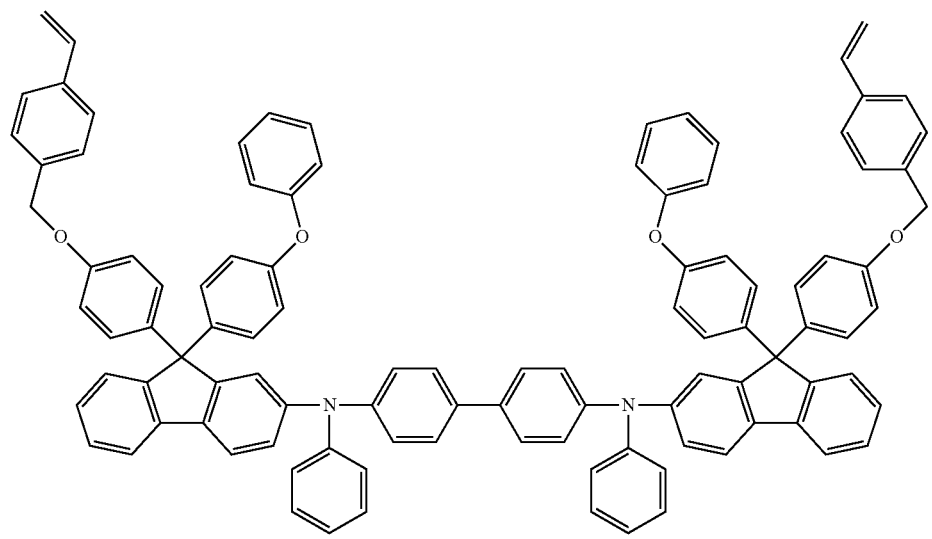
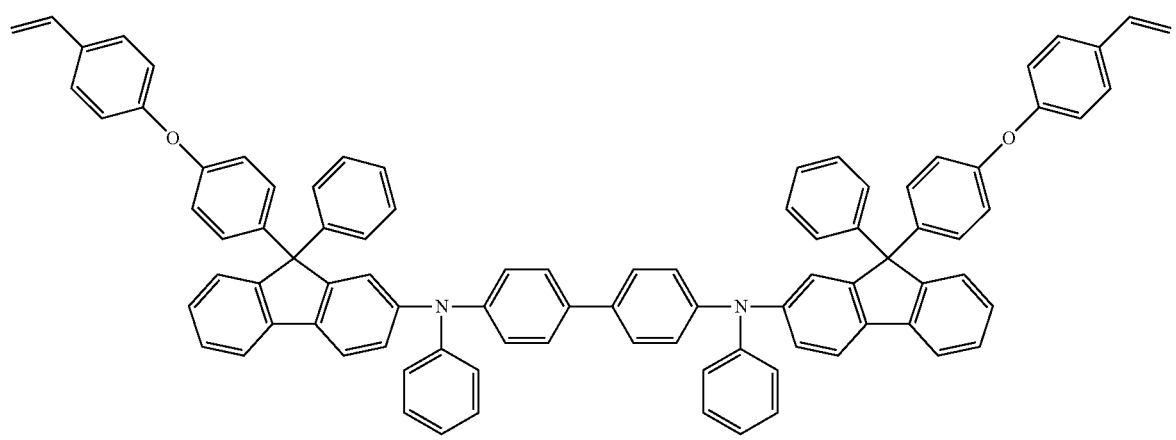

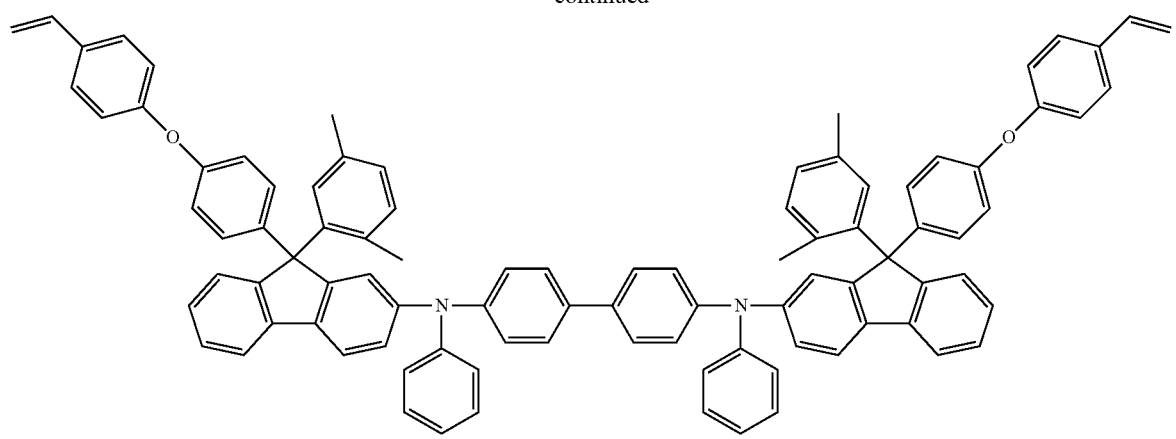
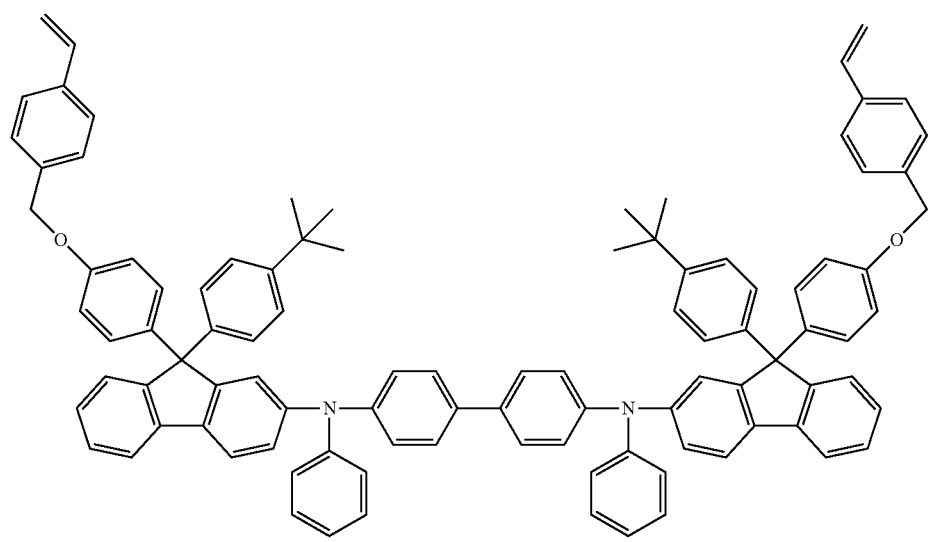
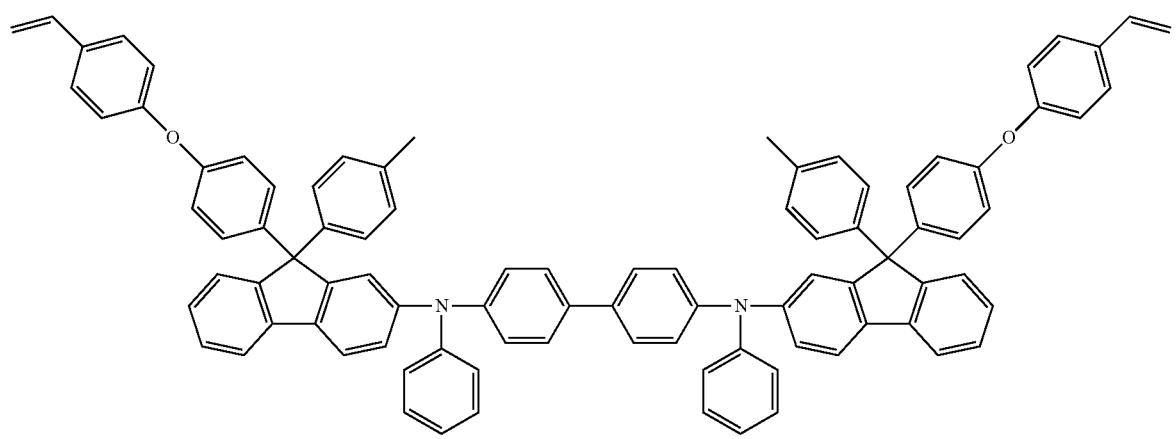

-continued
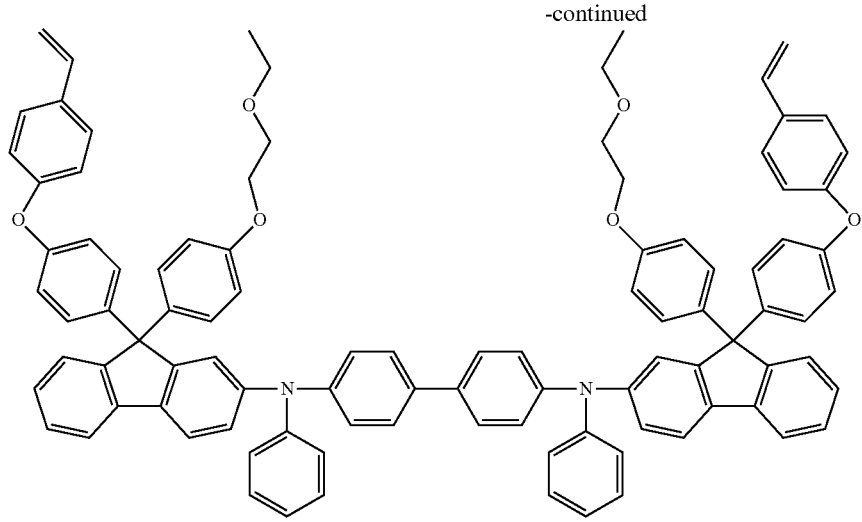
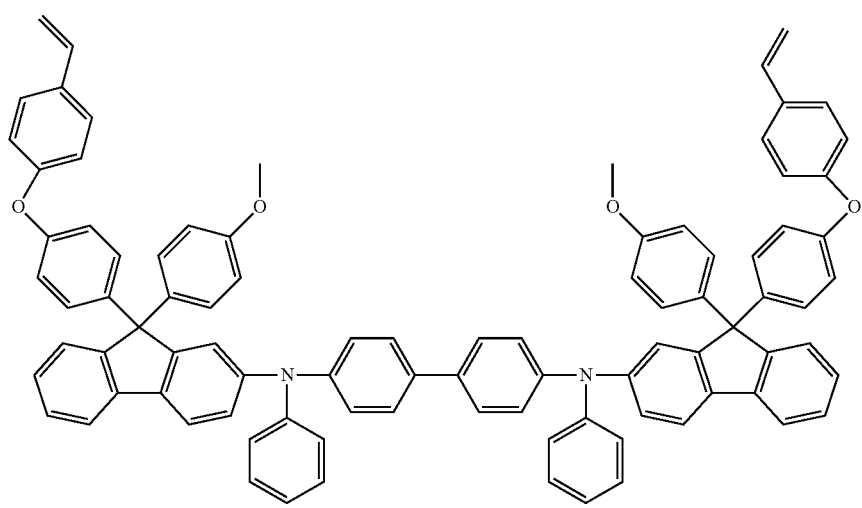
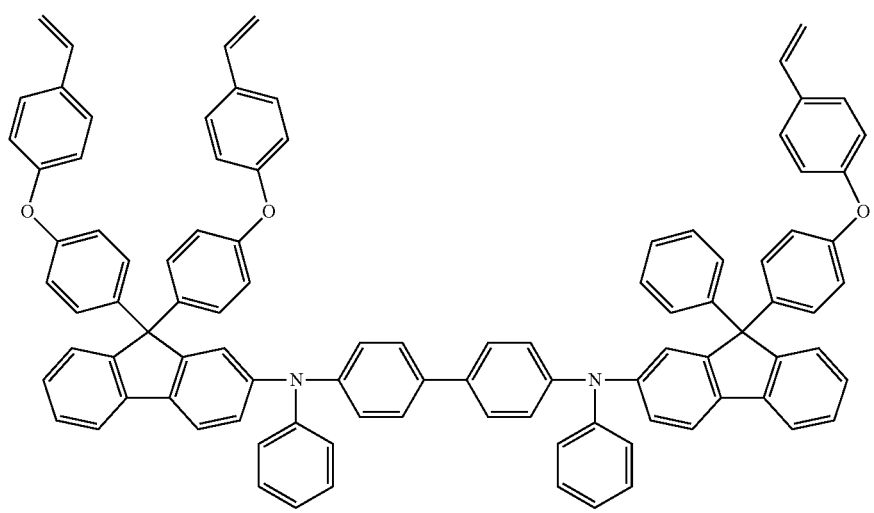

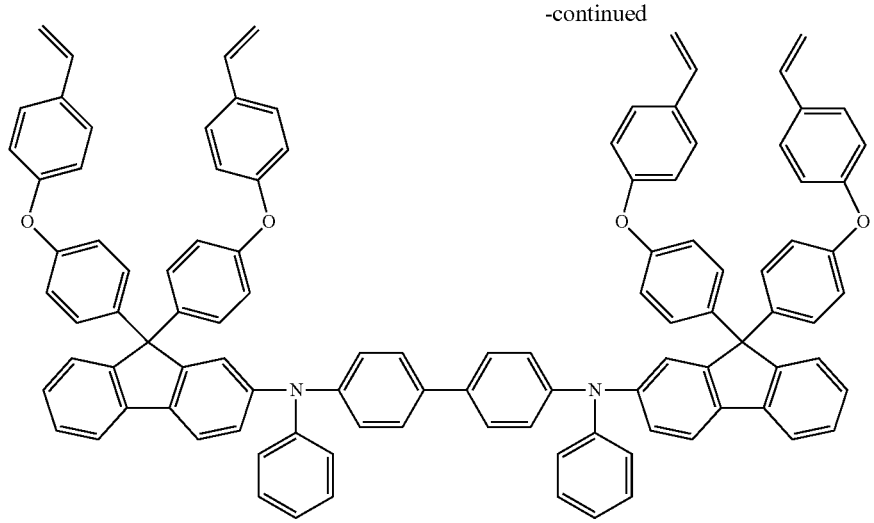
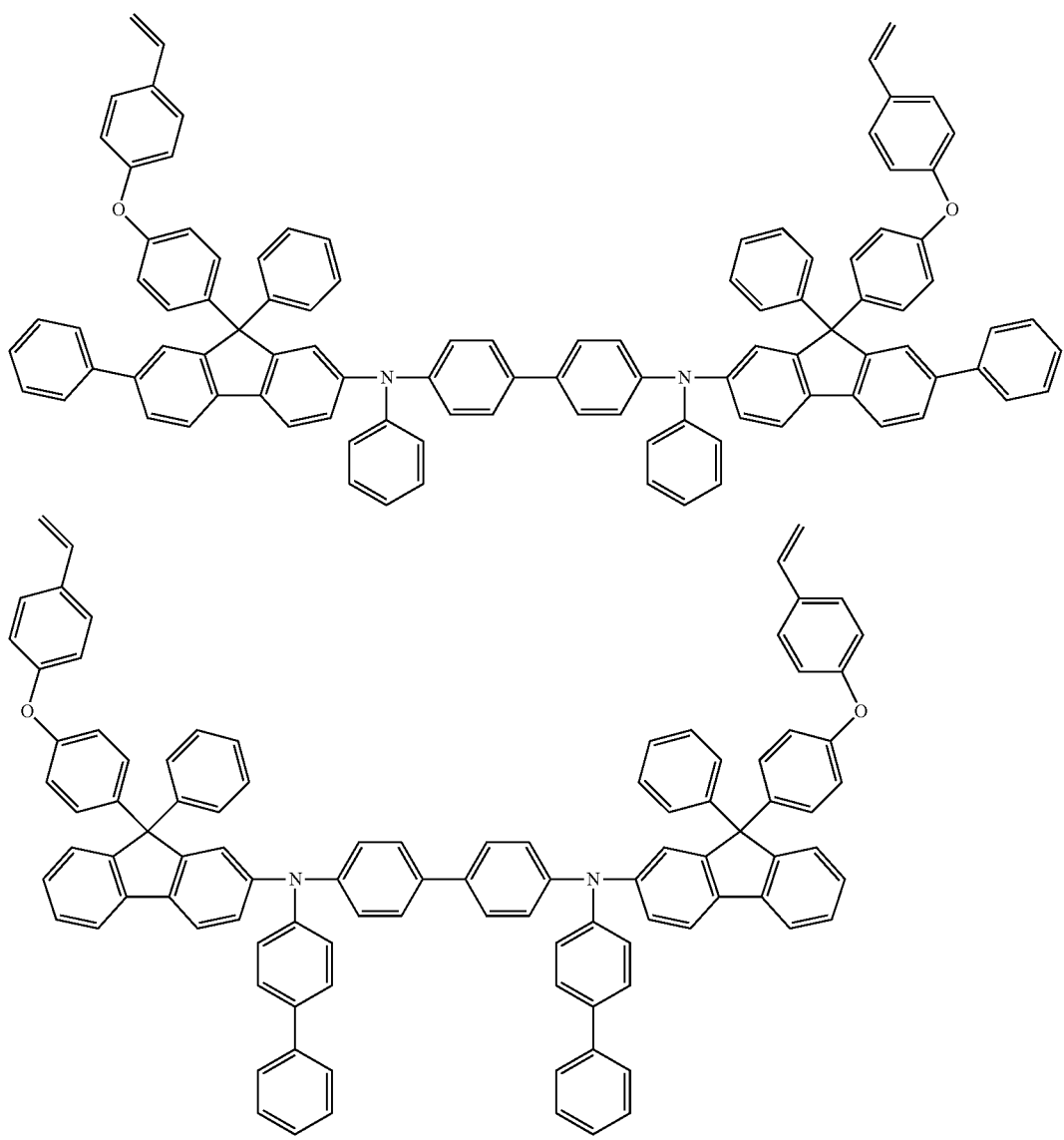

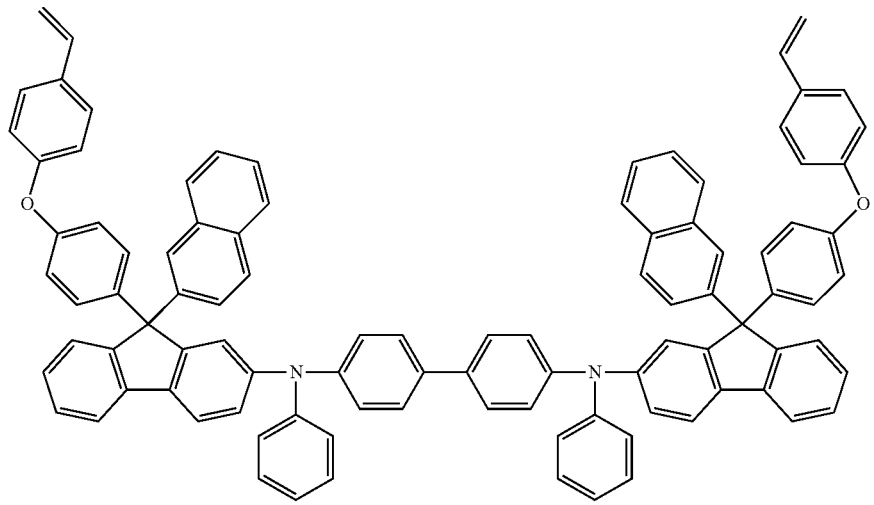
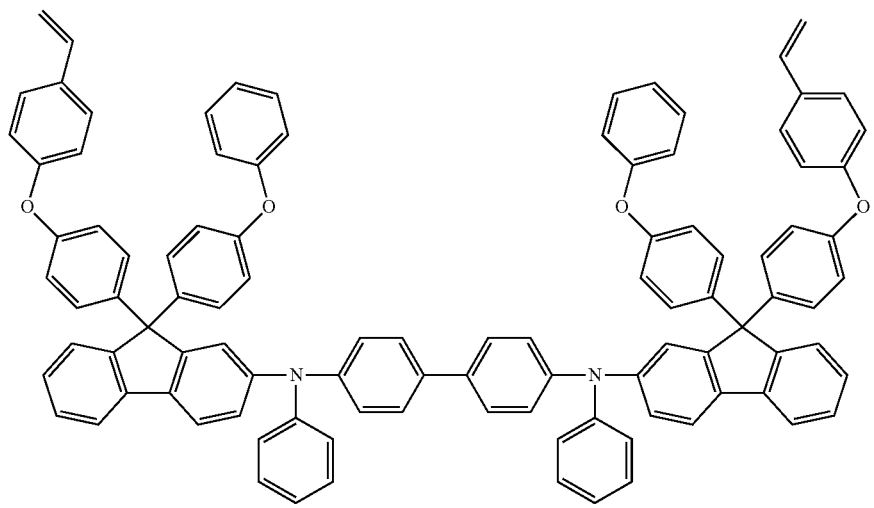
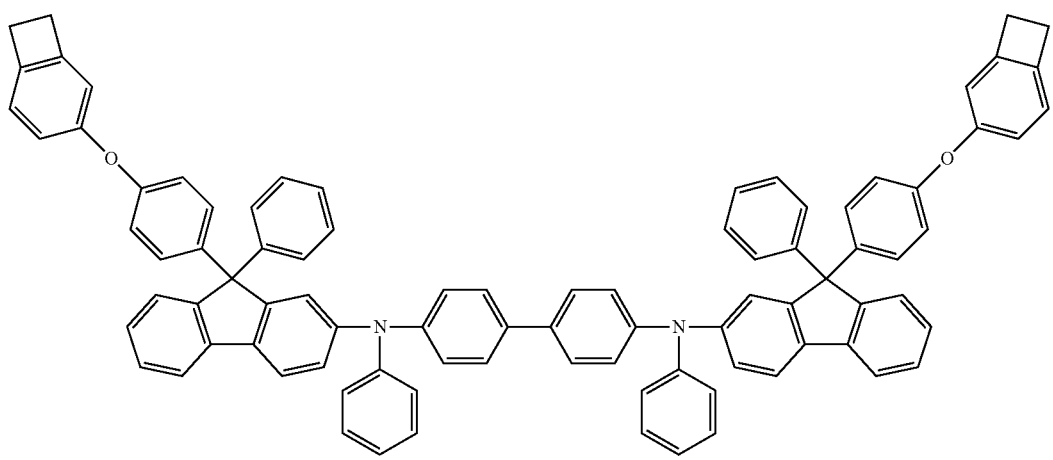

183 184
-continued
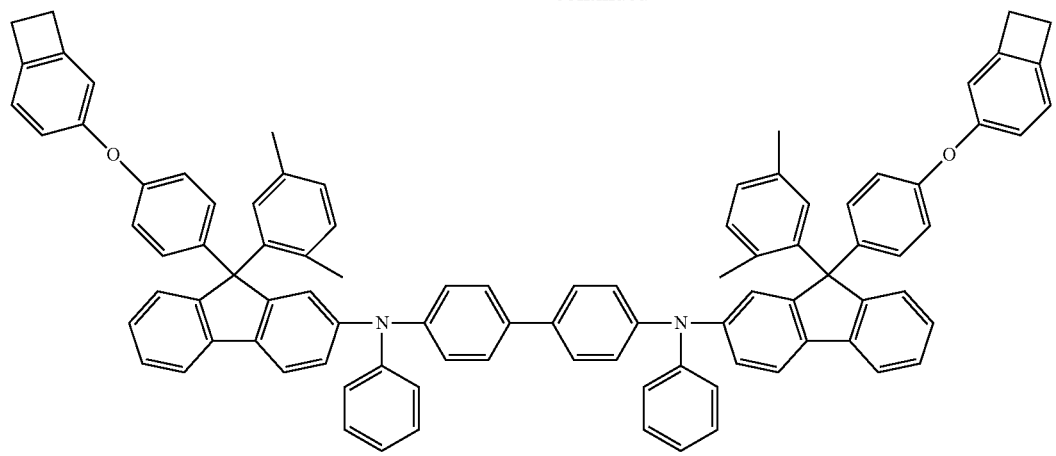
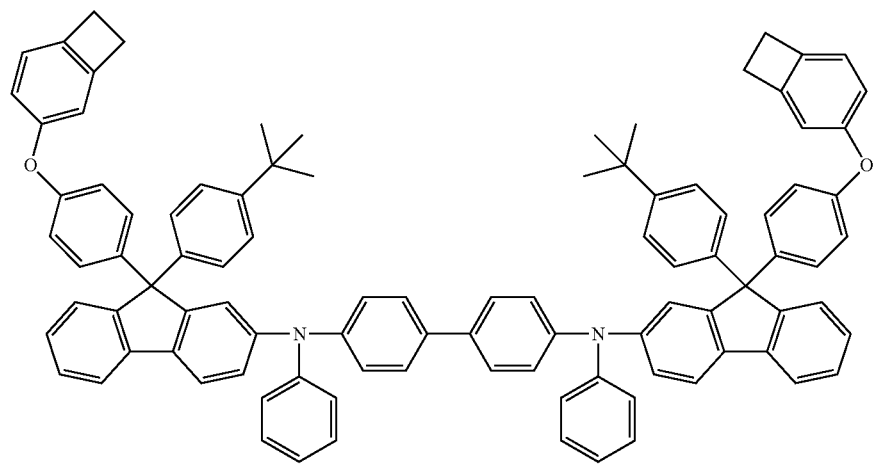
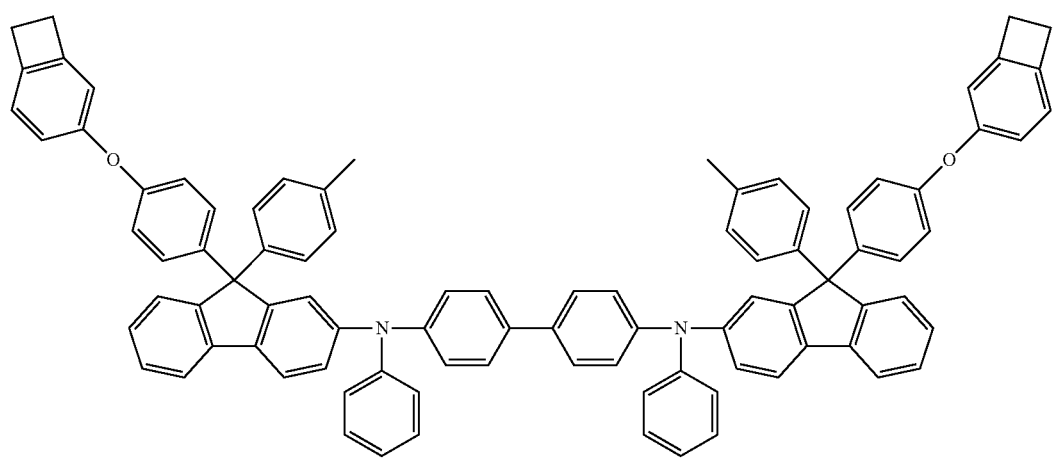

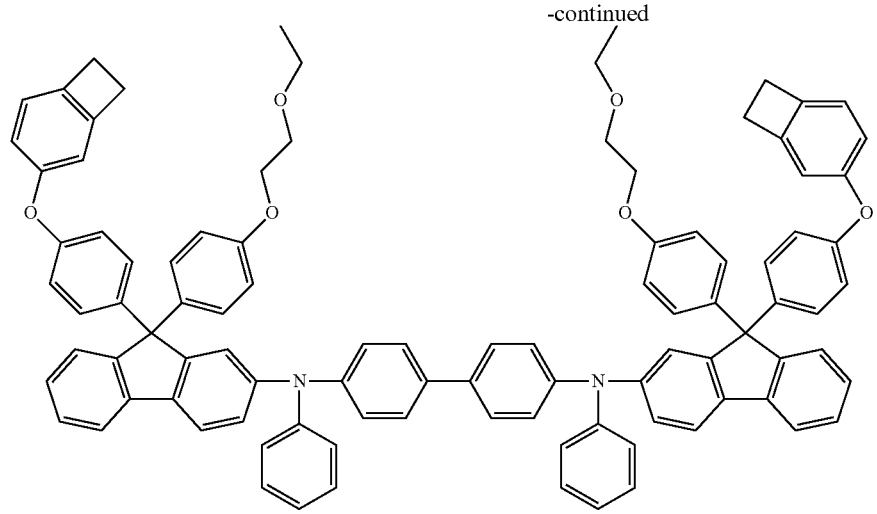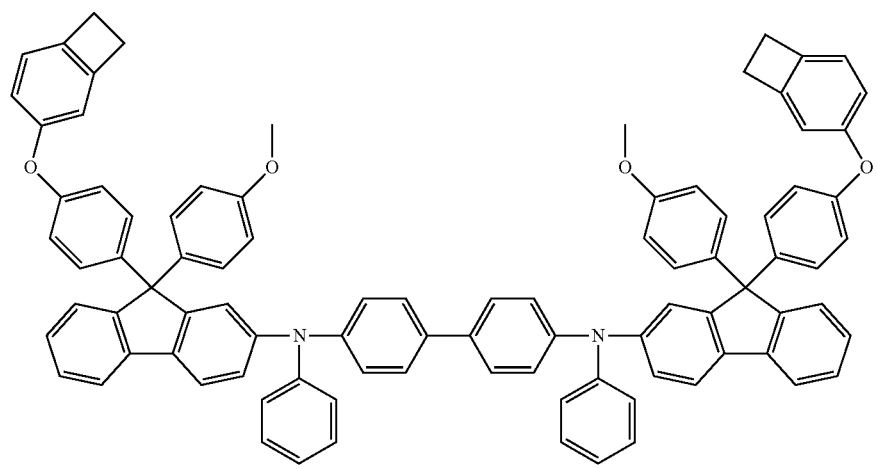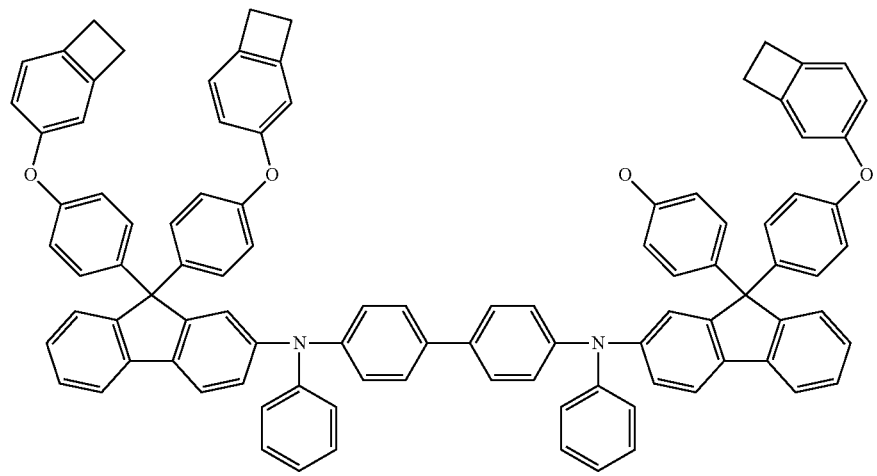

-continued
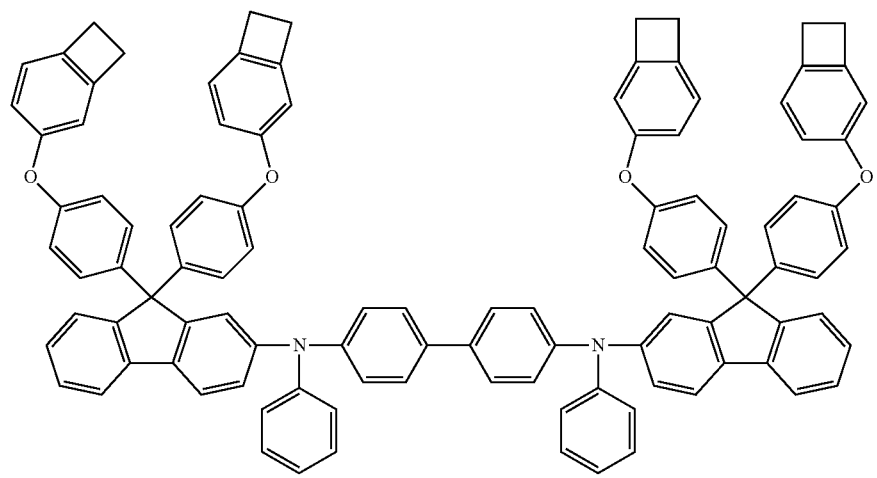
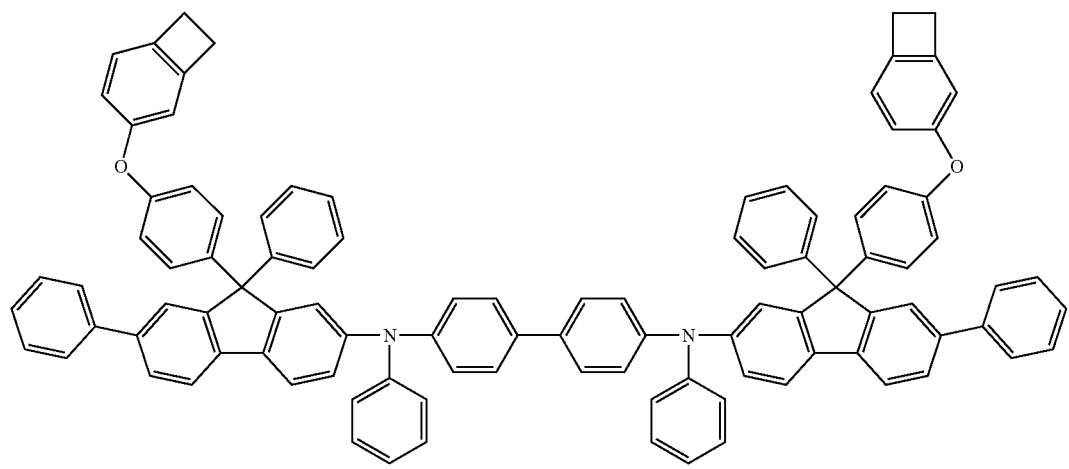
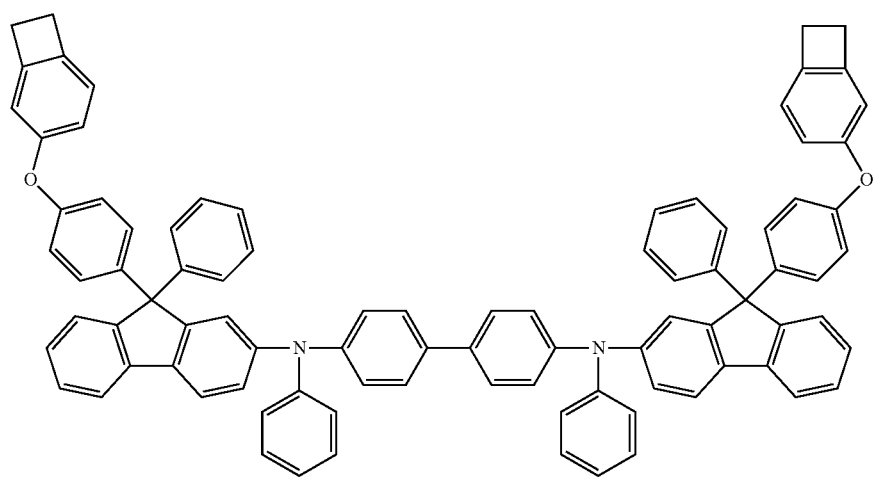

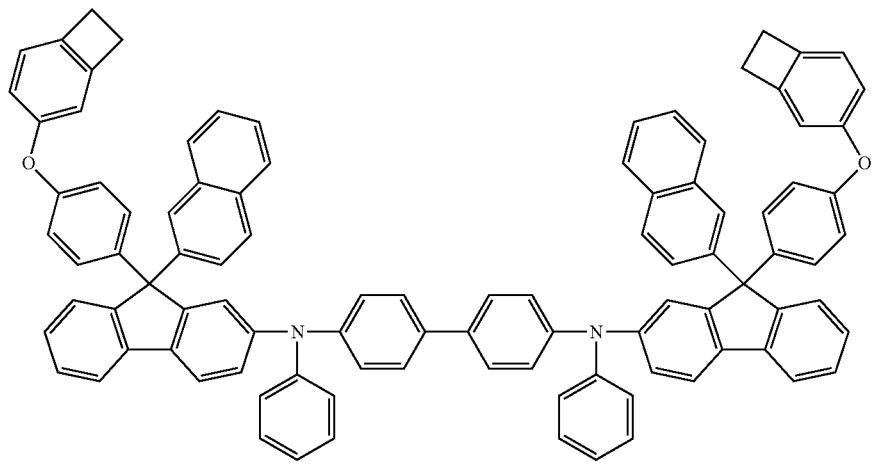
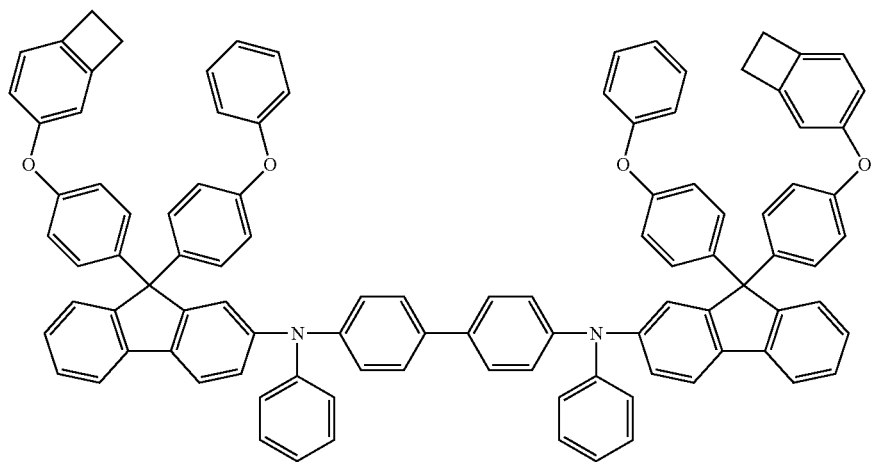
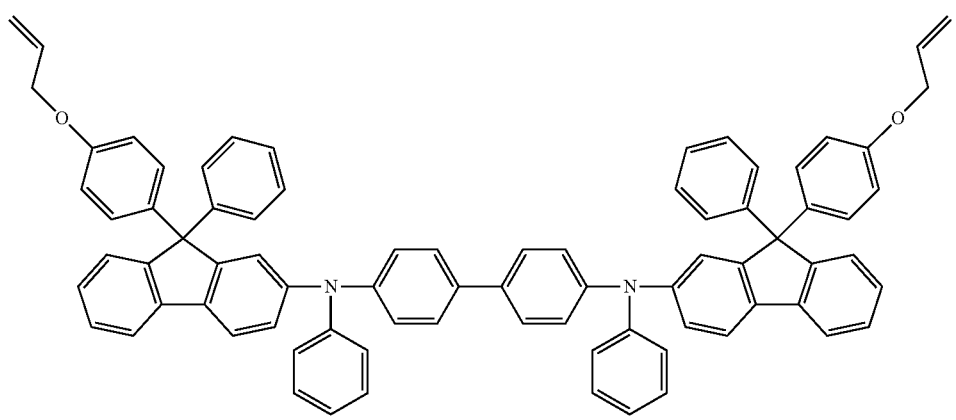

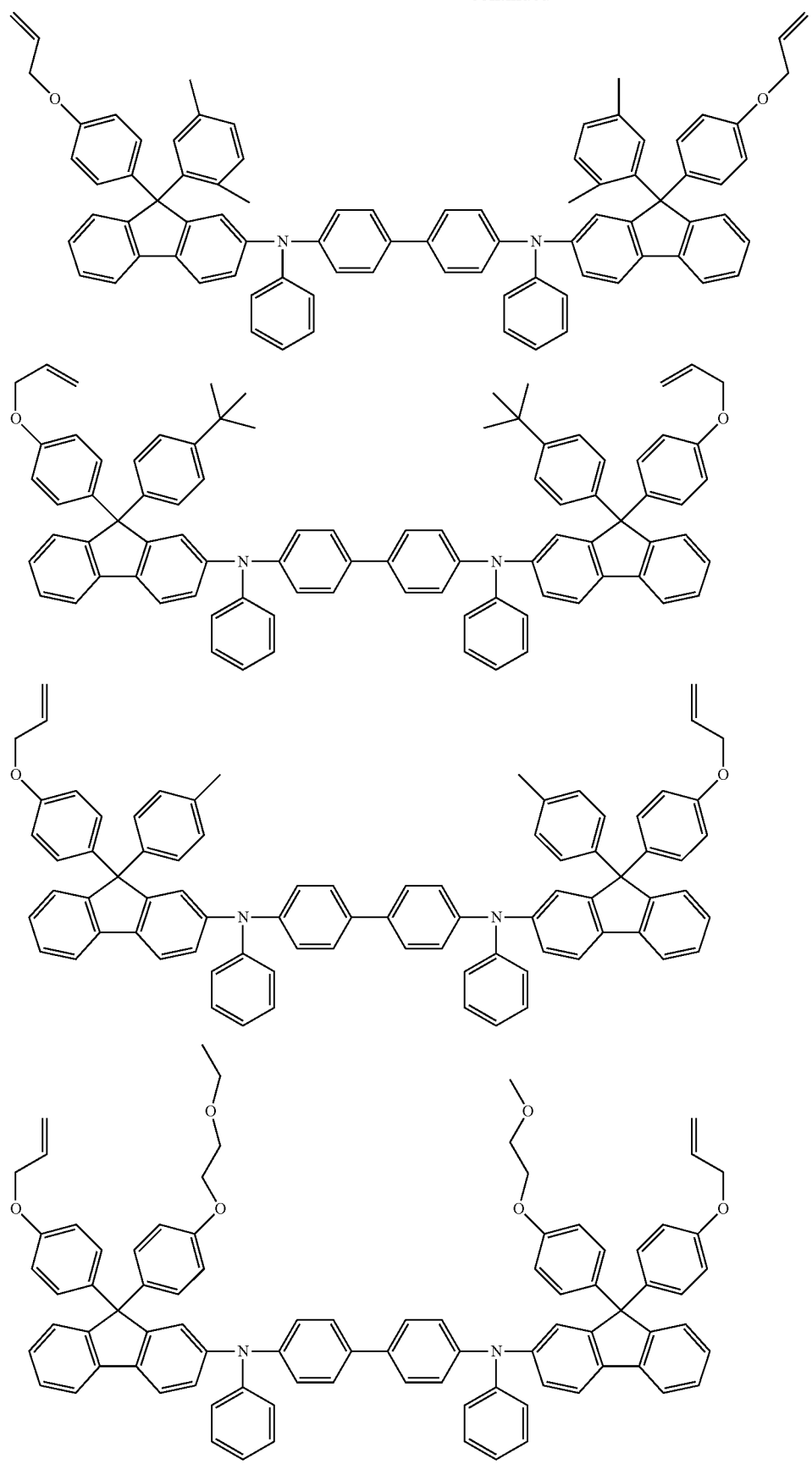

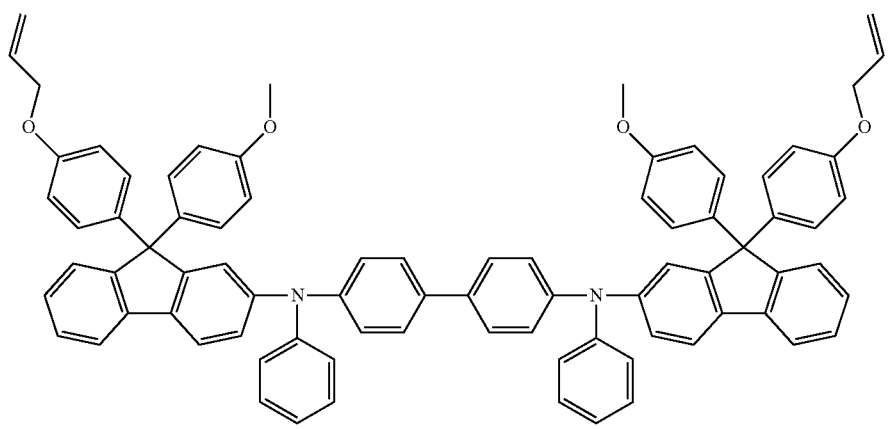
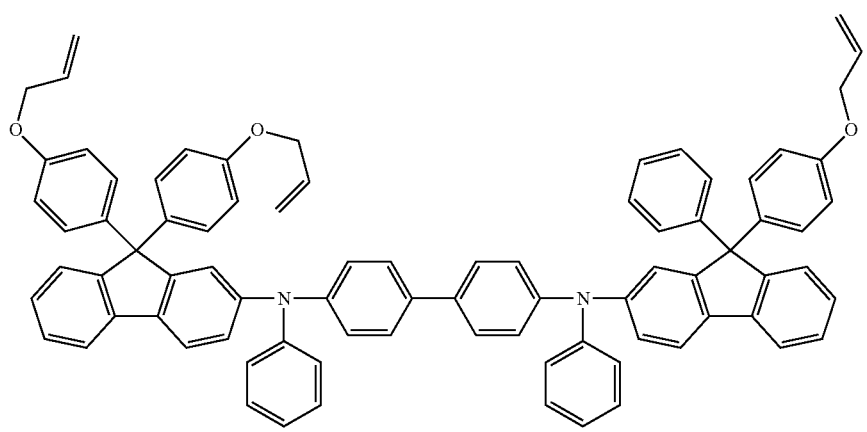
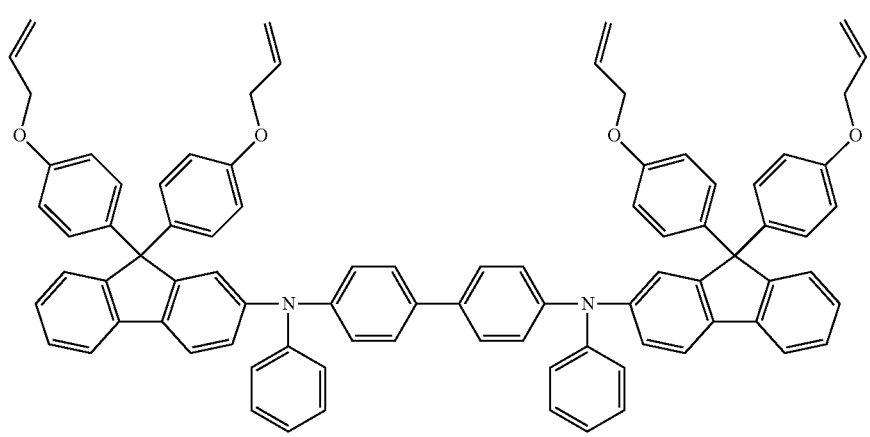
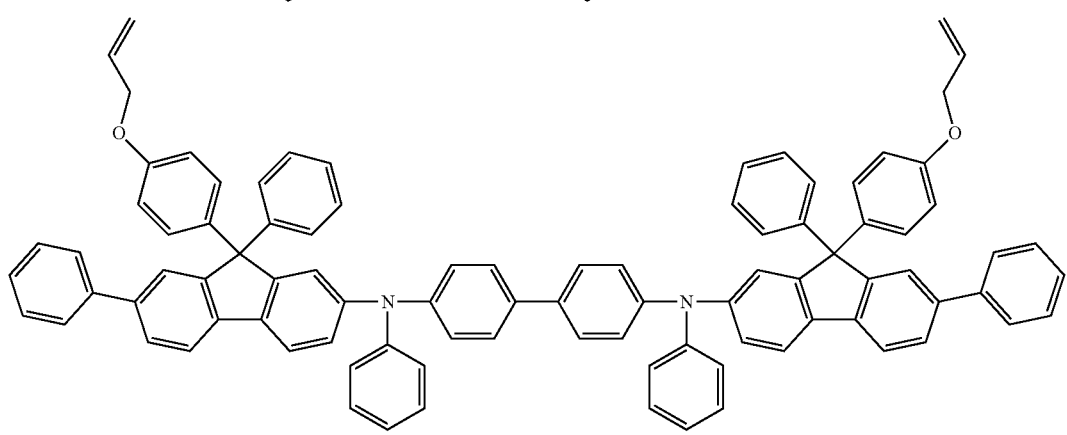

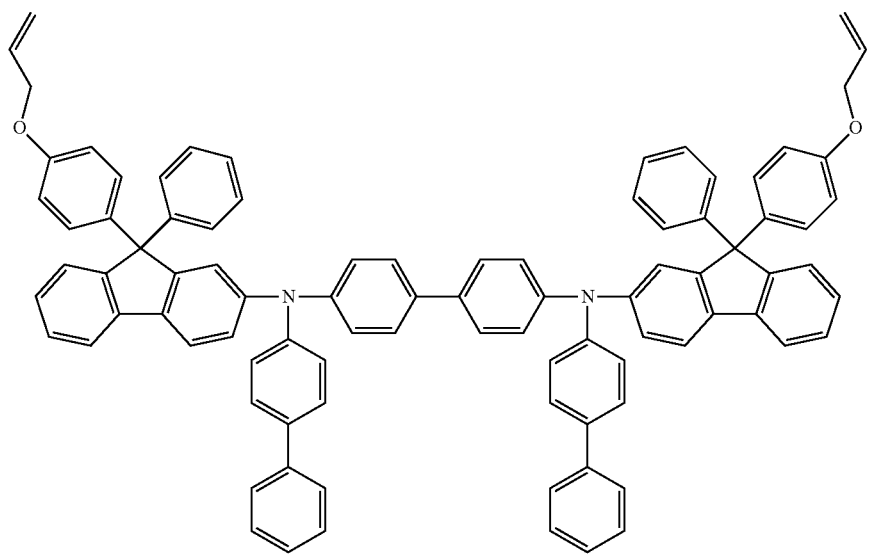
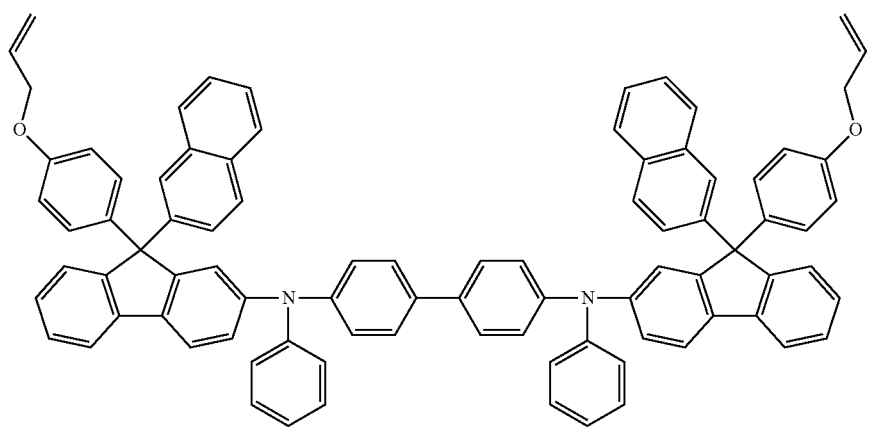
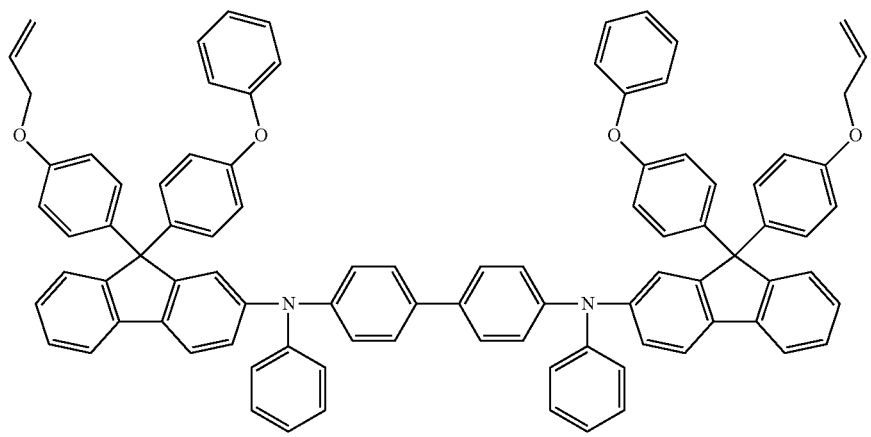

197 198
-continued
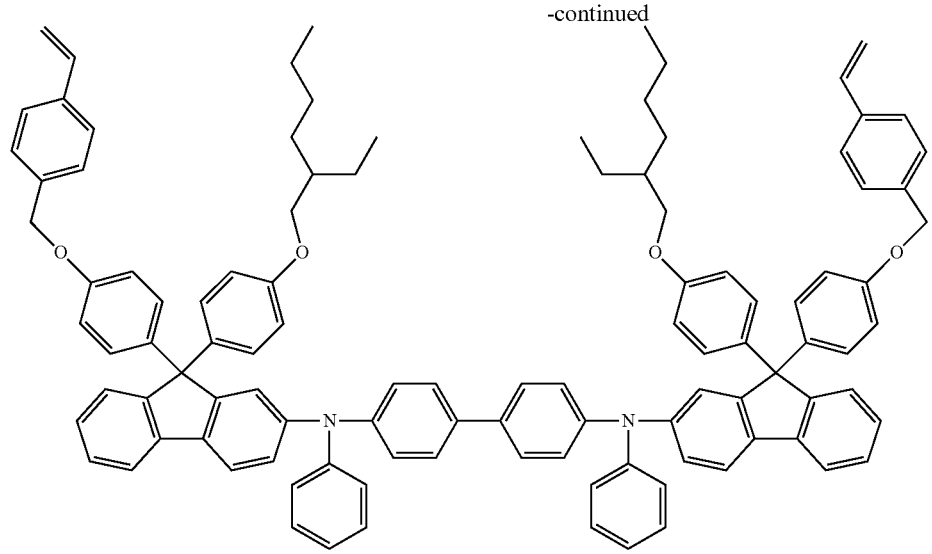
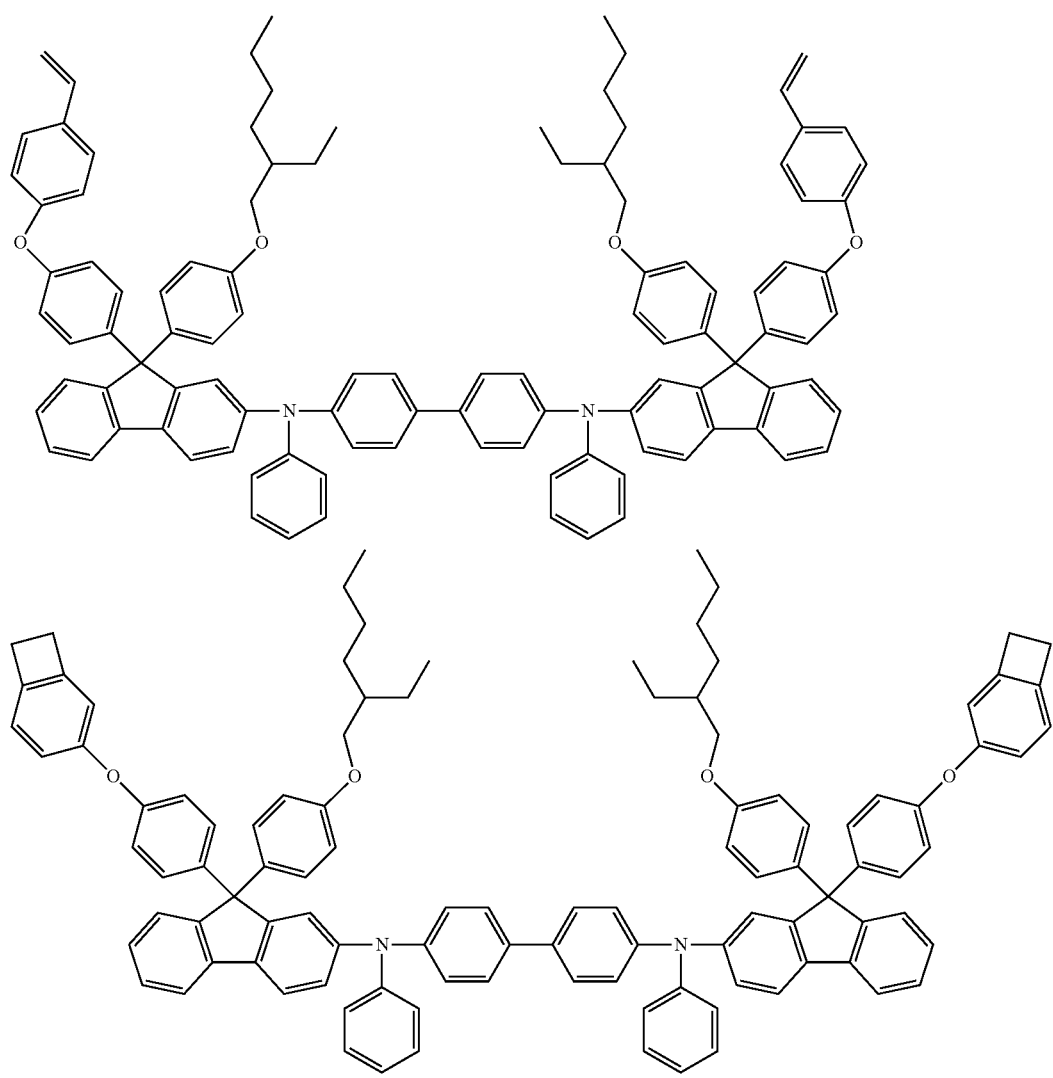

199 200
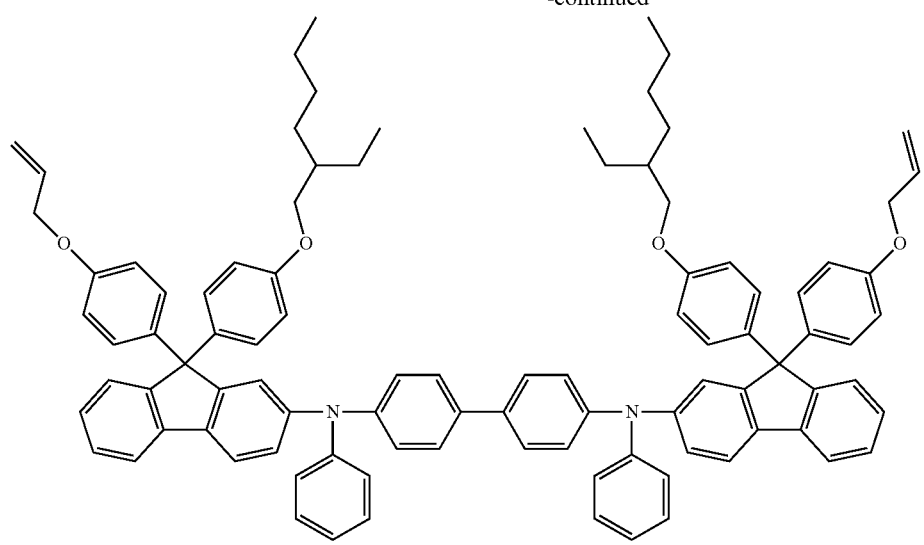
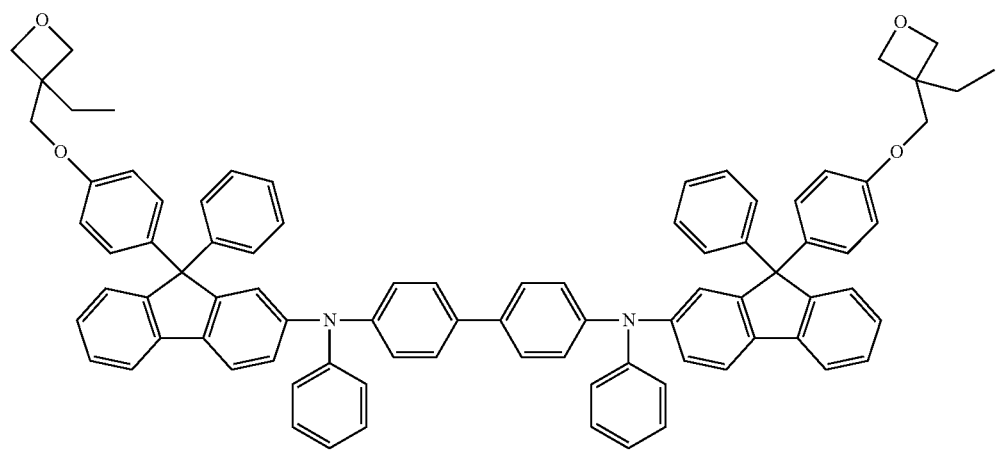
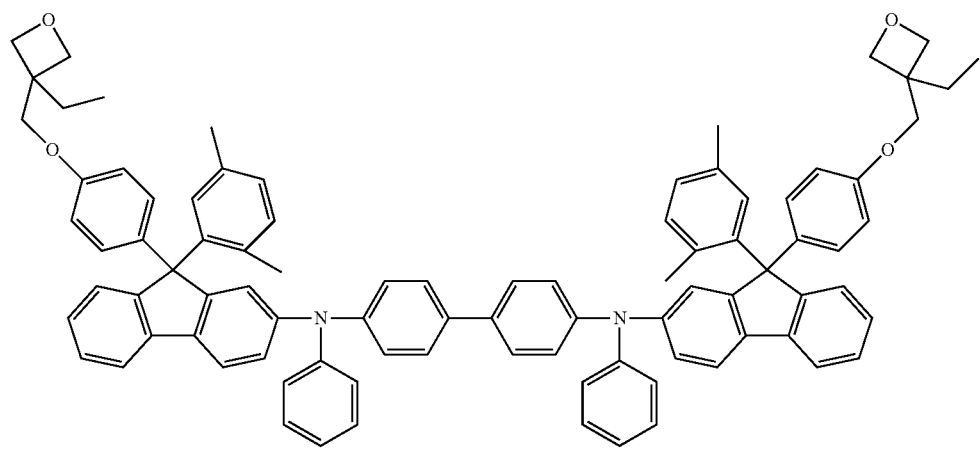

201
202
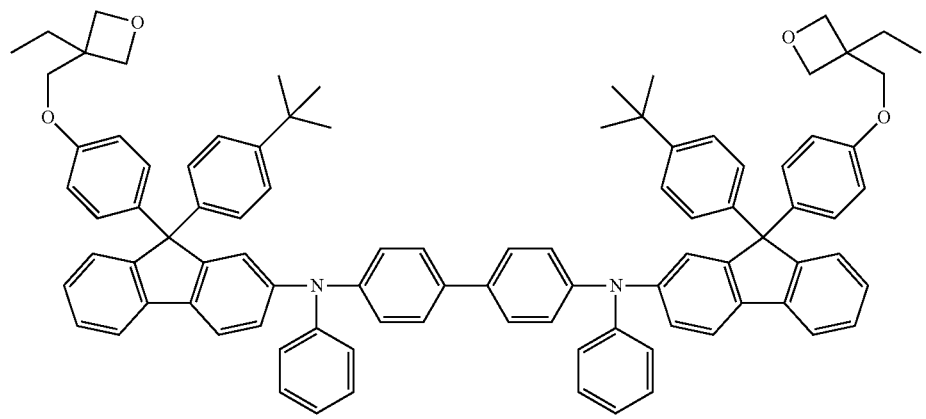
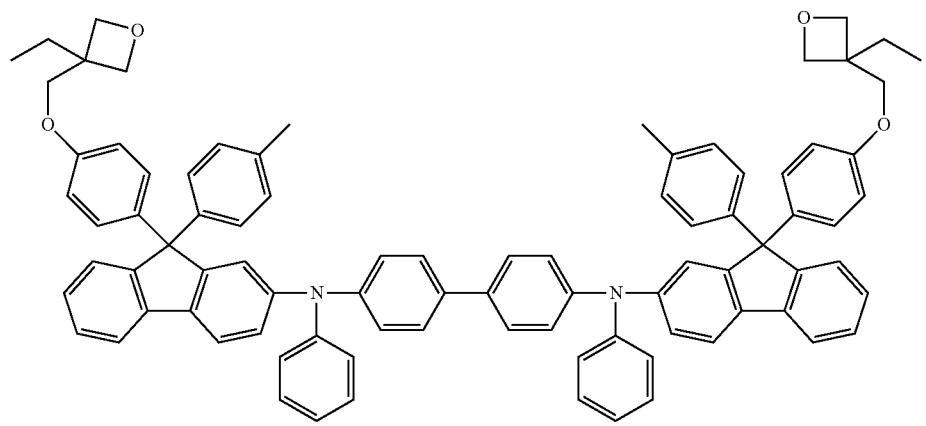
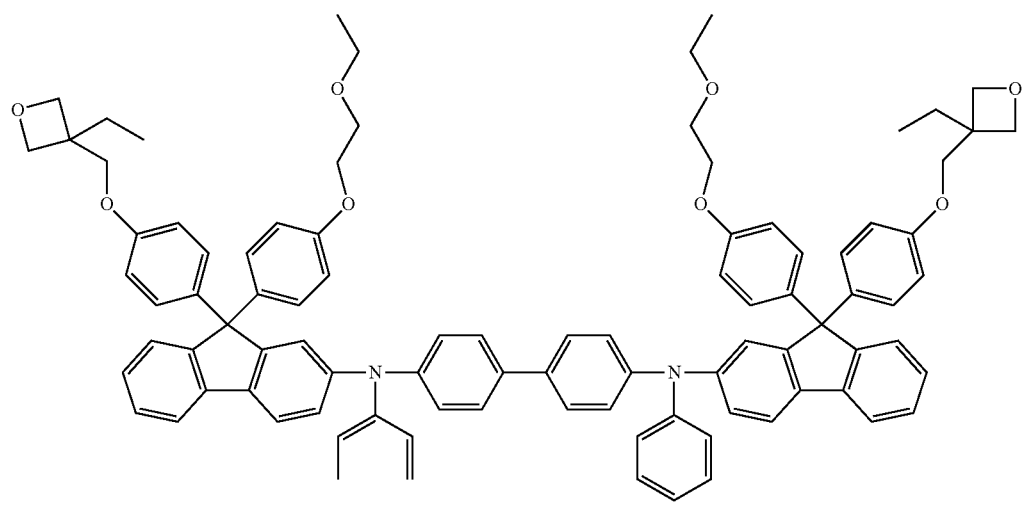

203 204
-continued
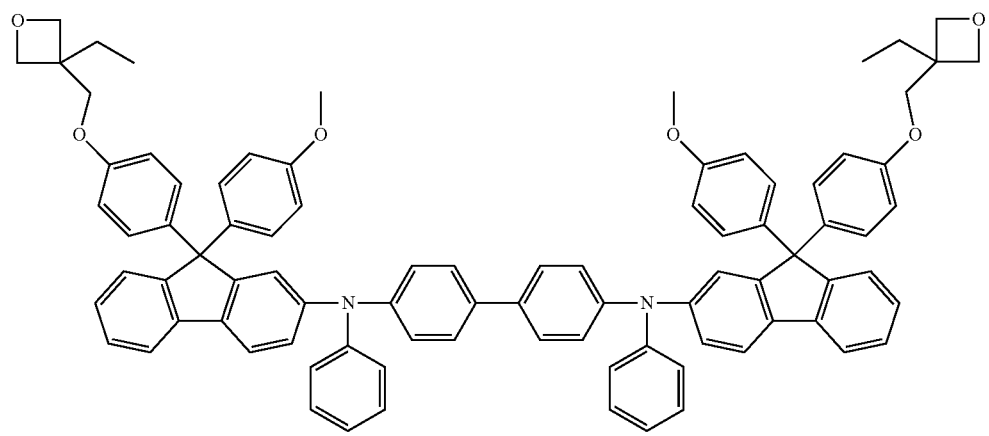
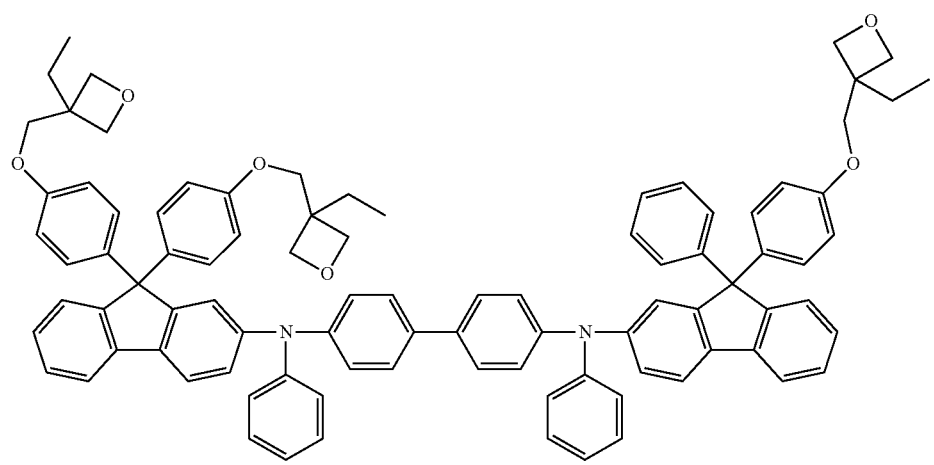
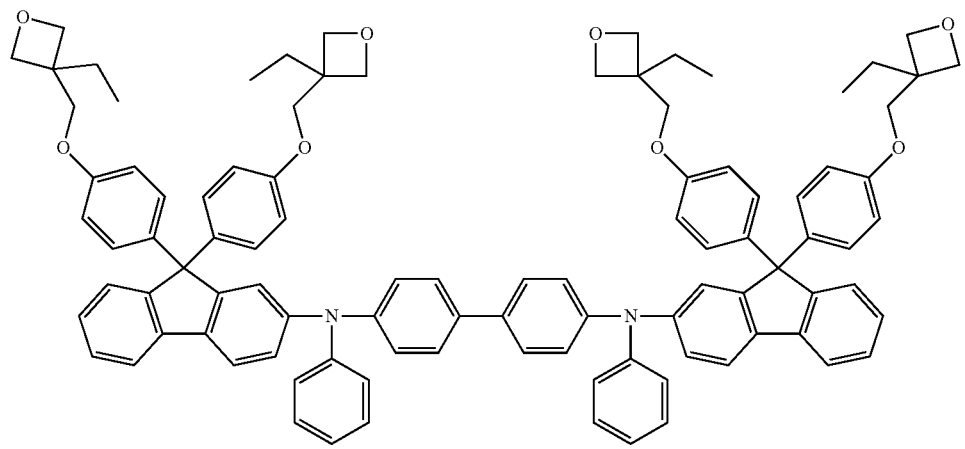

205 206
-continued
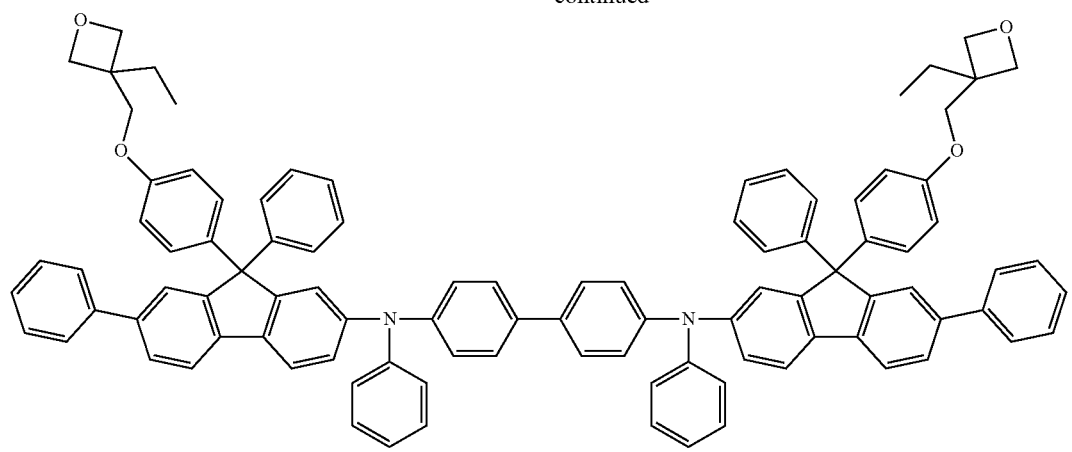
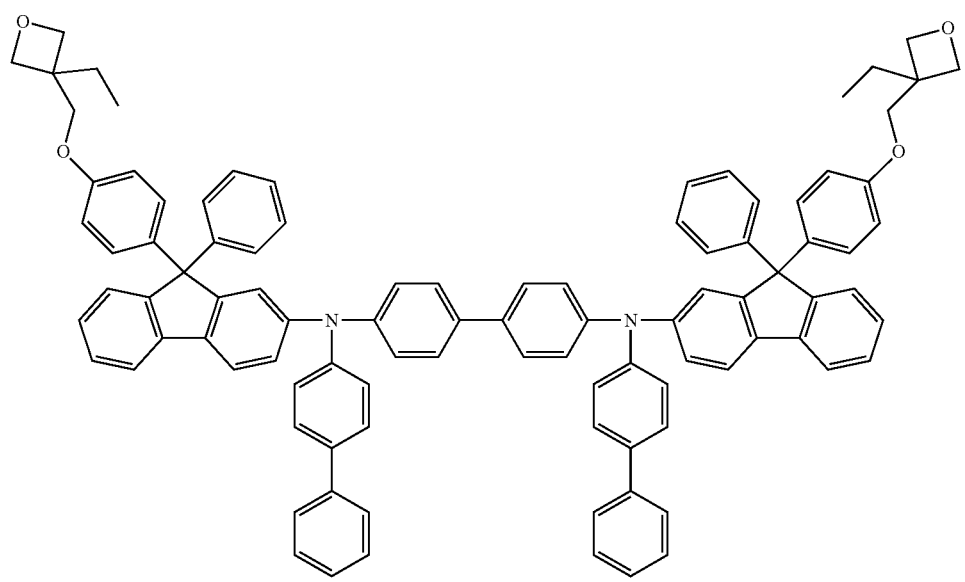
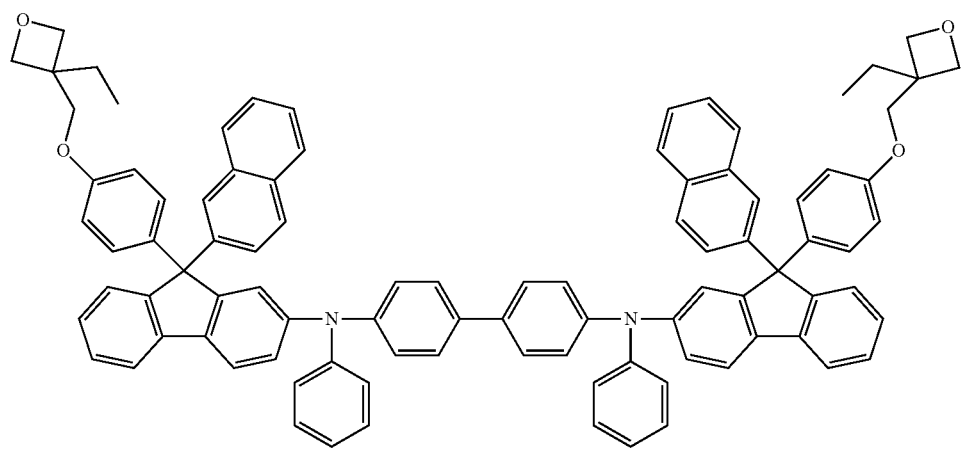

207
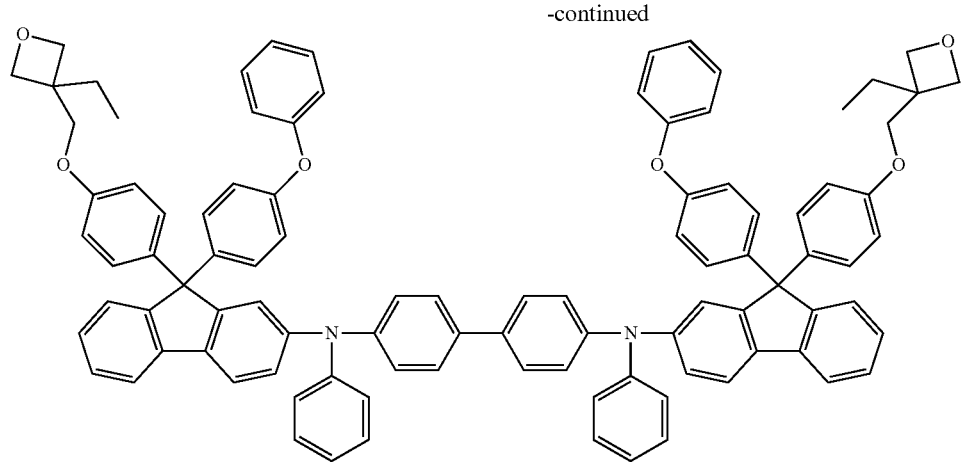
208
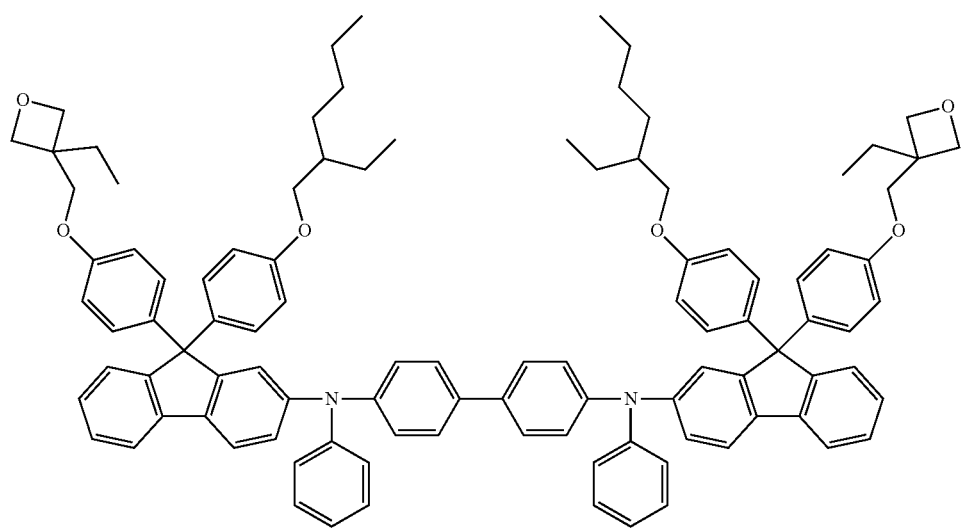
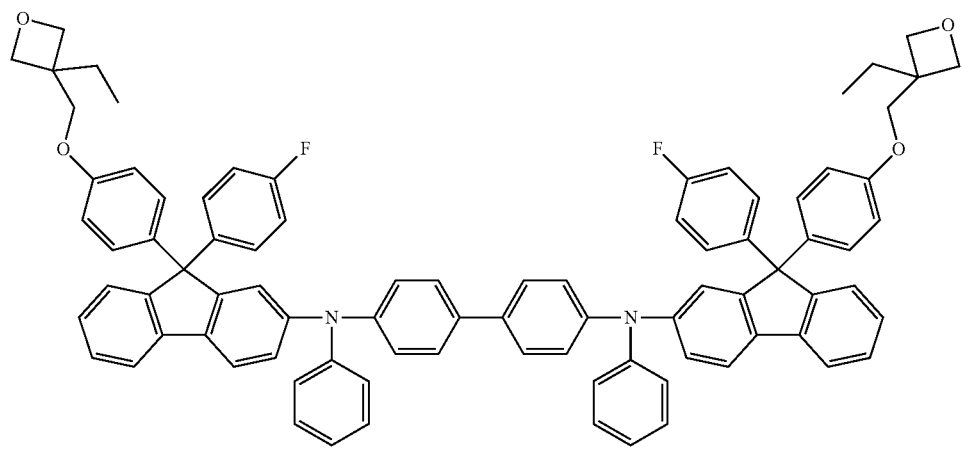

209 210
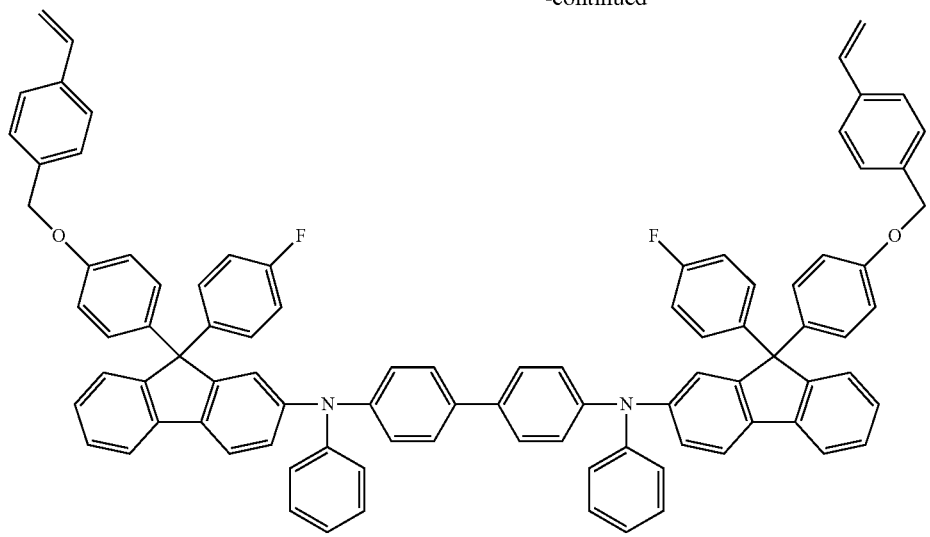
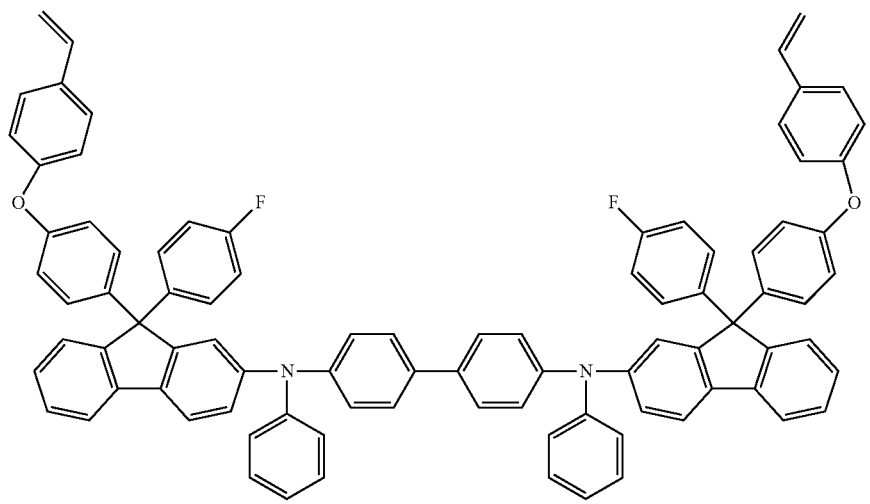
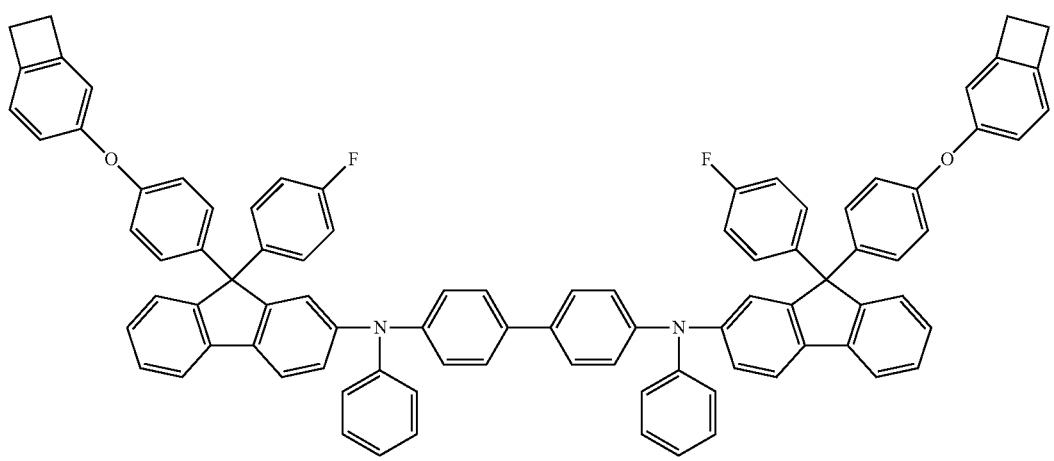

211 212
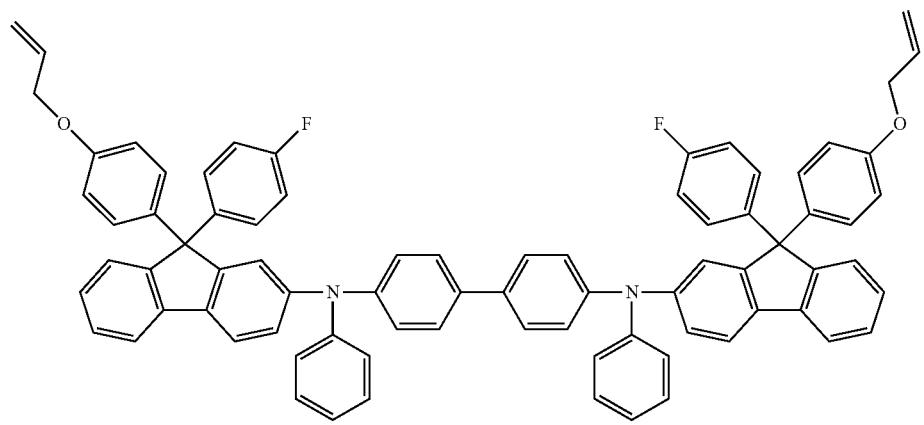
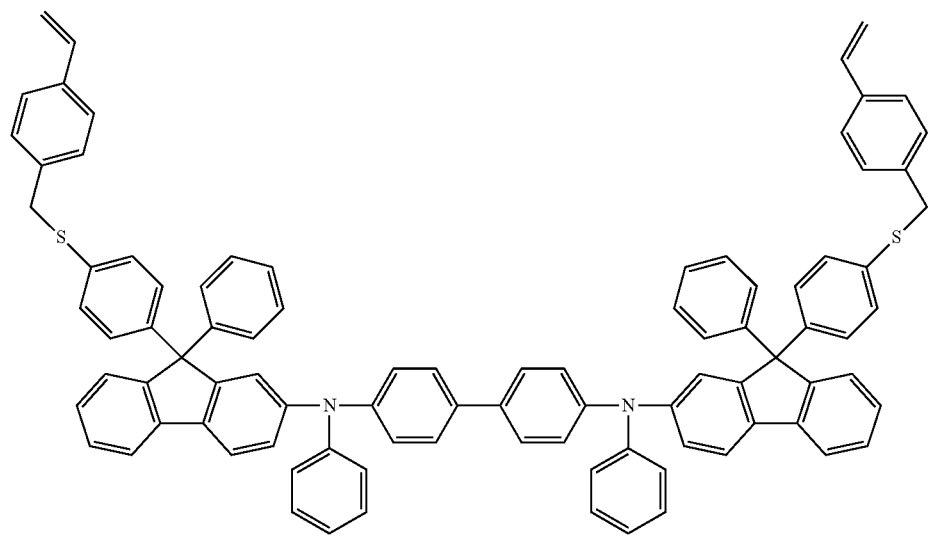
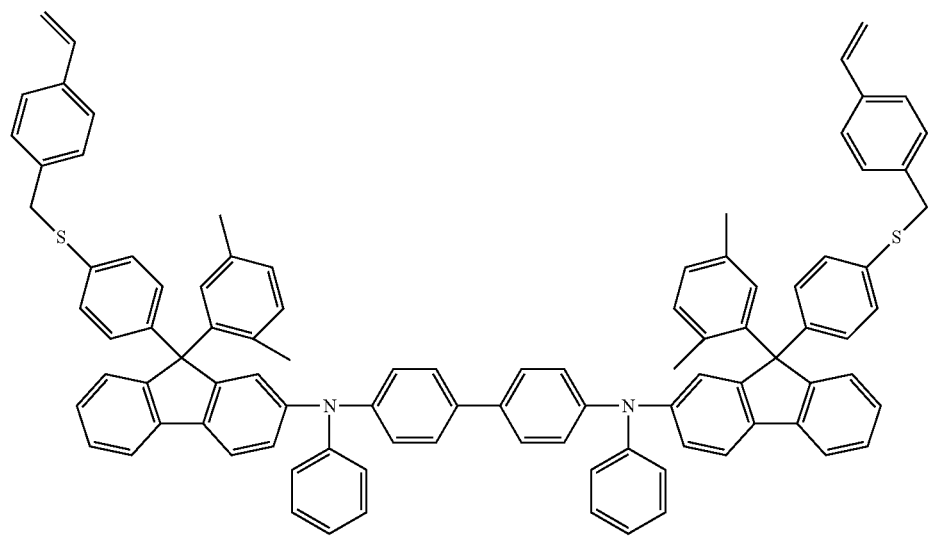

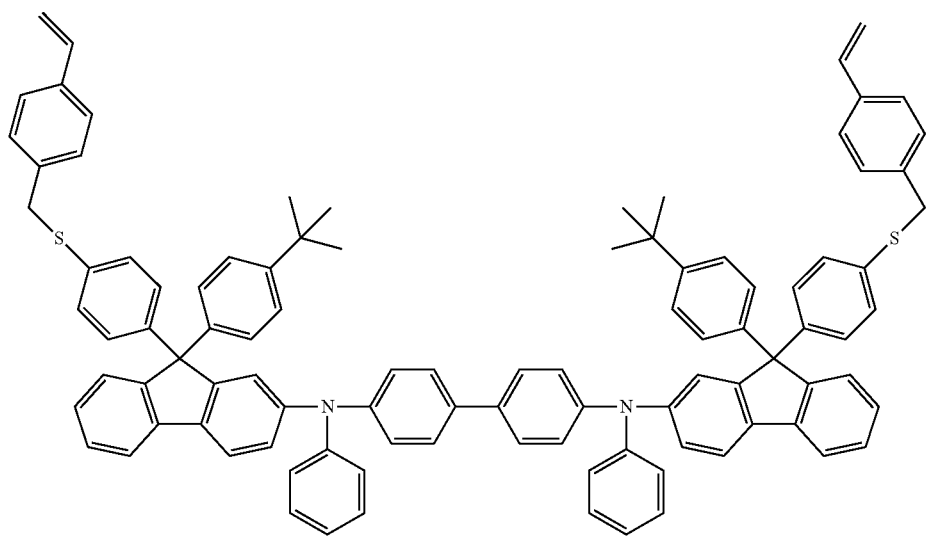
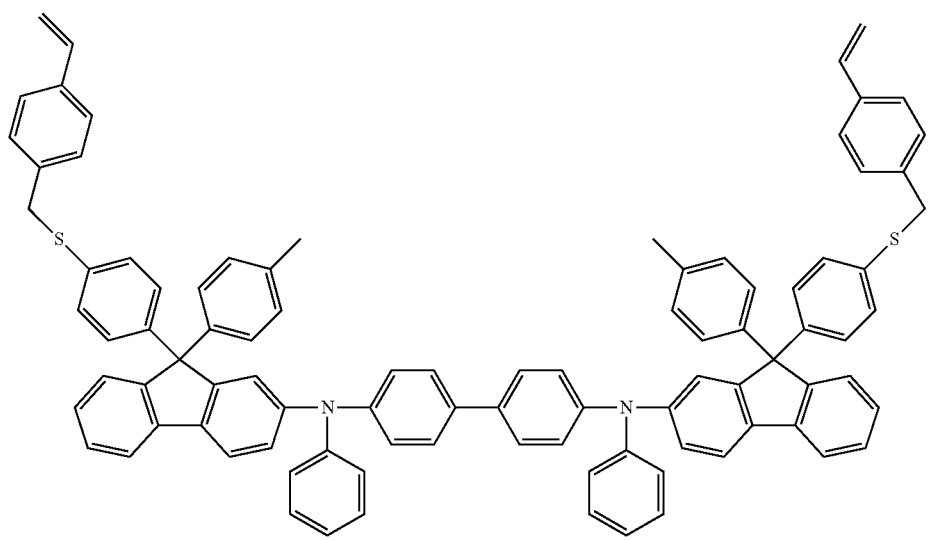
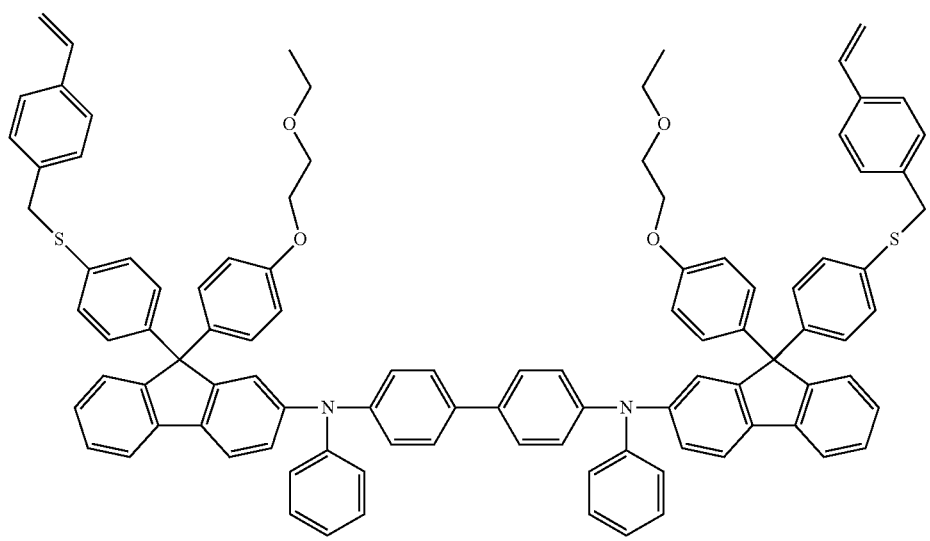

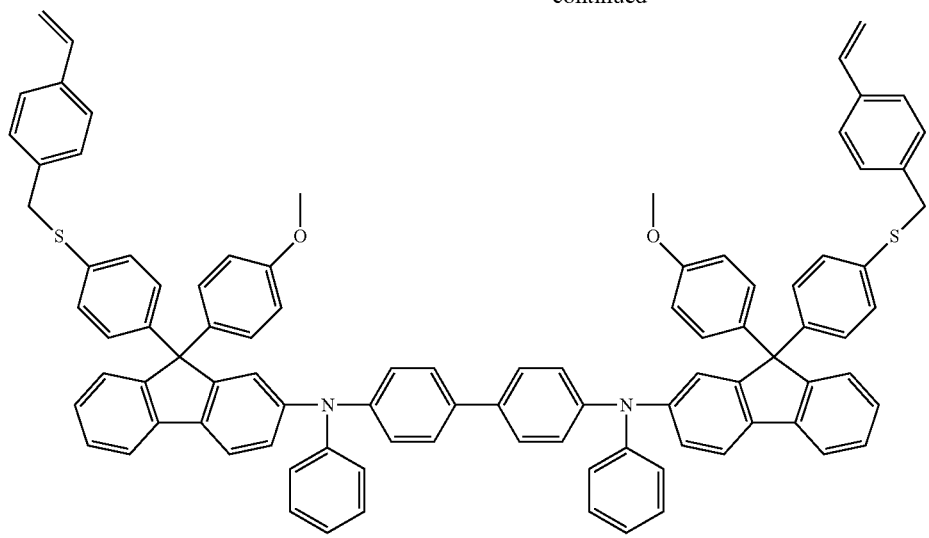
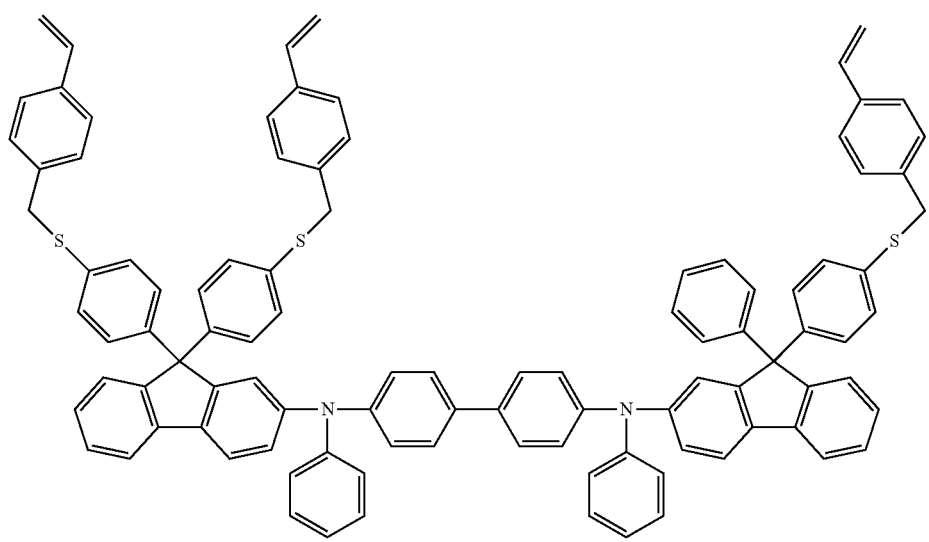
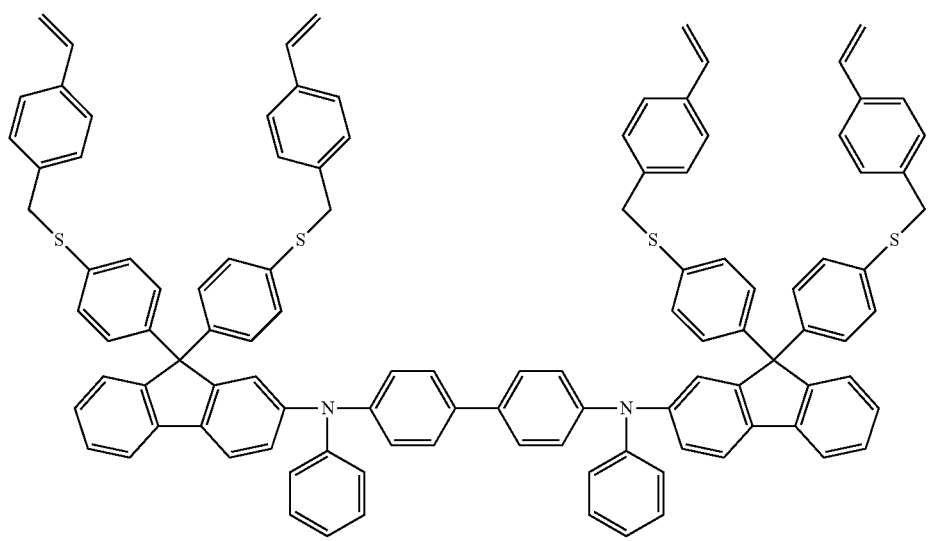

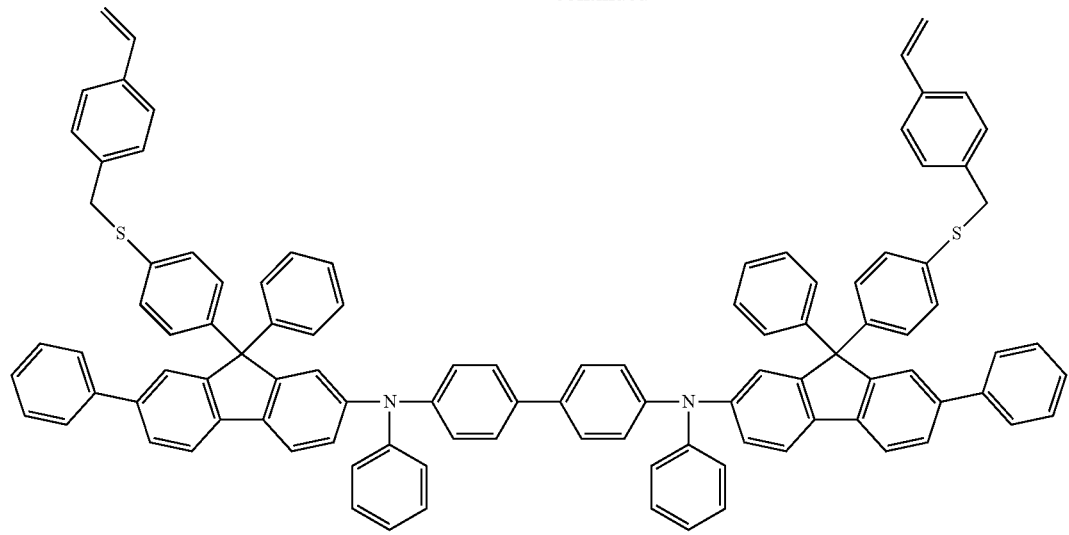
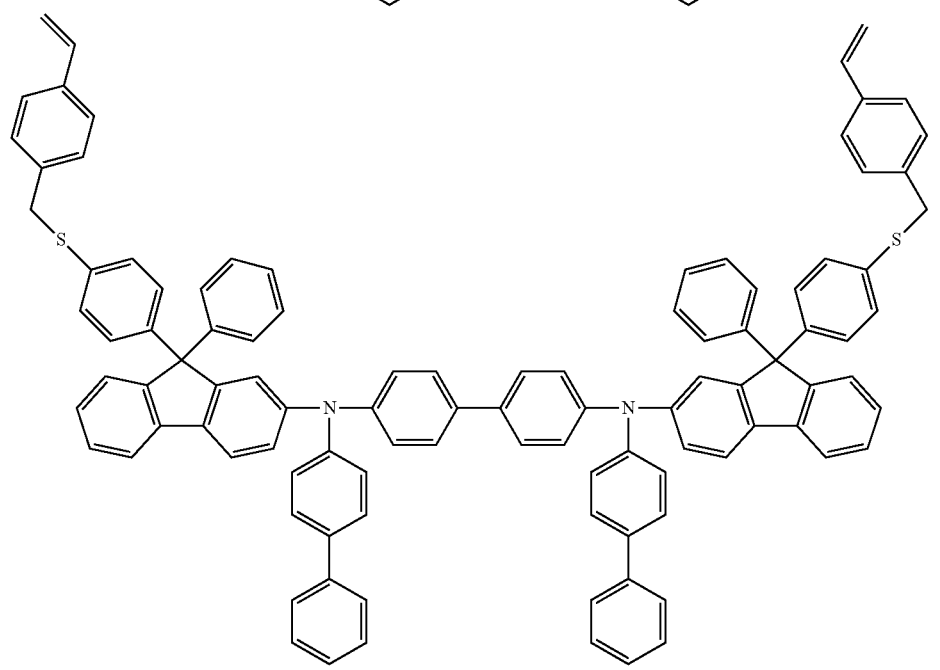
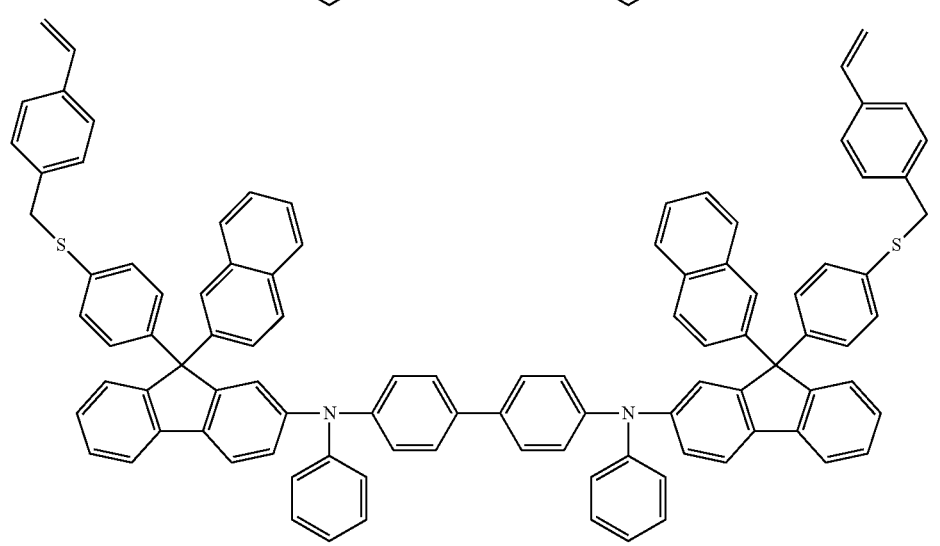

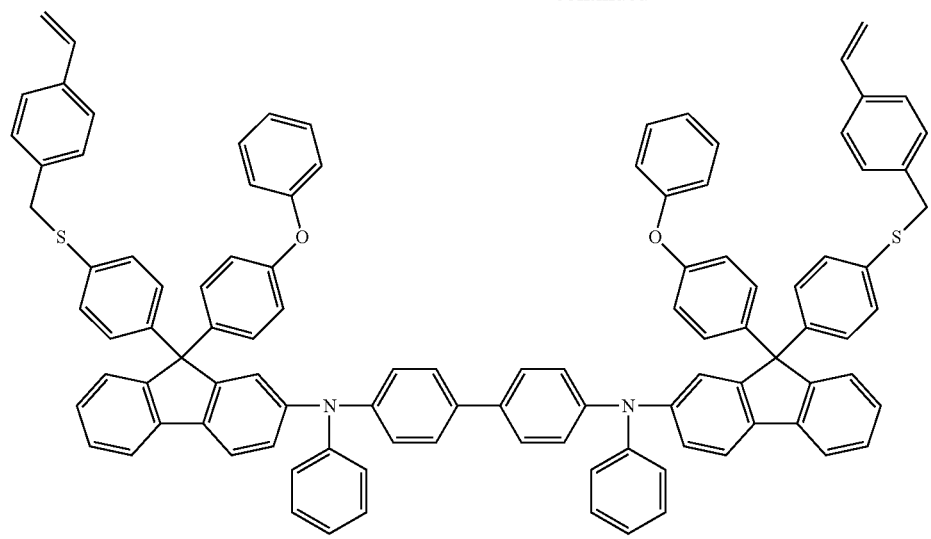
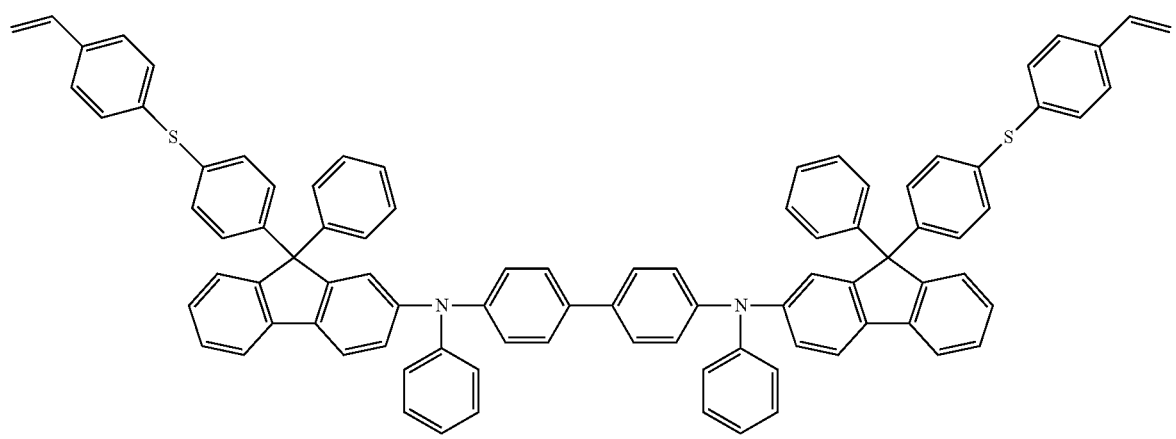
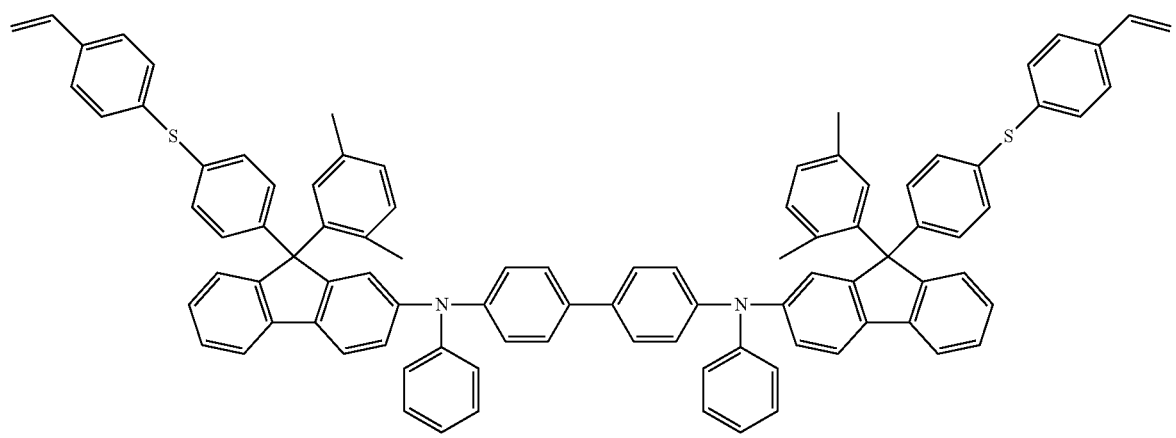

221 222
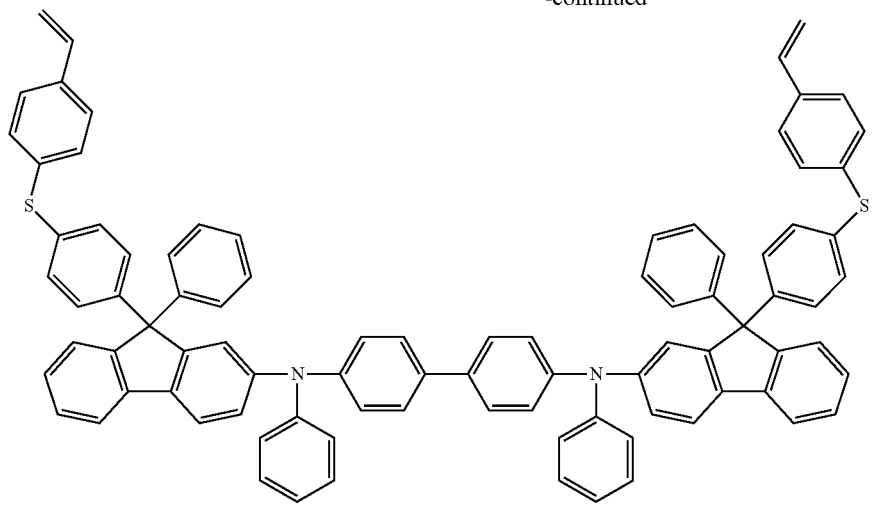
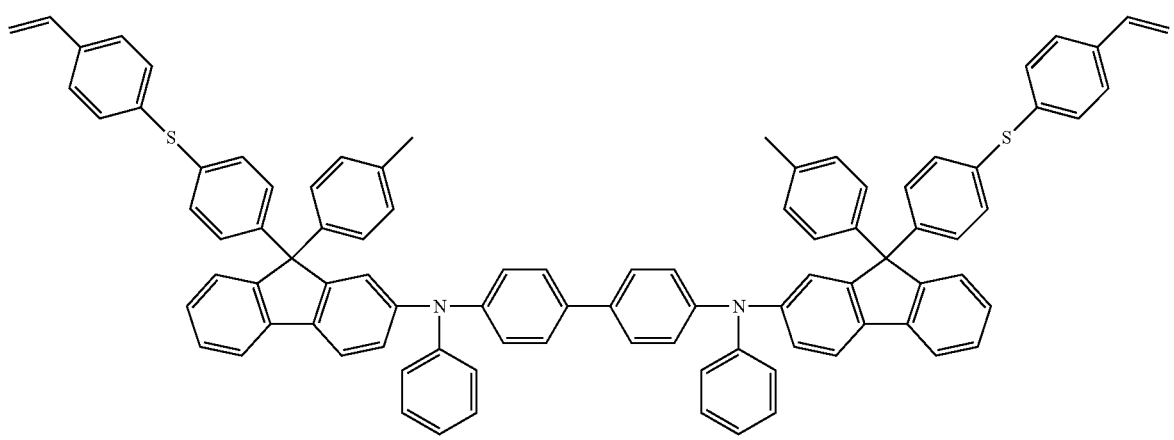
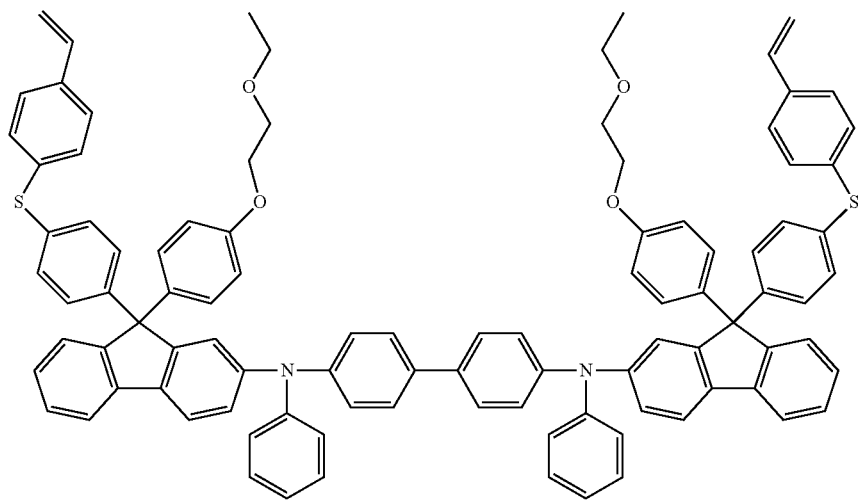

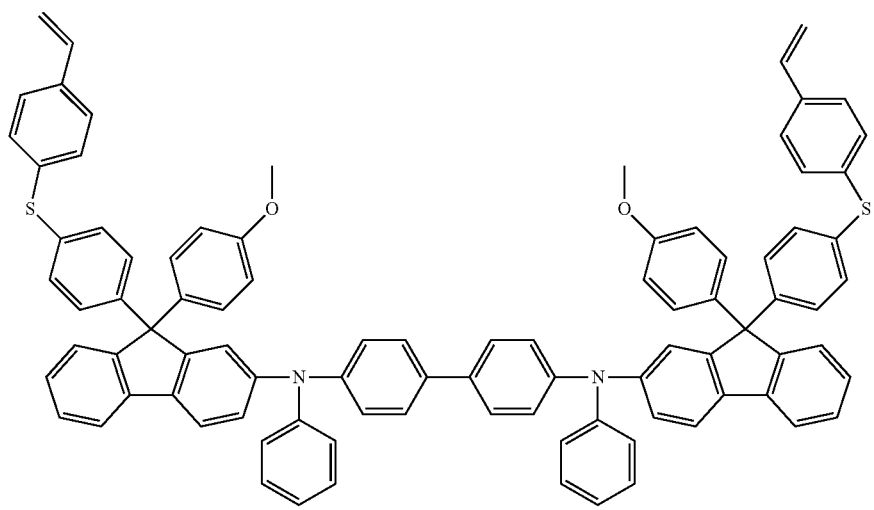
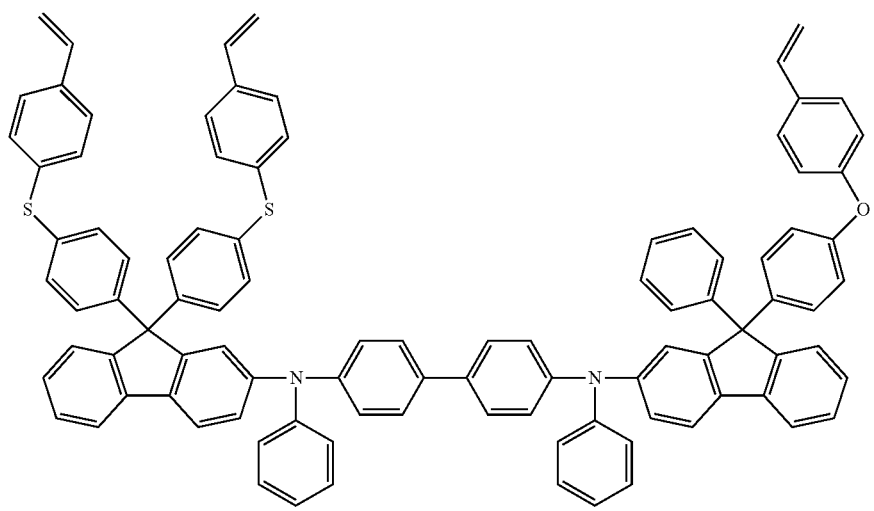
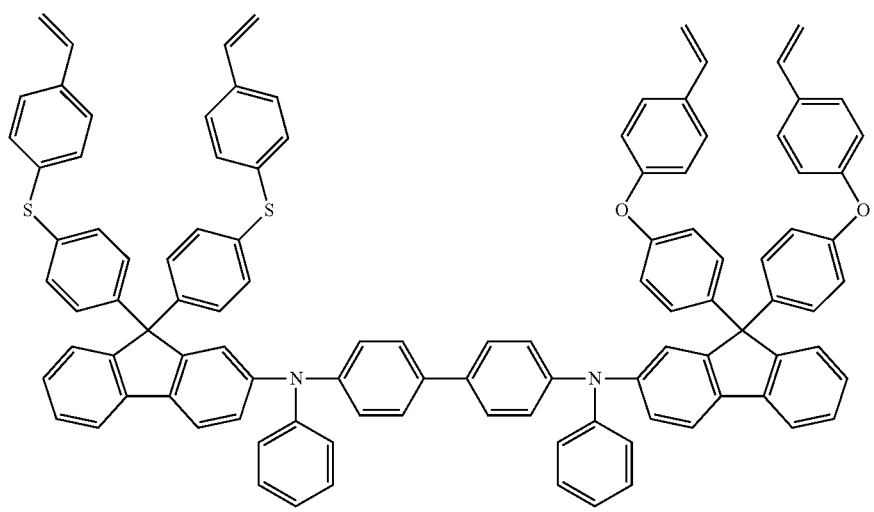

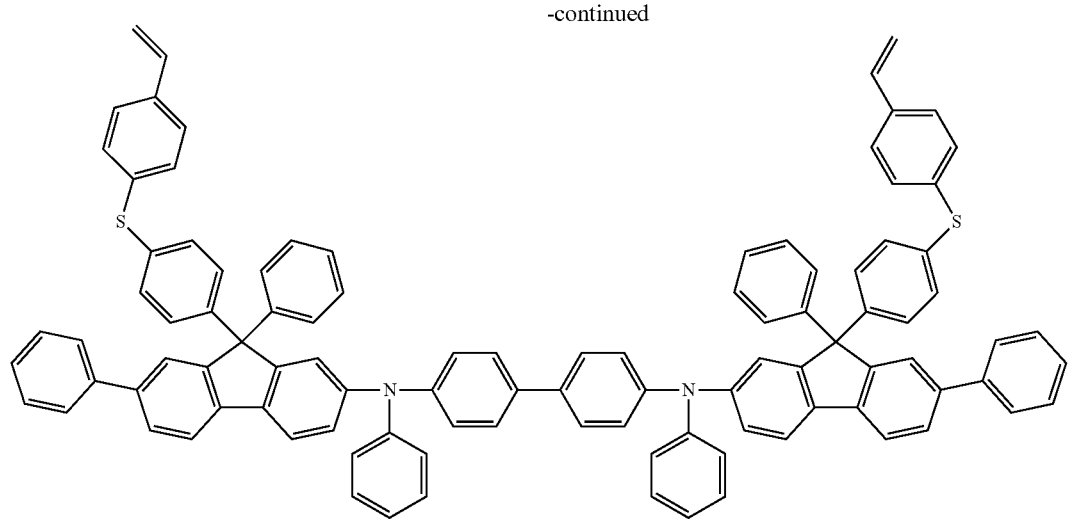
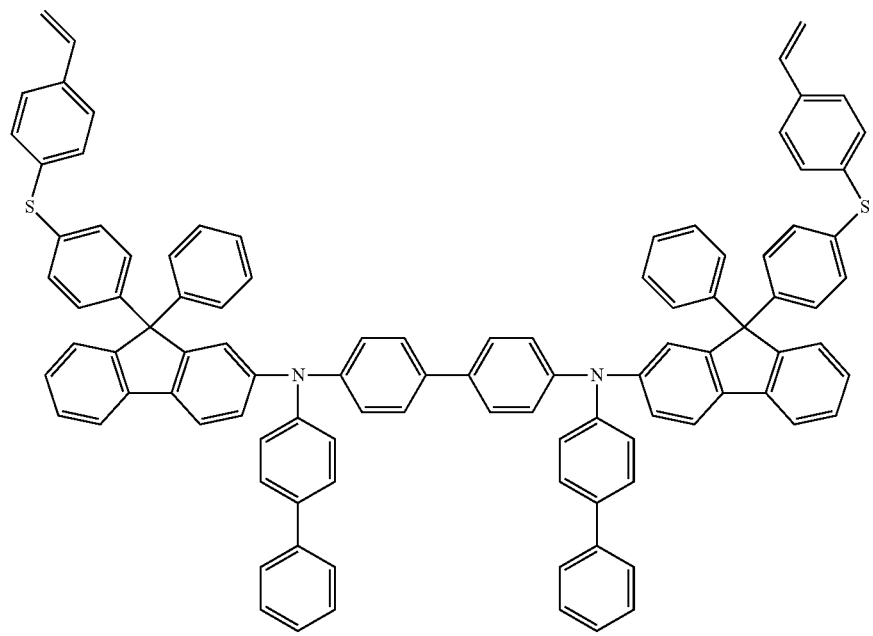
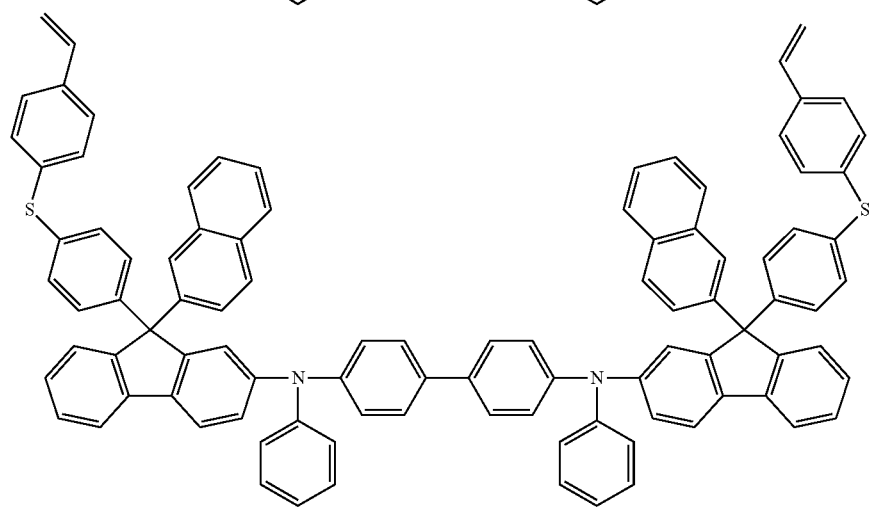

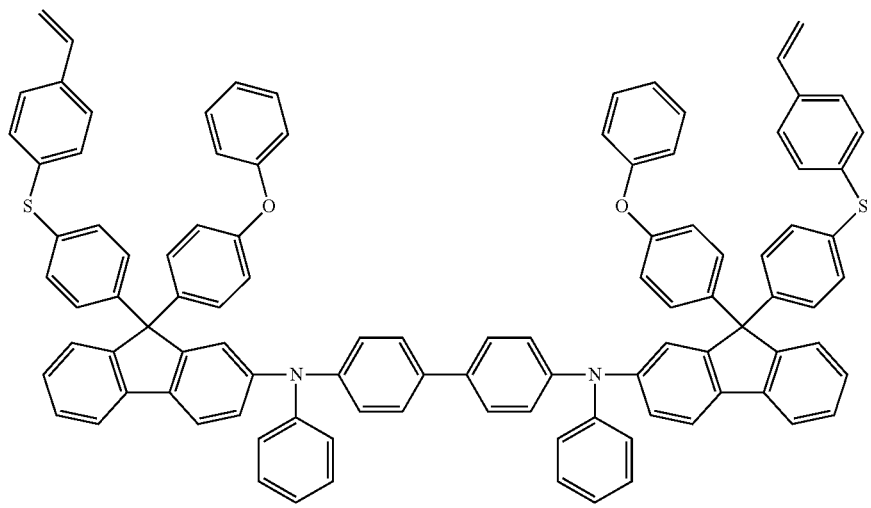
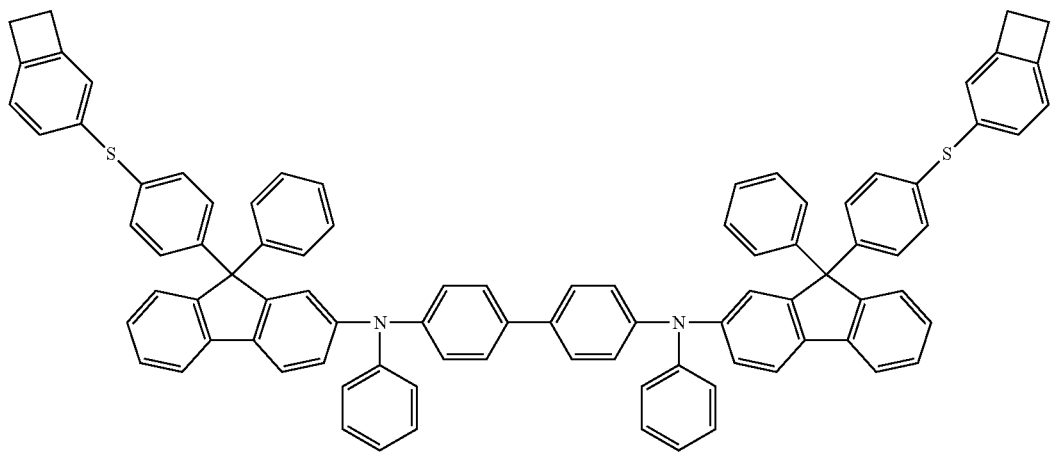
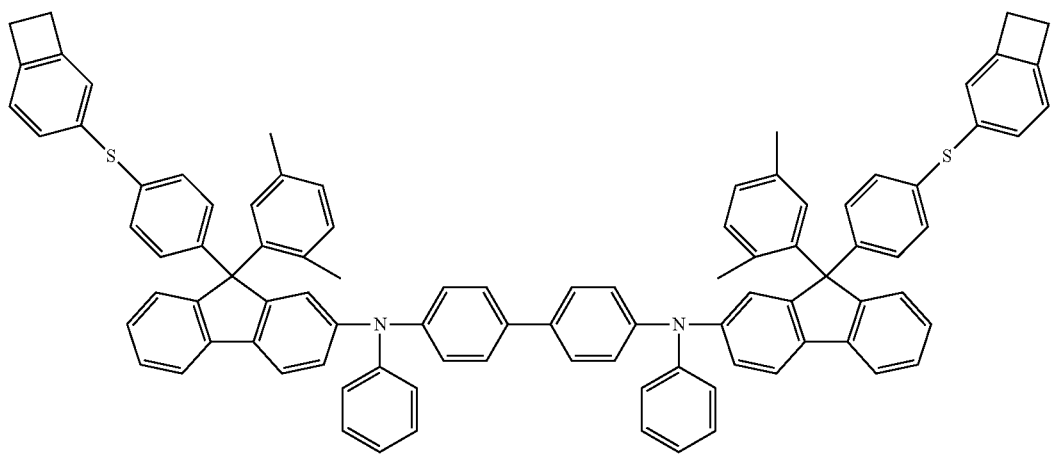

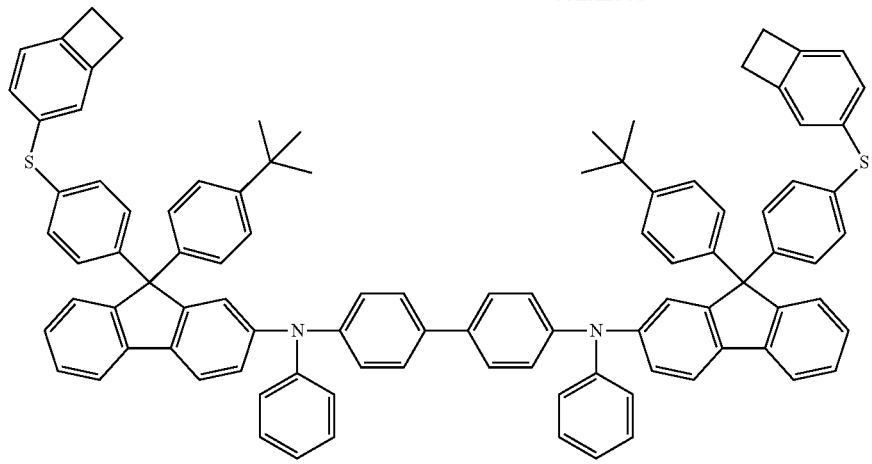
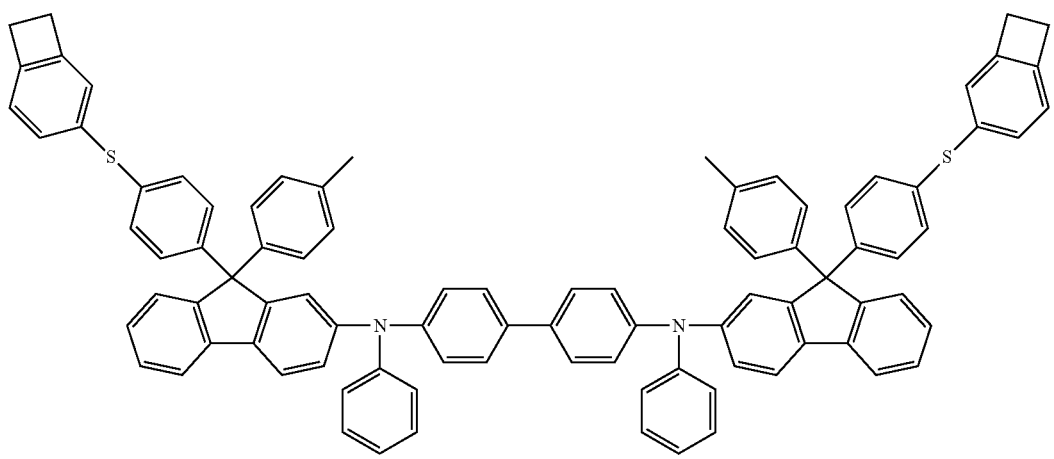
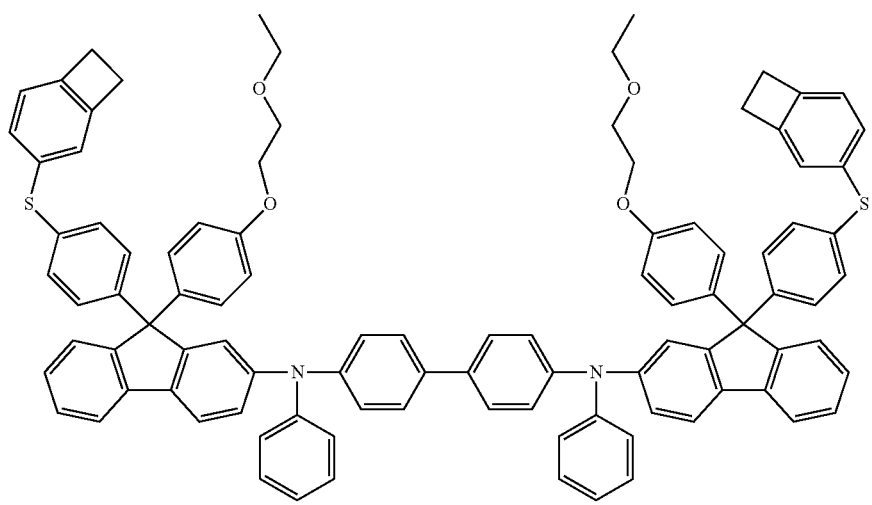

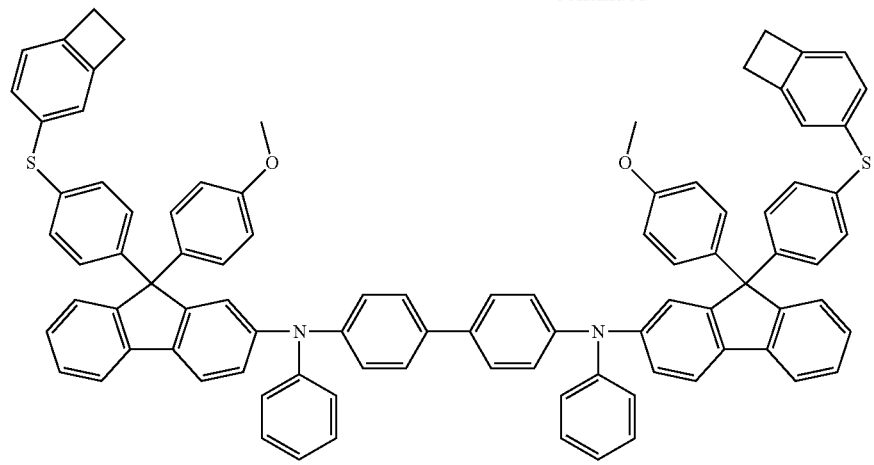
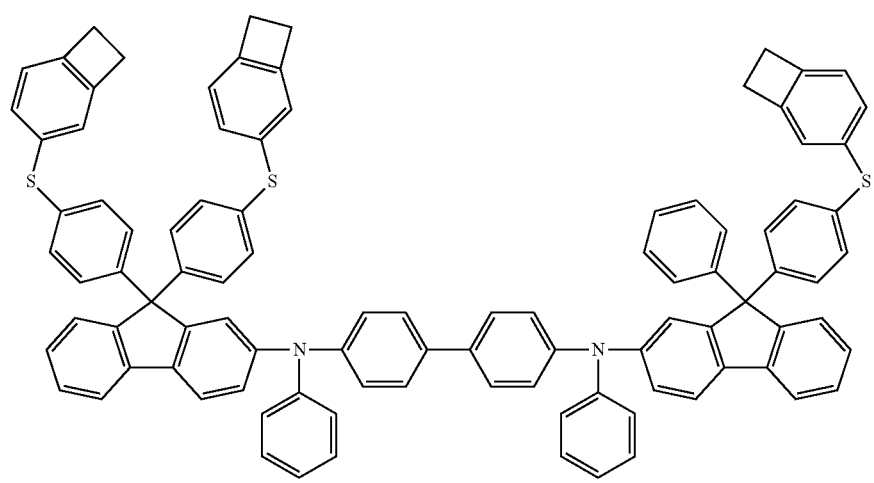
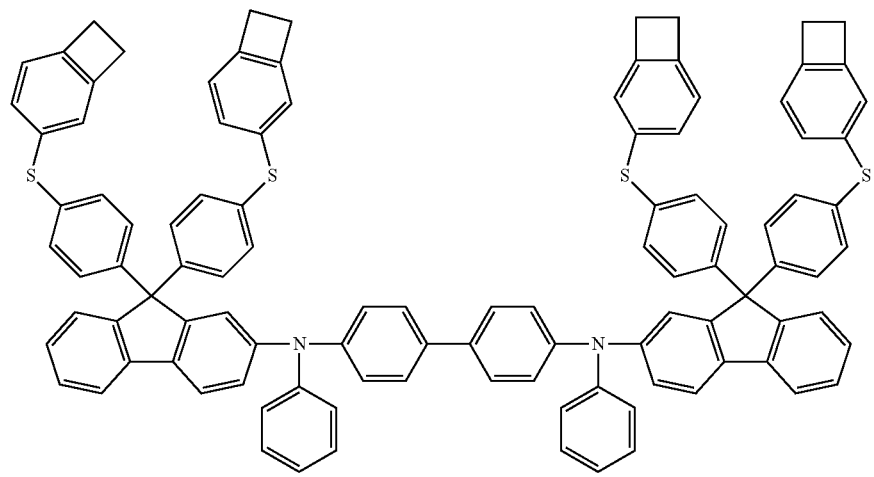

233
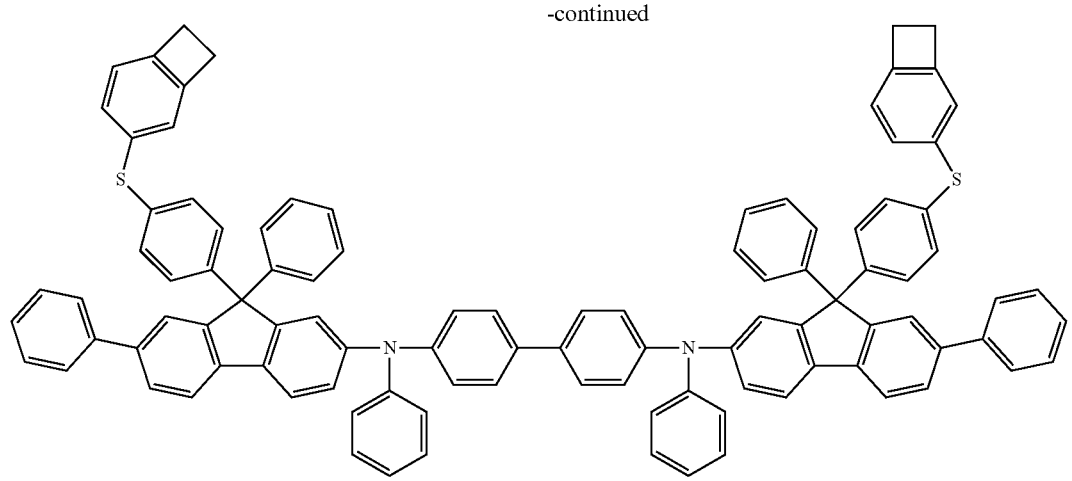
234
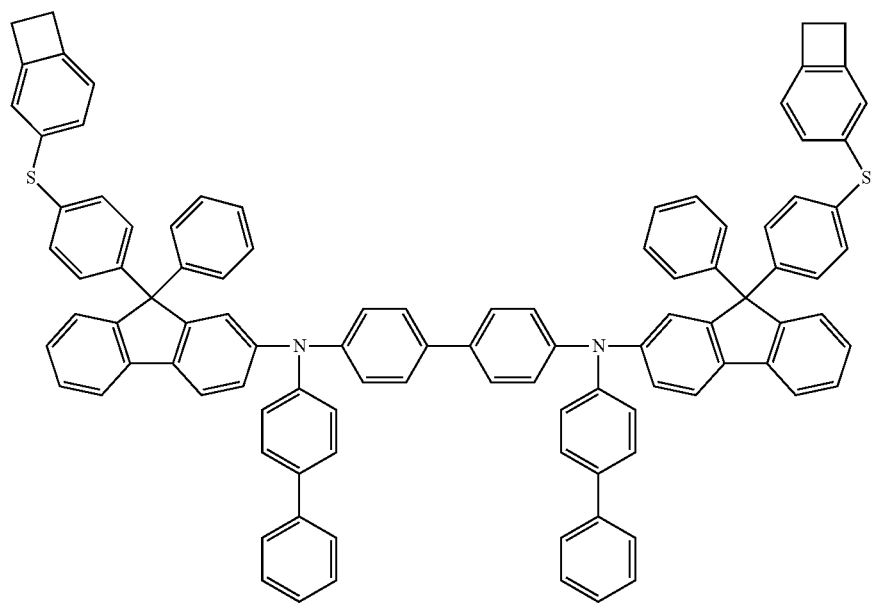
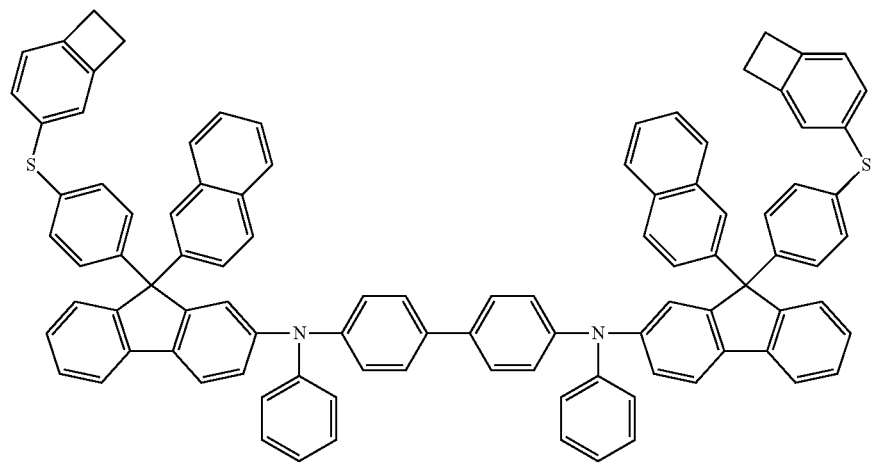

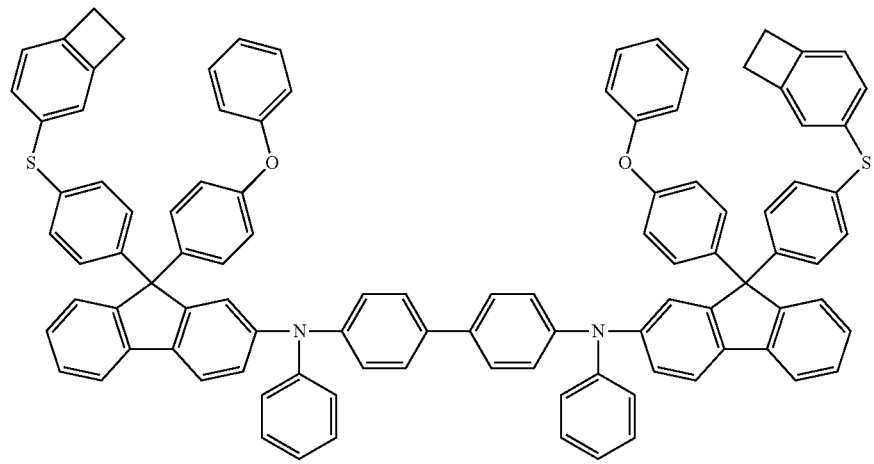
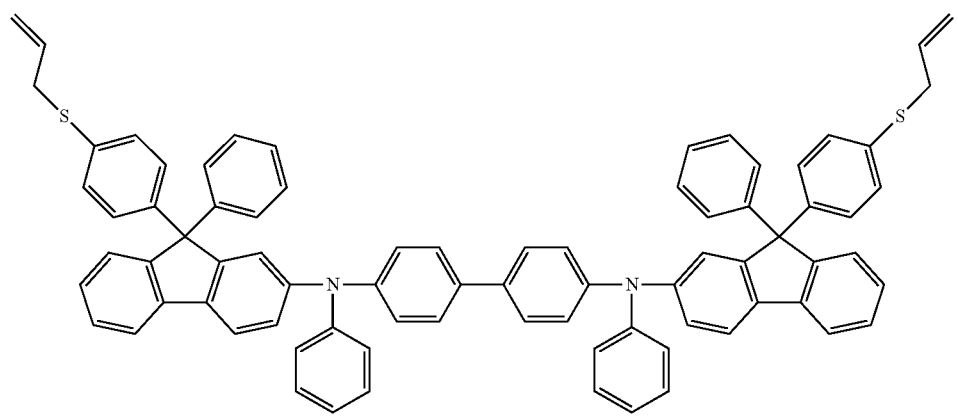
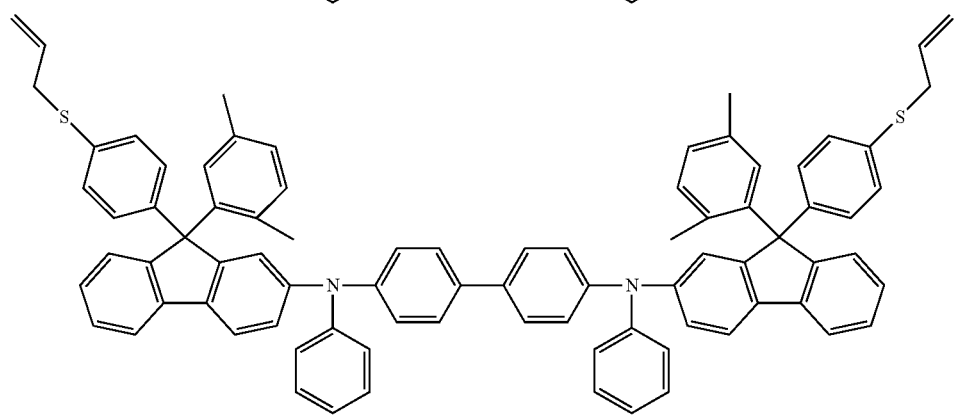
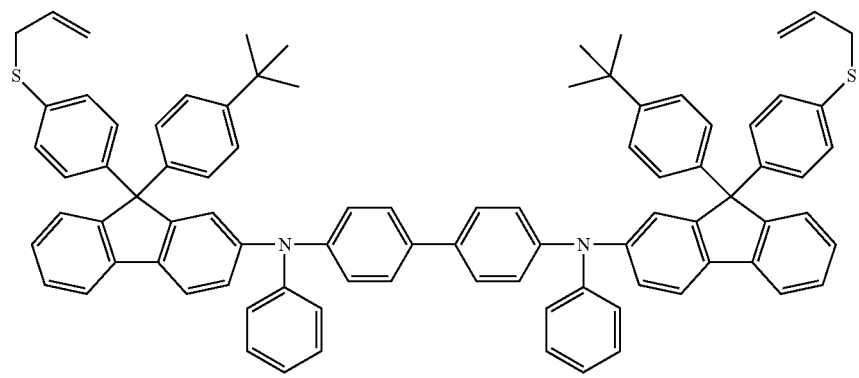

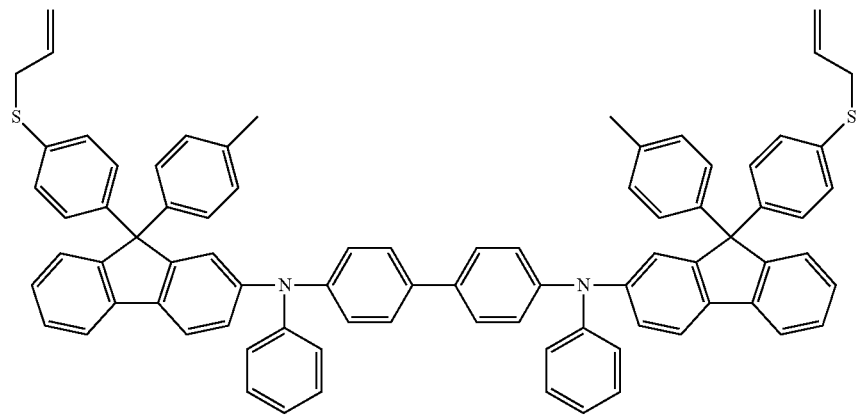
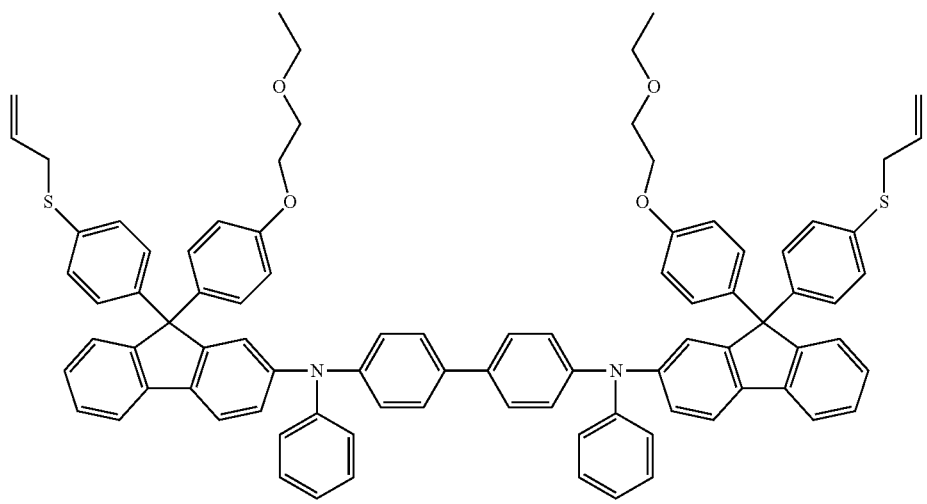
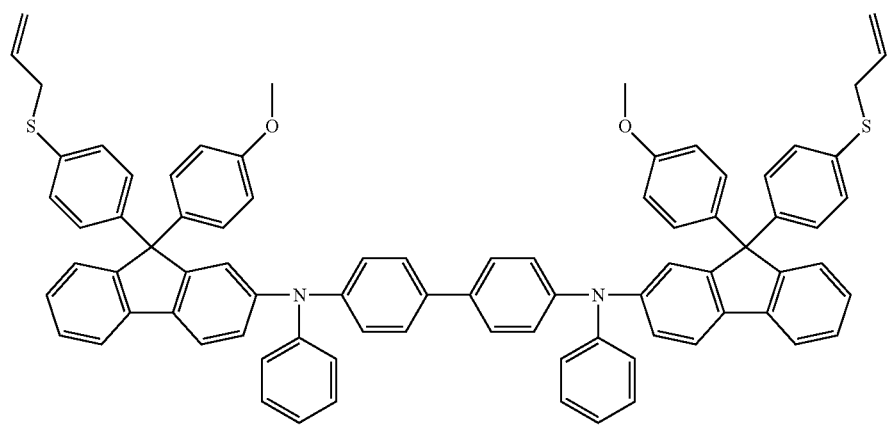

-continued
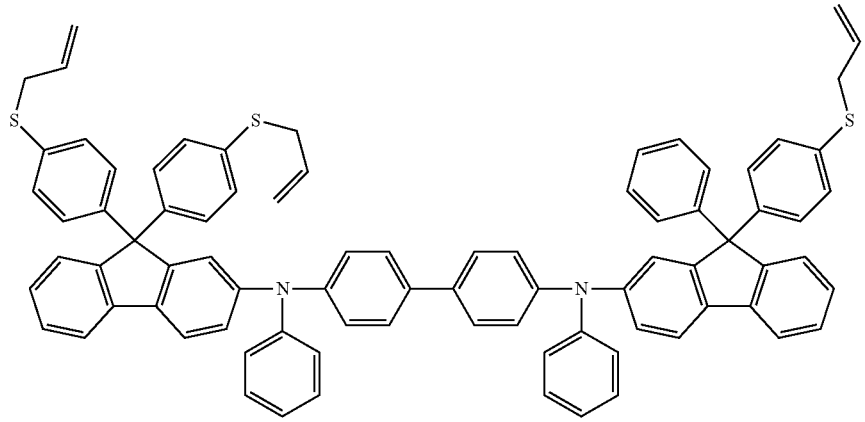
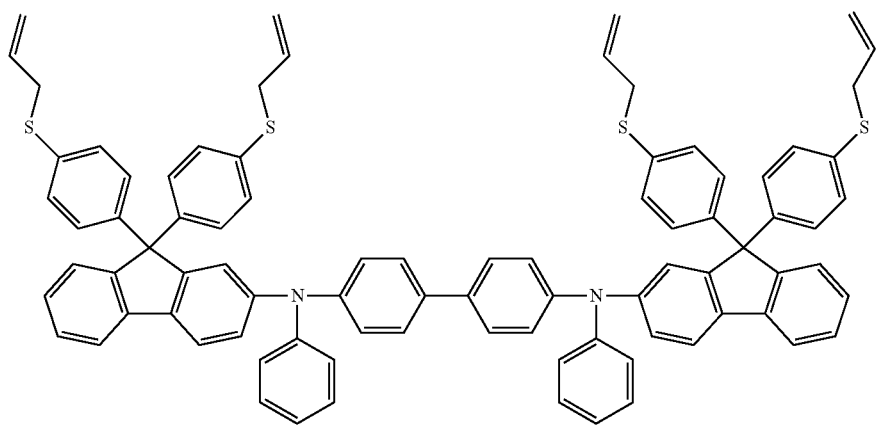
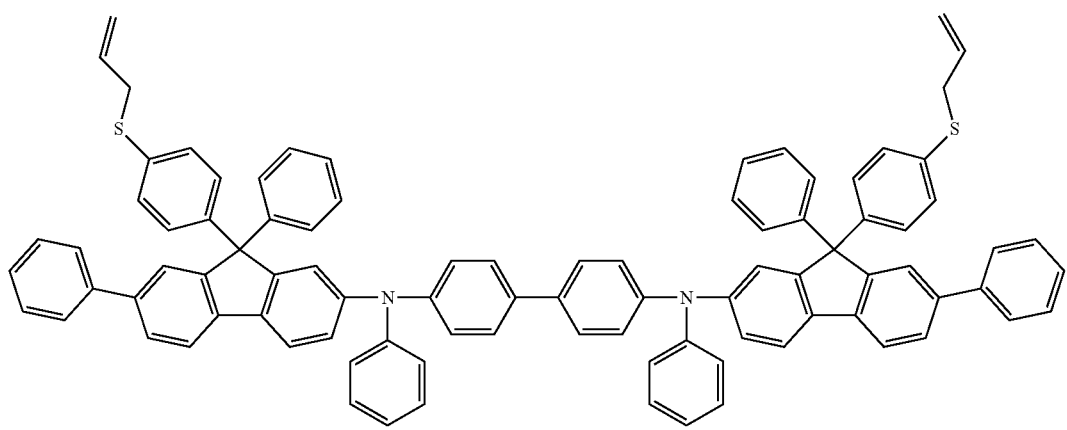

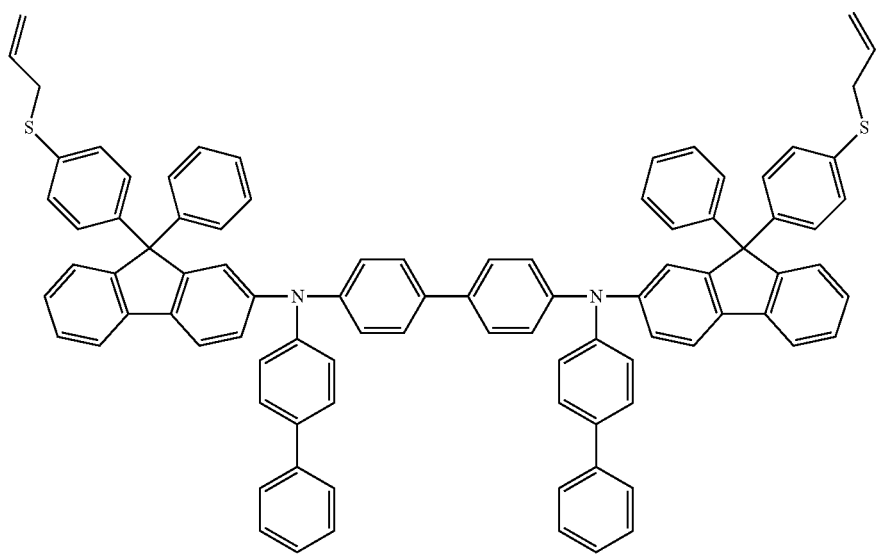
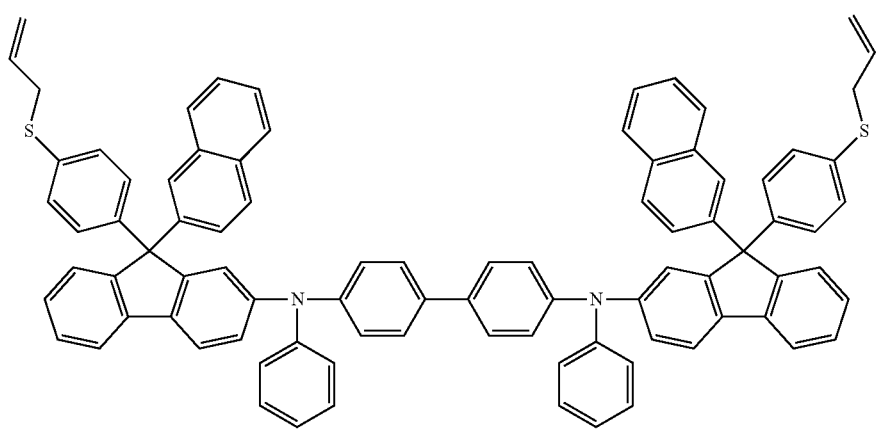
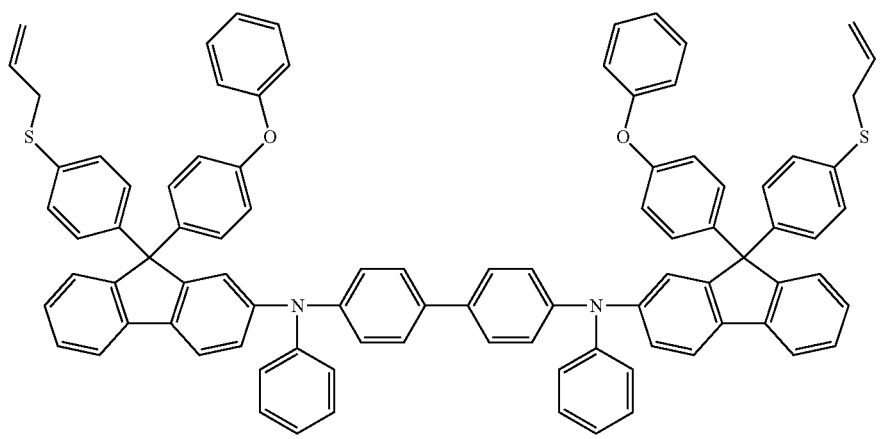

243 244
-continued
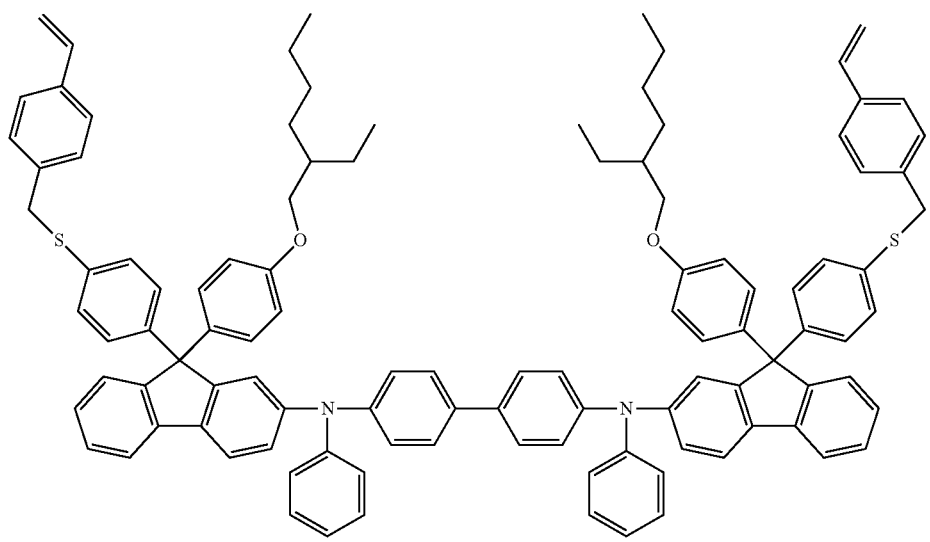
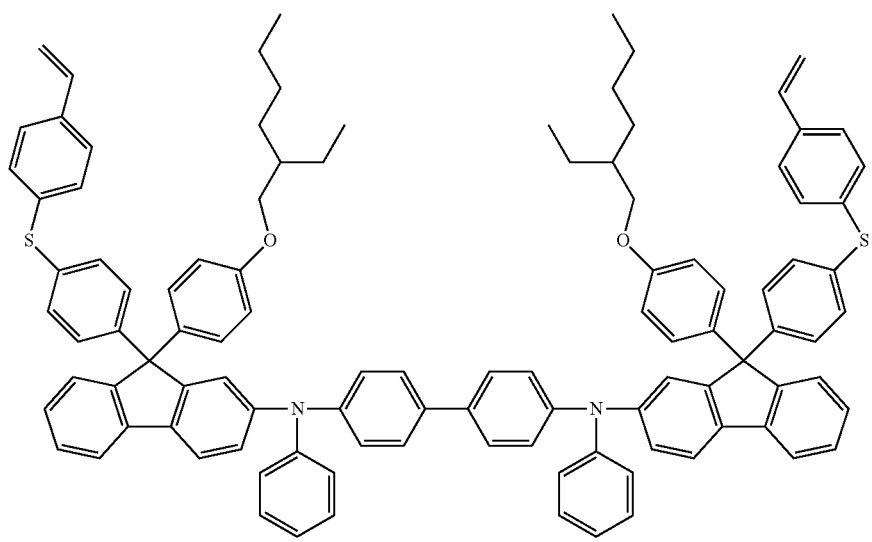 [SMILES: C=Cc1ccc(Sc2ccc(C3(c4ccc(OCC(CC)CCCC)cc4)c4ccccc4-c4ccc(N(c5ccccc5)c5ccc(-c6ccc(N(c7ccccc7)c7ccc8c(c7)C(c7ccc(OCC(CC)CCCC)cc7)(c7ccc(Sc9ccc(C=C)cc9)cc7)c7ccccc7-8)cc6)cc5)cc43)cc2)cc1]
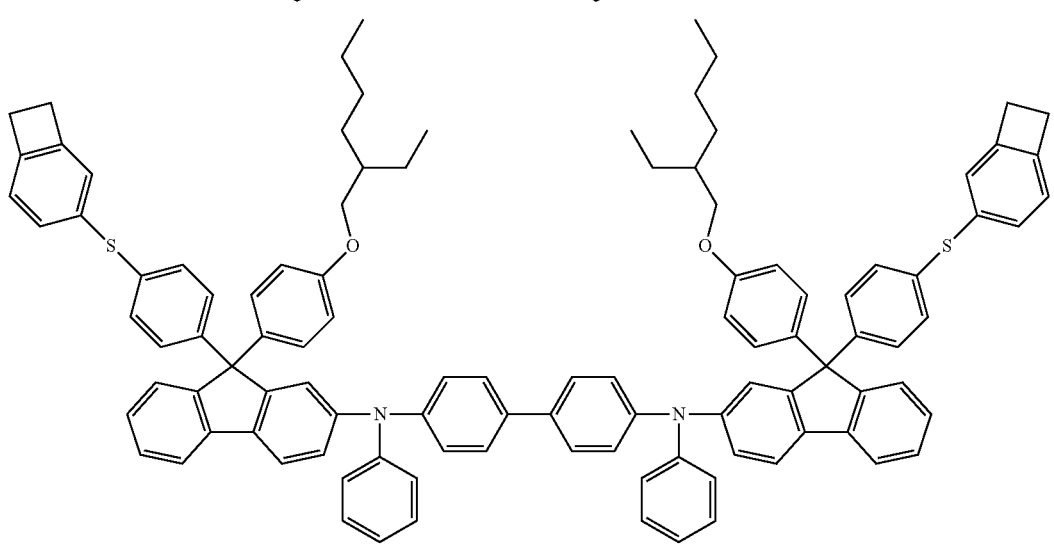

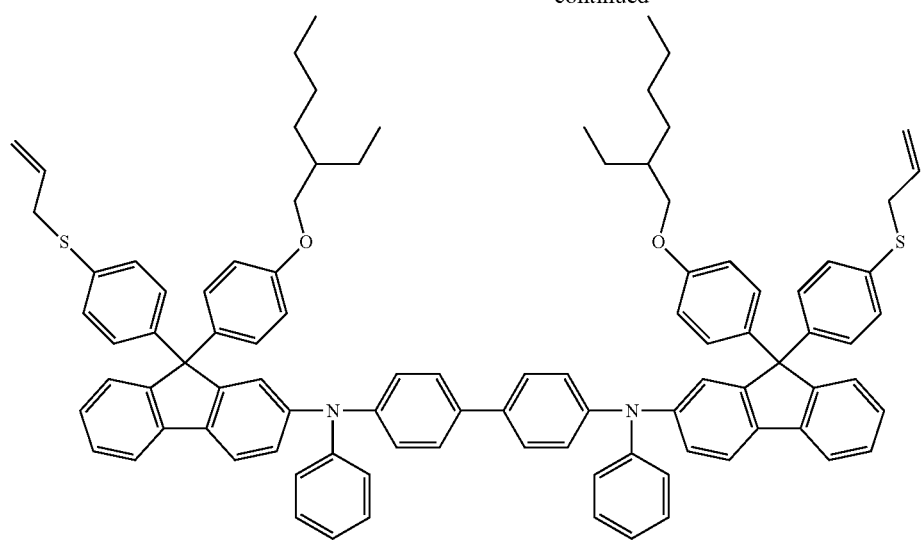
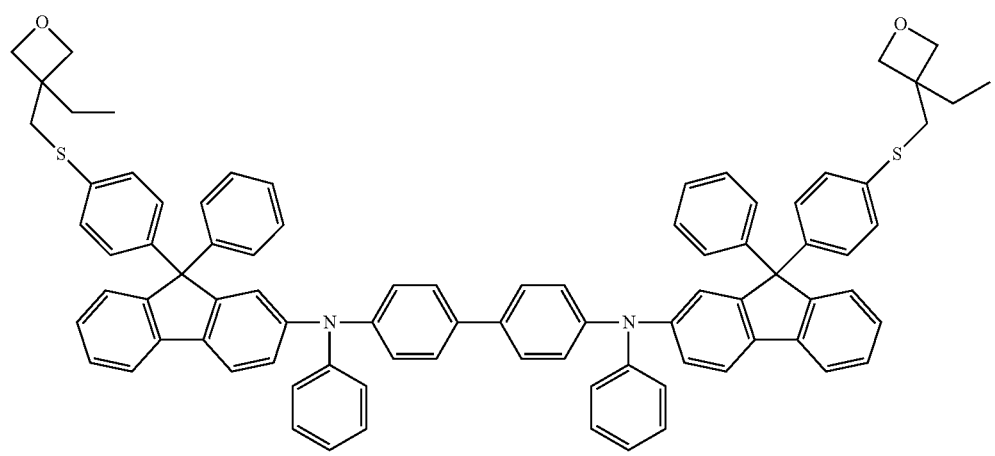
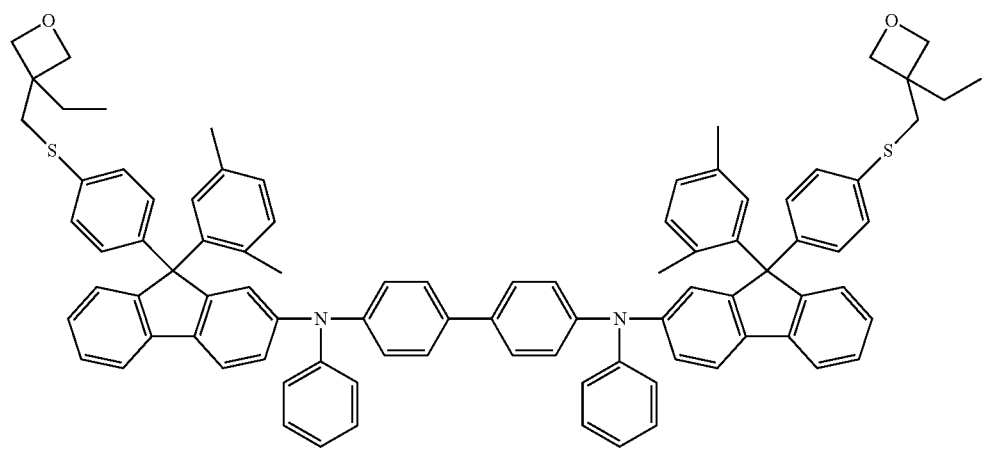

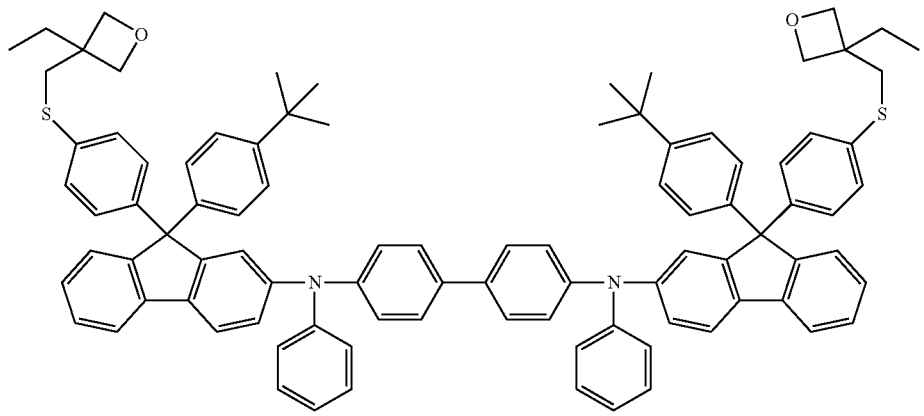
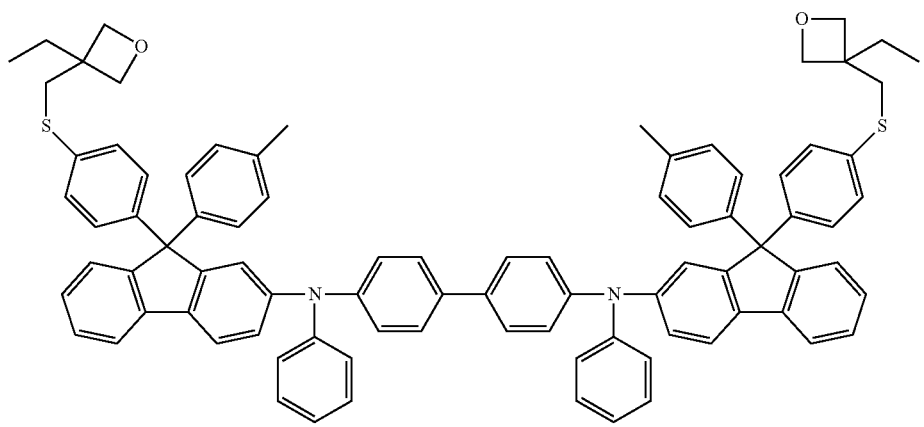
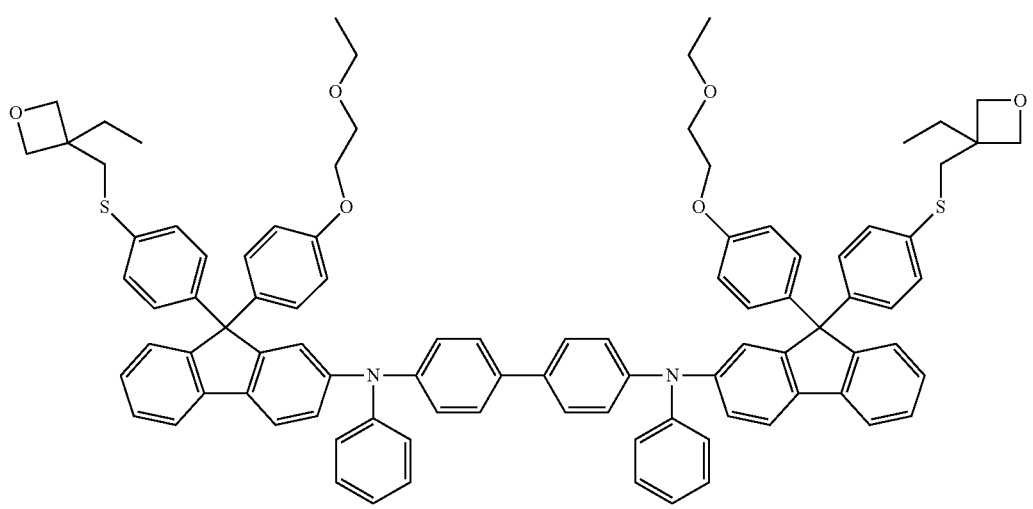

249 250
-continued
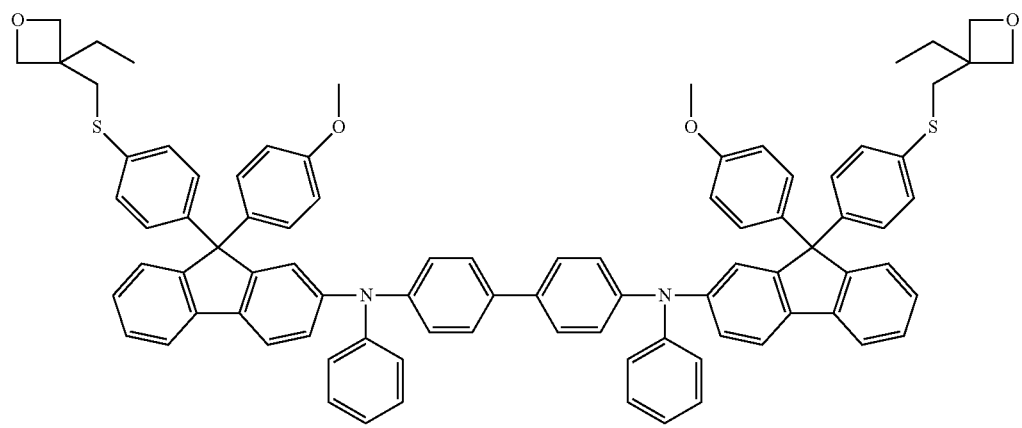
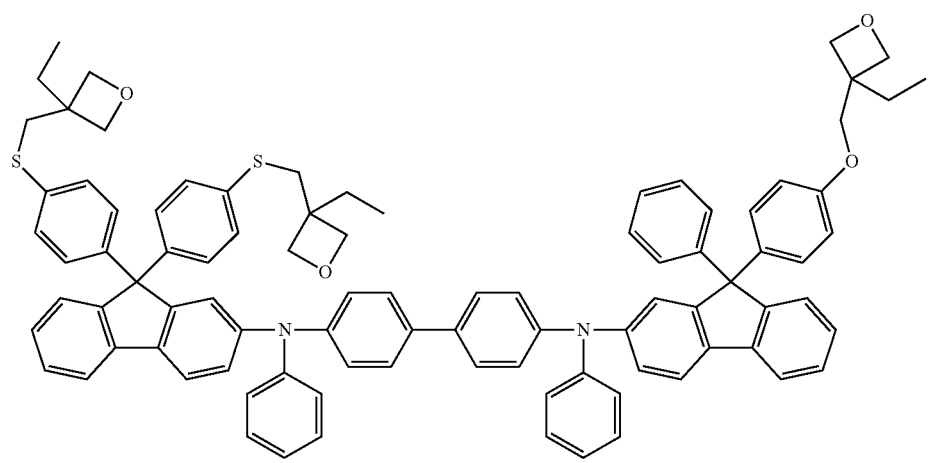
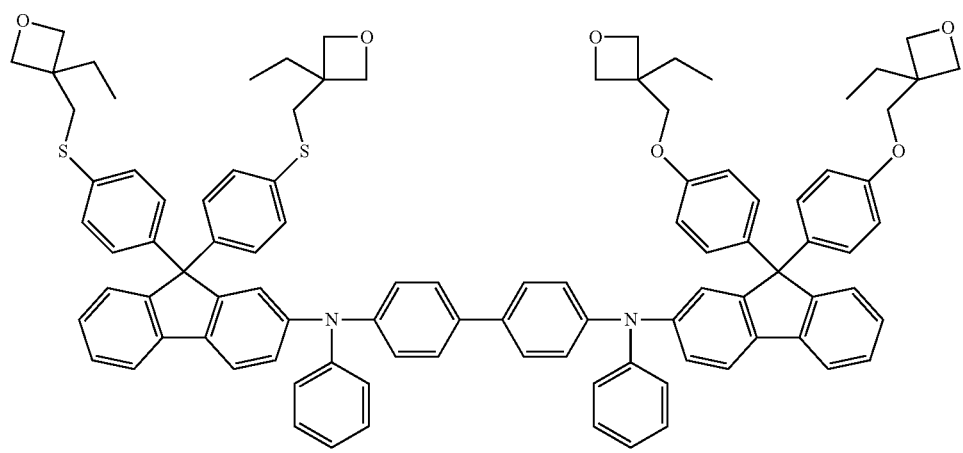

251
252
-continued
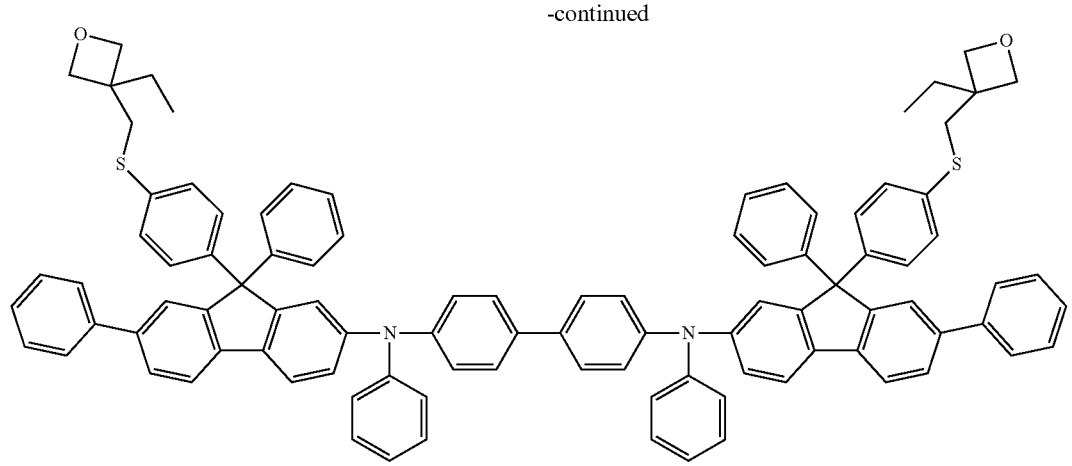
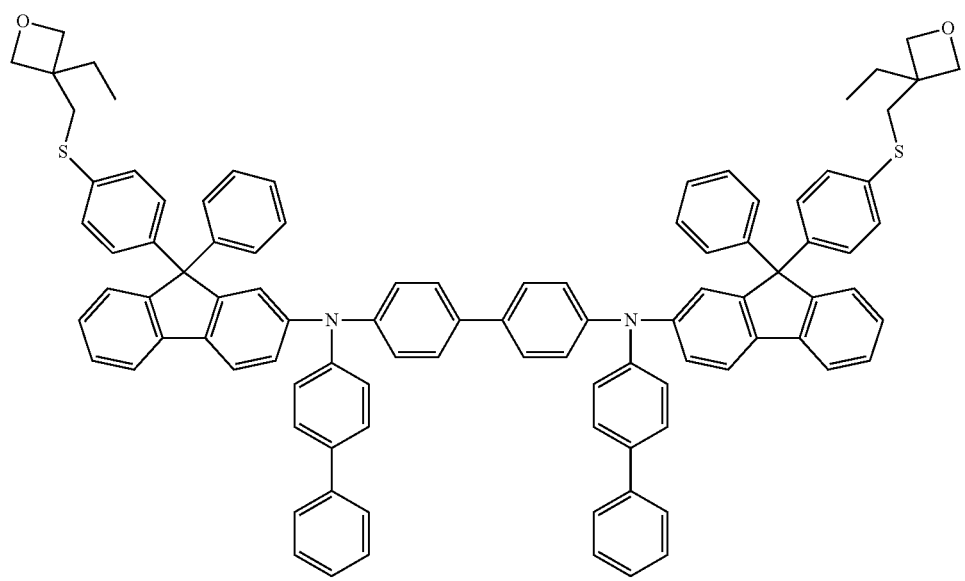
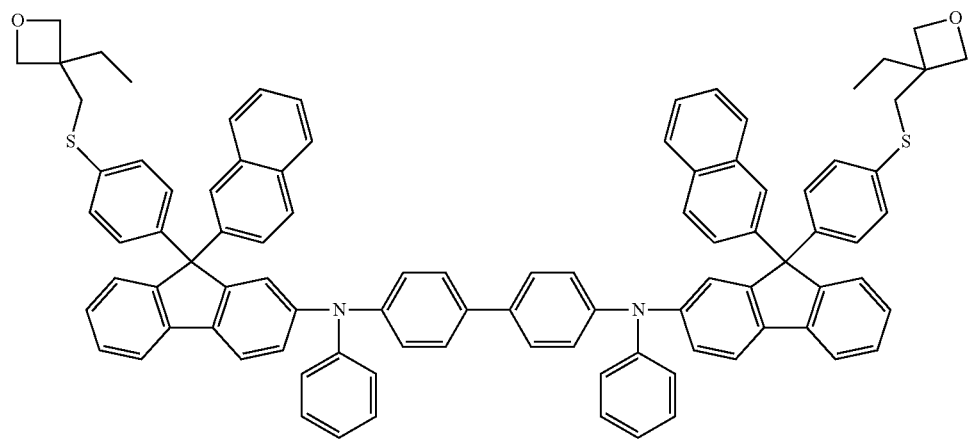

253 254
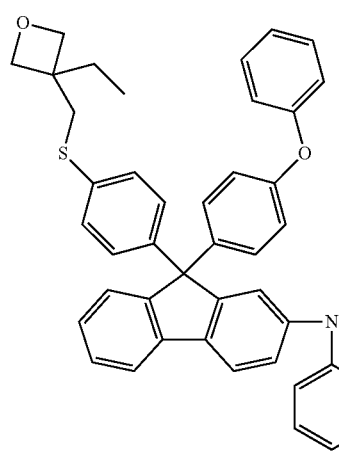
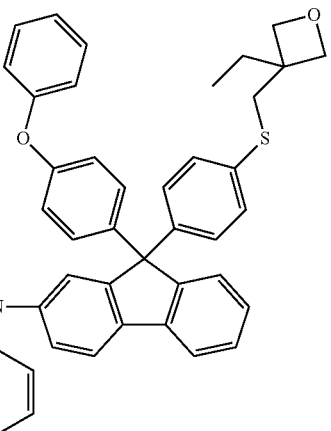
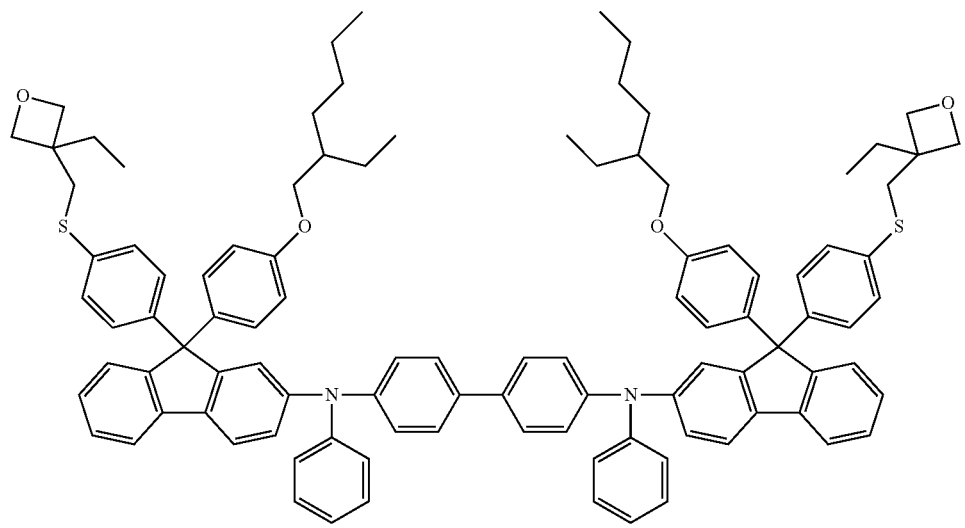
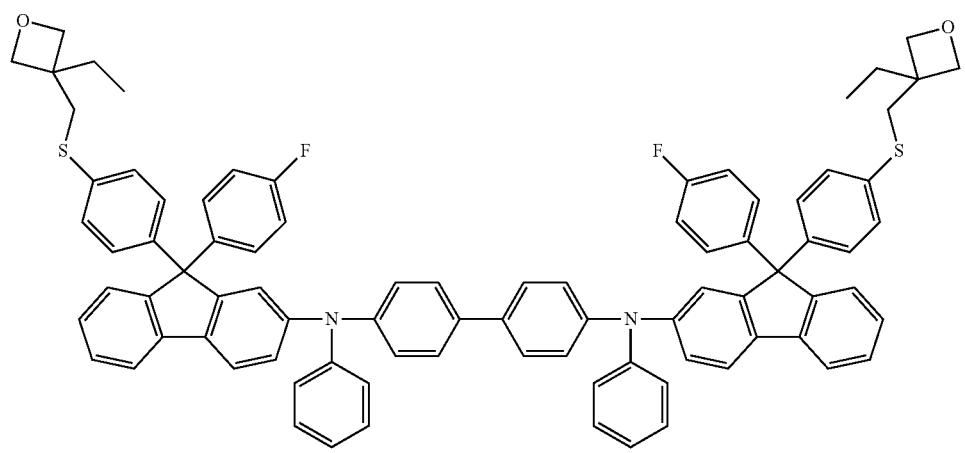

255 256
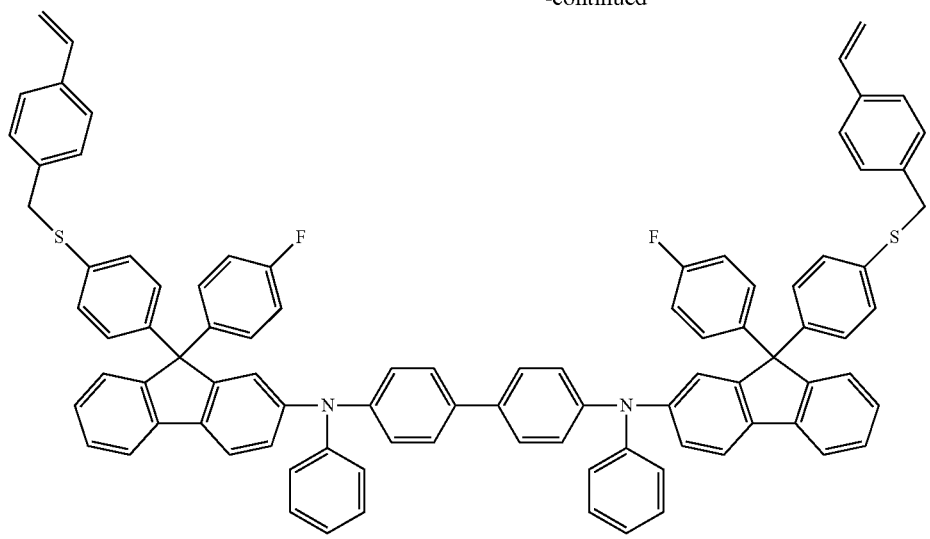
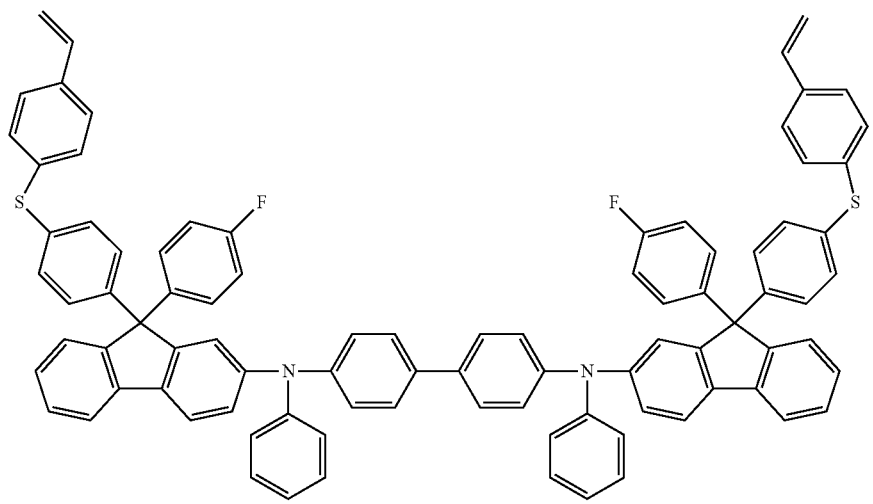
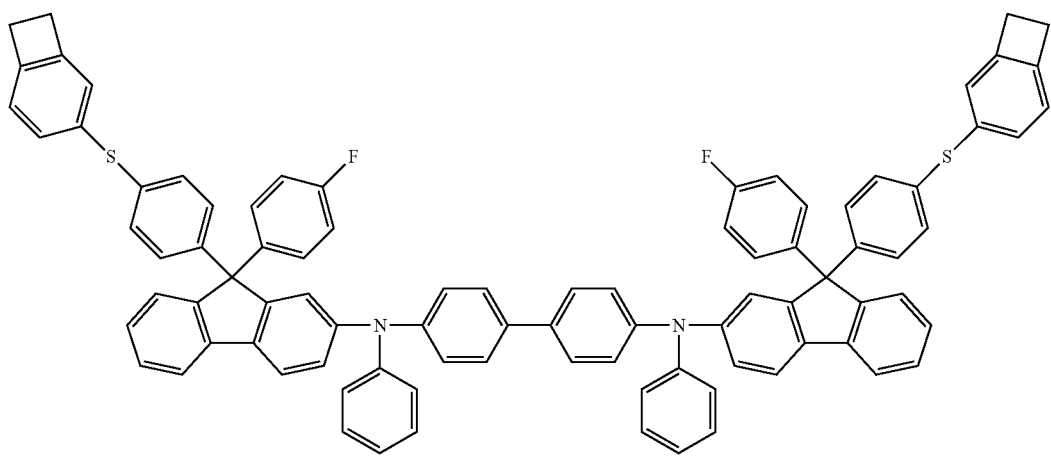

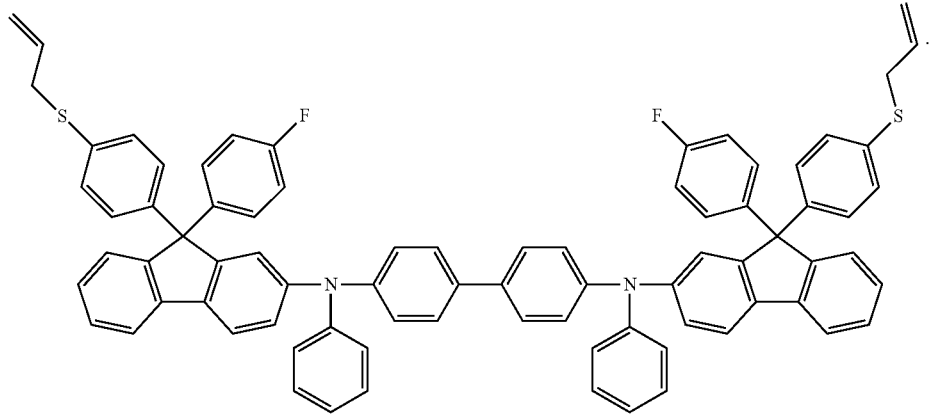 [SMILES: C=CCSc1ccc(C2(c3ccc(F)cc3)c3ccccc3-c3ccc(N(c4ccccc4)c4ccc(-c5ccc(N(c6ccccc6)c6ccc7c(c6)C(c6ccc(F)cc6)(c6ccc(SCC=C)cc6)c6ccccc6-7)cc5)cc4)cc32)cc1]

11. The polymer of claim 1, wherein
the polymer is formed by the compound represented by Chemical Formula 1 through 1 to 4 crosslinks and the compound represented by Chemical Formula 4 through 1 to 6 crosslinks.

12. The polymer of claim 1, wherein
the compound represented by Chemical Formula 1 and the compound represented by Chemical Formula 4 is included in a weight ratio of 1:99 to 99:1.

13. The polymer of claim 1, which has
a weight average molecular weight of 10,000 to 1,000,000 g/mol.

14. The polymer of claim 1, which has
a polydispersity index of 1 to 10.

15. An organic light emitting device comprising: a first electrode; a second electrode that is provided opposite to the first electrode; and one or more organic material layers that are provided between the first electrode and the second electrode, wherein the one or more organic material layers include the polymer according to claim 1.

16. The organic light emitting device of claim 15, wherein
the one or more organic material layers containing the compound include at least a hole injection layer, a hole transport layer, or a layer that simultaneously performs hole injection and hole transport.

17. The polymer of claim 1, wherein
the compound represented by Chemical Formula 1 is represented by the following structural formula:

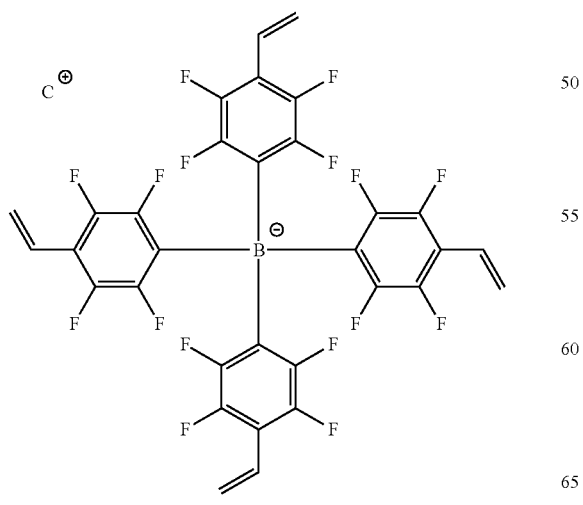

wherein $C^{\oplus}$ is defined the same as in Chemical Formula 1.

18. The polymer of claim 1, wherein
the cationic group is an onium ion.

19. The polymer of claim 1, wherein
the cationic group is selected from the group consisting of the following formulas:

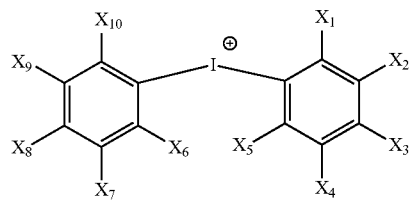

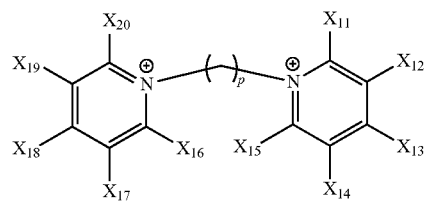

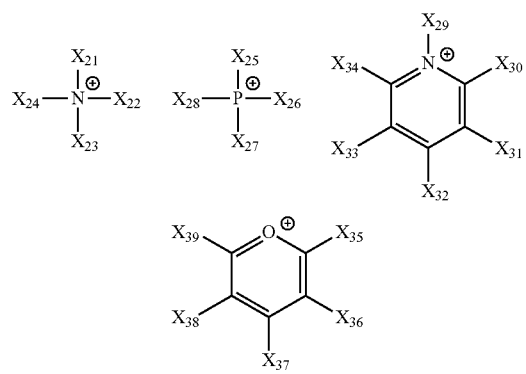

-continued

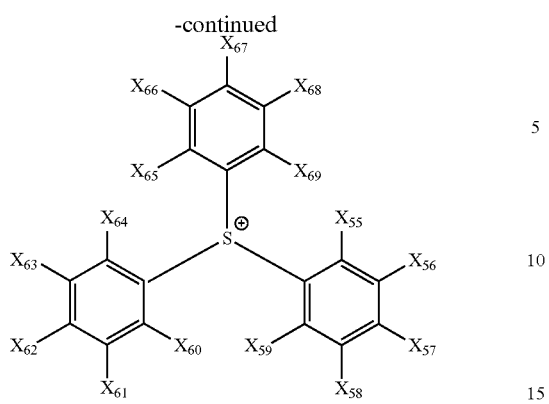

wherein,
$X_1$ to $X_{39}$ and $X_{55}$ to $X_{69}$ are each independently hydrogen; a cyano group; a nitro group; a halogen group; —$COOR_{104}$; a substituted or unsubstituted alkyl group; a substituted or unsubstituted alkoxy group; a substituted or unsubstituted cycloalkyl group; a substituted or unsubstituted fluoroalkyl group; or a substituted or unsubstituted aryl group, or a photocurable/thermosetting functional group,
$R_{104}$ is hydrogen; deuterium; or a substituted or unsubstituted alkyl group, and
p is an integer of 0 to 10.

* * * * *

UNITED STATES PATENT AND TRADEMARK OFFICE
CERTIFICATE OF CORRECTION

PATENT NO. : 11,845,824 B2
APPLICATION NO. : 17/059858
DATED : December 19, 2023
INVENTOR(S) : Minho Hwang, Ho Gyu Lee and Jaechol Lee It is certified that error appears in the above-identified patent and that said Letters Patent is hereby corrected as shown below:

On the Title Page

(54) "SAME NOVEL POLYMER AND ORGANIC LIGHT EMITTING DEVICE COMPRISING THE SAME" should read -- NOVEL POLYMER AND ORGANIC LIGHT EMITTING DEVICE COMPRISING THE SAME --

In the Specification

On Column 1, the title "SAME NOVEL POLYMER AND ORGANIC LIGHT EMITTING DEVICE COMPRISING THE SAME" should read -- NOVEL POLYMER AND ORGANIC LIGHT EMITTING DEVICE COMPRISING THE SAME --

Signed and Sealed this
Twenty-third Day of January, 2024

Katherine Kelly Vidal
*Director of the United States Patent and Trademark Office*